United States Patent [19]
Satoh et al.

[11] Patent Number: 5,637,886
[45] Date of Patent: Jun. 10, 1997

[54] THYRISTOR WITH IMPROVED DV/DT RESISTANCE

[75] Inventors: Katsumi Satoh; Kenichi Honda; Kazuhiko Niwayama, all of Fukuoka, Japan

[73] Assignee: Mitsubishi Denki Kabushiki Kaisha, Tokyo, Japan

[21] Appl. No.: 388,471

[22] Filed: Feb. 14, 1995

[30] Foreign Application Priority Data

Feb. 24, 1994 [JP] Japan .................... 6-026871

[51] Int. Cl.$^6$ ..................................... H01L 29/74
[52] U.S. Cl. ................. 257/107; 257/113; 257/115; 257/166; 257/175
[58] Field of Search ..................... 257/107, 113, 257/115, 166, 175, 379

[56] References Cited

U.S. PATENT DOCUMENTS

| | | | |
|---|---|---|---|
| 4,614,962 | 9/1986 | Bertotti et al. | 257/175 |
| 4,740,480 | 4/1988 | Oaka | 357/397 |

FOREIGN PATENT DOCUMENTS

| | | | |
|---|---|---|---|
| 0108874 | 8/1983 | European Pat. Off. | 257/113 |
| 59 14671 | 1/1984 | Japan | |
| 59-89462 | 5/1984 | Japan | |

*Primary Examiner*—Sara W. Crane
*Assistant Examiner*—Fetsum Abraham
*Attorney, Agent, or Firm*—Oblon, Spivak, McClelland, Maier & Neustadt, P.C.

[57] ABSTRACT

When an abrupt voltage noise is applied across an anode electrode (A) and a cathode electrode (K), displacement currents ($I_{10}$ to $I_{30}$) which are responsive to junction capacitances ($C_{10}$ to $C_{30}$) of respective unit thyristors ($ST_1$, $ST_2$, MT) are generated. The displacement currents ($I_{10}$ to $I_{30}$) flow into a compensation electrode (C) through paths in a P base layer (2) having resistances ($R_{10}$ to $R_{30}$), and further flow to an external power source through the cathode electrode (K) which is short-circuited with the compensation electrode (C). The paths of the three displacement currents ($I_{10}$ to $I_{30}$) are separated from each other by resistances ($R_{12}$, $R_{23}$). Therefore, a forward bias voltage of a junction ($D_{10}$) caused by the displacement current ($I_{10}$) is attenuated by the displacement current ($I_{20}$), while a forward bias voltage of a junction ($D_{20}$) caused by the displacement current ($I_{20}$) is attenuated by the displacement current ($I_{30}$). Thus, it is possible to improve a thyristor of a multistage structure in dv/dt resistance, at no sacrifice of sensitivity.

32 Claims, 80 Drawing Sheets

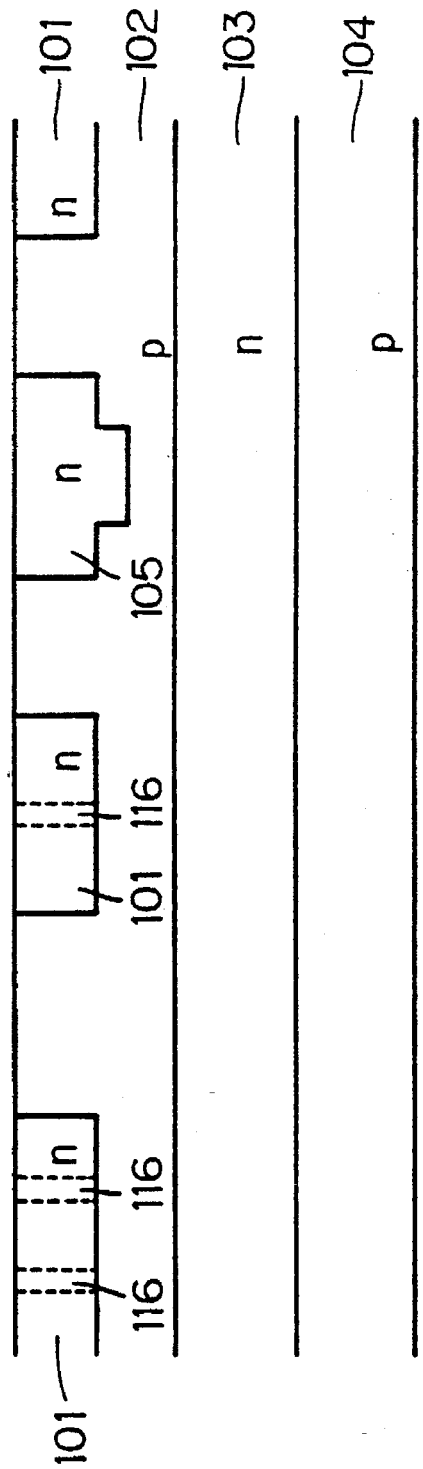
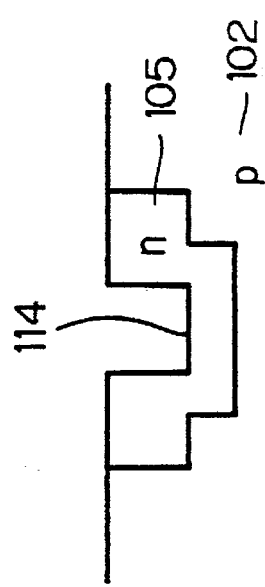

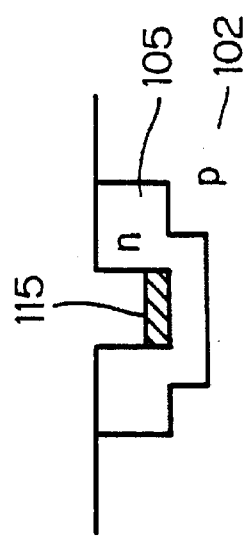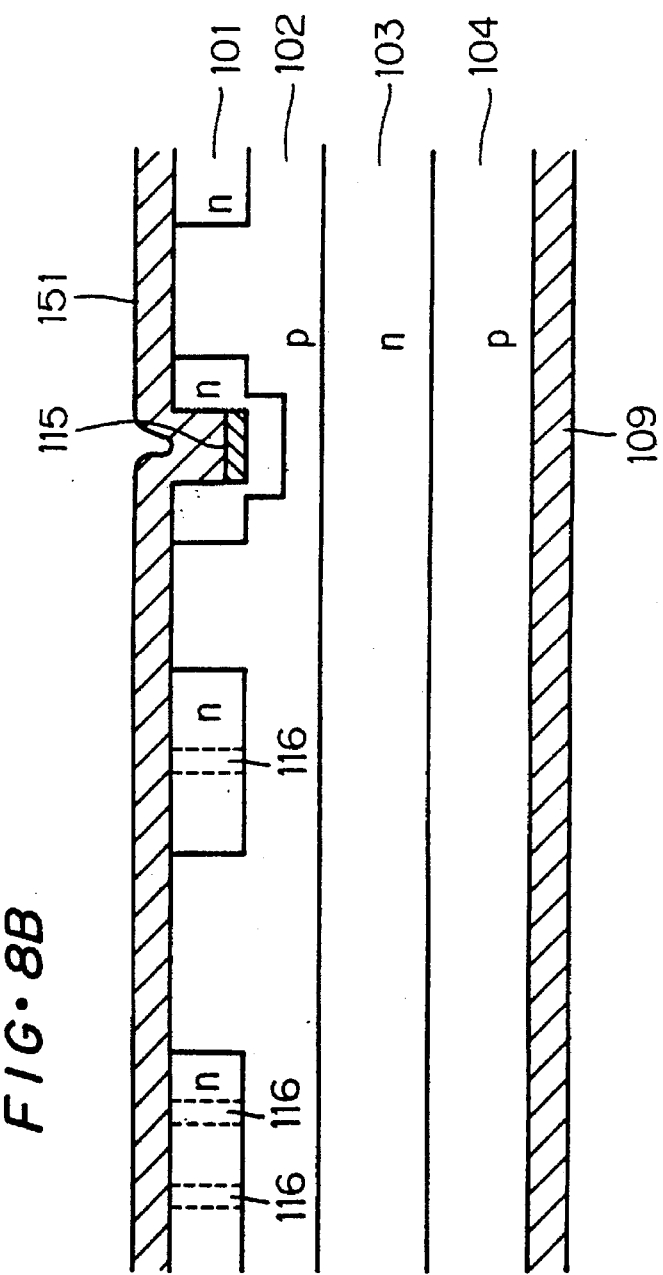

FIG·48A
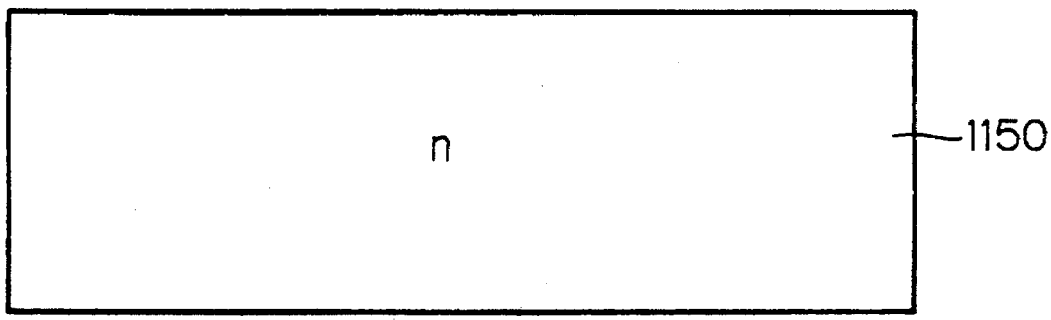
FIG·48B
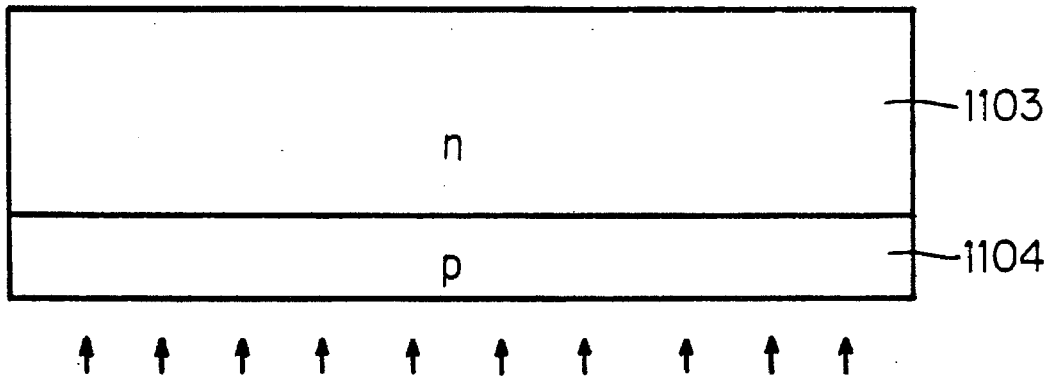

FIG·49
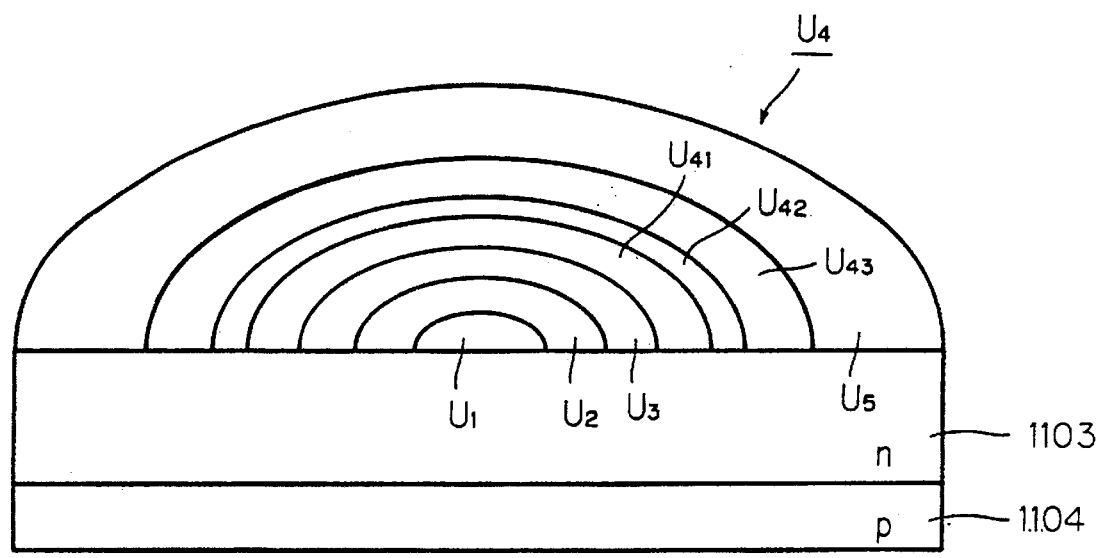

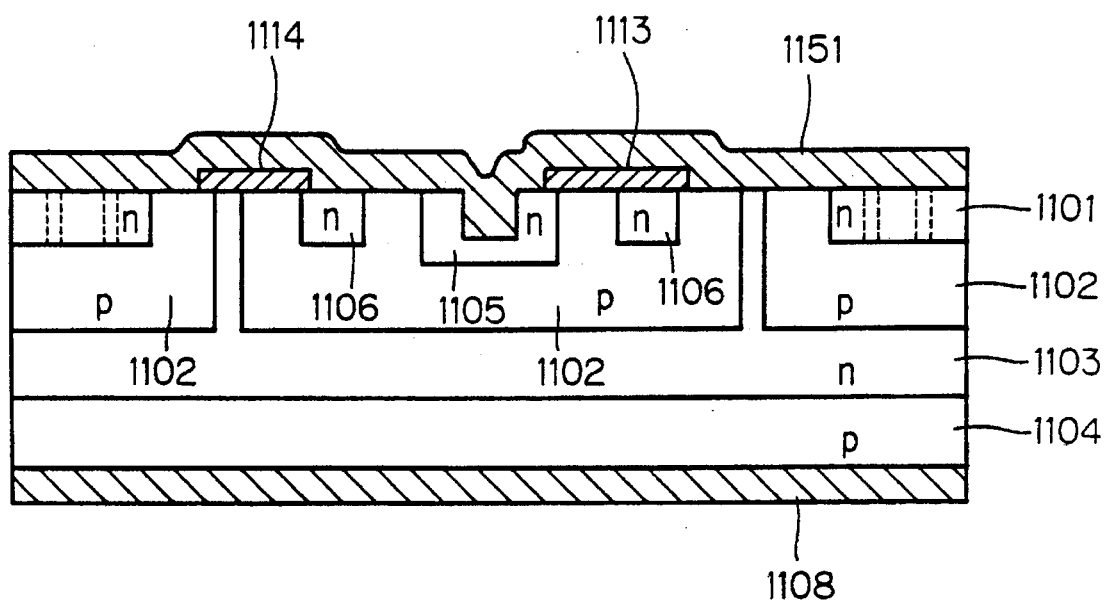
FIG·52

FIG·54

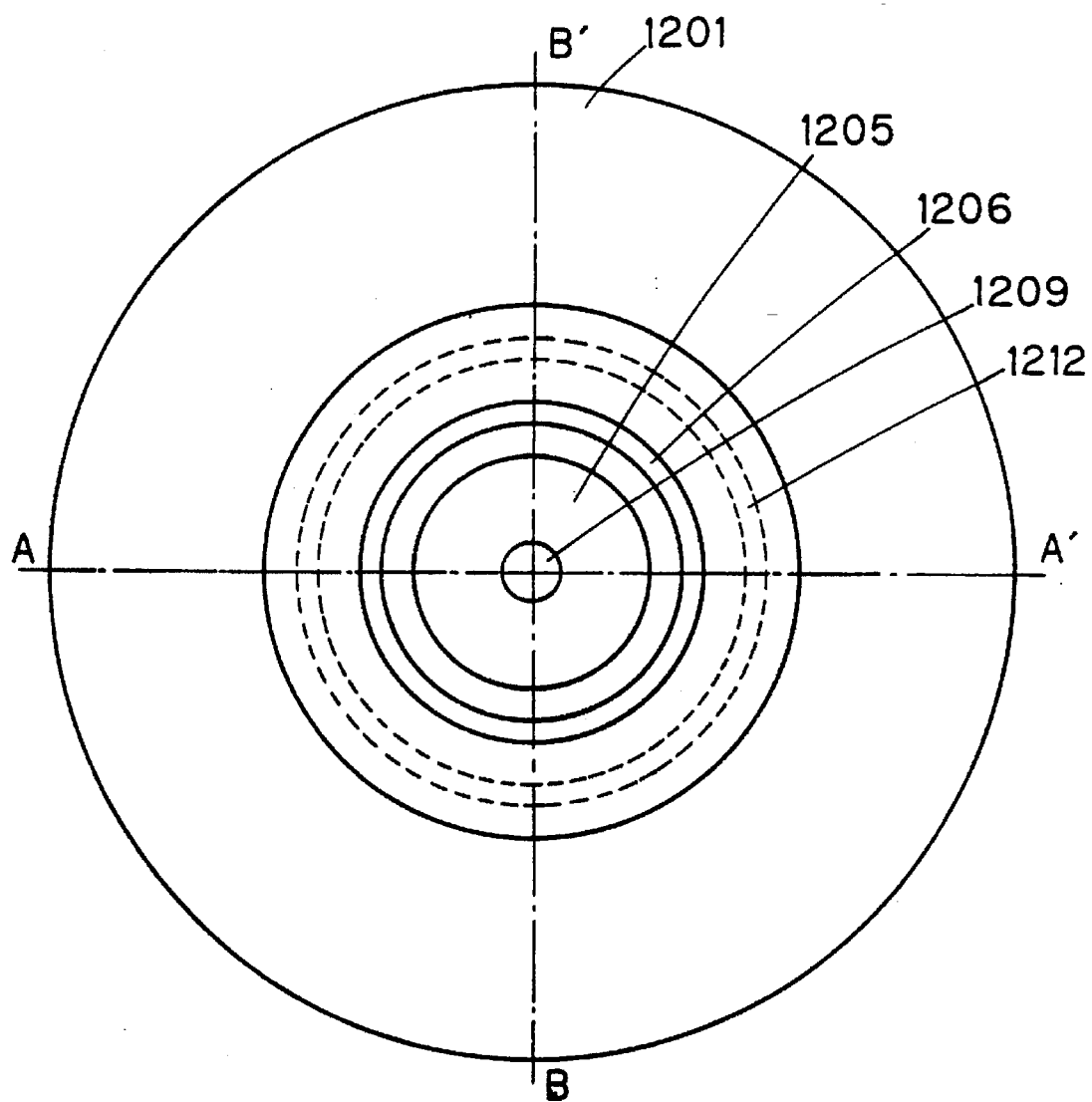
FIG·57

FIG·59
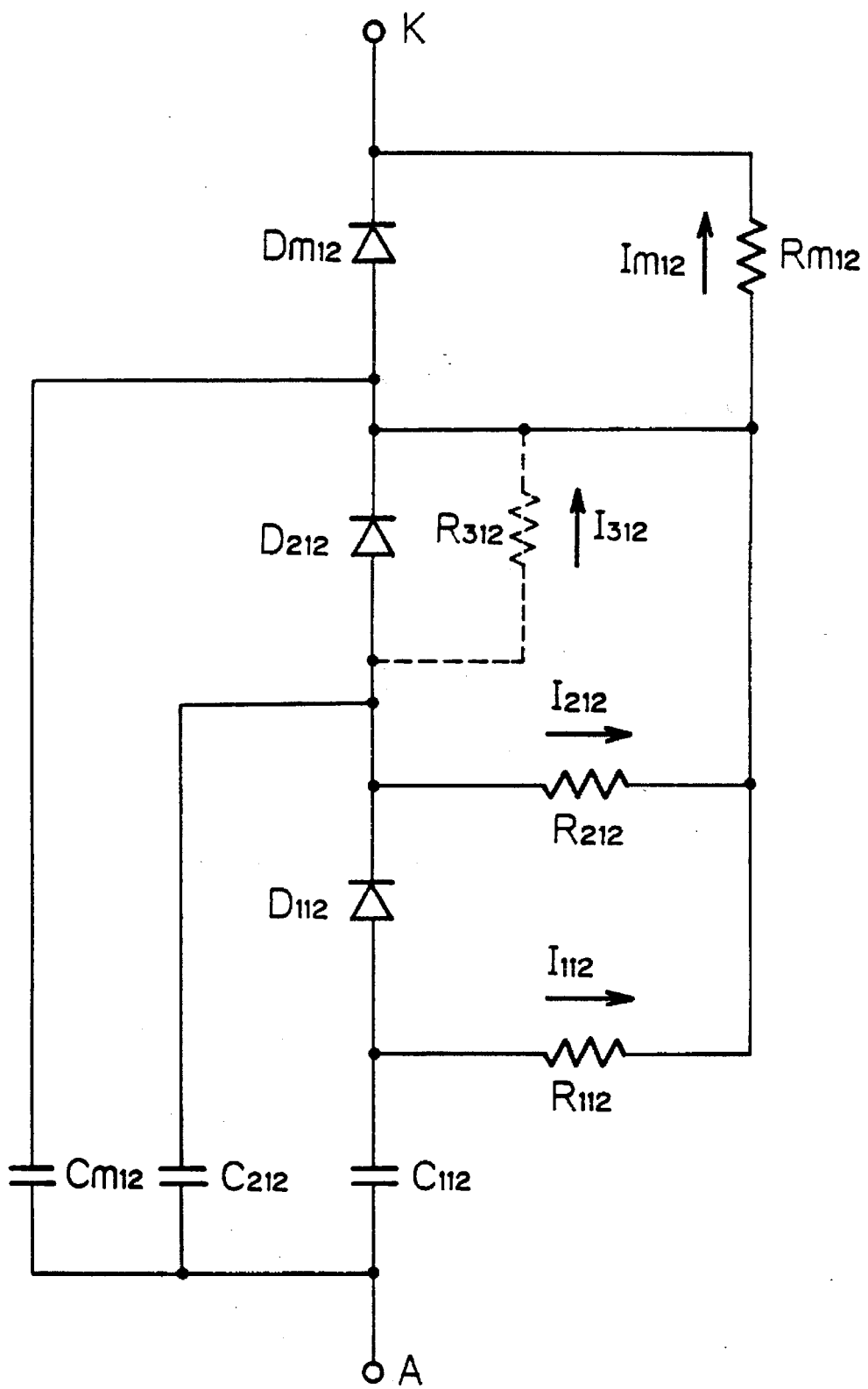

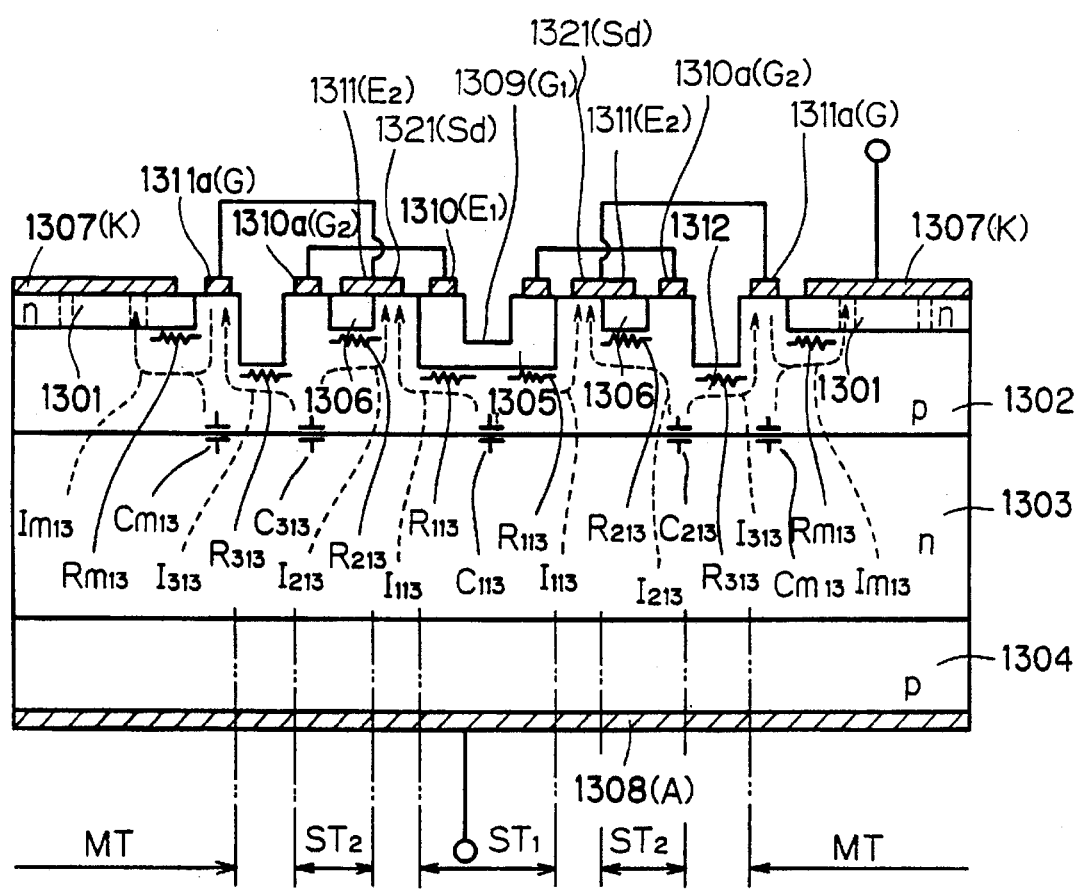
FIG·61

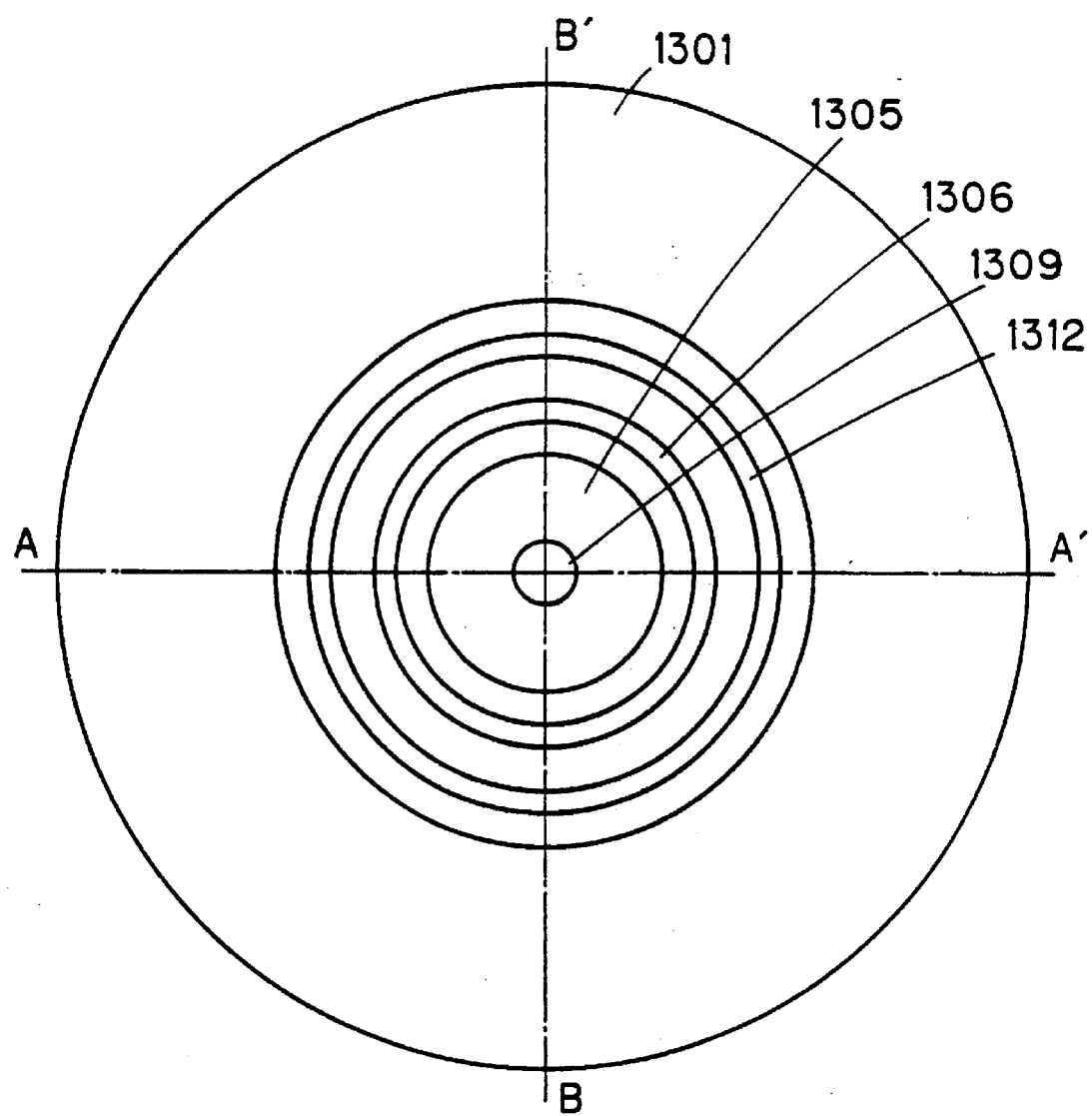
FIG·62

FIG·65
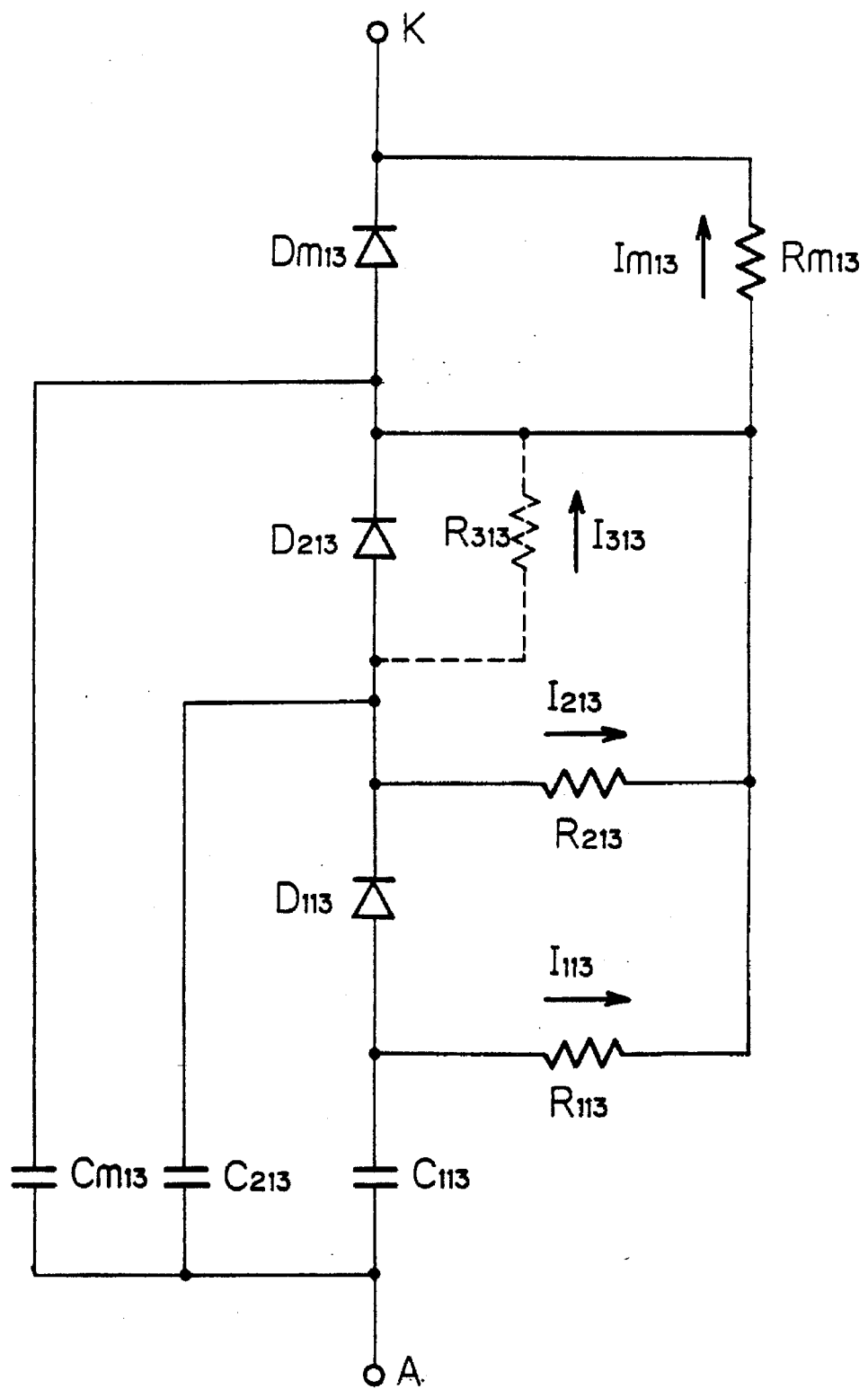

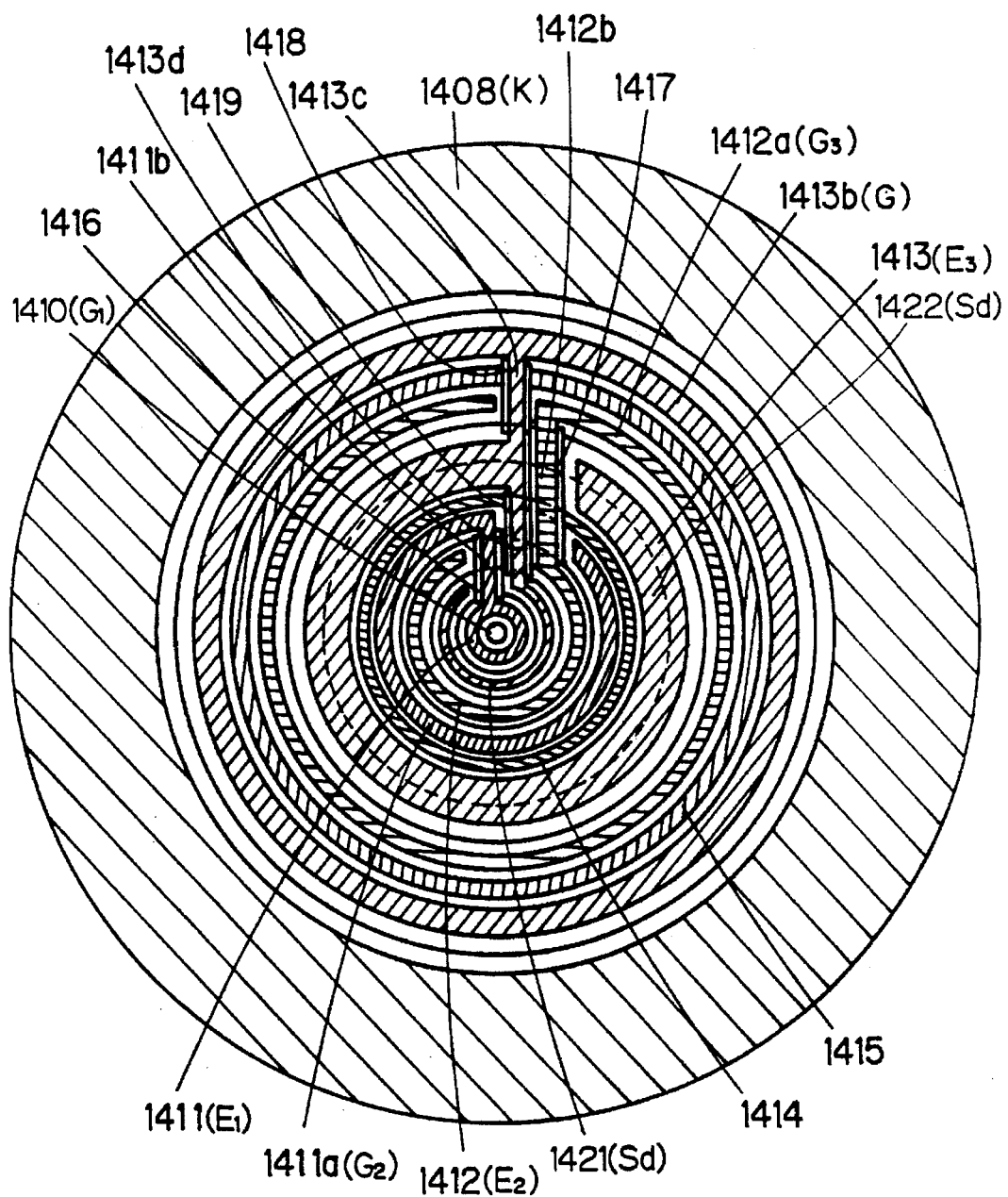
FIG·66

THYRISTOR WITH IMPROVED DV/DT RESISTANCE

BACKGROUND OF THE INVENTION

1. Field of the Invention

The present invention relates to a thyristor and a method of fabricating the same, and more particularly, it relates to a thyristor having a compensating structure for improving dv/dt resistance and a method of fabricating the same.

2. Background of the Invention

With increase in voltage and capacity of a thyristor valve which is applied to a converter such as a power converter for dc power transmission or a reactive power compensator, replacement of an existing thyristor by an optical trigger thyristor is strongly required. When an optical trigger thyristor is applied to such a converter, it is possible to improve electrical insulation between a main circuit and a control circuit and noise resistance as well as to simplify the control system, whereby the device can be advantageously miniaturized, reduced in weight and improved in reliability.

However, currently available optical trigger energy is so feeble as compared with electric trigger energy that it is necessary to increase photosensitivity of an optical trigger thyristor to several 10 times in terms of gate sensitivity of an electric trigger thyristor. When gate sensitivity is increased, however, the thyristor tends to operate in response to a rapidly rising voltage noise such as a lightening surge which is mixed from the main circuit side. An allowable voltage build-up rate causing no malfunction upon application of an excess voltage is called dv/dt resistance. When the area of a photoreceiving portion of an optical trigger thyristor is reduced for reducing a displacement current which is generated in this region, it is possible to increase the dv/dt resistance at no sacrifice of photosensitivity. In this case, however, a conduction region in an initial turn-on (ignition) stage, leading to reduction in resistance (called di/dt resistance) against a rapidly rising ON-state current which is generated in the initial turn-on stage. Thus, it is the most important technical subject to implement an optical trigger thyristor having high photosensitivity at no sacrifice of principal thyristor characteristics such as the dv/dt resistance and the di/dt resistance.

<Structure of Prior Art>

FIG. 75 is a sectional view showing a conventional optical thyristor which is disclosed in Japanese Patent Publication No. 1-36712 (1989). Referring to FIG. 75, arrangement of electrodes and the like are corrected for the purpose of illustrating the operation principle. A more correct sectional view is shown in FIG. 78 as described later. FIG. 76 is an enlarged sectional view showing a portion which is close to a cathode electrode of the optical thyristor shown in FIG. 75.

In this conventional device, four stage unit thyristors in total including first to third stage auxiliary thyristors $ST_1$ to $ST_3$ and a main thyristor MT are arranged in parallel with each other on a semiconductor substrate having four stacked semiconductor layers including a P emitter layer 2004, an N base layer 2003, a P base layer 2002 and N emitter layers (i.e., a main emitter layer 2001 and auxiliary emitter layers 2005a to 2005c). The P emitter layer 2004 and the P base layer 2002 are exposed on lower and upper major surfaces of the semiconductor substrate respectively. The auxiliary emitter layers 2005a to 2005c forming the auxiliary thyristors $ST_1$ to $ST_3$ respectively and the main emitter layer 2001 forming the main thyristor MT are selectively formed on an upper major surface portion of the P base layer 2002, to be separated from each other through the P base layer 2002.

A collector electrode 2007 (Sd) is formed to be electrically connected to an upper major surface of the P base layer 2006 which is adjacent to the main emitter layer 2001. The auxiliary thyristors $ST_1$ to $ST_3$ are formed to be enclosed with the collector electrode 2007. In the auxiliary thyristor $ST_1$, the N emitter layer 2005a is annularly provided around a photoreceiving portion 2014 ($G_1$), while an emitter electrode 2010a ($E_1$) is formed on an upper major surface of the N emitter layer 2005a to be electrically connected to the same. In the auxiliary thyristors $ST_2$ and $ST_3$, on the other hand, emitter electrodes 2010b ($E_2$) and 2010c ($E_3$) are formed on upper surfaces of the emitter layers 2005b and 2005c respectively, while gate electrodes 2011a ($G_2$) and 2011b ($G_3$) are formed on the upper surface of the P base layer 2002 to be electrically connected to the same respectively. Among these, the emitter electrode 2010c of the auxiliary thyristor $ST_3$ is integrally formed with the collector electrode 2007.

Further, the gate electrodes 2011a and 2011b of the auxiliary thyristors $ST_2$ and $ST_3$ are electrically connected to the emitter electrodes 2010a and 2010b of the precedent stage auxiliary thyristors $ST_1$ and $ST_2$ through wiring layers 2012a and 2012b of Al wires or the like respectively. Therefore, the respective stage auxiliary thyristors $ST_2$ and $ST_3$ receive turn-on currents flowing through the emitter electrodes 2010a and 2010b of the precedent stage auxiliary thyristors $ST_1$ and $ST_2$ as gate currents respectively, thereby carrying out turn-on operations. An anode electrode 2009 (A) and a cathode electrode 2008 (K) are formed on a lower major surface of the P emitter layer 2004 and an upper major surface of the main emitter layer 2001 to be electrically connected thereto respectively. The main emitter layer 2001 is provided with a number of through holes which are filled up with the P base layer 2002, i.e., short-circuiting portions 2013. The cathode electrode 2008 also covers upper major surfaces of the short-circuiting portions 2013, thereby being short-circuited not only with the main emitter layer 2001 but with the P base layer 2002.

<Operation of Prior Art>

In employment, the thyristor having the aforementioned structure is connected to an external power source (not shown), so that a positive voltage is applied across the anode electrode 2009 and the cathode electrode 2008. When an optical gate signal hv is applied to the photoreceiving portion 2014 in this state, a photoelectric current Iph is mainly generated in a depletion layer region of a central junction of the auxiliary thyristor $ST_1$. The photoelectric current Iph as generated flows into the P base layer 2002. This photoelectric current Iph transversely flows in the P base layer 2002 to pass through the collector electrode 2007 which is provided on the upper major surface of the P base layer 2002, and thereafter flows into the cathode electrode 2008 through the short-circuiting portions 2013 which are provided between the P base layer 2002 and the cathode electrode 2008. Consequently, the photoelectric current Iph causes a transverse potential difference in a region of the P base layer 2002 which is occupied by the auxiliary thyristor $ST_1$, thereby forward-biasing the N emitter layer 2005a of the auxiliary thyristor $ST_1$. When the largest potential difference of the forward-bias voltage approaches the value of a diffusion potential of the junction between the N emitter layer 2005a and the P base layer 2002, electron injection from the N emitter layer 2005a into the P base layer 2002 is abruptly increased to turn on the auxiliary thyristor $ST_1$ from the junction.

The turn-on current for the auxiliary thyristor $ST_1$ is applied to the gate electrode 2011a of the auxiliary thyristor $ST_2$ through the wiring layer 2012 as a gate current, thereby turning on the auxiliary thyristor $ST_2$. The auxiliary thyristor $ST_3$ is also turned on and the turn-on current therefor flows from the collector electrode 2007 to the cathode electrode 2008 through the short-circuiting portions 2013. At this time, the turn-on current for the auxiliary thyristor $ST_3$ functions as a gate current for the main thyristor MT.

The turn-on current for the auxiliary thyristors is successively increased in proportion to the number of the stages. Therefore, the gate current for the main thyristor MT is by far larger than the aforementioned photoelectric current Iph, for applying a sufficiently large forward bias to the main emitter layer 2001. Consequently, the main thyristor MT is turned on, whereby a main current flows from the anode electrode 2009 to the cathode electrode 2008.

Consider that a voltage noise having a large voltage change rate, i.e., a large dv/dt value, is applied across the anode electrode 2009 and the cathode electrode 2008. At this time, displacement currents $I_1$ to $I_3$ and $I_m$ corresponding to junction capacitances $C_1$ to $C_3$ and $C_m$ are generated in the respective thyristors from P-N junctions which are formed between the N base layer 2003 and the P base layer 2002. The displacement currents $I_1$ to $I_3$ which are generated in response to the junction capacitances $C_1$ to $C_3$ of the auxiliary thyristors $ST_1$ to $ST_3$ transversely flow in the P base layer 2002 toward the collector electrode 2007 respectively, accumulated in the collector electrode 2007, and thereafter flow into the cathode electrode 2008 through the short-circuiting portions 2013. As shown in FIG. 76 in an enlarged manner, a displacement current which is generated in the junction capacitance $C_m$ of the main thyristor MT joins with the displacement currents $I_1$ to $I_3$ for forming the displacement current $I_m$, which in turn flows into the cathode electrode 2008 from the short-circuiting portions 2013. Namely, the displacement currents $I_1$ to $I_3$ and $I_m$ flow through the same paths as the trigger currents such as the photoelectric current and the gate currents.

The displacement currents $I_1$ to $I_3$ cause transverse potential differences in portions of the P base layer 2002 which are located under the auxiliary emitter layers 2005a, 2005b and 2005c of the auxiliary thyristors $ST_1$ to $ST_3$ respectively. Similarly, the displacement current $I_m$ causes a transverse potential difference in a portion of the P base layer 2002 which is located under the main emitter layer 2001. Consequently, potentials of the portions of the P base layer 2002 which are along the bottom surfaces of the N emitter layers 2005a, 2005b, 2005c and 2001 are changed along the paths of the displacement currents $I_1$ to $I_3$ and $I_m$. A voltage across a portion of the P base layer 2002 having the highest potential which is located immediately under the auxiliary emitter layer 2005 and the collector electrode 2007 is provided by the product of a resistance $R_1$ of the portion of the P base layer 2002 which is along the path of the displacement current $I_1$ and the displacement current $I_1$. If the displacement current $I_2$ is not present, this voltage functions to forward-bias the P-N junction between the auxiliary emitter layer 2005a and the portion of the P base layer 2002 which is located immediately under the same, so that the auxiliary thyristor $ST_1$ is turned on when this forward bias voltage reaches the diffusion potential of the junction. Namely, the displacement current $I_1$ causes abnormal turn-on (abnormal ignition) of the auxiliary thyristor $ST_1$.

Similarly, the voltage across the portion of the P base layer 2002 having the highest potential which is located immediately under the auxiliary emitter layer 2005b and the collector electrode 2007 is provided by the product of a resistance $R_2$ of the P base layer 2002 which is along the path of the displacement current $I_2$ and the displacement current $I_2$. If the displacement current $I_3$ is not present, this voltage functions to forward-bias the P-N junction between the auxiliary emitter layer 2005b and the portion of the P base layer 2002 which is located immediately under the same, so that the auxiliary thyristor $ST_2$ is turned on when this forward bias voltage reaches the diffusion potential of the junction.

Similarly, the voltage across the portion of the P base layer 2002 having the highest potential which is located immediately under the auxiliary emitter layer 2005c and the collector electrode 2007 is provided by the product of a resistance $R_3$ of the P base layer 2002 along the path of the displacement current $I_3$ and the displacement current $I_3$. As shown in FIG. 76 in an enlarged manner, further, the voltage across the portion of the P base layer 2002 having the highest potential which is located immediately under the main emitter layer 2001 and the cathode electrode 2008 is provided by the product of a resistance $R_m$ of the P base layer 2002 along the path of the displacement current $I_m$ and the displacement current $I_m$.

FIG. 77 is a circuit diagram equivalently expressing a circuit which is related to behavior of the displacement currents $I_1$ to $I_3$ and $I_m$. Diodes $D_1$ to $D_3$ and $D_m$ express the P-N junctions between the N emitter layers 2005a, 2005b, 2005c and 2001 and the portions of the P base layer 2002 which are adjacent thereto respectively. The diodes $D_1$ to $D_3$ and $D_m$ are so expressed that the same are serially connected in this order, and this reflects the fact that the emitter electrodes of the respective stage unit thyristors are connected to the next stage gate electrodes.

As shown in this circuit diagram, the voltage provided by the product of the displacement current $I_1$ and the resistance $R_1$ is not applied as such to the diode $D_1$ as a forward bias voltage, but attenuated by the voltage provided by the product of the displacement current $I_2$ and the resistance $R_2$. Similarly, a voltage obtained by subtracting the voltage provided by the product of the displacement current $I_3$ and the resistance $R_3$ from that provided by the product of the displacement current $I_2$ and the resistance $R_2$ is applied to the diode $D_2$ as a forward voltage. Namely, this optical thyristor suppresses the initial and second stage unit thyristors $ST_1$ and $ST_2$ from abnormal ignition caused by the displacement currents, due to the action of the properly arranged collector electrode 2007.

It is also possible to substantially cancel the forward bias voltages which are applied to the diodes $D_1$ and $D_2$ by properly setting the values of the resistances $R_1$ to $R_3$. The resistances $R_1$ to $R_3$ and $R_m$ along the paths of the displacement currents $I_1$ to $I_3$ and $I_m$ substantially correspond to transverse resistances of the portions of the P base layer 2002 which are located immediately under the N emitter layers 2005a, 2005b, 2005c and 2001 respectively. Therefore, it is possible to effectively suppress abnormal ignition of the initial and second stage auxiliary thyristors $ST_1$ and $ST_2$ by properly controlling the transverse resistances in these portions of the P base layer 2002. Thus, this optical thyristor implements high dv/dt resistance.

<Structure of Electrode in Prior Art>

FIGS. 78 and 79 are a front sectional view and a plan view of the conventional device shown in FIG. 75. These figures correctly illustrate the number of stages of the auxiliary thyristors as well as arrangement and structures of the electrodes along the aforementioned gazette. Namely, this conventional device comprises six stage unit thyristors in total including five stage auxiliary thyristors $ST_1$ to $ST_5$ and a main thyristor MT, as shown in these figures. The semiconductor substrate has a stacked structure of a P emitter layer 3021, an N base layer 3022, a P base layer 3023 and N emitter layers 3024a to 3024f, and the N emitter layers 3024a to 3024f form the auxiliary thyristors $ST_1$ to $ST_5$ and the main thyristor MT respectively. Emitter electrodes 3027 to 3031 ($E_1$ to $E_5$) of the auxiliary thyristors $ST_1$ to $ST_5$ are provided on the N emitter layers 3024a to 3024e respectively, while a cathode electrode 3037 (K) is provided on the main emitter layer 3024f. An anode electrode 3038 (A) is formed on a lower major surface of the P emitter layer 3021.

Further, a collector electrode 3025 (Sd) is provided on the P base layer 3023, and the emitter electrode 3031 of the auxiliary thyristor $ST_5$ is integrally formed with the collector electrode 3025. Gate electrodes 3032 to 3035 ($G_2$ to $G_5$) of the auxiliary thyristors $ST_2$ to $ST_5$ are formed on the P base layer 3023, so that these gate electrodes 3032 to 3035 are electrically connected to the emitter electrodes of the precedent stage auxiliary thyristors through aluminum wires 3036 respectively. Further, the initial stage auxiliary thyristor $ST_1$ is provided with a photoreceiving portion 3026.

The collector electrode 3025, which also serves as a gate electrode of the main thyristor MT, is arranged to be enclosed with the cathode electrode 3037, for effectively implementing normal ignition of the main thyristor MT (see FIG. 79). Further, the auxiliary thyristors $ST_1$ to $ST_5$ are arranged inside the collector electrode 3025 to be independently enclosed with the collector electrode 3025 respectively. Thus, paths of displacement currents $I_1$ to $I_5$ (not shown) which are generated in the respective auxiliary thyristors $ST_1$ to $ST_5$ are effectively separated from each other. Since the paths of the displacement currents $I_1$ to $I_5$ are separated from each other, it is possible to attenuate forward bias voltages which are applied to the auxiliary thyristors due to the displacement currents.

While this conventional device comprises five stage auxiliary thyristors, normal ignition by an optical gate signal and behavior with respect to the displacement currents are similar to those of the aforementioned device comprising three stage auxiliary thyristors. When an optical signal is inputted, the auxiliary thyristors $ST_1$ to $ST_5$ successively ignite while amplifying a turn-on current, so that the main thyristor MT finally ignites by the amplified turn-on current. Further, the collector electrode 3025 serves to suppress the initial to fourth stage auxiliary thyristors $ST_1$ to $ST_4$ from abnormal ignition caused by the displacement currents derived from a voltage noise or the like.

Due to the aforementioned structure, however, the conventional optical thyristor has the following problems:

As shown in the circuit diagram of FIG. 77, the voltage corresponding to the product of the displacement current $I_3$ and the resistance $R_3$ is applied as such to the diode $D_3$ as a forward bias. Similarly, the voltage corresponding to the product of the displacement current $I_m$ and the resistance $R_m$ is applied as such to the diode $D_m$ as a forward bias. Namely, voltages by the displacement currents are applied as such to the P-N junctions between the auxiliary emitter layer 2005c of the final stage auxiliary thyristor $ST_3$ and the P base layer 2002 and between the main emitter layer 2001 of the main thyristor MT and the P base layer 2002 with no attenuation. This remains unchanged also when the number of stages is different. Namely, auxiliary thyristors which are suppressed from abnormal ignition caused by displacement currents are limited to that of the first stage to that which is precedent to the main thyristor by two stages, and the final auxiliary thyristor and the main thyristor are not suppressed from abnormal ignition in the conventional optical thyristor. This leads to such a problem that it is impossible to suppress abnormal ignition when only one stage auxiliary thyristor is present, i.e., when the optical thyristor is formed by only two stage unit thyristors including one stage auxiliary thyristor and a main thyristor.

As clearly understood from the circuit diagram shown in FIG. 77, further, the displacement currents $I_1$ to $I_3$ which are accumulated in the collector electrode 2007 flow to the cathode electrode (K) through the resistance $R_m$ with the displacement current $I_m$ generated in the main thyristor MT. Thus, the displacement currents generated in the auxiliary thyristors disadvantageously facilitate abnormal ignition of the main thyristor MT.

In order to suppress the main thyristor MT from such abnormal ignition, it is necessary to set the short-circuiting portions 2013 in large areas. When the areas of the short-circuiting portions 2013 are increased, however, an ON-state voltage which is required for normal ignition is increased and normal ignition is hindered, leading to reduction in di/dt resistance and increase in turn-on time. Namely, it is difficult to attain compatibility between improvement of dv/dt resistance and assurance of di/dt resistance.

In this optical thyristor, further, it is necessary to enclose all auxiliary thyristors with the collector electrode, and hence the collector electrode is increased in size and the cathode area of the main thyristor is relatively reduced in response thereto, leading to increase in ON-state voltage and reduction in surge current resistance.

In addition, the gate electrodes 3032 to 3035 of the auxiliary thyristors $ST_2$ to $ST_5$ and the emitter electrodes 3027 to 3030 of the precedent stage auxiliary thyristors $ST_1$ to $ST_4$ are electrically connected with each other through the aluminum wires in FIG. 78, and hence the gate electrodes 3032 to 3035 and the emitter electrodes 3027 to 3030 may be short-circuited or disconnected. Further, the fabrication process is complicated through the fabrication steps for wiring and connecting these electrodes with each other through the aluminum wires or the like.

SUMMARY OF THE INVENTION

A thyristor of a multistage structure according to a first aspect of the present invention comprises a plurality of stages of unit thyristors including a first stage thyristor which is ignited by an externally inputted trigger signal and a final stage thyristor which is fed with a main current while the unit thyristors are arranged in parallel with each other along a major surface of a semiconductor substrate, and the thyristor is characterized in that each unit thyristor comprises four semiconductor layers including a first emitter layer, a first base layer, a second base layer and a second emitter layer which are successively stacked on the semiconductor substrate with conductivity types alternately differing from each other, the first emitter layers are exposed on a lower major surface of the semiconductor substrate, the second base layers are exposed on an upper major surface of the semiconductor substrate, and the second emitter layers are selectively provided on upper major surface portions of the second base layers and exposed on the upper major surface, respective layers excluding the second emitter layers are continuous to each other between respective unit thyristors, the second emitter layers are separated from each other every unit thyristor through the second base layers, a first main electrode is formed on lower major surfaces of the first emitter layers, a second main electrode is formed on an upper major surface of the second emitter layer of the final stage unit thyristor, gate electrodes are formed on upper major surfaces of the second base layers of at least second and larger stage unit thyristors, emitter electrodes are formed on upper surfaces of the second emitter layers of the unit thyristors excluding the final stage one, the emitter electrodes of the unit thyristors excluding the final stage one are electrically connected with the gate electrodes of next stage unit thyristors, at least one compensation electrode which is electrically connected with the second main electrode is formed on the upper major surfaces of the second base layers, and the compensation electrode is so formed that a path for feeding a principal part of the trigger current which is inputted in one unit thyristor is separated from that for feeding a principal part of the trigger current which is inputted in the next unit thyristor.

In the thyristor according to the first aspect of the present invention, at least one compensation electrode is formed on the upper major surfaces of the second base layers and electrically connected to the second main electrode, whereby trigger currents such as the trigger currents which are generated by the gate electrodes supplied from the gate electrodes of the respective unit thyristors or the currents generated by the trigger signal which is inputted in the initial stage unit thyristor are accumulated in the compensation electrode. The displacement currents caused by voltage noises etc. are accumulated in the compensation electrode through the same paths as the trigger currents. Since the paths feeding the principal parts of the trigger currents for the adjacent ones of the unit thyristors are separated from each other, the principal parts of the displacement currents which are generated in these unit thyristors also flow through different paths. Consequently, a voltage which is brought by the displacement current generated in one stage unit thyristor for forward-biasing the junction between the second emitter layer and the second base layer of the unit thyristor is attenuated by the voltage across the gate electrode and the compensation electrode which is brought by the displacement current generated in the next unit thyristor. Namely, the unit thyristors are suppressed from abnormal ignition by the displacement currents.

Further, the compensation electrode is connected to the second main electrode dissimilarly to the collector electrode in the prior art, whereby the displacement currents which are accumulated in the compensation electrode will not act to increase the forward bias voltage in the junction between the second emitter layer and the second base layer of the final stage unit thyristor (i.e., the main thyristor). Namely, the displacement currents which are accumulated in the compensation electrode will not facilitate abnormal ignition of the main thyristor. Thus, it is not necessary to provide short-circuiting portions of excess areas in the main thyristor, whereby improvement in dv/dt resistance is implemented compatibly with assurance of di/dt resistance.

In addition, the compensation electrode is connected to the cathode electrode, whereby it is possible to separate the principal path of the displacement current which is generated in the unit thyristor precedent to the final stage (i.e., the final stage auxiliary thyristor) from that of the displacement current which is generated in the main thyristor. Thus, the voltage which is brought by the displacement current generated in the final stage auxiliary thyristor for forward-biasing the junction between the second emitter layer and the second base layer of this auxiliary thyristor is attenuated by the voltage across the gate electrode and the compensation electrode which is brought by the displacement current generated in the main thyristor. Namely, it is also possible to suppress the final stage auxiliary thyristor from abnormal ignition by the displacement current. Thus, it is possible to suppress abnormal ignition of the auxiliary thyristor also in a thyristor which is formed by two stage unit thyristors, i.e., one stage auxiliary thyristor and a main thyristor.

Preferably, the major surface of the semiconductor substrate is substantially in the form of a circle, and the unit thyristors are arranged to be rotation-symmetrical by at least twice about the center of the substantially circular major surface.

Preferably, the compensation electrode is so arranged that the principal part of the trigger current which is inputted in each unit thyristor passes through the second base layer which is located immediately under the second emitter layer of the unit thyristor.

The compensation electrode is so arranged that principal paths of the trigger currents for the respective unit thyristors pass through portions immediately under the second emitter layers of the unit thyristors, whereby the unit thyristors are not inhibited from correct ignition by the trigger currents.

Preferably, the electric resistance value of a path of a displacement current flowing across a junction capacitance between the first and second base layers of each unit thyristor and the second main electrode and the compensation electrode resulting from a voltage noise which is applied to the thyristor is so optimized that a forward voltage which is applied to a junction between the second base layer and the second emitter layer in the unit thyristor and a forward voltage which is applied to a junction between the second base layer and the second emitter layer in the next stage unit thyristor for the unit thyristor substantially cancel with each other.

Preferably, a portion receiving the trigger signal or a portion of the second base layer which is provided with the gate electrode in at least one stage unit thyristor is enclosed with the second emitter layer of the unit thyristor and separated from all compensation electrode(s) through the second emitter layer.

A portion such as the gate electrode supplied with the trigger current is enclosed with the second emitter layer with respect to at least one stage unit thyristor, while the compensation electrode is separated from the gate electrode etc. through the second emitter layer. In other words, the compensation electrode is arranged outside the second emitter layer enclosing the gate electrode etc. Therefore, the trigger current entirely passes through the portion immediately under the second emitter layer in the unit thyristor, whereby the trigger current is effectively utilized for correct ignition. Namely, correct ignition is further effectively performed.

Preferably, at least one stage is that excluding the final stage, and the second emitter layer of this stage unit thyristor is arranged to be enclosed with the second emitter layer of the final stage unit thyristor through a first partial base layer partially forming the second base layer, and the compensation electrode comprises a first partial compensation electrode which is formed on an upper major surface of the first partial base layer and integrally formed with the second main electrode.

The second emitter layer is formed to enclose the gate electrode etc. in at least one stage excluding the final stage, i.e., at least one stage auxiliary thyristor, while the compensation electrode is arranged outside the same. Further, the first partial compensation electrode which is one of the compensation electrode(s) is formed on the upper major surface of the first partial base layer which is adjacent to the outer side of the second emitter layer. Therefore, the trigger current for this auxiliary thyristor entirely passes through the portion immediately under the second emitter layer, to be collected in the first partial compensation electrode. Further, the first partial compensation electrode is integrally formed with the second main electrode, whereby it is not particularly necessary to reduce the area of the second main electrode serving as a cathode electrode, for example, for forming the first partial compensation electrode, dissimilarly to the collector electrode in the prior art. Thus, it is possible to effectively improve dv/dt resistance without increasing the ON-state voltage and reducing surge current resistance. In addition, the electrodes can be readily formed in the steps of fabricating the thyristor due to the integral formation of the first partial compensation electrode and the second main electrode, and the electrodes as formed are improved in reliability.

Preferably, the first partial compensation electrode is so annularly formed as to enclose the second emitter layer which is enclosed with the first partial base layer.

The first partial compensation electrode is so formed as to annularly enclose the second emitter layers of the auxiliary thyristors, whereby the trigger currents for the auxiliary thyristors flow in portions immediately under all portions of the second emitter layers with no deviation. Thus, correct ignition of the auxiliary thyristors caused by the trigger currents uniformly progress along the overall second emitter layers.

Preferably, the said at least one stage is that excluding the final stage, and the second emitter layer of the stage unit thyristor is arranged to be enclosed with the second emitter layer of the next stage unit thyristor through a second partial base layer partially forming the second base layer, the gate electrode of the next stage unit thyristor is formed on an upper major surface of the second partial base layer, the compensation electrode comprises a second partial compensation electrode which is formed on the upper major surface of the second partial base layer and electrically connected with the second main electrode, and a third partial compensation electrode which is formed on an upper major surface of a portion of the second base layer which is separated from the second partial base layer through the second emitter layer of the next stage unit thyristor and electrically connected with the second main electrode, and electric resistance across the next stage gate electrode and the second partial compensation electrode is set to be higher than that across the next stage gate electrode and the third partial compensation electrode.

The second partial compensation electrode is formed on the upper major surface of the second partial base layer which is adjacent to the outer side of the second emitter layer in at least one stage unit thyristor excluding the final stage one, whereby the trigger current for this unit thyristor entirely passes through the portion immediately under the second emitter layer to be collected in the second partial compensation electrode. On the other hand, relation between electrical resistance values across the gate electrode of the next stage unit thyristor and the second and third partial compensation electrodes is optimized while the second emitter layer of the next stage unit thyristor is interposed between the gate electrode and the third partial compensation electrode, whereby the trigger current for the next stage unit thyristor mainly passes through the portion immediately under the second emitter layer of the next stage unit thyristor to be collected in the third partial compensation electrode. Namely, the principal paths of the trigger currents for adjacent unit thyristors are effectively separated from each other, whereby a forward bias voltage caused by the displacement current in one stage unit thyristor is attenuated and hence this unit thyristor is suppressed from abnormal ignition caused by the displacement current. Further, both of the trigger currents for the adjacent unit thyristors pass through the portions immediately under the second emitter layers thereof, whereby the unit thyristors are not hindered from correct ignition by the trigger currents.

Preferably, the second partial base layer has an annular portion enclosing the second emitter layer of the said at least one stage unit thyristor and a projecting portion elongatedly projecting from the annular portion to the periphery, the gate electrode of the next stage unit thyristor is formed on an upper major surface of a portion of the projecting portion which is close to its forward end, and the second partial compensation electrode is formed on an upper major surface of the annular portion.

Preferably, the second emitter layer of the said at least one stage unit thyristor excluding the final stage one comprises a central portion enclosing a portion of the unit thyristor receiving the trigger signal or a portion of the second base layer which is provided with the gate electrode, and an arm portion extending from the central portion, the second partial base layer encloses the arm portion in the form of a sheath, the second partial compensation electrode is formed to partially enclose the central portion, and the gate electrode of the next stage unit thyristor is formed on an upper major surface of a forward end portion of the arm portion.

The second partial compensation electrode and the next stage gate electrode are positioned on ends of the second partial base layer annularly enclosing the arm portion of the second emitter layer of one stage unit thyristor, whereby it is possible to readily set the electrical resistance across the second stage gate electrode and the second partial compensation electrode to be higher than that across the same and the third partial compensation electrode.

Preferably, the said at least one stage is every one of the first to final stages, and a portion receiving the trigger signal or a portion of the second base layer provided with the gate electrode in each stage unit thyristor is enclosed with the second emitter layer of the unit thyristor, the second emitter layer of each unit thyristor excluding the final stage one is arranged to be enclosed with the second emitter layer of the final stage unit thyristor through a third partial base layer partially forming the second base layer, the compensation electrode comprises a fourth partial compensation electrode which is formed on an upper major surface of the third partial base layer and integrally formed with the second main electrode, the second emitter layer of the final stage unit thyristor is provided with a through hole having an end opening on the upper major surface of the second emitter layer and another end opening on a lower surface of the second emitter layer, the through hole is filled up with a fourth partial base layer partially forming the second base layer, and the compensation electrode further comprises a fifth partial compensation electrode which is formed on an upper major surface of the fourth partial base layer and integrally formed with the second main electrode.

Portions supplying the trigger currents such as the gate electrodes are enclosed with the second emitter layers in all unit thyristors, while the compensation electrode is separated from the gate electrodes etc. through the second emitter layers. Thus, correct ignition is efficiently performed in all unit thyristors. Further, the trigger currents for the respective stage unit thyristors excluding the final stage one, i.e., the respective auxiliary thyristors, are accumulated in the fourth partial compensation electrode which is formed on the upper major surface of the third partial base layer adjacent to the outer sides of the second emitter layers of the auxiliary thyristors, while the trigger current for the final stage unit thyristor, i.e., the main thyristor, is accumulated in the fifth or fourth partial compensation electrode. The component of the trigger current for the main thyristor accumulated in the fourth partial compensation electrode flows from the second emitter layer of the main thyristor which is adjacent to the outer side of the third partial base layer provided with the fourth partial compensation electrode to the fourth partial compensation electrode. Namely, the paths of the trigger currents are separated from each other between all auxiliary thyristors and the main thyristor. Therefore, the forward bias voltages are attenuated in all auxiliary thyristors, whereby dv/dt resistance is further improved. Further, both the fourth and fifth partial compensation electrodes are integrally formed with the second main electrode, whereby it is not particularly necessary to reduce the area of the second main electrode for forming these partial compensation electrodes. Thus, it is possible to attain improvement in dv/dt resistance without increasing the ON-state voltage and reducing surge current resistance. Further, integral formation of the fourth and fifth partial compensation electrodes with the second main electrode facilitates formation of the electrodes in the steps of fabricating the thyristor, and contributes to improvement in reliability of the electrodes as formed.

Preferably, the gate electrode of the final stage unit thyristor is so annularly formed as to divide the second emitter layer of the final stage unit thyristor into inner and outer sides, so that the unit thyristors excluding the final stage one are arranged inside the annular gate electrode.

The gate electrode of the final stage unit thyristor, i.e., the main thyristor, is annularly formed, whereby ignition quickly progresses along the overall main thyristor. Further, the respective stage unit thyristors excluding the final stage one, i.e., the respective auxiliary thyristors, are arranged inside the annular gate electrode of the main thyristor, whereby ignition of the thyristor quickly expands from the inner side toward the outer side. Thus, di/dt resistance is improved.

Preferably, the second emitter layer of the final stage unit thyristor has a circular outline, and the annular gate electrode is in the form of a circle which is concentric with the circular outline of the second emitter electrode with a diameter which is ⅓ to ½ the outer diameter of the circular second emitter layer.

The second emitter layer of the final stage unit thyristor, i.e., the main thyristor, has a circular outline and the gate electrode has an annular shape which is concentric with the outline of the second emitter layer, whereby ignition uniformly progresses in the main thyristor with no circumferential deviation. Further, the relation between the outline of the second emitter layer and the diameter of the gate electrode is optimized in the main thyristor, whereby ignition further quickly progresses along the overall main thyristor. Namely, di/dt resistance is further improved.

Preferably, the second emitter layer of the final stage unit thyristor is provided with a plurality of through holes having first ends opening on the upper major surface of the second emitter layer and second ends opening on a lower surface of the second emitter layer, the through holes are filled up with a fifth partial base layer partially forming the second base layer, and the compensation electrode further comprises a sixth partial compensation electrode which is formed on an upper major surface of the second partial base layer and integrally formed with the second main electrode.

The sixth partial compensation electrode is connected to the second base layer through the plurality of through holes which are provided in the second emitter layer of the final stage unit thyristor, i.e., the main thyristor. While the second emitter layer of the main thyristor generally occupies the widest area among the unit thyristors since a main current flows in the main thyristor, the main thyristor is suppressed from abnormal ignition caused by the displacement current flowing immediately under the second emitter layer due to arrangement of the sixth partial compensation electrode. Namely, improvement of dv/dt resistance is attained.

Preferably, the compensation electrode is so arranged that paths for feeding principal parts of the trigger currents which are inputted in the respective unit thyristors are separated from each other.

The principal paths of the trigger currents for all unit thyristors are separated from each other, whereby forward bias voltages caused by the displacement currents are attenuated in all stage unit thyristors excluding the final stage one, i.e., all auxiliary thyristors. Thus, all auxiliary thyristors are suppressed from abnormal ignition, whereby dv/dt resistance is further improved.

Preferably, the electric resistance value of a path of a displacement current flowing across a junction capacitance between the first and second base layers of each unit thyristor and the second main electrode and the compensation electrode resulting from a voltage noise which is applied to the thyristor is so optimized that a forward voltage which is applied to a junction between the second base layer and the second emitter layer in each unit thyristor excluding the final stage one and a forward voltage which is applied to a junction between the second base layer and the second emitter layer in the next unit thyristor for the unit thyristor substantially cancel with each other.

Preferably, the emitter electrode of one stage unit thyristor and the gate electrode of the next stage unit thyristor are connected with each other by a bridging portion of a conductor provided on an insulating film which is formed on the upper major surface of the semiconductor substrate integrally with the emitter and gate electrodes.

Electric connection between the emitter electrode of one stage unit thyristor and the gate electrode of the next stage unit thyristor is implemented by the bridging portion which is integrally formed with the same, whereby connection by wiring is unnecessary. Thus, failures such as short circuiting and disconnection are hardly caused by wiring. Namely, the thyristor is improved in reliability. Further, a connection step is not necessary in fabrication of the thyristor due to employment of the bridging portion, whereby the thyristor is easy to fabricate.

Preferably, a portion of the second base layer which is provided with the gate electrode of the next stage unit thyristor is enclosed with the second emitter layer of the next stage unit thyristor, and the width of a portion of the second emitter layer which is located immediately under the insulating film is not more than 2 mm in the narrowest portion.

An upper limit is set for the widths of the second emitter layers which are located immediately under portions covered with the insulating film in the upper poriton of the semiconductor substrate, i.e., the portions where the compensation electrode cannot be provided, whereby it is possible to prevent the second emitter layers from application of excess forward bias voltages caused by the displacement currents.

Preferably, the gate electrode of the final stage unit thyristor comprises a plurality of gate electrodes.

A plurality of gate electrodes are provided in the final stage unit thyristor, i.e., the main thyristor, whereby ignition quickly progresses along the overall main thyristor. Namely, this contributes to improvement in di/dt resistance.

Preferably, the unit thyristors which are precedent to one stage are arranged in plural so that the emitter electrodes of the plurality of precedent stage unit thyristors are electrically connected to the gate electrode of the said one stage unit thyristor.

The emitter electrodes of a plurality of precedent stage unit thyristors are electrically connected to one gate electrode of one stage unit thyristor, whereby amplification paths for turn-on currents are at least partially integrated. Even if the precedent stage unit thyristors are unequal in characteristics to each other, therefore, inequality of the amplification characteristics is reduced or eliminated every amplification path, whereby stable turn-on characteristics can be attained.

Preferably, at least three stage unit thyristors are so arranged that the numbers of the unit thyristors as arranged are successively increased from the first stage to the final stage.

The numbers of the unit thyristors from the initial stage one to that precedent to the final stage, i.e., the first to final stage auxiliary thyristors, are successively increased along the stages, whereby ignition is quickly carried out along the overall thyristor. Namely, this contributes to improvement in di/dt resistance.

Preferably, at least three stage unit thyristors are arranged, with presence of a combination of such a series of two stage unit thyristors that the number of next stage unit thyristors is larger than that of one stage unit thyristor.

Preferably, the trigger signal is an optical signal.

Ignition is started in response to an optical signal, whereby no malfunction is caused by a noise electric signal which is superposed on the trigger signal, dissimilarly to a thyristor receiving an electric signal as a trigger signal. While it is necessary to improve ignition sensitivity in order to ignite the overall thyristor by a feeble trigger current by an optical signal, further, the inventive thyristor which can improve its sensitivity without damaging dv/dt resistance is particularly suitable for a thyristor which is ignited by an optical signal, i.e., an optical thyristor.

Preferably, a photoreceiving portion receiving the optical signal is provided with an antireflection film, and the thickness of the antireflection film satisfies a relation of A−30 nm ≦ thickness of insulating film ≦ A+30 nm with respect to a value A which is expressed as follows:

$$A=(2\times n-1)\times \lambda/(4\times N)$$

where n represents a natural number, $\lambda$ represents a central wavelength of the optical signal, and N represents the refractive index of the insulating film.

The antireflection film of the photoreceiving portion is optimized in thickness. Thus, loss of the optical signal is reduced due to a small reflectance for the optical signal.

A thyristor of a multistage structure according to a second aspect of the present invention comprises at least three stage unit thyristors including a first stage thyristor which is ignited by an externally inputted trigger signal and a final stage thyristor which is fed with a main current while the unit thyristors are arranged in parallel with each other along a major surface of a semiconductor substrate, and the thyristor is characterized in that each unit thyristor comprises four semiconductor layers including a first emitter layer, a first base layer, a second base layer and a second emitter layer which are successively stacked on the semiconductor substrate with conductivity types alternately differing from each other, the first emitter layers are exposed on a lower major surface of the semiconductor substrate, the second base layers are exposed on an upper major surface of the semiconductor substrate, and the second emitter layers are selectively provided on upper major surface portions of the second base layers and exposed on the upper major surface, the respective layers excluding the second emitter layers are continuous to each other between the respective unit thyristors, the second emitter layers of the second and later stage unit thyristors are annularly formed to enclose the second emitter layers of precedent unit thyristors through portions of the second base layers which are annularly exposed on the upper major surface, an annular isolation region is provided for annularly dividing the portion of the second base layer which is adjacent to the outer side of the second emitter layer of each of the second and later stage unit thyristors into inner and outer regions and suppressing or inhibiting carrier movement between the regions, an emitter electrode of the initial stage unit thyristor is annularly formed on an upper major surface of the second emitter layer of the unit thyristor to enclose an input portion for the trigger signal, an emitter electrode of each stage unit thyristor excluding the initial and final stage ones is annularly formed along an annular upper major surface of the second emitter layer of the unit thyristor, a gate electrode of each unit thyristor excluding the initial and final stage ones is annularly formed on an upper major surface of the inner region which is adjacent to the outer side of the second emitter layer of the unit thyristor to enclose an upper major surface of the second emitter layer, a collector electrode of the second stage unit thyristor is annularly formed on an upper surface of the second base layer which is adjacent to the inner side of the second emitter layer of the unit thyristor to enclose the second emitter layer of the initial stage unit thyristor, a collector electrode of each unit thyristor excluding the initial and second stage ones is annularly formed on an upper major surface of the outer region which is adjacent to the inner side of the second emitter layer of the unit thyristor to enclose the isolation region, each of the annular emitter electrode, the gate electrode and the collector electrode of each unit thyristor excluding the initial and final stage ones has one parting portion, the emitter electrode of each unit thyristor excluding the initial and final stage ones and the gate electrode of the next stage unit thyristor are connected with each other by a bridging portion of a conductor formed on an insulating film which is formed on the upper surface of the semiconductor substrate to cross the parting portions of other electrodes which are arranged between the electrodes, the bridging portion is integrally formed with the electrodes to be connected with each other, the collector electrode of each unit thyristor excluding the initial stage one and the emitter electrode of the unit thyristor which is precedent to the final stage is connected with each other by a bridging portion of a conductor which is formed on the insulating film formed on the upper surface of the semiconductor substrate to cross the parting portions of other electrodes which are arranged between the electrodes, and the bridging portion is integrally formed with the electrodes to be connected with each other.

In the thyristor according to the second aspect of the present invention, the annular isolation region is provided between the gate electrodes of the unit thyristors from the second stage one to that precedent to the final stage and the collector electrodes of the next stage unit thyristors which are located outside the same, for suppressing or inhibiting carrier movement. Therefore, the trigger currents for the respective stages excluding the first one pass through portions under the second emitter layers of these stages to be accumulated in the collector electrodes of the stages. Further, the trigger current for the initial stage passes through a portion under the second emitter layer of the initial stage, to be accumulated in the second stage collector electrode which is located outside the same. Namely, the paths of the trigger currents for the initial stage to that precedent to the final stage are separated from each other. Therefore, forward bias voltages in the unit thyristors of the first stage to that which is younger by two stages than the final stage are attenuated. Thus, the thyristor is improved in dv/dt resistance. Further, the trigger current for each stage passes through a portion under the second emitter layer of this stage, whereby correct ignition by the trigger current is not inhibited.

Further, the emitter electrode of each stage and the next stage gate electrode, the emitter electrode of the stage precedent to the final one and the collector electrode serving as the gate electrode of the final stage, and the collector electrodes of the respective stages are connected with each other by the bridging portion which is integrally formed with these electrodes, whereby no wiring is required for connecting these electrodes with each other. Thus, no malfunctions such as short circuiting and disconnection of connecting wires are caused. Namely, the thyristor is improved in reliability. Further, the thyristor is easy to fabricate, since no step is required for connecting the emitter and gate electrodes with each other by wires.

Preferably, the isolation region is defined by the first base layer which is exposed on the upper major surface of the semiconductor substrate.

The isolation region is defined by the first base layer, whereby the same can be readily formed and it is possible to effectively suppress carrier movement.

Preferably, the thickness of the isolation region is not more than 60 μm.

The isolation region is optimized in thickness, whereby no withstand voltage deterioration is caused between the isolation region and the second base layer which is joined therewith.

Preferably, the isolation region is defined by a region of the second base layer which is smaller in depth than the upper major surface of the semiconductor substrate as compared with other portions of the second base layer.

The isolation region is formed by the region of the second base layer having a shallow depth from the upper major surface of the semiconductor substrate, whereby it is possible to readily ensure the withstand voltage with high allowance for the withstand voltage.

Preferably, the isolation region is defined by a groove which is formed in the semiconductor substrate from the upper major surface toward a deep portion.

The isolation region is defined by the groove which is formed in the upper major surface of the semiconductor substrate, whereby the depth of the second base layer from the upper major surface can be readily uniformalized. Thus, the withstand voltage can be further readily ensured.

Preferably, the thicknesses of the emitter electrodes, the gate electrodes and the collector electrodes which are connected to the bridging portion are at least about five times that of the insulating film which is located immediately under the bridging portion.

The electrodes which are connected to the bridging portion are optimized in thickness, whereby it is possible to prevent the electrodes from being broken in edge portions of the insulating film.

Preferably, the final stage consists of at least four stages, the emitter electrode of the unit thyristor which is precedent to the final stage one and the collector electrode is integrally formed through no bridging portion.

The emitter electrode of the unit thyristor which is precedent to the final stage one and the collector electrode are integrally formed without through the bridging portion, whereby the collector electrode can be readily formed in fabrication of the thyristor.

Preferably, the trigger signal is an optical signal.

Ignition is started in response to an optical signal. Therefore, no malfunction is caused by a noise electric signal which is superposed on the trigger signal, dissimilarly to a thyristor receiving an electric signal as a trigger signal. While it is necessary to improve ignition sensitivity in order to ignite the overall thyristor by a feeble trigger current by an optical signal, further, the inventive thyristor which can improve its sensitivity without damaging dv/dt resistance is particularly suitable for a thyristor which is ignited by an optical signal, i.e., an optical thyristor.

The present invention is also directed to a method of fabricating a thyristor. According to a third aspect of the present invention, a method of fabricating a thyristor having such a multistage structure that an emitter electrode of each stage unit thyristor excluding a final stage one is electrically connected to a gate electrode of a next stage unit thyristor and comprising a compensation electrode comprises (a) a step of preparing a first conductivity type semiconductor substrate having upper and lower major surfaces, (b) a step of introducing a second conductivity type impurity into the lower major surface of the semiconductor substrate thereby forming a first emitter layer which is exposed on the lower major surface, (c) a step of introducing a second conductivity type impurity into the upper major surface of the semiconductor substrate thereby forming a second conductivity type second base layer which is exposed on the upper major surface while leaving a first base layer, which is a first conductivity type layer, between the first emitter layer and the second base layer, (d) a step of selectively introducing a first conductivity type impurity into an upper major surface of the second base layer thereby selectively forming a first conductivity type second emitter layer having a depth not reaching the first base layer and being exposed on the upper major surface, (e) a step of forming a first conductor film serving as a first main electrode on the lower major surface of the semiconductor substrate, (f) a step of forming a second conductor film on the lower major surface of the semiconductor substrate, (g) a step of selectively removing the second conductor film for selectively forming a second main electrode and the emitter electrode of each stage on the upper major surface of the second emitter layer while selectively forming the gate electrode of each stage and the compensation electrode on the upper major surface of the second base layer, (h) a step of electrically connecting each emitter electrode and the next stage gate electrode with each other through a conductor, and (i) a step of electrically connecting the compensation electrode and the second main electrode with each other through a conductor.

According to a fourth aspect of the present invention, a method of fabricating a thyristor having such a multistage structure that an emitter electrode of each stage unit thyristor excluding a final stage one is electrically connected to a gate electrode of a next stage unit thyristor and comprising a compensation electrode comprises (a) a step of preparing a first conductivity type semiconductor substrate having upper and lower major surfaces, (b) a step of introducing a second conductivity type impurity into the lower major surface of the semiconductor substrate thereby forming a first emitter layer which is exposed on the lower major surface, (c) a step of introducing a second conductivity type impurity into the upper major surface of the semiconductor substrate thereby forming a second conductivity type second base layer which is exposed on the upper major surface while leaving a first base layer, which is a first conductivity type layer, between the first emitter layer and the second base layer, (d) a step of selectively introducing a first conductivity type impurity into an upper major surface of the second base layer thereby selectively forming a first conductivity type second emitter layer having a depth not reaching the first base layer and being exposed on the upper major surface, (e) a step of forming a first conductor film serving as a first main electrode on the lower major surface of the semiconductor substrate, (f) a step of selectively forming an insulating film on a portion of the upper major surface of the semiconductor substrate corresponding to a path between the emitter electrode and the gate electrode to be electrically connected with each other, (g) a step of forming a second conductor film on the upper major surface of the semiconductor substrate and the insulating film, (h) a step of selectively removing the second conductor film thereby selectively forming a second main electrode and the emitter electrode of each stage on the upper major surface of the second emitter layer, selectively forming the gate electrode of each stage and the compensation electrode on the upper major surface of the second base layer, and selectively forming a bridging portion for electrically connecting the emitter electrode of each stage and the next stage gate electrode with each other on the insulating film respectively, and (i) a step of electrically connecting the compensation electrode and the second main electrode with each other through a conductor.

According to a fifth aspect of the present invention, a method of fabricating a thyristor having at least three stage unit thyristors including an initial stage one which is ignited by an externally inputted trigger signal and a final stage one which is fed with a main current and comprising a collector electrode comprises (a) a step of preparing a first conductivity type semiconductor substrate having upper and lower major surfaces, (b) a step of introducing a second conductivity type impurity into the lower major surface of the semiconductor substrate, thereby converting the semiconductor substrate into a structure having a first conductivity type first base layer which is exposed on the upper major surface, and a first emitter layer which is exposed on the lower major surface, (c) a step of defining a first region to a fifth or larger odd region on the upper major surface of the semiconductor substrate so that all regions excluding the first and second ones are annular and each region is adjacent to the outer side of the region which is precedent thereto while enclosing the region which is precedent thereto, (d) a step of defining annular inner, intermediate and outer regions dividing each of even regions excluding second and fourth regions into three from the inner periphery toward the outer periphery, (e) a step of selectively introducing a second conductivity type impurity into an upper major surface of the first base layer thereby forming a second conductivity type second base layer which is exposed on the upper major surface excluding the intermediate region in the first base layer, (f) a step of selectively introducing a first conductivity type impurity into an upper major surface of the second base layer, thereby forming a first conductivity type second emitter layer which is exposed on each odd region in the second base layer, (g) a step of defining a path connecting the outer region of each even region excluding the second and fourth regions and each odd region which is younger by 3 than the even region on the upper major surface of the semiconductor substrate and forming an insulating layer on the path, (h) a step of defining a path connecting the inner region of every even region excluding the second and fourth regions and the second region with each other on the upper major surface of the semiconductor substrate and forming an insulating layer on the path, (i) a step of forming a first conductor layer on a lower major surface of the first emitter layer, (j) a step of forming a second conductor layer on the upper major surface of the semiconductor substrate and on the insulating layer, and (k) a step of selectively removing the second conductor layer thereby forming an annular electrode which is parted in one portion by the insulating layer on each of the inner and outer regions of the second region, the odd regions excluding the first, third and final regions and the fourth region to the region which is younger by 3 than the final region and the inner region of the region which is precedent to the final region while forming an annular electrode on each of the outer regions of the first region, the final region and the region which is precedent to the final region and further forming a bridging portion of a conductor integrally connecting the electrodes which are formed on the regions interconnected with each other by the path on the insulating layer.

Preferably, the method further comprises (l) a step of introducing a second conductivity type impurity into the intermediate region in advance of the step (g), thereby forming a second conductivity type semiconductor layer which is exposed on the intermediate region, and the second conductivity type semiconductor layer is shallower than the second emitter layer.

According to a sixth aspect of the present invention, a method of fabricating a thyristor having at least three stage unit thyristors including an initial stage one which is ignited by an externally inputted trigger signal and a final stage one which is fed with a main current and comprising a collector electrode comprises (a) a step of preparing a first conductivity type semiconductor substrate having upper and lower major surfaces, (b) a step of introducing a second conductivity type impurity into the lower major surface of the semiconductor substrate, thereby converting the semiconductor substrate into a structure having a second conductivity type first emitter layer which is exposed on the lower major surface, a first conductivity type first base layer which is formed on the first emitter layer, and a second conductivity type second base layer which is formed on the first base layer and exposed on the upper major surface, (c) a step of defining a first region to a fifth or larger odd region on the upper major surface of the semiconductor substrate so that all regions excluding the first and second ones are annular and each region is adjacent to the outer side of the region which is precedent thereto while enclosing the region which is precedent thereto, (d) a step of defining annular inner, intermediate and outer regions dividing each of even regions excluding second and fourth regions into three from the inner periphery toward the outer periphery, (e) a step of selectively introducing a first conductivity type impurity into an upper major surface of the second base layer thereby forming a first conductivity type second emitter layer which is exposed on the odd region in the second base layer, (f) a step of forming a groove which is shallower than the first base layer along the intermediate region, (g) a step of defining a path connecting the outer region of each even region excluding the second and fourth regions and each odd region which is younger by 3 than the even region on the upper major surface of the semiconductor substrate and forming an insulating layer on the path, (h) a step of defining a path connecting the inner region of every even region excluding the second and fourth regions and the second region with each other on the upper major surface of the semiconductor substrate and forming an insulating layer on the path, (i) a step of forming a first conductor layer on a lower major surface of the first emitter layer, (j) a step of forming a second conductor layer on the upper major surface of the semiconductor substrate and on the insulating layer, and (k) a step of selectively removing the second conductor layer thereby forming an annular electrode which is parted in one portion by the insulating layer on each of the inner and outer regions of the second region, the odd regions excluding the first, third and final regions and the fourth region to the region which is younger by 3 than the final region and the inner region of the region which is precedent to the final region while forming an annular electrode on each of the outer regions of the first region, the final region and the region which is precedent to the final region and further forming a bridging portion of a conductor integrally connecting the electrodes which are formed on the regions interconnected with each other by the path on the insulating layer.

The method of fabricating a thyristor according to each of the third to sixth aspects of the present invention, is suitable for efficiently fabricating the inventive thyristor.

Accordingly, an object of the present invention is to obtain a thyristor which is improved in dv/dt resistance by suppression of abnormal ignition of a final stage auxiliary thyristor and a main thyristor with compatible assurance of di/dt resistance, suppressed in increase of an ON-state voltage, and excellent in surge current resistance and reliability through simple fabrication steps, and a method which is suitable for fabricating the thyristor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A and 7B illustrate a step of fabricating the optical thyristor according to the first embodiment of the present invention;

FIGS. 8A and 8B illustrate a step of fabricating the optical thyristor according to the first embodiment of the present invention;

FIGS. 48A and 48B illustrate steps of fabricating the optical thyristor according to the eleventh embodiment of the present invention;

FIG. 49 illustrates a step of fabricating the optical thyristor according to the eleventh embodiment of the present invention;

FIG. 52 illustrates a step of fabricating the optical thyristor according to the eleventh embodiment of the present invention;

FIG. 57 is a plan view showing the optical thyristor according to the twelfth embodiment of the present invention in a state before formation of electrodes;

FIG. 59 is an equivalent circuit diagram of the optical thyristor according to the twelfth embodiment of the present invention;

FIG. 61 is a sectional view showing the optical thyristor according to the thirteenth embodiment of the present invention;

FIG. 62 is a plan view showing the optical thyristor according to the thirteenth embodiment of the present invention in a state before formation of electrodes;

FIG. 65 is an equivalent circuit diagram of the optical thyristor according to the thirteenth embodiment of the present invention;

FIG. 66 is a plan view showing an optical thyristor according to a fourteenth embodiment of the present invention;

DESCRIPTION OF THE PREFERRED EMBODIMENTS

<Principle of Embodiments>

Figure 1A:
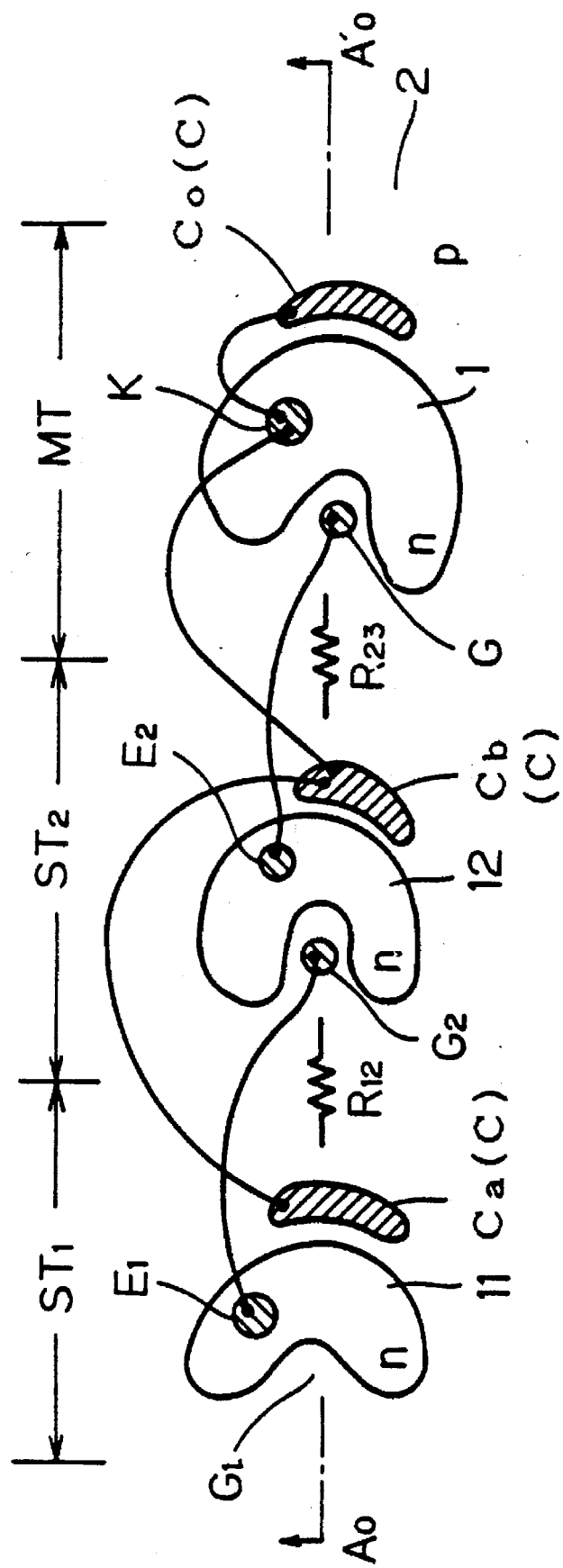
FIGS. 1A and 1B show the structure of a thyristor for illustrating the principle of the present invention.
Figure 1B:
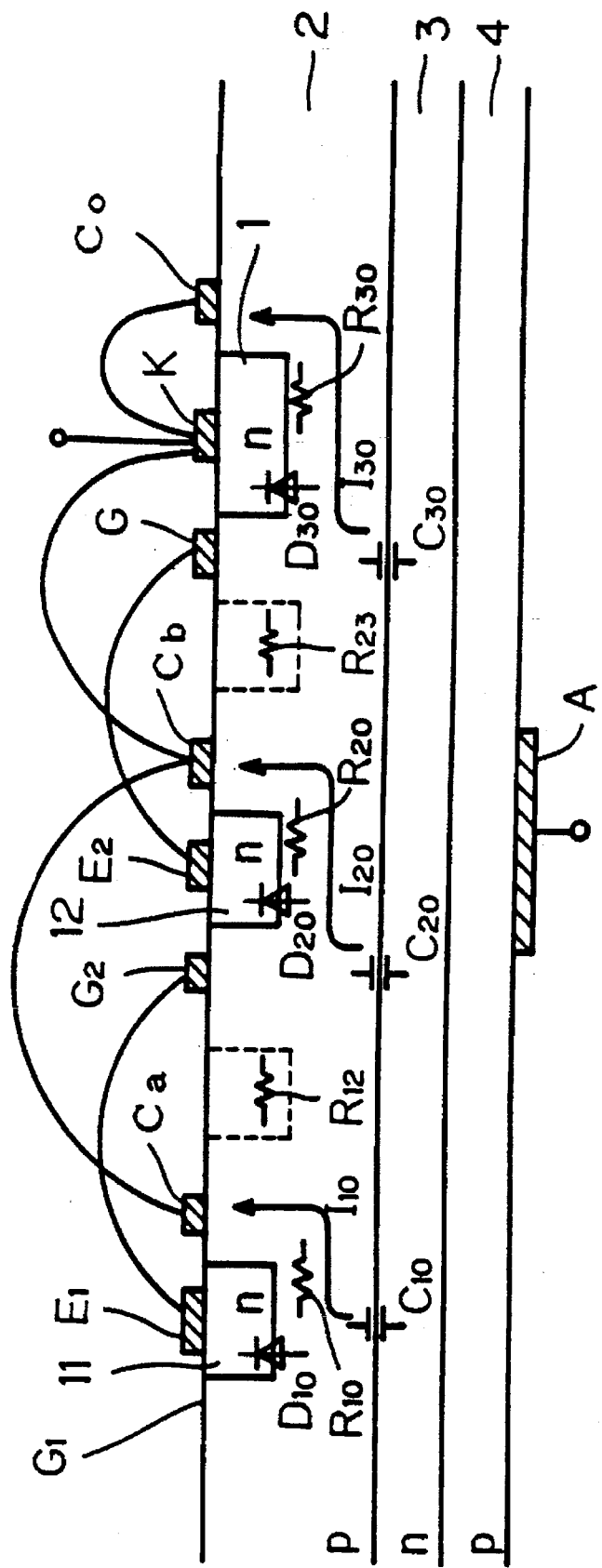

In advance of explanation of respective embodiments of the present invention, the principle which is applied to first to tenth embodiments in particular is now described. FIGS. 1A and 1B illustrate a thyristor according to each of these embodiments in a modelled manner. FIG. 1A is a plan view showing this thyristor, and FIG. 1B is a front sectional view taken along the line $A_0$–$A_0'$ in FIG. 1A. In this thyristor, three stage unit thyristors including an initial stage auxiliary thyristor $ST_1$, a second stage auxiliary thyristor $ST_2$ and a main thyristor MT are arranged on a single semiconductor substrate in parallel with each other. Four types of semiconductor layers including a P-type P emitter layer (first emitter layer) 4, an N-type N base layer (first base layer) 3, a P-type P base layer (second base layer) 2 and N-type N emitter layers (second emitter layers) 1, 11 and 12 are stackedly formed in this order on the semiconductor substrate having a pair of major surfaces. The N emitter layers 1, 11 and 12 are selectively formed on an upper surface of the P base layer 2. The respective layers excluding the N emitter layers 1, 11 and 12 are continuous with each other between the respective unit thyristors. On the other hand, the N emitter layers 1, 11 and 12 forming the unit thyristors $ST_1$, $ST_2$ and MT respectively are separated from each other through the P base layer 2.

An anode electrode (first main electrode) A is formed on the P emitter layer 4 which is exposed on the lower major surface of the semiconductor substrate. On the other hand, emitter electrodes $E_1$ and $E_2$ and a cathode electrode (second main electrode) K are formed on upper major surfaces of the N emitter layers 1, 11 and 12 respectively. Further, gate electrodes $G_2$ and G are formed on the upper major surface of the P base layer 2 preferably in proximity to the N emitter layers 11 and 12, to be electrically connected with the precedent stage emitter electrodes $E_1$ and $E_2$ respectively.

Further, compensation electrodes C (Ca, Cb and C0) are formed on three portions of the upper major surface of the P base layer 2, preferably in proximity to the emitter layers 11, 12 and 1 respectively. These compensation electrodes C are electrically connected with each other as well as with the cathode electrode K. The compensation electrode Ca which is in proximity to the initial stage auxiliary thyristor $ST_1$ is preferably so formed as to be opposed to a gate signal input part $G_1$, which is a portion receiving a gate signal in the auxiliary thyristor $ST_1$, through the N emitter layer 11. Similarly, the compensation electrodes Cb and C0 which are in proximity to the unit thyristors $ST_2$ and MT are preferably formed to be opposed to the gate electrodes $G_2$ and G through the N emitter layers 12 and 1 respectively.

<Ordinary Operation of Thyristor Shown in FIGS. 1A and 1B>

The thyristor having the aforementioned structure operates as follows: When a positive voltage is applied across the anode electrode A and the cathode electrode K through connection with an external power source (not shown) and a trigger current is supplied to the trigger signal input part $G_1$ of the auxiliary thyristor $ST_1$, this trigger current passes through a portion of the P base layer 2 located under the N emitter layer 11 and flows into the compensation electrode Ca which is in proximity to the N emitter layer 11. The trigger current flowing into the compensation electrode Ca further flows toward the external power source through the cathode electrode K. A potential difference is caused in the path of the trigger current flowing from the trigger signal input part $G_1$ to the compensation electrode Ca, by a resistance $R_{10}$ along this path. The N emitter layer 11 is forward-biased by this potential difference. When the highest voltage of this forward bias voltage approaches the value of a diffusion potential which is specific to the junction between the N emitter layer 11 and the P base layer 2, electron injection from the N emitter layer 11 to the P base layer 2 is abruptly increased, whereby the auxiliary thyristor $ST_1$ is turned on from the junction.

The turn-on current for the auxiliary thyristor $ST_1$ is applied to the gate electrode $G_2$ of the auxiliary thyristor $ST_2$ through a connecting wire as a trigger current. The trigger current as applied passes through a portion of the P base layer 12 located under the N emitter layer 12 and flows into the compensation electrode Cb which is in proximity to the N emitter layer 12. A potential difference is caused in a path of the trigger current flowing from the gate electrode $G_2$ to the compensation electrode Cb by a resistance $R_{20}$ along the path. This potential difference forward-biases the N emitter layer 12, whereby the auxiliary thyristor $ST_2$ is turned on. This turn-on current is further applied to the gate electrode G of the main thyristor MT as a trigger current through a connecting wire. The trigger current as applied passes through a portion of the P base layer 2 located under the N emitter layer 1 and flows into the compensation electrode C which is in proximity to the N emitter layer 1. A potential difference is caused in a path of the trigger current flowing from the gate electrode G to the compensation electrode C by a resistance $R_{30}$ along this path.

The turn-on currents for the auxiliary thyristors $ST_1$ and $ST_2$ are successively amplified along the stages. Therefore, the trigger current for the main thyristor MT is by far larger than that supplied to the initial stage auxiliary thyristor $ST_1$, and applies a sufficiently large forward bias to the N emitter layer 1. Consequently, the main thyristor MT is turned on. Thus, a main current flows from the anode electrode A to the cathode electrode K.

A resistance $R_{12}$ of a path between the gate electrode $G_2$ and the compensation electrode Ca which is in proximity to the auxiliary thyristor $ST_1$ is set at a larger value as compared with the resistance $R_{20}$. Therefore, the trigger current which is supplied from the gate electrode $G_2$ preferentially flows through the path having the resistance $R_{20}$ as compared with that having the resistance $R_{12}$. Similarly, a resistance $R_{23}$ of a path between the gate electrode G and the compensation electrode Cb which is in proximity to the auxiliary thyristor $ST_2$ is set at a larger value as compared with the resistance $R_{30}$. Therefore, the trigger current which is supplied from the gate electrode G preferentially flows through the path having the resistance $R_{30}$ as compared with that having the resistance $R_{23}$. Thus, the auxiliary thyristor $ST_2$ and the main thyristor MT are turned on in excellent sensitivity.

Since the gate electrodes $G_1$, $G_2$ and G are arranged as shown in FIGS. 1A and 1B, the trigger currents which are supplied to the unit thyristors $ST_1$, $ST_2$ and MT flow through the resistance $R_{10}$, $R_{20}$ and $R_{30}$ independently of each other. In other words, the paths of the respective trigger currents are separated from each other. This serves an essential function in attenuation of influences exerted by displacement currents as described later.

<Characteristic Operation of Thyristor shown in FIGS. 1A and 1B>

Consider that a voltage noise having a large voltage change rate, i.e., a large dv/dt value, is applied across the anode electrode A and the cathode electrode K in the thyristor having the aforementioned structure. At this time, displacement currents $I_{10}$ to $I_{30}$ which are responsive to junction capacitances $C_{10}$ to $C_{30}$ are generated from P-N junctions formed between the N base layer 3 and the P base layer 2 in the thyristor. The displacement currents $I_{10}$ to $I_{30}$ which are generated in the junction capacitances $C_{10}$ to $C_{30}$ of the unit thyristors $ST_1$, $ST_2$ and MT flow into the compensation electrodes C through the P base layer 2, and further flow to the external power source through the cathode electrode K. Namely, the displacement currents $I_{10}$ to $I_{30}$ flow through the same paths as the aforementioned trigger currents.

A voltage which is provided by the product of the resistance $R_{10}$ and the displacement current $I_{10}$ is generated in the path feeding the displacement current $I_{10}$. If the displacement current $I_{20}$ is not generated in the next stage unit thyristor $ST_2$, this voltage acts to forward-bias the P-N junction between the N emitter layer 11 and the portion of the P base layer 2 located immediately under the same, so that the auxiliary thyristor $ST_1$ is turned on when this forward bias voltage reaches the diffusion potential of the junction. Namely, the auxiliary thyristor $ST_1$ is abnormally turned on (abnormally ignited) by the displacement current $I_{10}$.

Similarly, a voltage which is provided by the product of the resistance $R_{20}$ and the displacement current $I_{20}$ is generated in the path feeding the displacement current $I_{20}$. If the displacement current $I_{30}$ is not generated in the final unit thyristor MT, this voltage acts to forward-bias the P-N junction between the N emitter layer 12 and the portion of the P base layer 2 located immediately under the same.

Further, a voltage which is provided by the product of the resistance $R_{30}$ and the displacement current $I_{30}$ is generated in the path feeding the displacement current $I_{30}$, and this current acts to forward-bias the P-N junction between the N emitter layer 1 and the portion of the P base layer 2 located immediately under the same as such.

Figure 2:
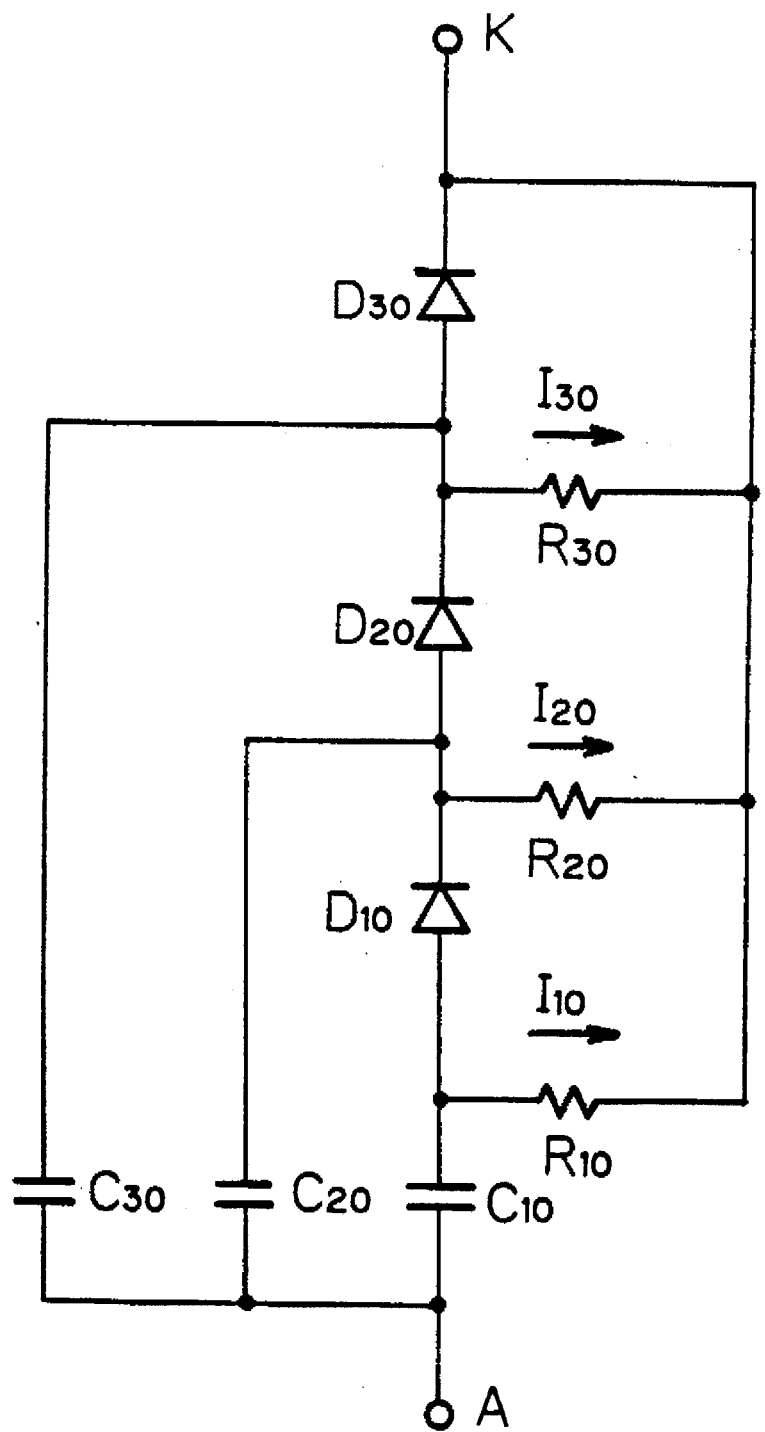
FIG. 2 is an equivalent circuit diagram of the thyristor shown in FIGS. 1A and 1B.

FIG. 2 is a circuit diagram showing a circuit which is related to the behavior of the displacement currents $I_{10}$ to $I_{30}$. Diodes $D_{10}$ to $D_{30}$ express P-N junctions between the N emitter layers 11, 12 and 1 and the portions of the P base layer 2 which are adjacent thereto. Since the emitter electrodes of the respective stage unit thyristors are connected to the next stage gate electrodes, it is possible to express the diodes $D_{10}$ to $D_{30}$ as being serially connected with each other in this order.

As understood from the circuit diagram of FIG. 2, the voltage which is provided by the product of the displacement current $I_{10}$ and the resistance $R_{10}$ is not applied as such to the diode $D_{10}$ as a forward bias voltage, but the same is attenuated by the voltage which is provided by the product of the displacement current $I_{20}$ and the resistance $R_{20}$. Similarly, a voltage obtained by subtracting that provided by the product of the displacement current $I_{30}$ and the resistance $R_{30}$ from that provided by the product of the displacement current $I_{20}$ and the resistance $R_{20}$ is applied to the diode $D_{20}$ as a forward voltage. Namely, the initial and second stage unit thyristors $ST_1$ and $ST_2$ are suppressed from abnormal ignition caused by the displacement currents, due to the action of the properly arranged compensation electrodes C in this optical thyristor. Thus, this thyristor can implement high dv/dt resistance. This also applies to a thyristor having a different number of unit thyristors. Namely, forward bias voltages in N emitter layers of all auxiliary thyristors are attenuated so that all auxiliary thyristors are suppressed from abnormal ignition.

Further, it is also possible to substantially cancel the forward bias voltages which are applied to the diodes $D_{10}$ and $D_{20}$ by properly setting the values of the resistances $R_{10}$ to $R_{30}$. The resistances $R_{10}$ to $R_{30}$ along the paths of the displacement currents $I_{10}$ to $I_{30}$ substantially correspond to values of transverse resistances of the P base layer 2 in the positions located immediately under the N emitter layers 11, 12 and 1 respectively. Therefore, it is possible to effectively suppress the initial and second stage auxiliary thyristors $ST_1$ and $ST_2$ from abnormal ignition by properly controlling the values of the transverse resistances of the P base layer 2 in these portions.

The forward bias voltages which are applied to the diodes $D_{10}$ to $D_{30}$ are attenuated since the paths feeding the displacement currents $I_{10}$ to $I_{30}$ are independently of each other, as shown in the circuit diagram of FIG. 2. When the displacement currents $I_{10}$ to $I_{30}$ flow through a common resistance, the effect of attenuating the forward bias voltages is eliminated or weakened. In other words, the separation of the paths of the displacement currents $I_{10}$ to $I_{30}$, i.e., the paths of the trigger currents for the respective unit thyristors, has an important function in suppression of abnormal ignition of the unit thyristors. While it is difficult in practice to separate the paths feeding all portions of the displacement currents $I_{10}$ to $I_{30}$, the effect of attenuating the forward bias voltages sufficiently appears so far as the paths feeding principal parts of the displacement currents $I_{10}$ to $I_{30}$ are separated from each other. In other words, the paths of the principal parts of the trigger currents for the unit thyristors may simply be separated from each other.

It is possible to sufficiently suppress abnormal ignition of one stage unit thyristor by separating the path (path of a trigger current) of a displacement current which is generated in this unit thyristor from that (path of a trigger current) of a displacement current which is generated in the next stage unit thyristor. When the path (path of the trigger current for the auxiliary thyristor $ST_1$) of the displacement current $I_{10}$ is separated from only the path (path of the trigger current for the auxiliary thyristor $ST_2$) of the displacement current $I_{20}$, at least the auxiliary thyristor $ST_1$ is suppressed from abnormal ignition. This example is described later with reference to eighth and ninth embodiments.

In this thyristor, the compensation electrodes C are connected to the cathode electrode K dissimilarly to the collector electrode in the prior art, whereby the displacement currents $I_{10}$ and $I_{20}$ of the auxiliary thyristors $ST_{10}$ and $ST_{20}$ which are accumulated in the compensation electrodes Ca and Cb will not act on the junction s between the N emitter layer 1 of the main thyristor MT and the P base layer 2 to increase the forward bias voltage. Namely, the displacement currents $I_{10}$ and $I_{20}$ of the auxiliary thyristors $ST_{10}$ and $ST_{20}$ accumulated in the compensation electrodes Ca and Cb will not facilitate abnormal ignition of the main thyristor MT. In this thyristor, therefore, it is not necessary to provide short-circuiting portions of excess areas in the main thyristor MT, whereby improvement of dv/dt resistance and assurance of di/dt resistance are compatibly implemented.

Since the compensation electrodes C are connected to the cathode electrode K, further, it is possible to separate the path of the displacement current $I_{20}$ of the auxiliary thyristor $ST_{20}$ (final stage auxiliary thyristor in general) from that of the displacement current $I_{30}$ of the main thyristor MT, as shown in FIGS. 1A and 1B. Thus, it is also possible to suppress abnormal ignition of the final stage auxiliary thyristor $ST_{20}$. Also in a thyristor which is formed by two stage unit thyristors including one stage auxiliary thyristor and a main thyristor, therefore, it is possible to suppress abnormal ignition of the auxiliary thyristor (illustrated in first to fourth embodiments).

In the thyristor shown in FIGS. 1A and 1B, the compensation electrodes C are so arranged that the paths of the trigger currents for the unit thyristors $ST_{10}$, $ST_{20}$ and MT pass through the portions located immediately under the N emitter layers 11, 12 and 1 as hereinabove described, whereby the unit thyristors $ST_{10}$, $ST_{20}$ and MT are not inhibited from correct ignition by the trigger currents. If the voltages generated in the paths of the trigger currents are sufficiently high to ignite the unit thyristors $ST_{10}$, $ST_{20}$ and MT, i.e., if the resistances $R_{10}$ to $R_{30}$ along the paths are sufficiently high, however, normal ignition is not inhibited either. In other words, it is not requisite to provide such a structure that the trigger currents pass through the portions located immediately under the N emitter layers 11, 12 and 1 in order to implement normal ignition of the unit thyristors $ST_{10}$, $ST_{20}$ and MT. However, there is such an advantage that normal ignition is readily guaranteed through this structure.

The structure of annularly enclosing the portions such as the gate electrodes which are supplied with the trigger currents with the N emitter layer while arranging the compensation electrodes C outside the same is particularly effective for guaranteeing normal ignition, since the trigger currents which are supplied from the gate electrodes necessarily pass through the portions located immediately under the N emitter layer. In the embodiments described later, a number of exemplary unit thyristors employing this structure are adopted.

In order to improve the resistances $R_{12}$ and $R_{23}$ across the paths of the displacement currents $I_{10}$ to $I_{30}$, it is effective to employ a structure of increasing the portions of the P base layer 2 interposed between the paths in thickness, i.e., a structure of increasing the distances between the paths, a structure of selectively providing an N emitter layer such as the N emitter layer 1 of the main thyristor MT, for example, between the paths, or a structure of providing grooves between the paths.

<First Embodiment>
<1-1. Structure of the Device>

Figure 3:
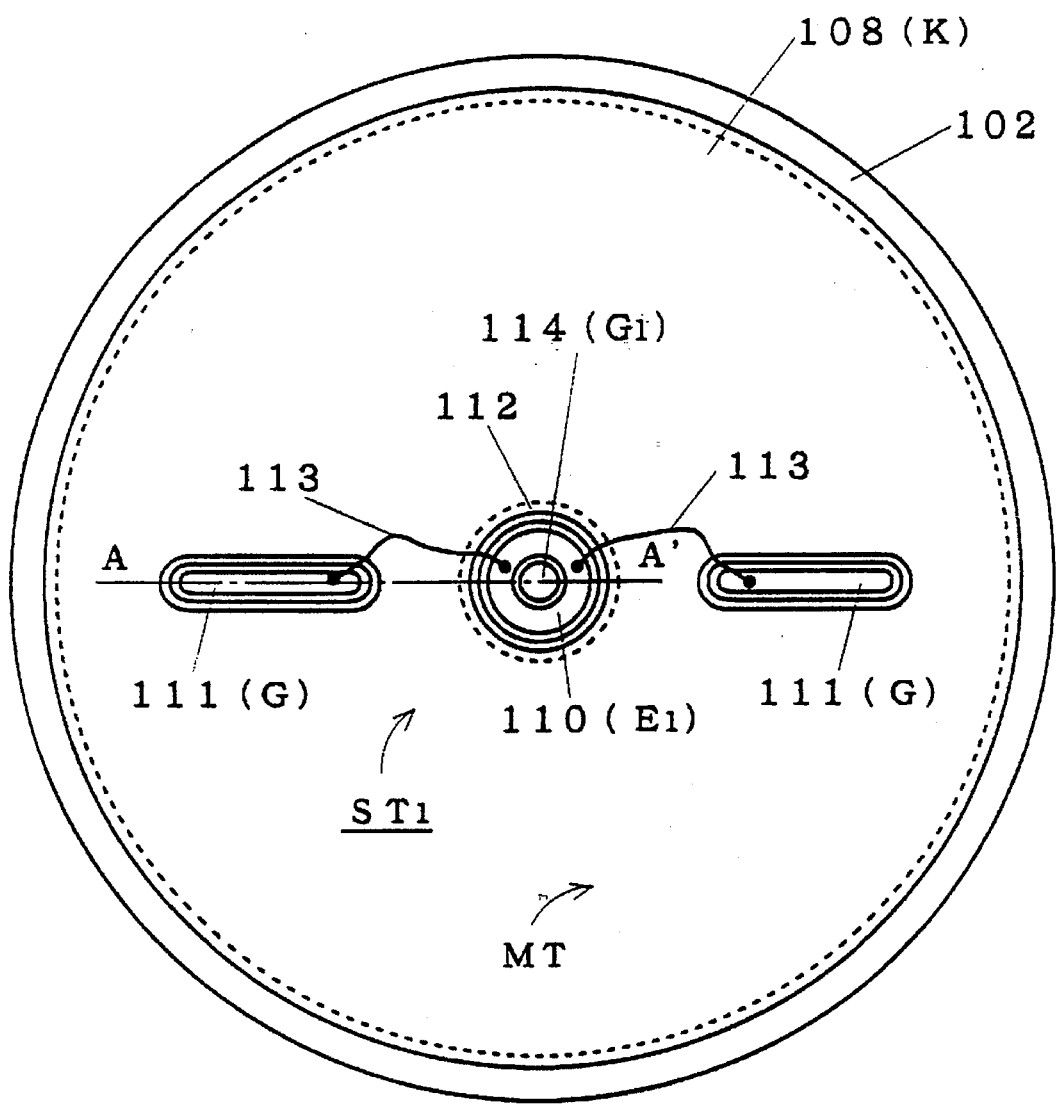
FIG. 3 is a plan view showing an optical thyristor according to a first embodiment of the present invention.
Figure 4:
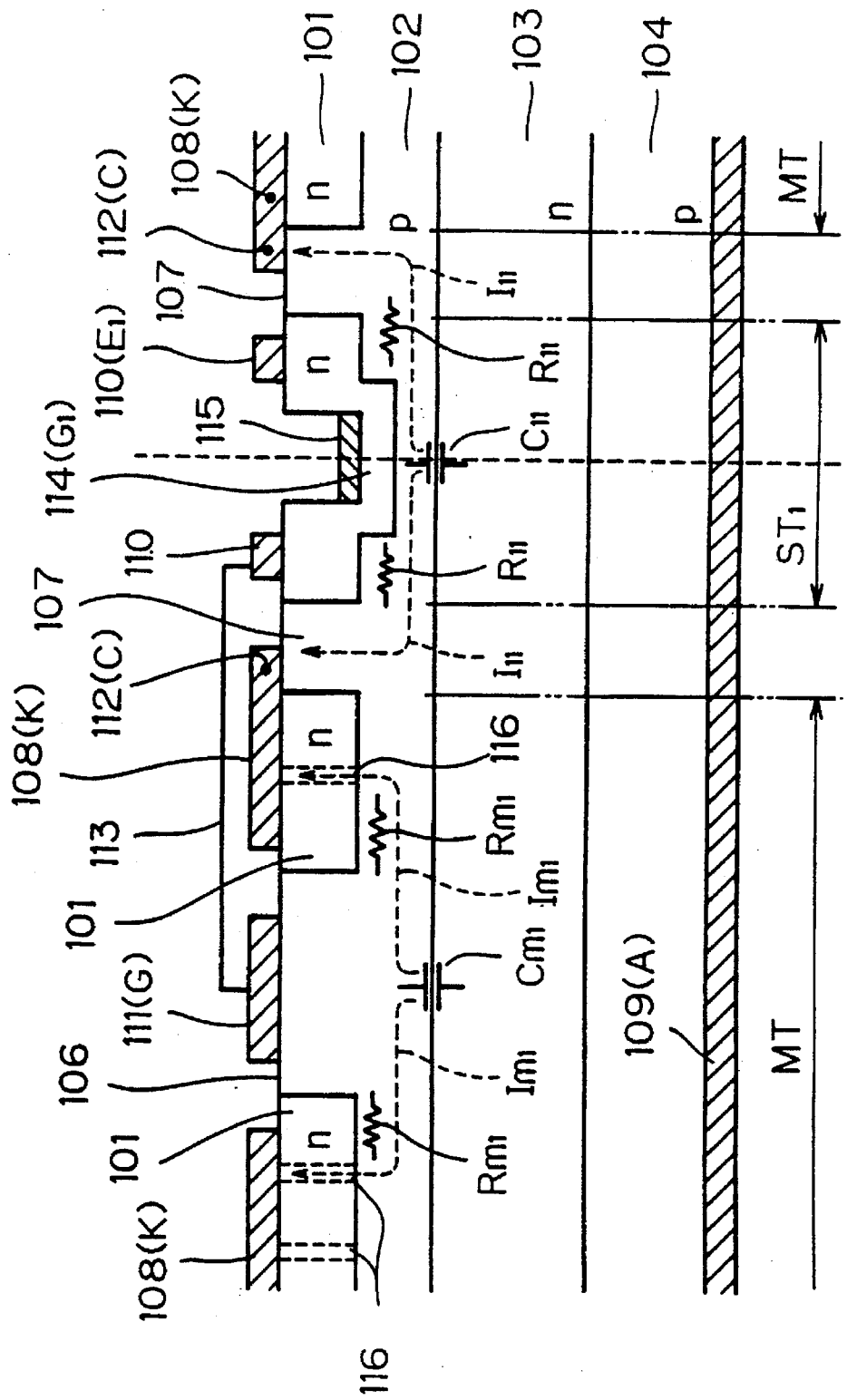
FIG. 4 is a sectional view of the optical thyristor according to the first embodiment of the present invention taken along the line A–A' in FIG. 3.
Figure 5:
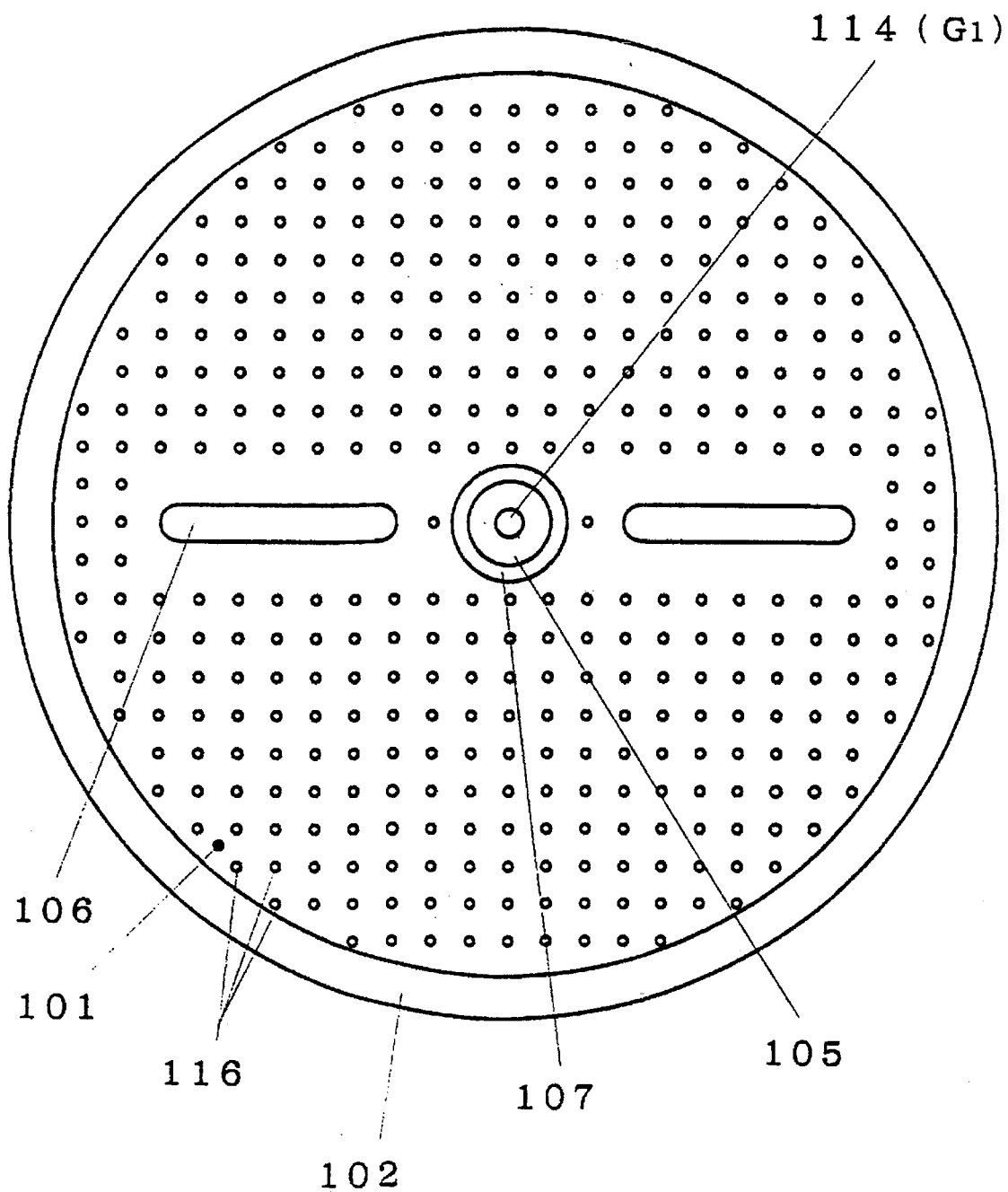
FIG. 5 is a plan view showing the thyristor according to the first embodiment of the present invention in a state before formation of electrodes.

A first embodiment of the present invention is now described. FIGS. 3 to 5, illustrating the structure of an optical thyristor according to this embodiment, are a plan view, a sectional view taken along the line A–A' in FIG. 3, and a plan view with omission of electrodes respectively. Referring to these figures, symbols A, K, $E_K$, $G_K$ and C for the electrodes employed in FIGS. 1A and 1B are also employed for corresponding electrodes with parentheses (). This also applies to the remaining embodiments.

In this thyristor, an N-type main emitter layer 101, a P-type P base layer 102, an N-type N base layer 103 and a P-type P emitter layer 104 are stackedly formed on a substantially discoidal semiconductor substrate of silicon having a pair of major surfaces, thereby forming a main thyristor MT. A circular N-type auxiliary emitter layer 105 is located substantially at the center of the semiconductor substrate, and forms one auxiliary thyristor $ST_1$ with the P base layer 102, the N base layer 103 and the P emitter layer 104. The auxiliary emitter layer 105 is separated from the main emitter layer 101 through the P base layer 102. Namely, this thyristor is a two-stage thyristor comprising one stage auxiliary thyristor $ST_1$ and the main thyristor MT.

The auxiliary thyristor $ST_1$ is provided on its center with a photoreceiving portion 114 which is coated with a film 115 of $SiO_2$ or the like for serving as an antireflection film. The thickness of the antireflection film 115 is most preferably odd times a value obtained by dividing ¼ of the wavelength of an optical trigger signal by the refractive index of the antireflection film 115. When the antireflection film 115 is a single-layer film, it is possible to minimize reflectance by setting the thickness of the antireflection film 115 at the aforementioned level, thereby minimizing loss of the optical signal. It is possible to attain an excellent antireflection property when the thickness of the antireflection film 115 satisfies a relation of A−30 nm≦thickness of insulating film≦A+30 nm with respect to $A=(2\times n-1)\times\lambda/(4\times N)$, where n represents a natural number, λ represents the central wavelength of the optical signal, and N represents the refractive index of the insulating film.

First regions 106 are defined as parts of the P base layer 102 which are formed to be adjacent to the main emitter layer 101 and enclosed with the same while being exposed on the upper major surface. These first regions 106 are defined to occupy two portions which are symmetrical to each other around the auxiliary thyristor $ST_1$ which is located substantially at the center of the semiconductor substrate. A second region 107 is defined as a part of the P base layer 102 which is formed to enclose the auxiliary emitter layer 105 while being enclosed with the main emitter layer 101 and exposed on the upper major surface. The first regions 106 and the second region 107 are separated from each other by parts of the main emitter layer 101. A cathode electrode 108 is electrically in contact with the main emitter layer 101. The main emitter layer 101 is provided therein with a plurality of short-circuiting portions 116 which are in the form of small holes vertically passing through the same, so that the cathode electrode 108 is short-circuited with the P base layer 102 through the short-circuiting portions 116. Portions of the cathode electrode 108 which are in contact with the short-circuiting portions 116 function as compensation electrodes.

An anode electrode 109 is electrically in contact with a lower major surface of the P emitter layer 104. An auxiliary emitter electrode 110 is formed on the auxiliary emitter layer 105, to be electrically in contact with the auxiliary emitter layer 105. Gate electrodes 111 of the main thyristor MT are formed on the first regions 106, to be electrically in contact with the first regions 106. A compensation electrode 112 which is formed on the second region 107 is electrically in contact with the second region 107, and integrally formed with the cathode electrode 108. Wires 113 such as aluminum wires electrically connect the auxiliary emitter electrode 110 with the gate electrodes 111.

<1-2. Steps of Fabricating the Device>

Figure 6A:
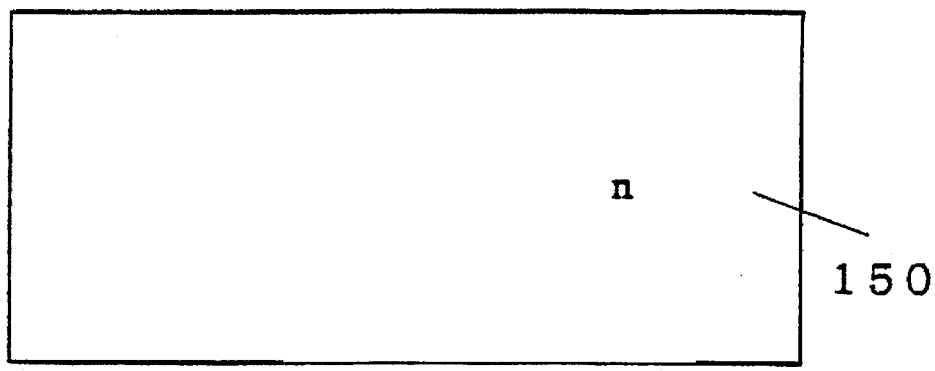
FIGS. 6A and 6B illustrate a step of fabricating the optical thyristor according to the first embodiment of the present invention.
Figure 6B:
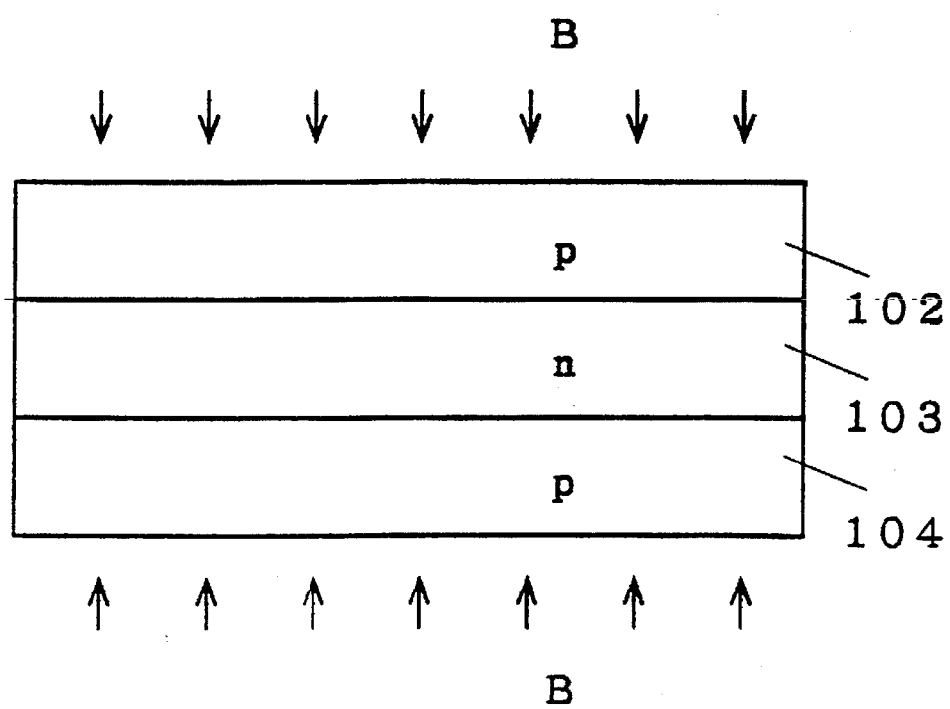

A method of fabricating this optical thyristor is now described. FIGS. 6A to 8 illustrate exemplary steps of the fabrication method. In order to fabricate the optical thyristor, a semiconductor substrate 105 of N-type silicon having a substantially discoidal shape and containing an N-type impurity in relatively low concentration is prepared as shown in FIG. 6A. Then, a P-type impurity such as boron is introduced into overall opposite major surfaces of the semiconductor substrate 150. Thus, the semiconductor substrate 150 is brought into such a structure that a P-type P base layer 102, an N-type N base layer 103 and a P-type P emitter layer 104 are successively stacked in order from the upper major surface side.

Then, an oxide film which is selectively formed on the semiconductor substrate 150 is employed as a mask for selectively introducing an N-type impurity such as phosphorus into the upper major surface, thereby forming an N-type auxiliary emitter layer 105 which is selectively exposed on an upper major surface of the P base layer 102 and an N-type main emitter layer 101 having a substantially circular outer periphery in the P base layer 102, as shown in FIG. 7A. An oxide film is formed on a region of the upper major surface of the semiconductor substrate 150 for forming the main emitter layer 101 with sprinkling of a plurality of small regions. Thus, the main emitter layer 101 as formed is provided with a plurality of vertically passing through holes, so that the P base layer 102 is exposed on the upper major surface of the semiconductor substrate 150 through the through holes. Namely, a plurality of short-circuiting portions 116 are simultaneously formed with the main emitter layer 101. Thereafter the oxide film employed as a mask is removed. The technique of selectively introducing an impurity through such an oxide film serving as a mask itself is well known in the art, and hence steps of forming and removing the oxide film are not illustrated.

Then, the center of the auxiliary emitter layer 105 is partially removed by etching, thereby forming a photoreceiving portion 114, as shown in FIG. 7B.

Then, an oxide film 115 is formed to cover the photoreceiving portion 114 as shown in FIG. 8A, so that its thickness is odd times a value which is obtained by dividing ¼ of the wavelength of an optical trigger signal by the refractive index of the oxide film.

Then, metal films 151 and 109 of aluminum or the like are formed on both major surfaces by vapor deposition or the like, as shown in FIG. 8B. The metal film 109 formed on the lower major surface functions as the anode electrode 109 as such.

Referring again to FIG. 4, the metal film 151 formed on the upper major surface is selectively etched thereby simultaneously forming the cathode electrode 108, the auxiliary emitter electrode 110, the gate electrodes 111, and the compensation electrode 112 which is integrally formed with the cathode electrode 118. Then, the auxiliary emitter electrode 110 and the gate electrodes 111 are electrically brought into contact with each other by wiring materials such as aluminum wires.

According to this method, the compensation electrode 112 and the cathode electrode 108 are not electrically connected with each other by a wiring material but integrally formed with each other, whereby the fabrication steps are simplified.

<1-3. Ordinary Operation of the Device>

The ordinary operation of this device is now described with reference to FIG. 4. In order to use this device, an external power source is connected to the anode electrode 109 and the cathode electrode 108, for applying a positive voltage across these electrodes. The photoreceiving portion 114 is irradiated with an optical trigger signal under application of this positive voltage, whereby a photoelectric current is generated in depletion layer regions provided on both sides of a P-N junction which is formed between the N base layer 103 and the P base layer 102 of the auxiliary thyristor $ST_1$, to flow into the P base layer 102. This photoelectric current transversely flows through the P base layer 102, to thereafter flow into the compensation electrode 112 which is formed on the second region 107. The path of the photoelectric current is identical to that (shown in FIG. 4) of a displacement current $I_{11}$ described later. The photoelectric current flowing into the compensation electrode 112 further flows to the external power source from the cathode electrode 108.

Consequently, the photoelectric current develops a transverse potential difference in the portion of the P base layer 102 located immediately under the auxiliary emitter layer 105 of the auxiliary thyristor $ST_1$, thereby forward-biasing a P-N junction which is formed between the auxiliary emitter layer 105 of the auxiliary thyristor $ST_1$ and the P base layer 102. When the forward bias voltage approaches the value of the diffusion potential which is specific to the P-N junction, electron injection from the auxiliary emitter layer 105 into the P base layer 102 is abruptly increased to turn on the auxiliary thyristor $ST_1$. The turn-on current for the auxiliary thyristor $ST_1$ flows from the auxiliary emitter electrode 110 to the wires 113 and the gate electrodes 111, thereby being supplied to the first region 106. The turn-on current which is supplied to the first region 106 functions as a gate current for the main thyristor MT.

The gate current which is supplied to the first region 106 transversely flows through the P base layer 102, and thereafter passes through the short-circuiting portions 116 provided in the main emitter layer 101, thereby flowing into the cathode electrode 108. This gate current is by far larger than the photoelectric current which is generated in the auxiliary thyristor $ST_1$ whereby a high voltage is generated along the path of the gate current. As the result, a sufficiently high forward bias voltage is applied to a P-N junction between the main emitter layer 101 and the P base layer 102, whereby the main thyristor MT is turned on. Thus, a main current flows from the anode electrode 109 to the cathode electrode 108. Namely, the thyristor conducts.

In order to improve photosensitivity of the thyristor, transverse resistance of the portion of the P base layer 102 located immediately under the auxiliary emitter layer 105 of the auxiliary thyristor $ST_1$ which is turned on at first may be increased, in general. Thus, the voltage generated along the path of the photoelectric current is increased, whereby the auxiliary thyristor $ST_1$ is easily turned on. Namely, photosensitivity of the thyristor is improved.

<1-4. Characteristic Operation of the Device>

Description is now made on the operation of the optical thyristor, to which a voltage noise having a large dv/dt value is applied. At this time, the displacement current $I_{11}$ is generated by a capacitance $C_{11}$ of the junction between the auxiliary emitter layer 105 of the auxiliary thyristor $ST_1$ and the P base layer 102, while a displacement current $I_{m1}$ is generated by a capacitance $C_{m1}$ of the junction between the main emitter layer 101 of the main thyristor MT and the P base layer 102. The displacement current $I_{11}$ generated in the auxiliary thyristor $ST_1$ flows into the compensation electrode 112 through the P base layer 102 along the same path as the photoelectric current, and thereafter flows toward the cathode electrode 108. This displacement current $I_{11}$ develops a transverse potential difference mainly in the portion of the P base layer 102 which is located immediately under the auxiliary emitter layer 105, due to a resistance $R_{11}$ provided in the path.

On the other hand, the displacement current $I_{m1}$ generated in the main thyristor MT flows into the cathode electrode 108 through the same path as the gate current. This displacement current $I_{m1}$ develops a transverse potential difference mainly in the portion of the P base layer 102 which is located immediately under the main emitter layer 101 of the main thyristor MT, due to a resistance $R_{m1}$ provided in the path. Thus, the paths of the two displacement currents $I_{11}$ and $I_{m1}$ are separated from each other similarly to the paths of the photoelectric current and the gate current, to bring the potential differences based on the resistances $R_{11}$ and $R_{m1}$ which are specific to the respective paths.

Figure 9:
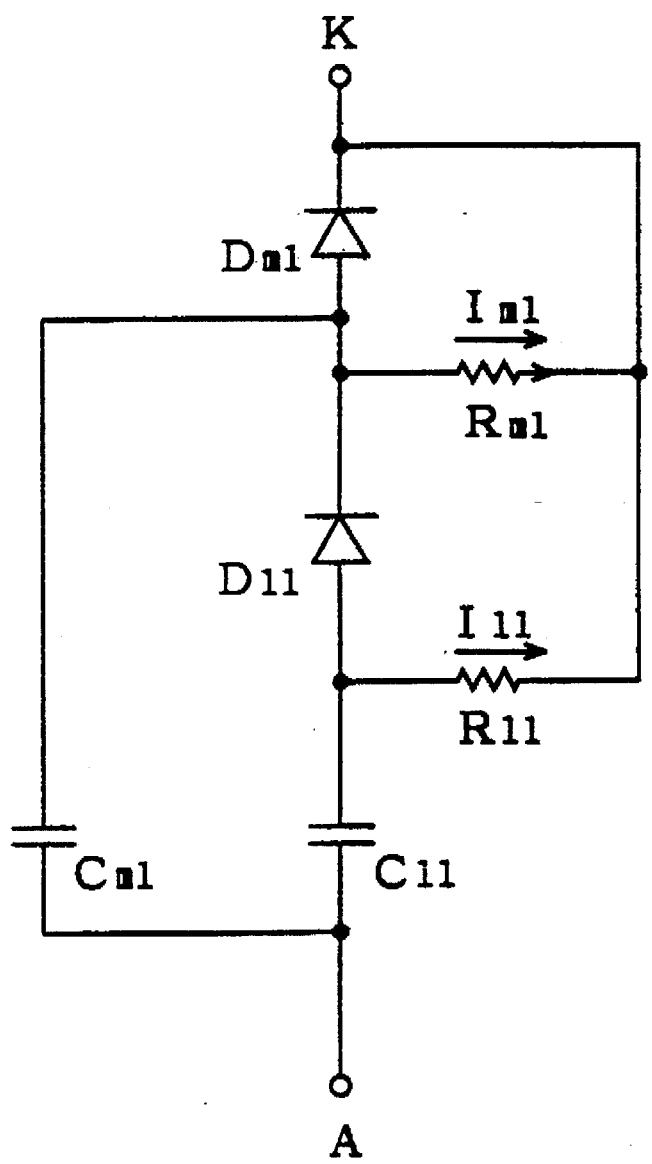
FIG. 9 is an equivalent circuit diagram of the optical thyristor according to the first embodiment of the present invention.

FIG. 9 is an equivalent circuit diagram of this thyristor which is related to behavior of the displacement currents $I_{11}$ and $I_{m1}$. Diodes $D_{11}$ and $D_{m1}$ equivalently express the junctions between the auxiliary emitter layer 105 of the auxiliary thyristor $ST_1$ and the P base layer 102 and between the main emitter layer 101 of the main thyristor MT and the P base layer 102 respectively. The resistances $R_{11}$ and $R_{m1}$, which are those along the paths of the displacement currents $I_{11}$ and $I_{m1}$ respectively as described above, mainly correspond to transverse resistances of the portions of the P base layer 102 located immediately under the auxiliary emitter layer 105 and the main emitter layer 102. Single ends of the respective resistances $R_{11}$ and $R_{m1}$ are short-circuited with the cathode electrode 108 (K).

A voltage corresponding to the product of the displacement current $I_{11}$ and the resistance $R_{11}$ is applied to an anode of the diode $D_{11}$. However, this voltage is not applied as such across the anode and a cathode of the diode $D_{11}$, i.e., the junction between the auxiliary emitter layer 105 and the P base layer 102, as a forward bias voltage. Since a voltage corresponding to the product of the displacement current $I_{m1}$ and the resistance $R_{m1}$ is applied to the cathode of the diode $D_{11}$, a forward bias voltage corresponding to the difference ($I_{11} \times R_{11} - I_{m1} \times R_{m1}$) between these two voltages is applied across the anode and the cathode of the diode $D_{11}$. Namely, the forward bias voltage for the auxiliary thyristor $ST_1$ which is originally brought by the displacement current $I_{11}$ is attenuated by the displacement current $I_{m1}$. Thus, the auxiliary thyristor $ST_1$ is suppressed from abnormal ignition caused by the displacement current $I_{11}$, whereby the overall thyristor is improved in dv/dt resistance.

Further, it is also possible to cancel the forward bias voltage which is applied to the junction of the auxiliary thyristor $ST_1$, by adjusting the resistances $R_{11}$ and $R_{m1}$, or the aforementioned transverse resistances forming principal parts thereof.

The parameters deciding the photosensitivity are the value of the photoelectric current and the resistance $R_{11}$ (in other words, the transverse resistance of the portion of the P base layer 102 mainly located immediately under the auxiliary emitter layer 105), while those deciding the dv/dt resistance are the displacement current $I_{m1}$ and the resistance $R_{m1}$ of its path. Therefore, it is possible to decide the photosensitivity and the dv/dt resistance independently of each other, thereby improving the dv/dt resistance without reducing the photosensitivity.

In this thyristor, further, the displacement current $I_{11}$ which is generated in the auxiliary thyristor $ST_1$ will not flow into the short-circuiting portions 116 for short-circuiting the cathode electrode 108 and the P base layer 102, whereby the areas of the short-circuiting portions 116 can be reduced. The main thyristor MT can be easily turned on due to such area reduction of the short-circuiting portions 116, whereby a conduction area (area of a region implementing conduction) in the main thyristor MT is quickly increased in the turn-on time. Consequently, di/dt resistance is improved and the turn-on time is reduced. Further, the area of the cathode electrode 108 can be increased due to the area reduction of the short-circuiting portions 116, whereby it is possible to reduce an ON-state voltage (voltage developed across the anode electrode 109 and the cathode electrode 108 when the thyristor is brought into a conducting state while short-circuiting an external load, i.e., a collector-to-emitter saturation voltage $V_{CE(sat)}$) and to improve surge current resistance.

<Second Embodiment>

Figure 10:
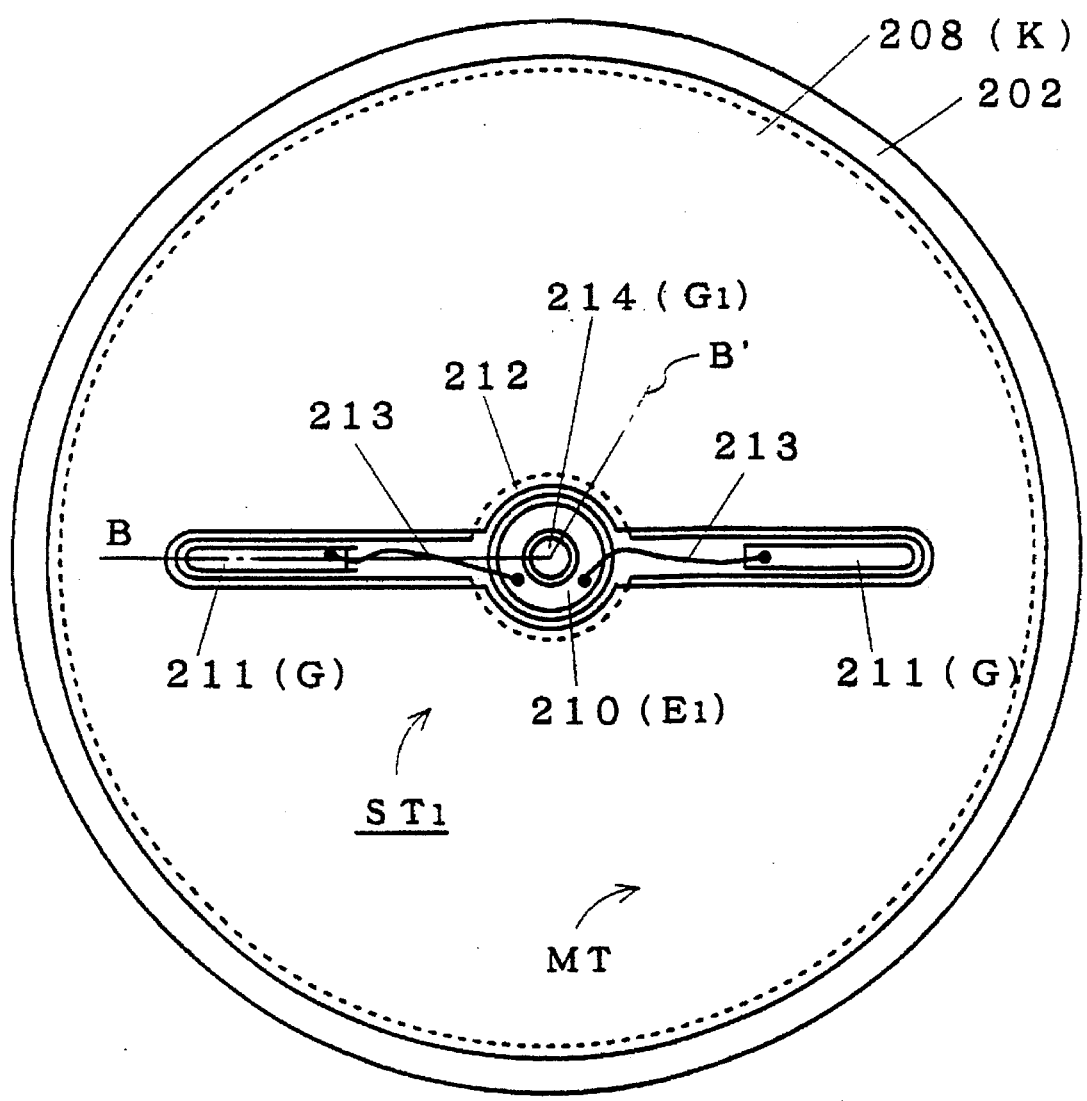
FIG. 10 is a plan view showing an optical thyristor according to a second embodiment of the present invention.
Figure 11:
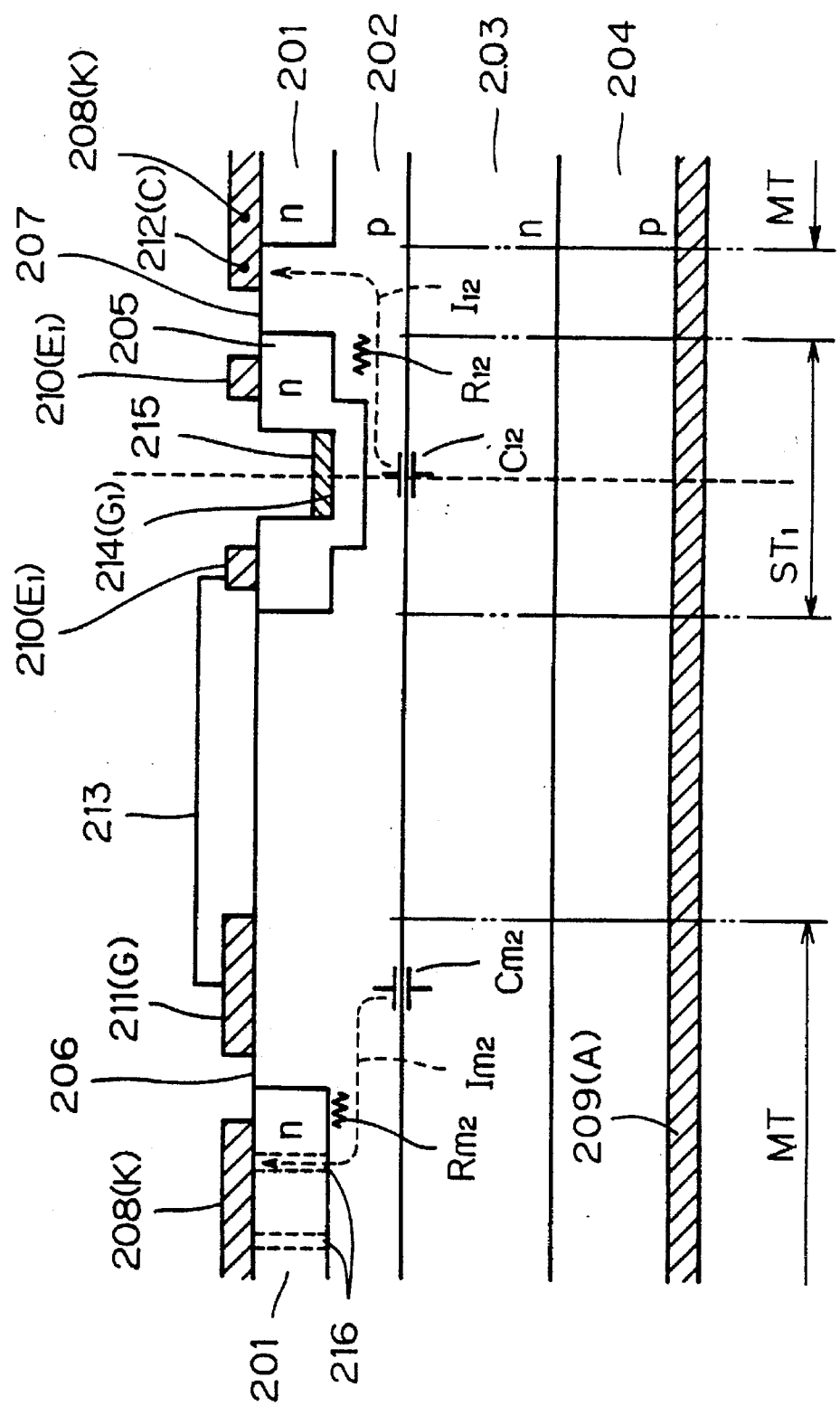
FIG. 11 is a sectional view of the optical thyristor according to the second embodiment of the present invention taken along the line B–B' in FIG. 10.
Figure 12:
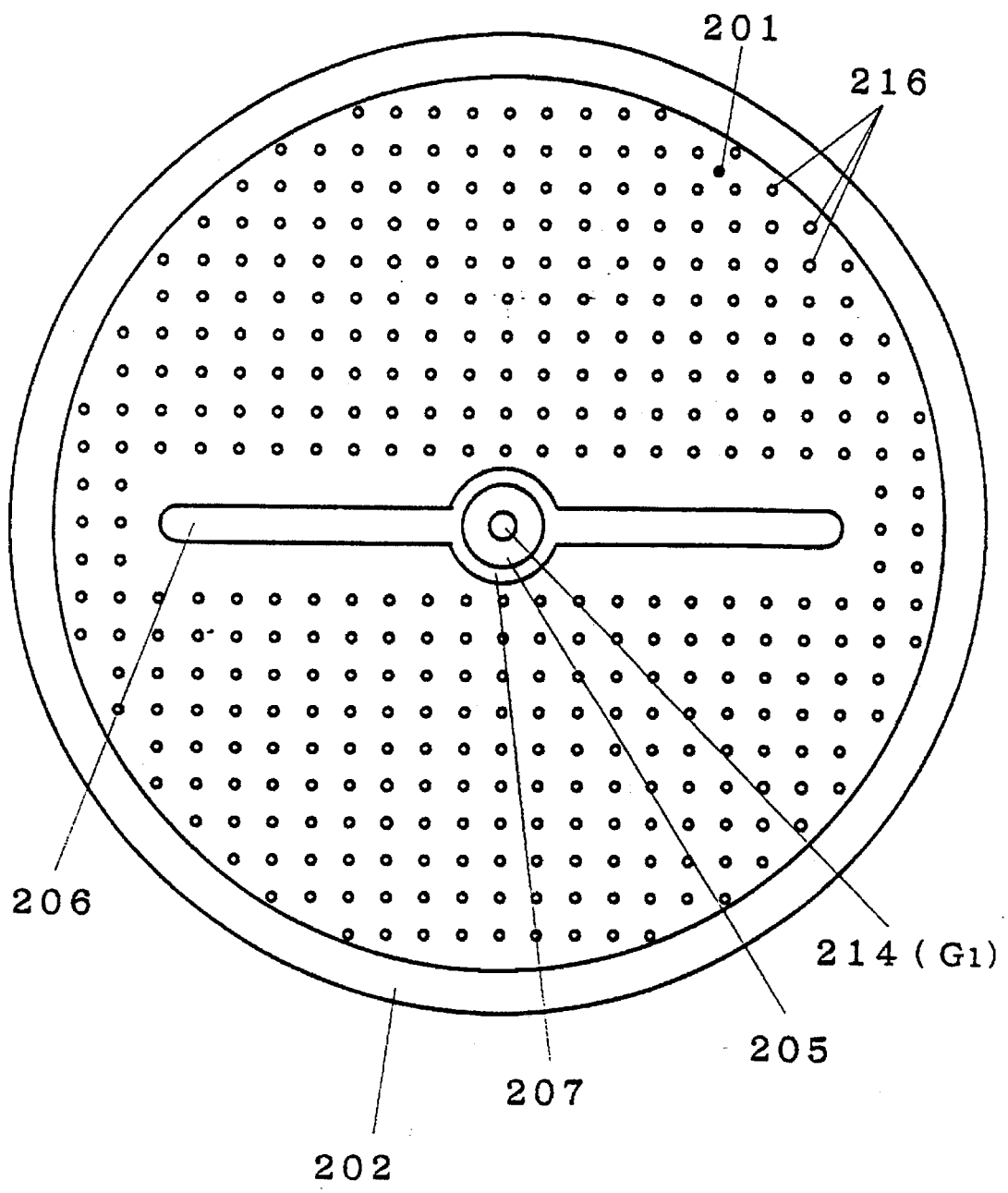
FIG. 12 is a plan view showing the optical thyristor according to the second embodiment of the present invention in a state before formation of electrodes.

A second embodiment of the present invention is now described. FIGS. 10 to 12, illustrating the structure of an optical thyristor according to this embodiment, are a plan view, a sectional view taken along the line B–B' in FIG. 10, and a plan view showing the thyristor with omission of electrodes.

In this thyristor, an N-type main emitter layer 201, a P-type P base layer 202, an N-type N base layer 203, and a P-type P emitter layer 204 are stackedly formed on a substantially discoidal semiconductor substrate of silicon having a pair of major surfaces, thereby forming a main thyristor MT. A circular N-type auxiliary emitter layer 205 is positioned on a substantially central portion of the semiconductor substrate, to form one auxiliary thyristor $ST_1$ with the P base layer 202, the N base layer 203 and the P emitter layer 204. The auxiliary emitter layer 205 and the main emitter layer 201 are separated from each other through the P base layer 202. Namely, this thyristor is a two-stage structure thyristor having one-stage auxiliary thyristor $ST_1$ and the main thyristor MT, similarly to the first embodiment.

The auxiliary thyristor $ST_1$ is provided on its center with a photoreceiving portion 114 which is coated with an antireflection film 215. The thickness of the antireflection film 215 is set similarly to that in the first embodiment.

First and second regions 206 and 207 are defined on upper major surfaces of portions of the P base layer 202 which are adjacent to the auxiliary emitter layer 205 of the auxiliary thyristor $ST_1$ which is positioned at a substantially central portion of the semiconductor substrate and the main emitter layer 201 of the main thyristor MT and extending in two radial directions through the same. The first region 206 is defined in the vicinity of both ends of the P base layer 202, while the second region 207 is defined in the vicinity of the auxiliary emitter layer 205. The first and second regions 206 and 207 are two regions which are defined on the same P base layer 202, and connected with each other through the P base layer 202. However, the first and second regions 206 and 207 are sufficiently separated from each other, and hence the portion of the P base layer 202 located between these regions is set at a sufficiently high resistance.

A cathode electrode 208 is electrically in contact with the main emitter layer 201. The main emitter layer 201 is provided with a plurality of short-circuiting portions 216 in the form of holes vertically passing through the same, so that the cathode electrode 208 is short-circuited with the P base layer 202 through the short-circuiting portions 216. Portions of the cathode electrode 208 which are in contact with the short-circuiting portions 216 serve as compensation electrodes. An anode electrode 209 is electrically in contact with a lower major surface of the P emitter layer 204. An auxiliary emitter electrode 210 is formed on the auxiliary emitter layer 205, to be electrically in contact with the auxiliary emitter layer 205. Gate electrodes 211 of the main thyristor MT are formed on the first region 206, to be electrically in contact with the first region 206. A compensation electrode 212 which is formed on the second region 207 is electrically in contact with the second region 207, and integrally formed with the cathode electrode 208. Wires 213 such as aluminum wires electrically connect the auxiliary emitter electrode 210 and the gate electrodes 211 with each other. In this thyristor, no cathode electrode 208 is provided immediately under the wires 213 dissimilarly to the device according to the first embodiment, whereby a significance level of short-circuiting between the wires 213 and the cathode electrode 208 is reduced, to attain higher reliability.

A method of fabricating the optical thyristor is similar to that for the optical thyristor according to the first embodiment.

The ordinary operation of this thyristor is now described. Operating portions which are common to those of the first embodiment are simply described. When a positive voltage is applied across the anode electrode 209 and the cathode electrode 208 and a photoreceiving portion 214 is irradiated with an optical trigger signal, a photoelectric current is generated in the auxiliary thyristor $ST_1$. This photoelectric current flows into the compensation electrode 212 through the same path as a displacement current $I_{12}$ (shown in FIG. 11) described later, and further flows toward an external power source from the cathode electrode 108. When the photoreceiving portion 214 is irradiated with such a high optical trigger signal that the photoelectric current exceeds a prescribed value, the auxiliary thyristor $ST_1$ is turned on. The turn-on current for the auxiliary thyristor $ST_1$ flows from the auxiliary emitter electrode 210 to the wires 213 and the gate electrodes 211, thereby being supplied to the first region 206 as a gate current for the main thyristor MT.

Since a resistance between the first and second regions 206 and 207 is set at a sufficiently high level, the gate current which is supplied to the first region 206 is not directed to the compensation electrode 211 provided in the second region 207 but preferentially flows to the cathode electrode 208 through the short-circuiting portions 216 provided in the main emitter layer 201. While this embodiment is provided with no main emitter layer 202 separating the first and second regions 206 and 207 dissimilarly to the first embodiment, the two regions 206 and 207 are sufficiently separated from each other as described above to sufficiently increase the resistance therebetween, whereby the path of the gate current is similar to that in the first embodiment. Therefore, the gate current is effectively utilized for applying a forward bias voltage to the main emitter layer 201 of the main thyristor MT. Consequently, the main thyristor MT is turned on to bring the thyristor into a conducting state.

Description is now made on a characteristic operation of the optical thyristor to which a voltage noise having a high dv/dt value is applied. Upon application of such a voltage noise, displacement currents $I_{12}$ and $I_{m2}$ which are generated by capacitances $C_{12}$ and $C_{m2}$ of junctions between the auxiliary emitter layer 205 of the auxiliary thyristor $ST_1$ and the P base layer 202 and between the main emitter layer 201 of the main thyristor MT and the P base layer 202 flow into the cathode electrode 108 through the same paths as the photoelectric current and the gate current respectively. Thus, this thyristor is equivalently expressed by a circuit diagram shown in FIG. 13. Diodes $D_{12}$ and $D_{m2}$ express the junctions between the auxiliary emitter layer 205 of the auxiliary thyristor $ST_1$ and the P base layer 202 and between the main emitter layer 201 of the main thyristor MT and the P base layer 202 respectively. Resistances $R_{12}$ and $R_{m2}$, which are along the paths of the displacement currents $R_{12}$ and $I_{m2}$ respectively, mainly correspond to transverse resistances of the portions of the P base layer 202 which are located immediately under the auxiliary emitter layer 205 and the main emitter layer 201 respectively.

Figure 13:
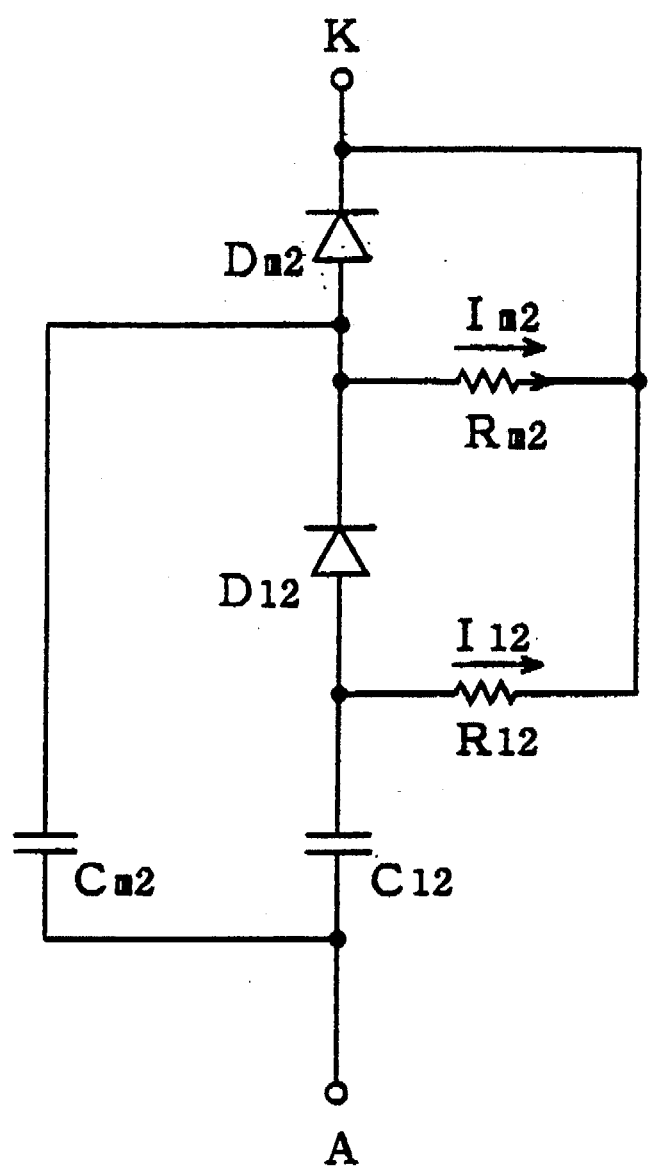
FIG. 13 is an equivalent circuit diagram of the optical thyristor according to the second embodiment of the present invention.

As understood from the circuit diagram of FIG. 13, a forward bias voltage corresponding to the voltage difference ($I_{12} \times R_{12} - I_{m2} \times R_{m2}$) along the paths of the displacement currents $I_{12}$ and $I_{m2}$ is applied across an anode and a cathode of the diode $D_{12}$. Namely, a forward bias voltage for the auxiliary thyristor $ST_1$ which is originally brought by the displacement current $I_{12}$ is attenuated by the displacement current $I_{m2}$. Thus, the auxiliary thyristor $ST_1$ is suppressed from abnormal ignition caused by the displacement current $I_{12}$, whereby the overall thyristor is improved in dv/dt resistance. It is also possible to cancel a forward bias voltage which is applied to the junction of the auxiliary thyristor $ST_1$ by adjusting the resistances $R_{12}$ and $R_{m2}$. In addition, it is possible to decide photosensitivity and dv/dt resistance independently of each other, whereby the dv/dt resistance can be improved without reducing the photosensitivity.

Further, the displacement current $I_{12}$ which is generated in the auxiliary thyristor $ST_1$ will not flow into the short-circuiting portions 216 similarly to the thyristor according to the first embodiment, whereby it is possible to improve di/dt resistance, the turn-on time, the ON-state voltage and surge current resistance.

<Third Embodiment>

Figure 14:
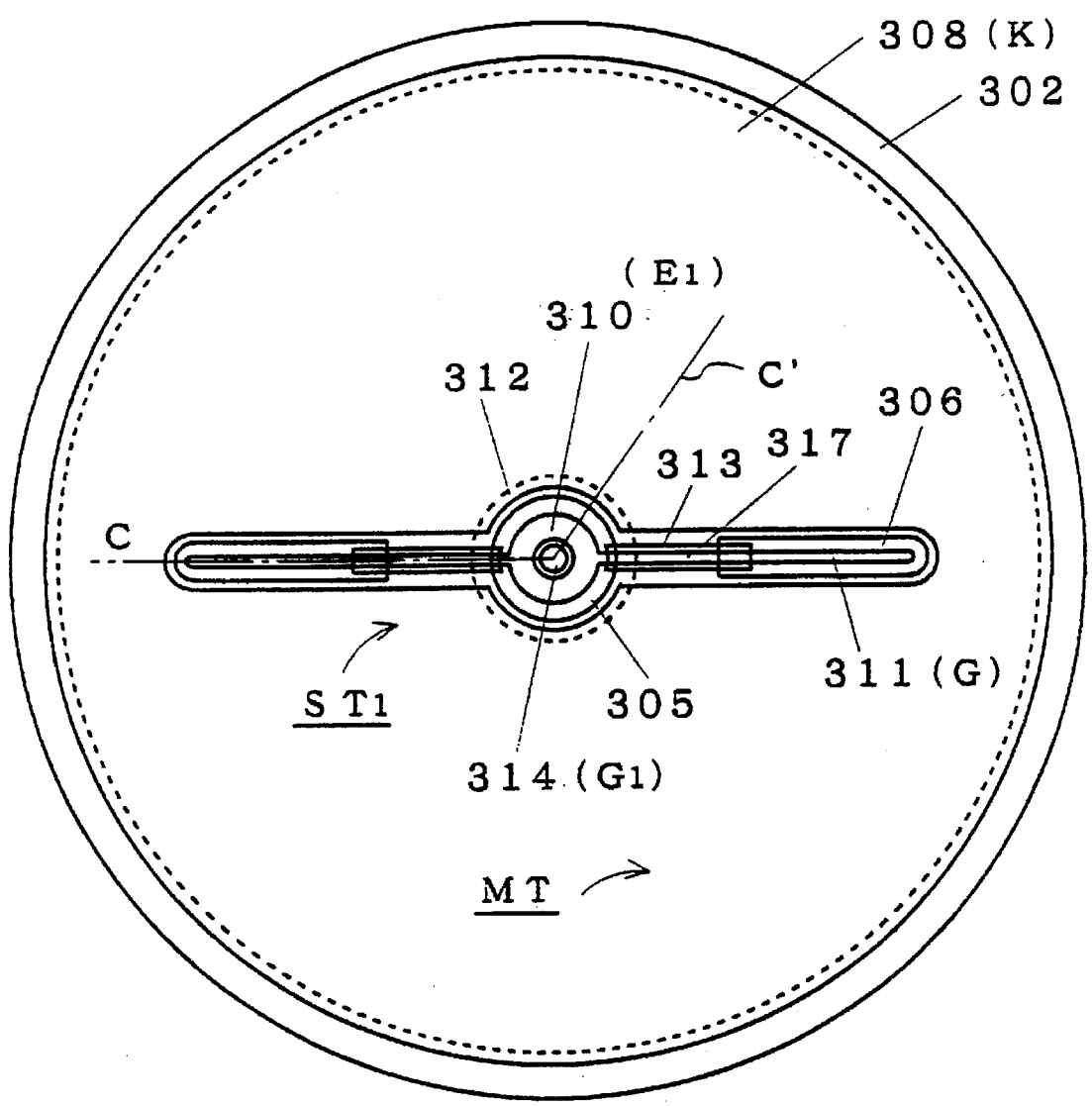
FIG. 14 is a plan view showing an optical thyristor according to a third embodiment of the present invention.
Figure 15:
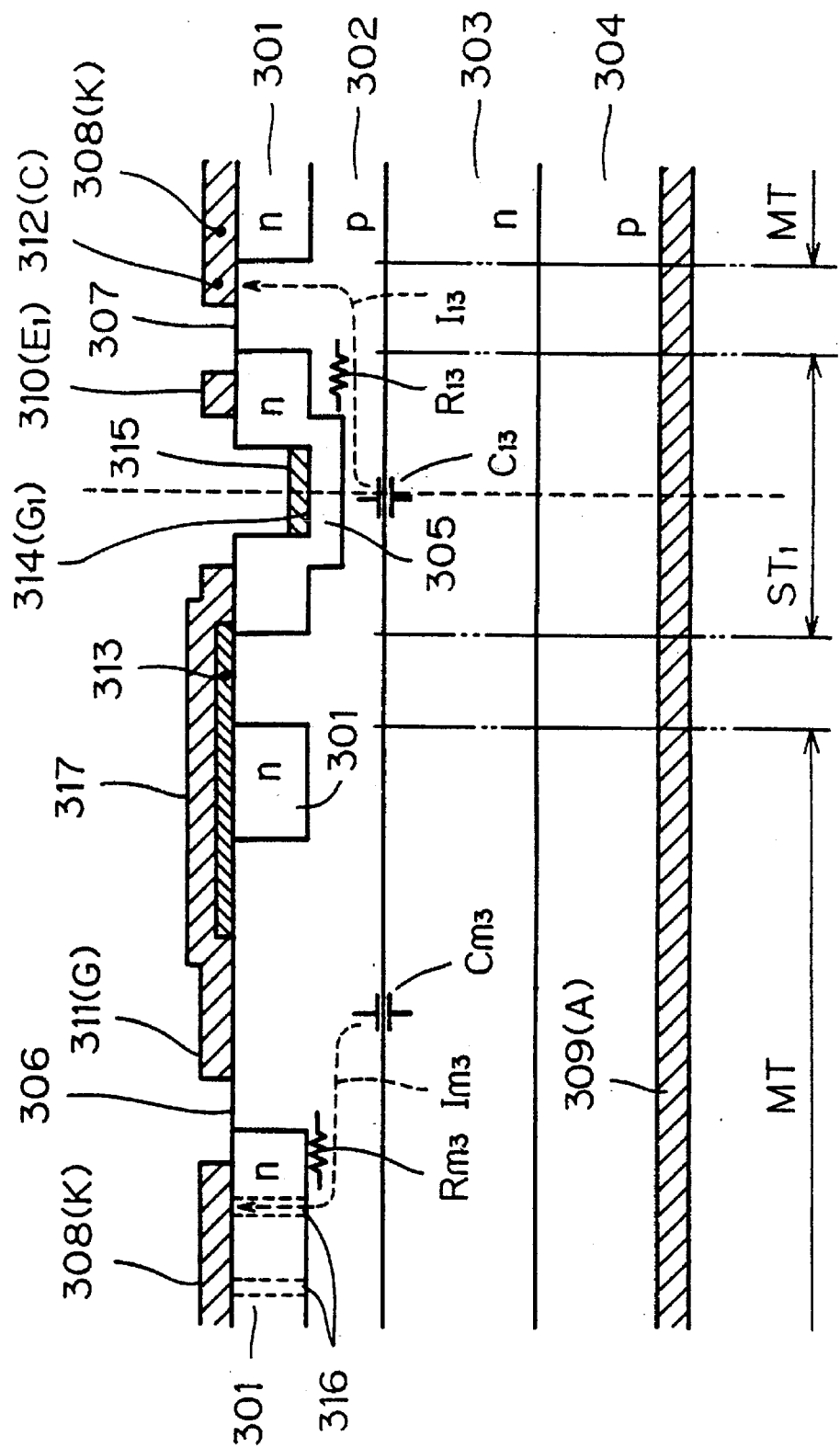
FIG. 15 is a sectional view of the optical thyristor according to the third embodiment of the present invention taken along the line C–C' in FIG. 14.
Figure 16:
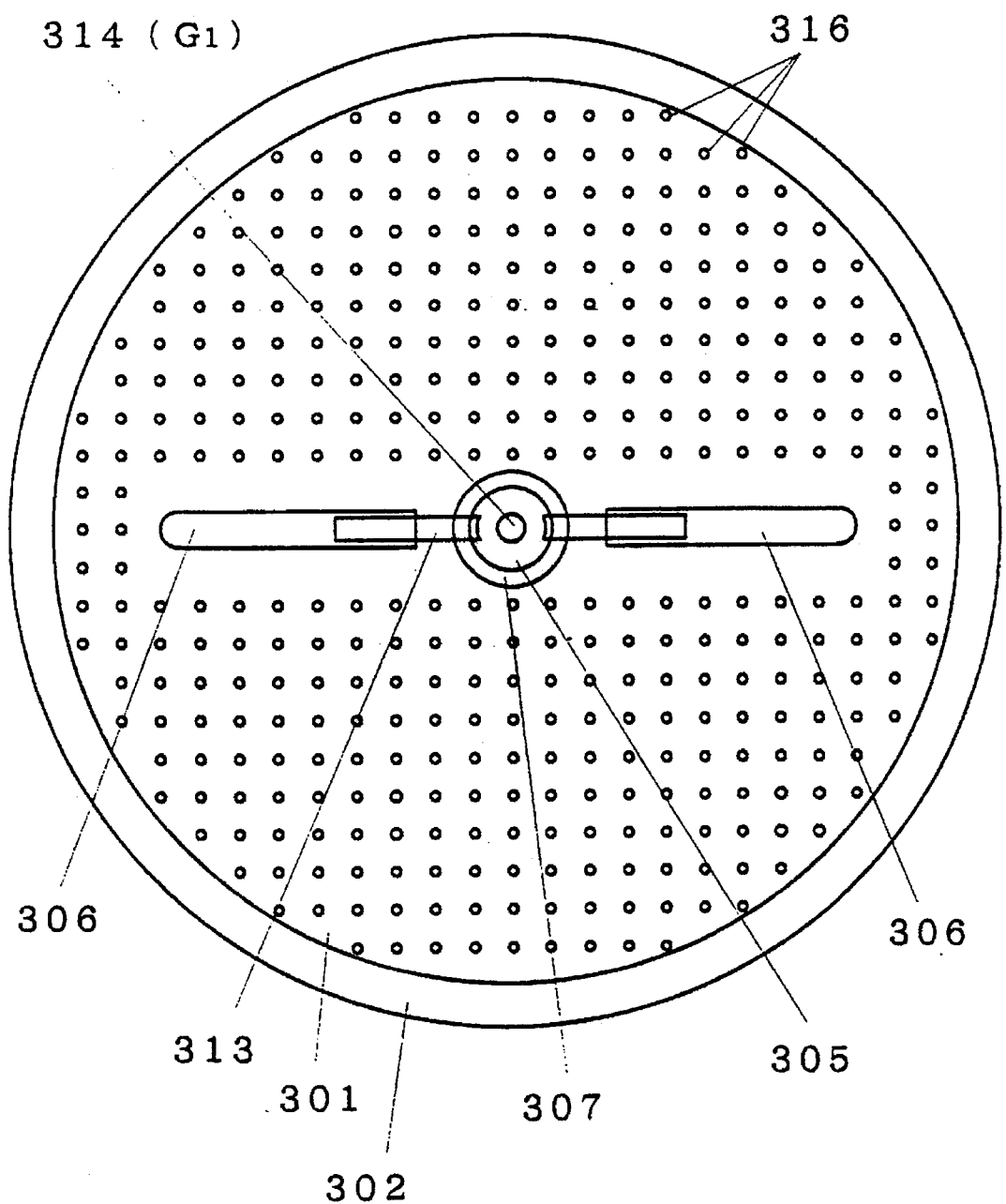
FIG. 16 is a plan view of the optical thyristor according to the third embodiment of the present invention in a state before formation of electrodes.

A third embodiment of the present invention is now described. FIGS. 14 to 16, illustrating the structure of an optical thyristor according to this embodiment, are a plan view, a sectional view taken along the line C–C' in FIG. 14, and a plan view showing the thyristor with omission of electrodes respectively.

In this thyristor, an N-type main emitter layer 301, a P-type P base layer 302, an N-type N base layer 303 and a P-type P emitter layer 304 are stackedly formed on a substantially discoidal semiconductor substrate of silicon having a pair of major surfaces, thereby forming a main thyristor MT. A circular N-type auxiliary emitter layer 305 is positioned substantially at the center of the semiconductor substrate, to form one auxiliary thyristor $ST_1$ with the P base layer 302, the N base layer 303 and the P emitter layer 304. Further, the auxiliary emitter layer 305 and the main emitter layer 301 are separated from each other through the P base layer 302. Namely, this thyristor is also a two-stage structure thyristor comprising one-stage auxiliary thyristor $ST_1$ and the main thyristor MT, similarly to the first embodiment.

The auxiliary thyristor $ST_1$ is provided on its center with a photoreceiving portion 314 which is coated with an antireflection film 315. The thickness of the antireflection film 315 is optimized similarly to that in the first embodiment.

First and second regions 306 and 307 are defined similarly to the first and second regions 106 and 107 in the first embodiment. Therefore, the first and second regions 306 and 307 are separated from each other by a part of the main emitter layer 301. The minimum width of the part of the main emitter layer 301 separating the first and second regions 306 and 307 from each other is preferably not more than 2 mm at the maximum. If the minimum width is in excess of 2 mm, a portion of the P base layer 302 located under this part of the main emitter layer 301 has an excessive transverse resistance to cause abnormal ignition of the part of the main emitter layer 301 by a displacement current described later, leading to reduction in dv/dt resistance of the overall thyristor.

A cathode electrode 308 is electrically in contact with the main emitter layer 301. The main emitter layer 301 is provided with a plurality of short-circuiting portions 316 in the form of small holes vertically passing through the same, so that the cathode electrode 308 is short-circuited with the P base layer 302 through the short-circuiting portions 316. Portions of the cathode electrode 308 which are in contact with the short-circuiting portions 316 serve as compensation electrodes. An anode electrode 309 is electrically in contact with a lower major surface of the P emitter layer 304. An auxiliary emitter electrode 310 is formed on the auxiliary emitter layer 305, to be electrically in contact with the auxiliary emitter layer 305. Gate electrodes 311 of the main thyristor MT are formed on the first region 306, to be electrically in contact with the first region 306. A compensation electrode 312 which is formed on the second region 307 is electrically in contact with the second region 307, and integrally formed with the cathode electrode 308.

A serial electric insulating film 313 is formed to extend over parts of the auxiliary emitter layer 305, the second region 307, the main emitter layer 301 and the first region 307 respectively. A conductive bridging portion 317 is integrally formed with the emitter electrode 310 and the gate electrodes 311 on the insulating film 313. This bridging portion 317 electrically connects the emitter electrode 310 and the gate electrodes 311 with each other. Since the emitter electrode 310 and the gate electrodes 311 are connected with each other not by wiring materials but by the bridging portion 317 which is integrally formed with the electrodes to be connected with each other, whereby the thyristor is advantageously improved in reliability with no probability for disconnection in the wiring materials and short-circuiting with other portions.

Figure 17A:
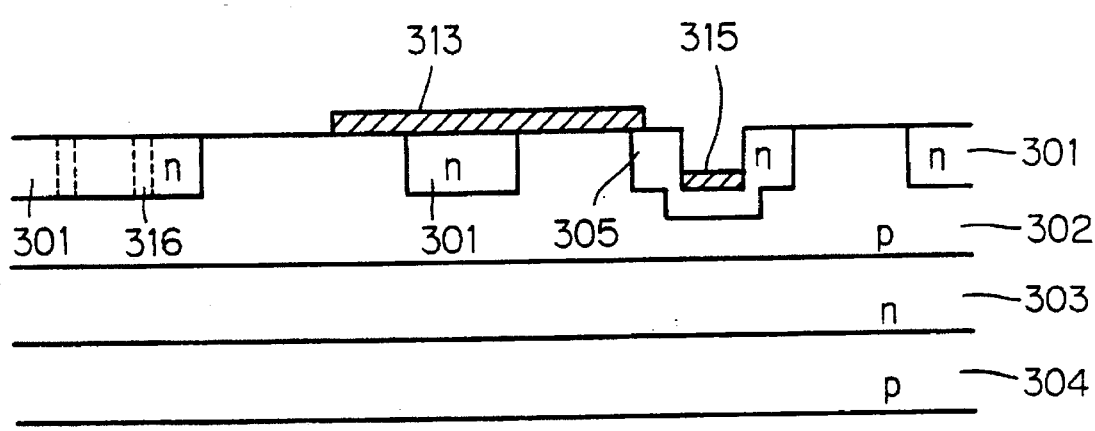
FIGS. 17A and 17B illustrate steps of fabricating the optical thyristor according to the third embodiment of the present invention.
Figure 17B:
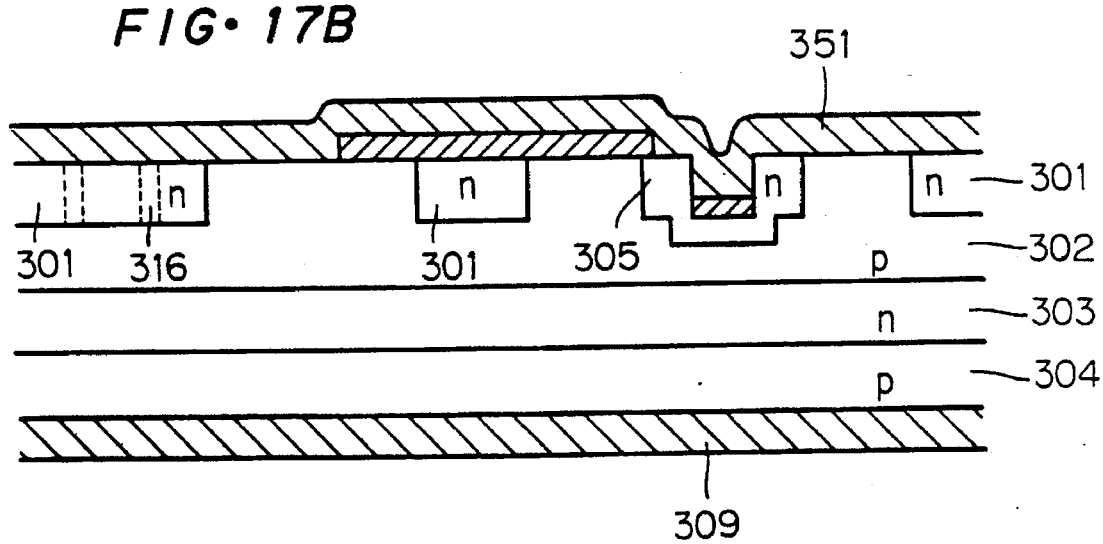

A method of fabricating this optical thyristor is now described. FIGS. 17A and 17B are process diagrams showing steps of fabricating the thyristor according to this embodiment. A step of preparing a semiconductor substrate to that of forming a photoreceiving portion 314 are similar to those of the first embodiment. Thereafter insulating films 313 and 315 such as oxide films are selectively formed on the semiconductor substrate, as shown in FIG. 17A. The insulating film 315 is formed to cover the photoreceiving portion 314, while the insulating film 313 is selectively formed to extend over parts of an auxiliary emitter layer 305, a second region 317, a main emitter layer 301 and a first region 316 respectively. These insulating films 313 and 315 are adjusted to have prescribed thicknesses respectively.

Thereafter metal films 351 and 309 of aluminum or the like are formed on both major surfaces by vapor deposition or the like, as shown in FIG. 17B. The metal film 309 provided on the lower major surface functions as the anode electrode 309 as such.

Referring again to FIG. 15, the metal film 351 provided on the upper major surface is selectively etched to simultaneously form the cathode electrode 308, the auxiliary emitter electrode 310, the gate electrodes 311, the compensation electrode 312 which is integrated with the cathode electrode 318, and the bridging portion 317 which is integrated with the emitter electrode 310 and the gate electrodes 311.

In the method of fabricating the thyristor according to this embodiment, the bridging portion 317 is formed simultaneously with the other electrodes while being insulated from the main emitter layer 301 through the insulating film 313 which is formed simultaneously with the antireflection film 315 of the photoreceiving portion 314 in place of providing aluminum wires after formation of the electrodes, whereby the fabrication steps are advantageously simplified.

The ordinary operation of this thyristor is similar to that of the first embodiment. Further, a characteristic operation of this thyristor to which a voltage noise having a large dv/dt value is applied is also similar to that of the first embodiment. Namely, displacement currents $I_{13}$ and $I_{m3}$ which are generated by capacitances $C_{13}$ and $C_{m3}$ of junctions between the auxiliary emitter layer 305 of the auxiliary thyristor $ST_1$ and the P base layer 302 and between the main emitter layer 301 of the main thyristor MT and the P base layer 302 flow into the cathode electrode 308 through the same paths as the photoelectric current and the gate current respectively. These paths are separated from each other. Therefore, this thyristor is equivalently expressed by a circuit diagram shown in FIG. 18. Diodes $D_{13}$ and $D_{m3}$ express the junctions between the auxiliary emitter layer 305 of the auxiliary thyristor $ST_1$ and the P base layer 302 and between the main emitter layer 301 of the main thyristor MT and the P base layer 302 respectively. Resistances $R_{13}$ and $R_{m3}$, which are along the paths of the displacement currents $I_{13}$ and $I_{m3}$ respectively, mainly correspond to transverse resistances of portions of the P base layer 302 which are located immediately under the auxiliary emitter layer 305 and the main emitter layer 301 respectively.

Figure 18:
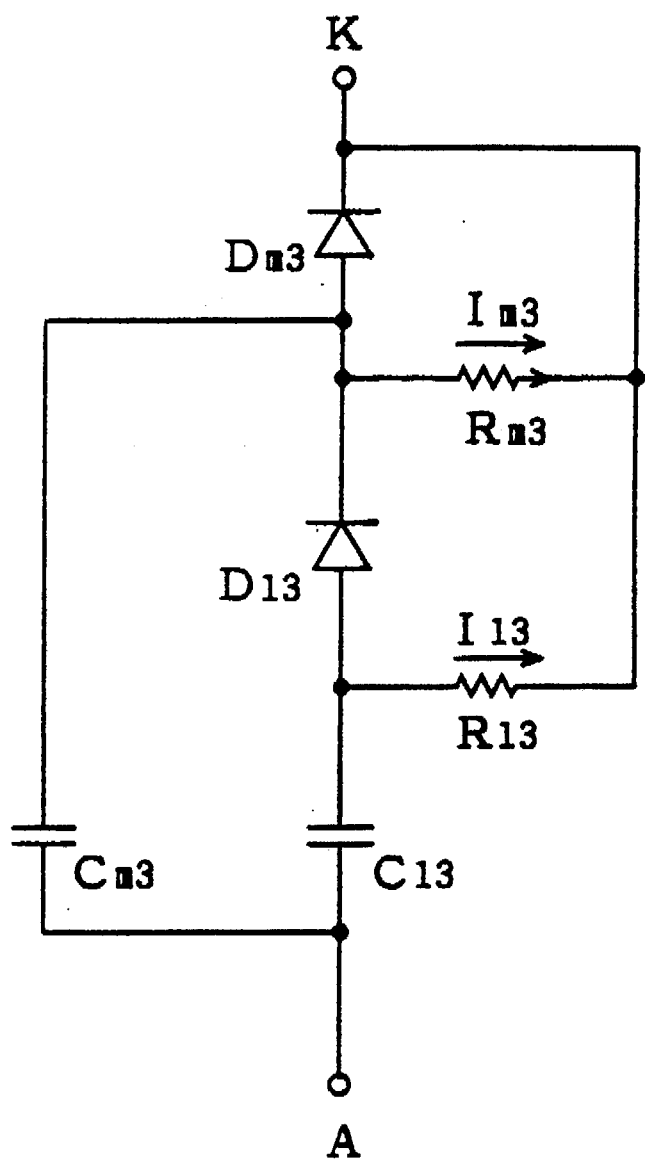
FIG. 18 is an equivalent circuit diagram of the optical thyristor according to the third embodiment of the present invention.

As understood from the circuit diagram of FIG. 18, a forward bias voltage corresponding to the voltage difference $(I_{13} \times R_{13} - I_{m3} \times R_{m3})$ along the paths of the displacement currents $I_{13}$ and $I_{m3}$ is applied across an anode and a cathode of the diode $D_{13}$. Namely, a forward bias voltage for the auxiliary thyristor $ST_1$ which is originally brought by the displacement current $I_{13}$ is attenuated by the displacement current $I_{m3}$. Thus, the auxiliary thyristor $ST_1$ is suppressed from abnormal ignition caused by the displacement current $I_{13}$, whereby the overall thyristor is improved in dv/dt resistance. It is also possible to cancel a forward bias voltage which is applied to the junction of the auxiliary thyristor $ST_1$ by adjusting the resistances $R_{13}$ and $R_{m3}$. In addition, it is possible to decide photosensitivity and dv/dt resistance independently of each other, whereby the dv/dt resistance can be improved without reducing the photosensitivity.

Further, the displacement current $I_{13}$ which is generated in the auxiliary thyristor $ST_1$ will not flow into the short-circuiting portions 316 similarly to the thyristor according to the first embodiment, whereby it is possible to improve di/dt resistance, the turn-on time, the ON-state voltage and surge current resistance.

<Fourth Embodiment>

Figure 19:
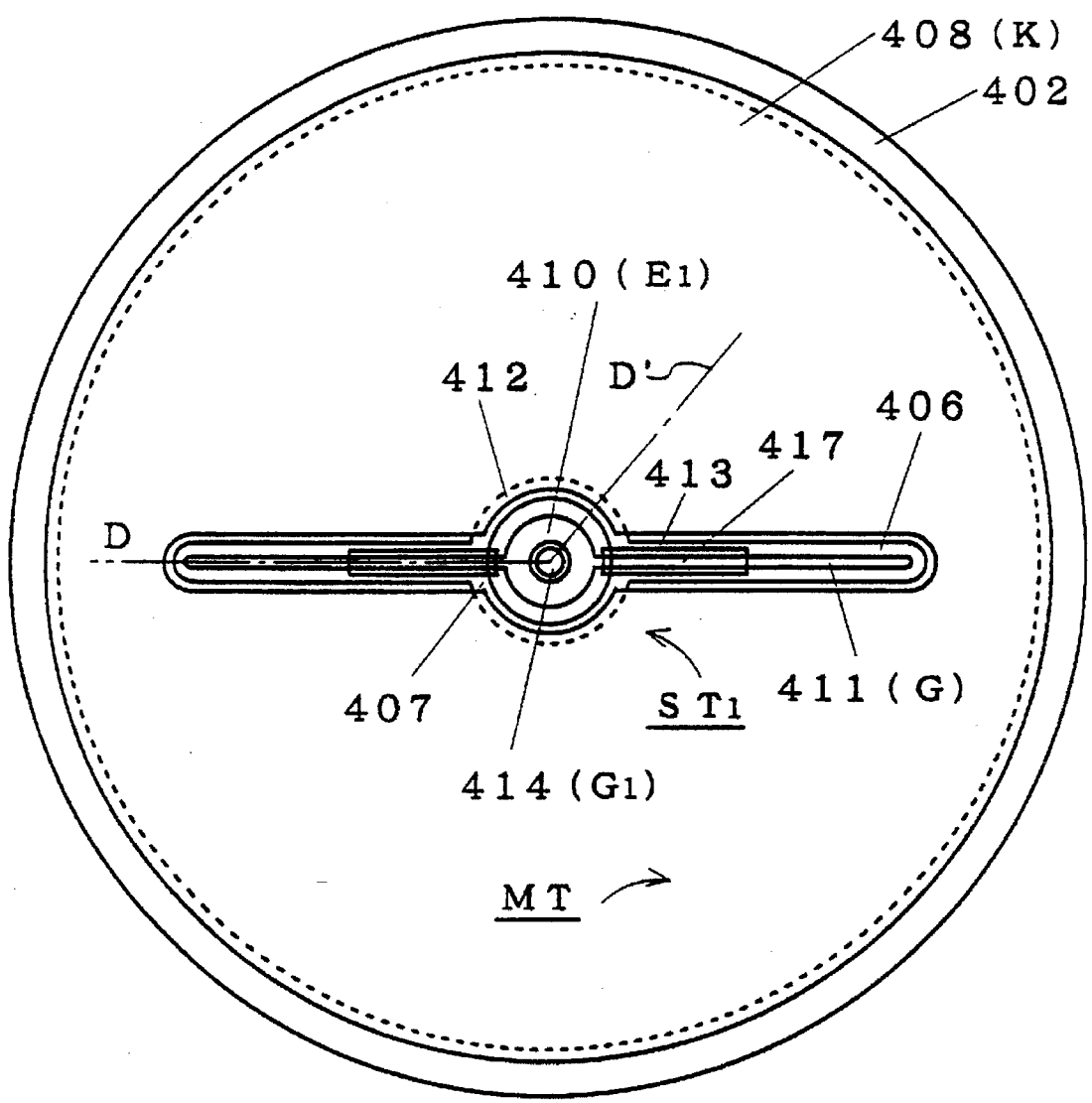
FIG. 19 is a plan view showing an optical thyristor according to a fourth embodiment of the present invention.
Figure 20:
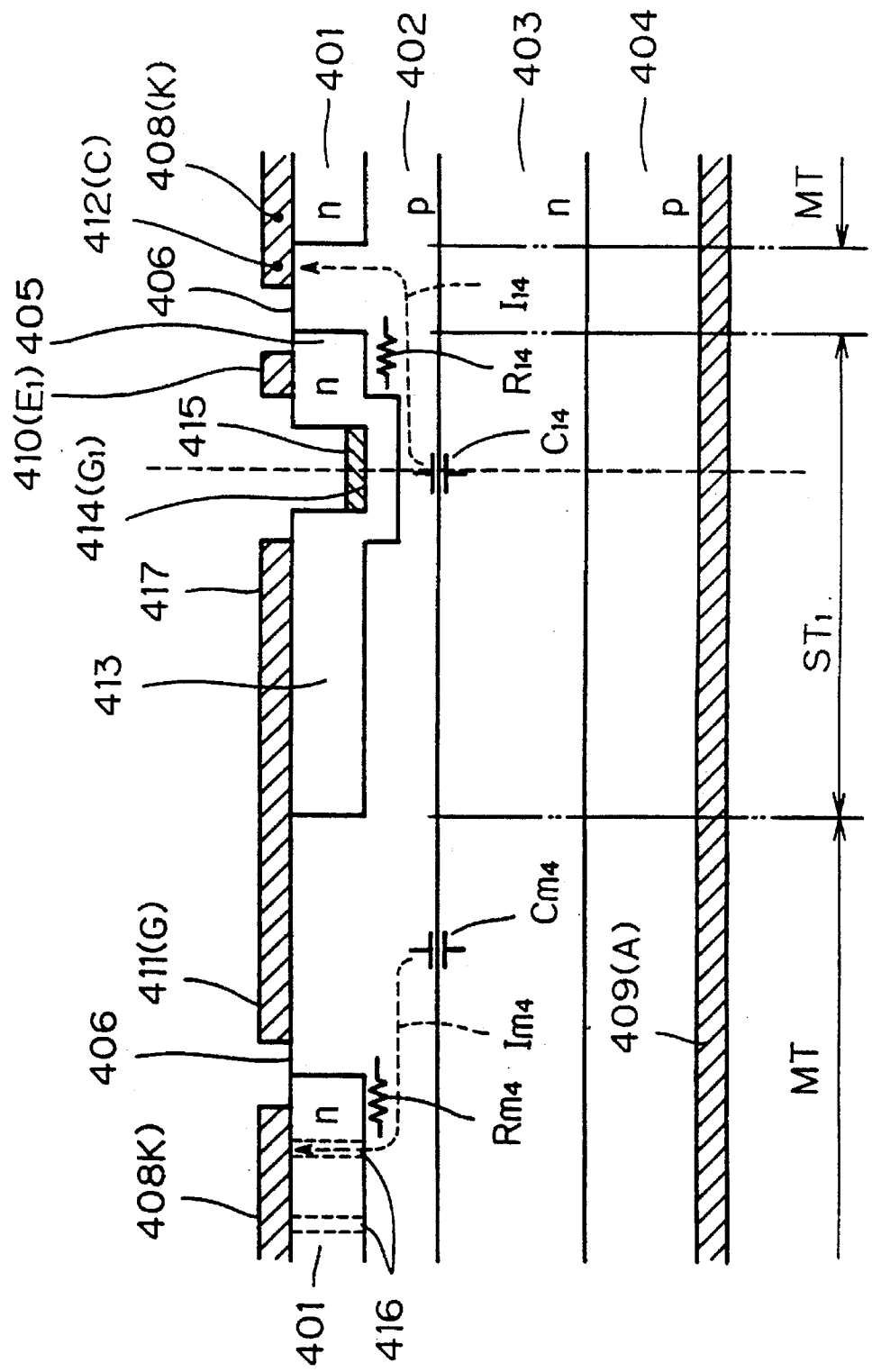
FIG. 20 is a sectional view of the optical thyristor according to the fourth embodiment of the present invention taken along the line D–D' in FIG. 19.
Figure 21:
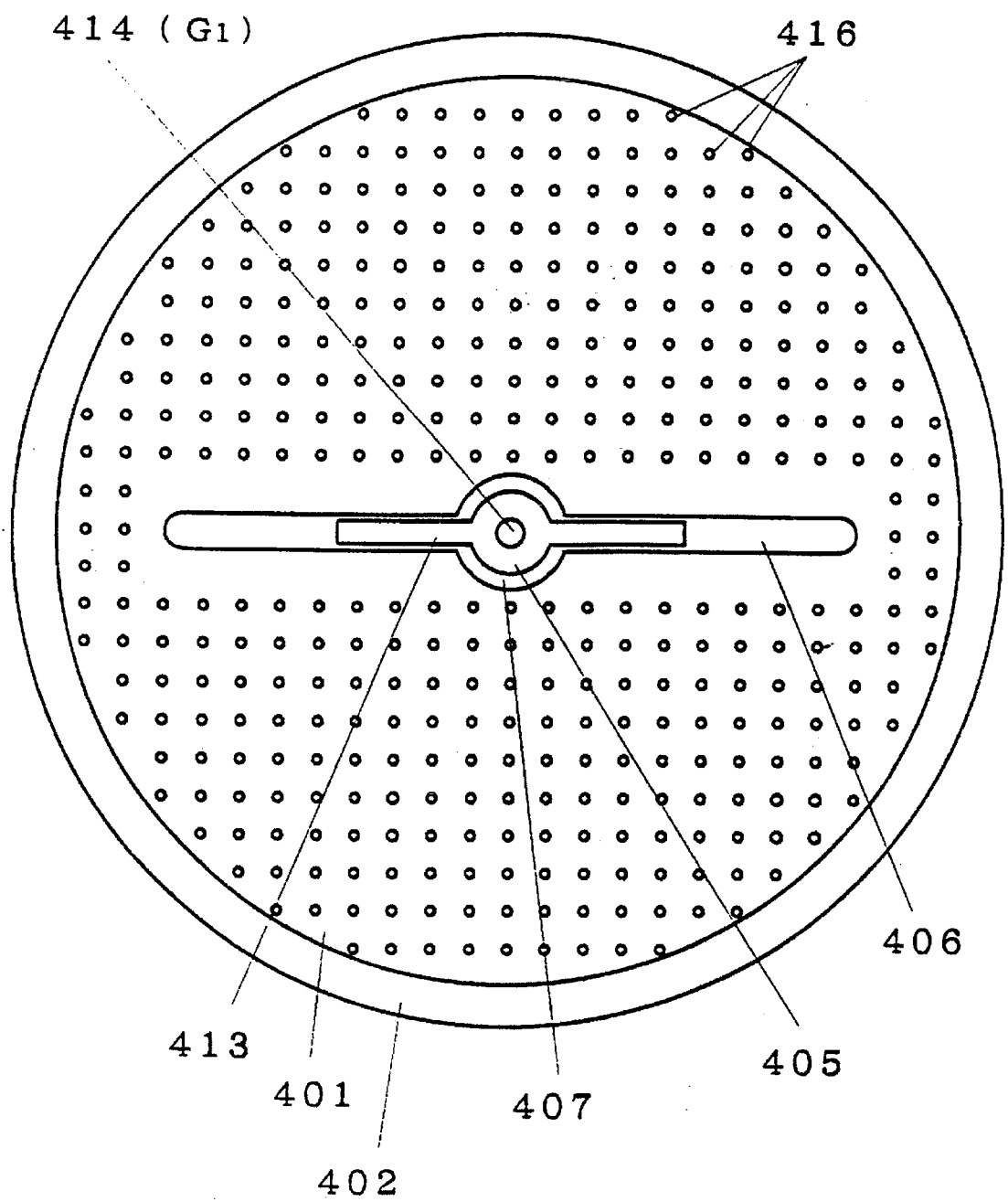
FIG. 21 is a plan view showing the optical thyristor according to the fourth embodiment of the present invention in a state before formation of electrodes.

A fourth embodiment of the present invention is now described. FIGS. 19 to 21, illustrating the structure of an optical thyristor according to this embodiment, are a plan view, a sectional view taken along the line D–D' in FIG. 19, and a plan view showing the thyristor with omission of electrodes respectively.

In this thyristor, an N-type main emitter layer 401, a P-type P base layer 402, an N-type N base layer 403 and a P-type P emitter layer 404 are stackedly formed on a substantially discoidal semiconductor substrate of silicon having a pair of major surfaces, thereby forming a main thyristor MT. An N-type auxiliary emitter layer 405 forms one auxiliary thyristor $ST_1$ with the P base layer 402, the N base layer 403 and the P emitter layer 404. Namely, this thyristor is also a two-stage structure thyristor comprising one-stage auxiliary thyristor $ST_1$ and the main thyristor MT, similarly to the first embodiment.

Further, the auxiliary emitter layer 405 and the main emitter layer 401 are separated from each other through the P base layer 402. The auxiliary emitter layer 405 comprises a circular central portion which is positioned substantially at the center of the semiconductor substrate and an arm portion 413 extending toward the outer periphery. A portion of the P base layer 402 which is adjacent to the outer side of the auxiliary emitter layer 402 extends in two radial directions, to enclose the arm portion 413 in the form of a sheath. The auxiliary emitter layer 405 is provided on its center with a photoreceiving portion 414 which is coated with an antireflection film 415. The thickness of the antireflection film 415 is set similarly to that in the first embodiment.

First and second regions 406 and 407 are defined on an upper major surface of a portion of the P base layer 402 which is held between the auxiliary emitter layer 405 and the main emitter layer 401. The first region 406 is defined in the vicinity of both ends of the P base layer 402, while the second region 407 is defined in the vicinity of the central portion of the auxiliary emitter layer 405. The first and second regions 406 and 407, which are two regions defined on the same P base layer 402, are connected with each other by the P base layer 402. However, the portion of the P base layer 402 connecting these regions with each other extends along the arm portion 413 of the auxiliary emitter layer 405 in the form of a sheath. Therefore, it is possible to readily set the resistance of the P base layer 202 between these regions at a high level as compared with the thyristor according to the second embodiment.

A cathode electrode 408 is electrically in contact with the main emitter layer 401. The main emitter layer 401 is provided therein with a plurality of short-circuiting portions 416 which are in the form of small holes vertically passing through the same, so that the cathode electrode 408 is short-circuited with the P base layer 402 through the short-circuiting portions 416. Portions of the cathode electrode 408 which are in contact with the short-circuiting portions 416 serve as compensation electrodes. An anode electrode 409 is electrically in contact with a lower major surface of the P emitter layer 404. An auxiliary emitter electrode 410 is formed on the auxiliary emitter layer 405, to be electrically in contact with the auxiliary emitter layer 405. Gate electrodes 411 of the main thyristor MT are formed on the first region 406, to be electrically in contact with the first region 406. A compensation electrode 412 which is formed on the second region 407 is electrically in contact with the second region 407, and integrally formed with the cathode electrode 408.

A conductive bridging portion 417 for electrically connecting the auxiliary emitter electrode 410 and the gate electrodes 411 with each other is formed on the arm portion 413 integrally with the auxiliary emitter electrode 410 and the gate electrodes 411. Thus, the auxiliary emitter electrode 410 and the gate electrodes 411 are connected with each other not by wiring materials but by the bridging portion 417 which is integrally formed with the electrodes to be connected with each other, whereby the thyristor is advantageously improved in reliability with no probability for disconnection in the wiring materials and short-circuiting with other portions. Further, it is not necessary to form the bridging portion 417 on an insulating film, whereby no pinhole management of such an insulating film is required and the thyristor is improved in reliability and productivity.

A method of fabricating this optical thyristor is now described. A step of preparing a semiconductor substrate 150 to that of forming metal films 151 and 109 on both sides of the semiconductor substrate (FIG. 8B) are identical to those of the first embodiment. The metal film 109 provided on the lower major surface functions as the anode electrode 409 as such.

Then, the metal film 151 provided on the upper major surface is selectively etched to simultaneously form the cathode electrode 408, the auxiliary emitter electrode 410, the gate electrodes 411, the compensation electrode 412 which is integrated with the cathode electrode 418, and the bridging portion 417 which is integrated with the emitter electrode 410 and the gate electrodes 411 (FIG. 20).

In the method of fabricating the thyristor according to this embodiment, the bridging portion 417 is formed simultaneously with the other electrodes in place of providing aluminum wires or the like after formation of the electrodes and it is not necessary to provide an insulating film between the bridging portion 417 and the semiconductor substrate, whereby the fabrication steps are simplified.

The ordinary operation of this thyristor is similar to that of the second embodiment. Further, a characteristic operation of this thyristor to which a voltage noise having a large dv/dt value is also similar to that of the second embodiment. Due to application of such a voltage noise, displacement currents $I_{14}$ and $I_{m4}$ are generated from capacitances $C_{14}$ and $C_{m4}$ of junctions between the auxiliary emitter layer 405 of the auxiliary thyristor $ST_1$ and the P base layer and between the main emitter layer 401 of the main thyristor MT and the P base layer 402 respectively. These displacement currents $I_{14}$ and $I_{m4}$ pass through the same paths as a photoelectric current and a gate current respectively. Namely, the displacement current $I_{14}$ passes through a portion of the P base layer 402 located immediately under the auxiliary emitter layer 405 and flows toward the compensation electrode 412. On the other hand, the displacement current $I_{m4}$ is not directed to the compensation electrode 411 which is provided in the second region 407 but preferentially flows to the cathode electrode 408 through the short-circuiting portions 416 which are provided in the main emitter layer 401, since the resistance between the first and second regions 406 and 407 is set at a sufficiently high value. These paths are separated from each other. Thus, this thyristor is equivalently expressed by a circuit diagram shown in FIG. 22.

Figure 22:
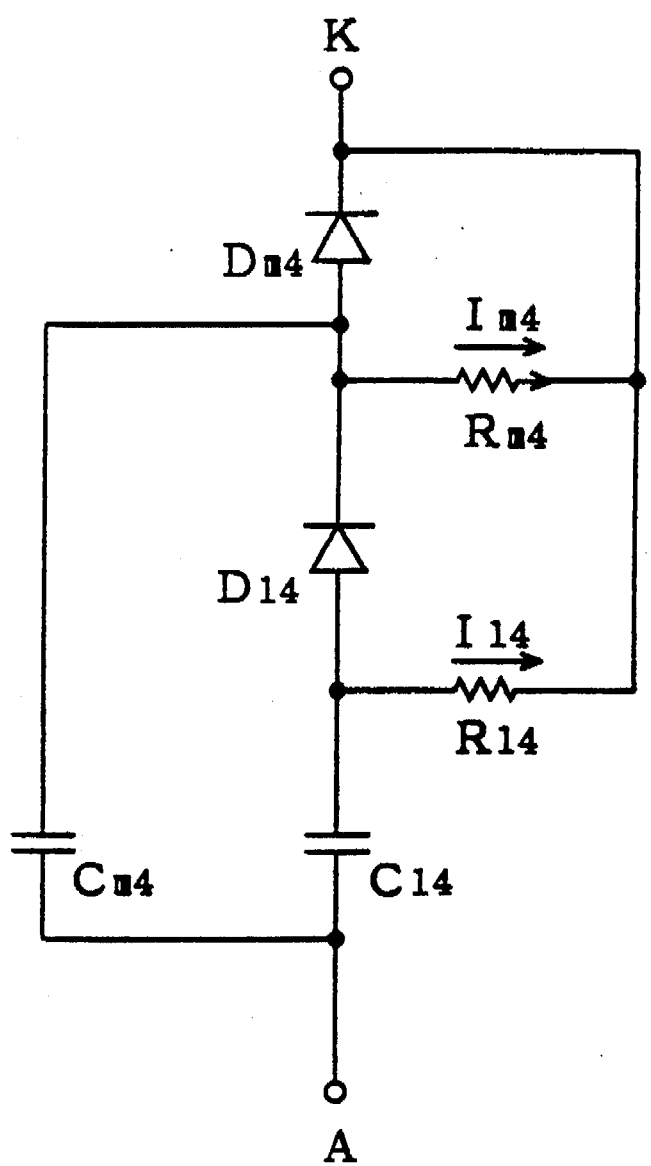
FIG. 22 is an equivalent circuit diagram of the optical thyristor according to the fourth embodiment of the present invention.

Referring to FIG. 22, diodes $D_{14}$ and $D_{m4}$ express the junctions between the auxiliary emitter layer 405 of the auxiliary thyristor $ST_1$ and the P base layer 402 and between the main emitter layer 401 of the main thyristor MT and the P base layer 402 respectively. Resistances $R_{14}$ and $R_{m4}$, which are along the paths of the displacement currents $I_{14}$ and $I_{m4}$ respectively, mainly correspond to transverse resistances of portions of the P base layer 402 which are located immediately under the auxiliary emitter layer 405 and the main emitter layer 401 respectively.

As understood from the circuit diagram of FIG. 22, a forward bias voltage corresponding to the voltage difference $(I_{14} \times R_{14} - I_{m4} \times R_{m4})$ along the paths of the displacement currents $I_{14}$ and $I_{m4}$ is applied across an anode and a cathode of the diode $D_{14}$. Namely, a forward bias voltage for the auxiliary thyristor $ST_1$ which is originally brought by the displacement current $I_{14}$ is attenuated by the displacement current $I_{m4}$. Thus, the auxiliary thyristor $ST_1$ is suppressed from abnormal ignition caused by the displacement current $I_{14}$, whereby the overall thyristor is improved in dv/dt resistance. It is also possible to cancel a forward bias voltage which is applied to the junction of the auxiliary thyristor $ST_1$ by adjusting the resistances $R_{14}$ and $R_{m4}$. In addition, it is possible to decide photosensitivity and dv/dt resistance independently of each other, whereby the dv/dt resistance can be improved without reducing the photosensitivity.

Further, the displacement current $I_{14}$ which is generated in the auxiliary thyristor $ST_1$ will not flow into the short-circuiting portions 416 similarly to the thyristor according to the first embodiment, whereby it is possible to improve di/dt resistance, the turn-on time, the ON-state voltage and surge current resistance.

<Fifth Embodiment>

<5-1. Structure of the Device>

A fifth embodiment of the present invention is now described. In a heavy thyristor having a large diameter, a multistage amplifying gate structure is generally employed in order to improve di/di resistance which is reduced following increase of the diameter and the withstand voltage.

Figure 23:
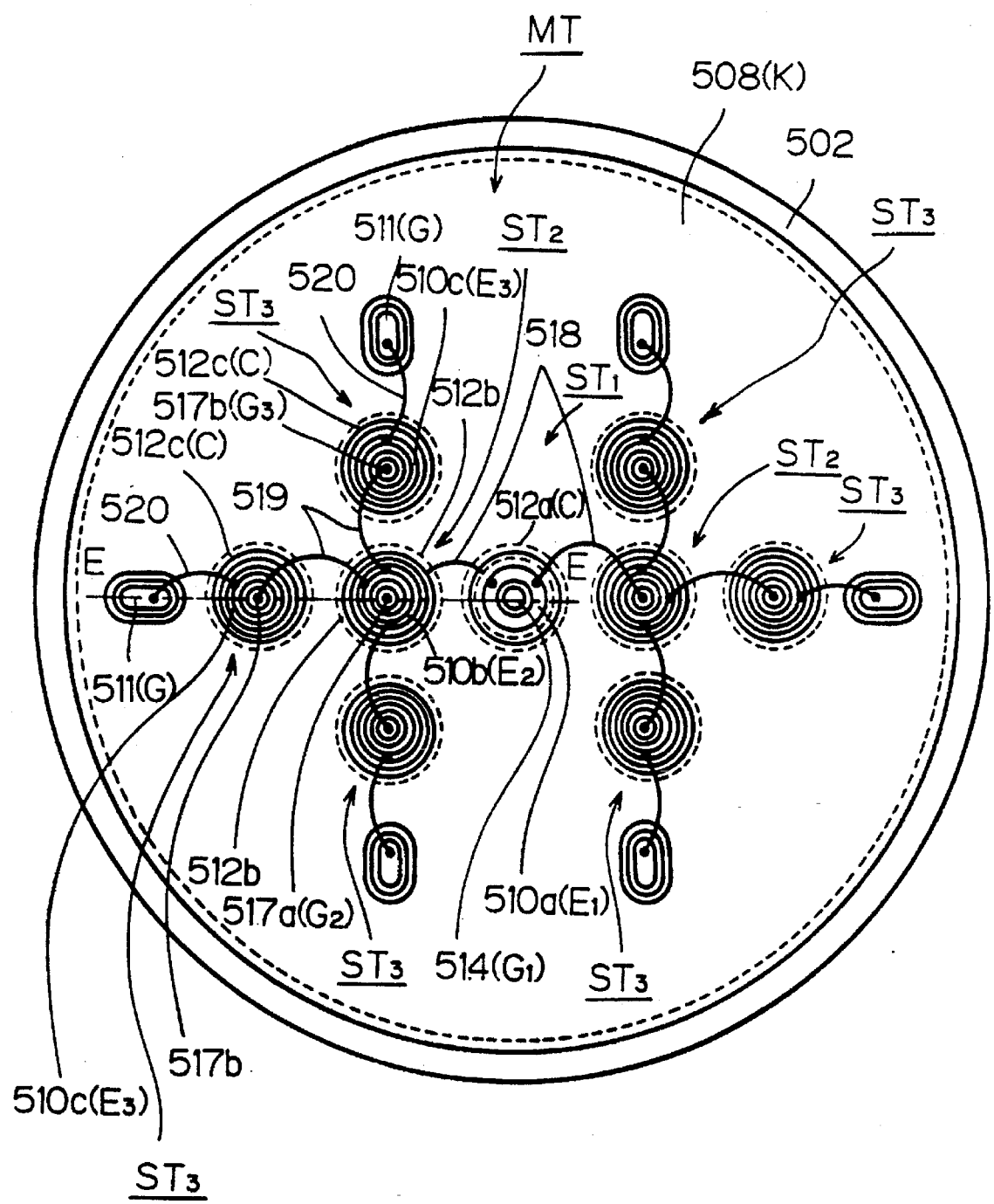
FIG. 23 is a plan view showing an optical thyristor according to a fifth embodiment of the present invention.
Figure 24:
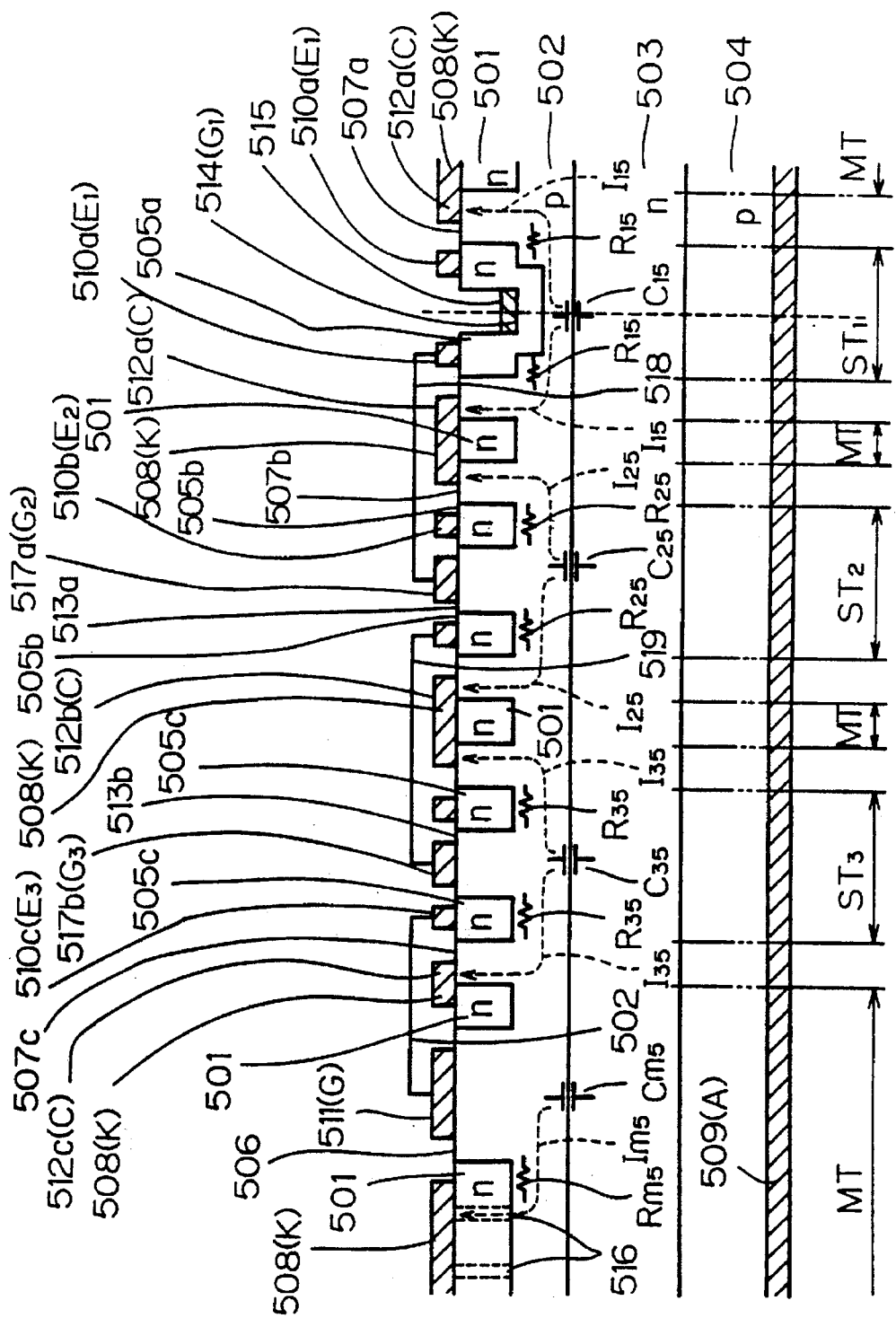
FIG. 24 is a sectional view showing the optical thyristor according to the fifth embodiment of the present invention taken along the line E–E' in FIG. 23.
Figure 25:
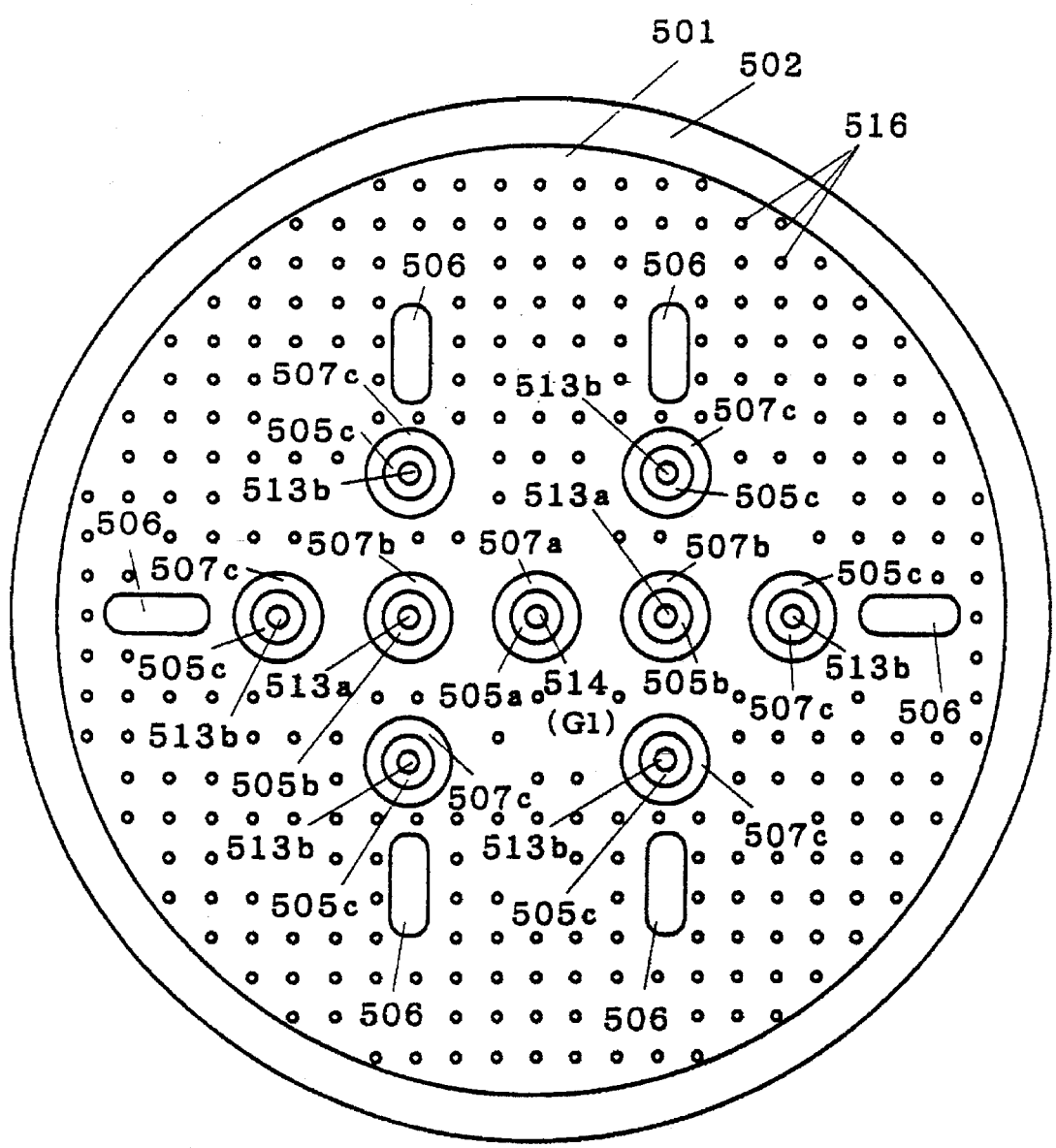
FIG. 25 is a plan view showing the optical thyristor according to the fifth embodiment of the present invention in a state before formation of electrodes.

A thyristor according to this embodiment employs the multistage amplifying gate structure. FIGS. 23 to 25, illustrating the structure of an optical thyristor according to this embodiment, are a plan view, a sectional view taken along the line E–E' in FIG. 23, and a plan view showing the thyristor with omission of electrodes respectively.

In this optical thyristor, an N-type main emitter layer 501, a P-type P base layer 502, an N-type N base layer 503 and a P-type P emitter layer 504 are stackedly formed on a substantially discoidal semiconductor substrate of silicon having a pair of major surfaces, thereby forming a main thyristor MT. A circular N-type auxiliary emitter layer 505a is positioned substantially at the center of the semiconductor substrate, and forms an initial stage auxiliary thyristor $ST_1$ with the P base layer 502, the N base layer 503 and the P emitter layer 504. Annular N-type auxiliary emitter layers 505b and portions 513a of the P base layer 502 which are enclosed with the same form second stage auxiliary thyristors $ST_2$ with the N base layer 503 and the P emitter layer 504. Further, annular N-type auxiliary emitter layers 505c and portions 513b of the P base layer 502 which are enclosed with the same form third stage auxiliary thyristors $ST_3$ with the N base layer 503 and the P emitter layer 504. Namely, this thyristor has a four-stage structure provided with three stage auxiliary thyristors $ST_1$ to $ST_3$ and the main thyristor MT.

The auxiliary emitter layer 505a of the initial stage auxiliary thyristor $ST_1$ is provided on its center with a photoreceiving portion 514. The photoreceiving portion 514 is coated with an antireflection film 515, whose thickness is optimized similarly to that in the first embodiment.

The auxiliary thyristor $ST_1$ is provided on a central portion, the auxiliary thyristors $ST_2$ are provided on two portions around the same while the auxiliary thyristors $ST_3$ are provided on six portions around the same, so that these auxiliary thyristors $ST_1$ to $ST_3$ are enclosed with the main emitter layer 501 of the main thyristor MT independently of each other. Portions of the P base layer 502 which are adjacent to the main emitter layer 501, enclosed with the main emitter layer 501 and exposed on the upper major surface of the semiconductor substrate are formed in four portions as first regions 506. Further, portions enclosing the auxiliary emitter layers 505a, 505b and 505c, which are enclosed with the main emitter layer 501 and annularly exposed on the upper major surface of the semiconductor substrate, are formed as second regions 507a, 507b and 507c. The first and second regions 506, 507a, 507b and 507c are separated from each other by the main emitter layer 501.

A cathode electrode 508 is formed on the upper major surface of the main emitter layer 501, to be electrically connected with the main emitter layer 501. The main emitter layer 501 is provided therein with a plurality of short-circuiting portions 516 in the form of holes vertically passing through the same, so that the cathode electrode 508 is short-circuited with the P base layer 502 through the short-circuiting portions 516. Portions of the cathode electrode 508 which are in contact with the short-circuiting portions 516 serve as compensation electrodes.

An anode electrode 509 is formed on the lower major surface of the P emitter layer 504, to be electrically in contact with the P emitter layer 504. Annular auxiliary emitter electrodes 510a, 510b and 510c are formed on the auxiliary emitter layers 505a, 505b and 505c respectively, to be electrically in contact with the auxiliary emitter layers 505a, 505b and 505c respectively. Gate electrodes 511 of the main thyristor MT are formed on the first regions 506, to be electrically in contact with the first regions 506. Compensation electrodes 512a, 512b and 512c which are annularly formed on the second regions 507a, 507b and 507c respectively are electrically in contact with the second regions 507a, 507b and 507c respectively, and integrally formed with the cathode electrode 508.

Auxiliary gate electrodes 517a and 517b of the auxiliary thyristors $ST_2$ and $ST_3$ are formed on the portions 513a and 513b of the P base layer 502 which are exposed on the major surfaces enclosed with the auxiliary emitter layers 505b and 505c. The auxiliary emitter electrode 510a of the auxiliary thyristor $ST_1$ and the auxiliary gate electrodes 517a of the auxiliary thyristors $ST_2$ are electrically connected with each other through wires 518 such as aluminum wires. Similarly, the auxiliary emitter electrodes 510b of the auxiliary thyristors $ST_2$ and the auxiliary gate electrodes 517b of the auxiliary thyristors $ST_3$ are electrically connected with each other by wires 519 such as aluminum wires. Further, the auxiliary emitter electrodes 510c of the auxiliary thyristors $ST_3$ and the gate electrodes 511 of the main thyristor MT are electrically connected with each other by wires 520 such as aluminum wires.

<5-2. Steps of Fabricating the Device>

A method of fabricating this optical thyristor is now described. A step of preparing a semiconductor substrate 150 to that of forming metal films 151 and 109 on both sides of the semiconductor substrate (FIG. 8B) are identical to those of the first embodiment. The metal film 109 provided on the lower major surface functions as the anode electrode 509 as such.

Then, the metal film 151 (FIG. 8B) provided on the upper major surface is selectively etched to simultaneously form the cathode electrode 508, the auxiliary emitter electrodes 510a to 510c, the auxiliary gate electrodes 517a and 517b, the gate electrodes 511, and the compensation electrodes 512a to 512c enclosing the auxiliary emitter layers 505a to 505c and being integrated with the cathode electrode 508, as shown in FIGS. 23 and 24.

Thereafter the auxiliary emitter electrodes 510a, 510b and 510c and the auxiliary gate electrodes 517a and 517b and the gate electrodes 511 are electrically connected with each other through wiring materials such as aluminum wires respectively, as shown in FIG. 23.

According to this method, the compensation electrodes 512a to 512c are not electrically connected with the cathode electrode 508 by wiring materials but integrally formed with the same, whereby the fabrication steps are advantageously simplified.

<5-3. Ordinary Operation of the Device>

The ordinary operation of this device is now described with reference to FIG. 24. In order to use this device, an external power source is connected to the anode electrode 509 and the cathode electrode 508 of this device, thereby applying a positive voltage across these electrodes. When the photoreceiving portion 514 is irradiated with an optical trigger signal under such application of the positive voltage, a photoelectric current is generated in depletion layer regions provided on both sides of a P-N junction formed between the N base layer 503 and the P base layer 502 of the initial stage auxiliary thyristor $ST_1$, to flow into the P base layer 502. This photoelectric current transversely flows through the P base layer, and thereafter flows into the electrode 512a which is provided on the second region 507a. The path of the photoelectric current is identical to that (shown in FIG. 24) of a displacement current $I_{15}$ described later. The photoelectric current flowing into the compensation electrode 512a further flows to the external power source from the cathode electrode 508.

Consequently, the photoelectric current develops a transverse potential difference in the portion of the P base layer 502 located immediately under the auxiliary emitter layer 505a of the auxiliary thyristor $ST_1$, thereby forward-biasing a P-N junction which is formed between the auxiliary emitter layer 505a of the auxiliary thyristor $ST_1$ and the P base layer 502. When this forward bias voltage approaches the value of a diffusion potential which is specific to the P-N junction, electron injection from the auxiliary emitter layer 505a into the P base layer 502 is abruptly increased to turn on the auxiliary thyristor $ST_1$. The turn-on current for the auxiliary thyristor $ST_1$ flows from the auxiliary emitter electrode 510a to the wires 518 and the auxiliary gate electrodes 517b, thereby being supplied to the portions 513a of the P base layer 502. The turn-on currents supplied to the portions 513a of the P base layer 502 function as gate currents for the auxiliary thyristors $ST_2$.

The gate currents transversely pass through the portions of the P base layer 502 located immediately under the annular auxiliary emitter layers 505b, to flow into the annular compensation electrodes 512b. The gate currents flowing into the compensation electrodes 512b further flow from the cathode electrode 508 to the external power source. Since the gate currents are by far larger than the photoelectric current which is generated in the auxiliary thyristor $ST_1$, high voltages are generated along the paths of the gate currents. Consequently, forward bias voltages of sufficient values are applied to P-N junctions between the auxiliary emitter layers 505b and the P base layer 502, whereby the auxiliary thyristors $ST_2$ are turned on. The turn-on currents for the auxiliary thyristors $ST_2$ flow from the auxiliary emitter electrodes 510b to the wires 518 and the auxiliary gate electrodes 517b, thereby being supplied to the portions 513b of the P base layer 502. The turn-on currents supplied to the portions 513b of the P base layer 502 function as gate currents for the auxiliary thyristors $ST_3$.

Due to the gate currents, the auxiliary thyristors $ST_3$ are turned on by a mechanism which is similar to that for turning on the auxiliary thyristors $ST_2$. The turn-on currents for the auxiliary thyristors $ST_3$ flow from the auxiliary emitter electrodes 510c to the wires 518 and the gate electrodes 511, thereby being supplied to the first regions 506. The turn-on currents supplied to the first regions 506 function as gate currents for the main thyristor MT.

The gate currents supplied to the first regions 506 transversely flow through the P base layer 502 and thereafter pass through the short-circuiting portions 516 provided in the main emitter layer 501, thereby flowing into the cathode electrode 508. These gate currents are those obtained by successively amplifying the photoelectric current which is generated in the auxiliary thyristor $ST_1$ over three stages, whereby large voltages are generated along the paths of the gate currents. Consequently, a forward bias voltage of a sufficient value is applied to the P-N junction between the main emitter layer 501 and the P base layer 502, whereby the main thyristor MT is turned on. Thus, a main current flows from the anode electrode 509 to the cathode electrode 508. Namely, the thyristor conducts.

In order to improve photosensitivity of the thyristor, the transverse resistance of the portion of the P base layer 502 located immediately under the auxiliary emitter layer 505 of the auxiliary thyristor $ST_1$ which is turned on at first may be increased in general. Thus, the voltage generated along the path of the photoelectric current is increased, whereby the auxiliary thyristor $ST_1$ is easily turned on. Namely, the thyristor is improved in photosensitivity.

<5-4. Characteristic Operation of the Device>

Description is now made on an operation of the optical thyristor to which a voltage noise having a large dv/dt value is applied. At this time, displacement currents $I_{15}$, $I_{25}$, $I_{35}$ and $I_{m5}$ are generated by capacitances $C_{15}$, $C_{25}$, $C_{35}$ and $C_{m5}$ of junctions between the auxiliary thyristor $ST_1$ and the P base layer 502, between the auxiliary emitter layers 505b of the auxiliary thyristors $ST_2$ and the P base layer 502, the auxiliary emitter layers 505c of the auxiliary thyristors $ST_3$ and the P base layer 502, and between the main emitter layer 501 of the main thyristor MT and the P base layer 502 respectively.

The displacement current $I_{15}$ which is generated in the auxiliary thyristor $ST_1$ flows into the compensation electrode 512a through the same path as the photoelectric current in the P base layer 502, and thereafter flows into the cathode electrode 508. Due to a resistance $R_{15}$ provided in this path, this displacement current $I_{15}$ develops a transverse potential difference in the portion of the P base layer 502 located immediately under the auxiliary emitter layer 505a. Similarly, the displacement currents $I_{25}$ which are generated in the auxiliary thyristors $ST_2$ flow through the same paths as the gate currents for the auxiliary thyristors $ST_2$ in the P base layer 502 to flow into the compensation electrodes 512b, and thereafter flow to the cathode electrode 508. Due to resistances $R_{25}$ provided in the paths, the displacement currents $I_{25}$ develop transverse potential differences mainly in the portions of the P base layer 502 located immediately under the auxiliary emitter layers 505b. Further, the displacement currents $I_{35}$ which are generated in the auxiliary thyristors $ST_3$ flow through the same paths as the gate currents for the auxiliary thyristors $ST_3$ in the P base layer 502 to flow into the compensation electrodes 512c, and thereafter flow to the cathode electrode 508. Due to resistances $R_{35}$ provided in the paths, the displacement currents $I_{35}$ develop transverse potential differences mainly in the portions of the P base layer 502 located immediately under the auxiliary emitter layers 505c.

Further, the displacement current Imps which is generated in the main thyristor MT flows into the cathode electrode 508 through the same path as the gate current for the main thyristor MT. Due to a resistance $R_{m5}$ provided in this path, the displacement current $I_{m5}$ develops a transverse potential difference in the portion of the P base layer 502 located immediately under the main emitter layer 505 of the main thyristor MT. Thus, the paths of the four types of displacement currents $I_{15}$ to $I_{35}$ and $I_{m5}$ are separated from each other similarly to the paths of the photoelectric current and the respective gate currents, to bring the potential differences based on the resistances $R_{15}$ to $R_{35}$ and $R_{m5}$ which are specific to the paths respectively.

Figure 26:
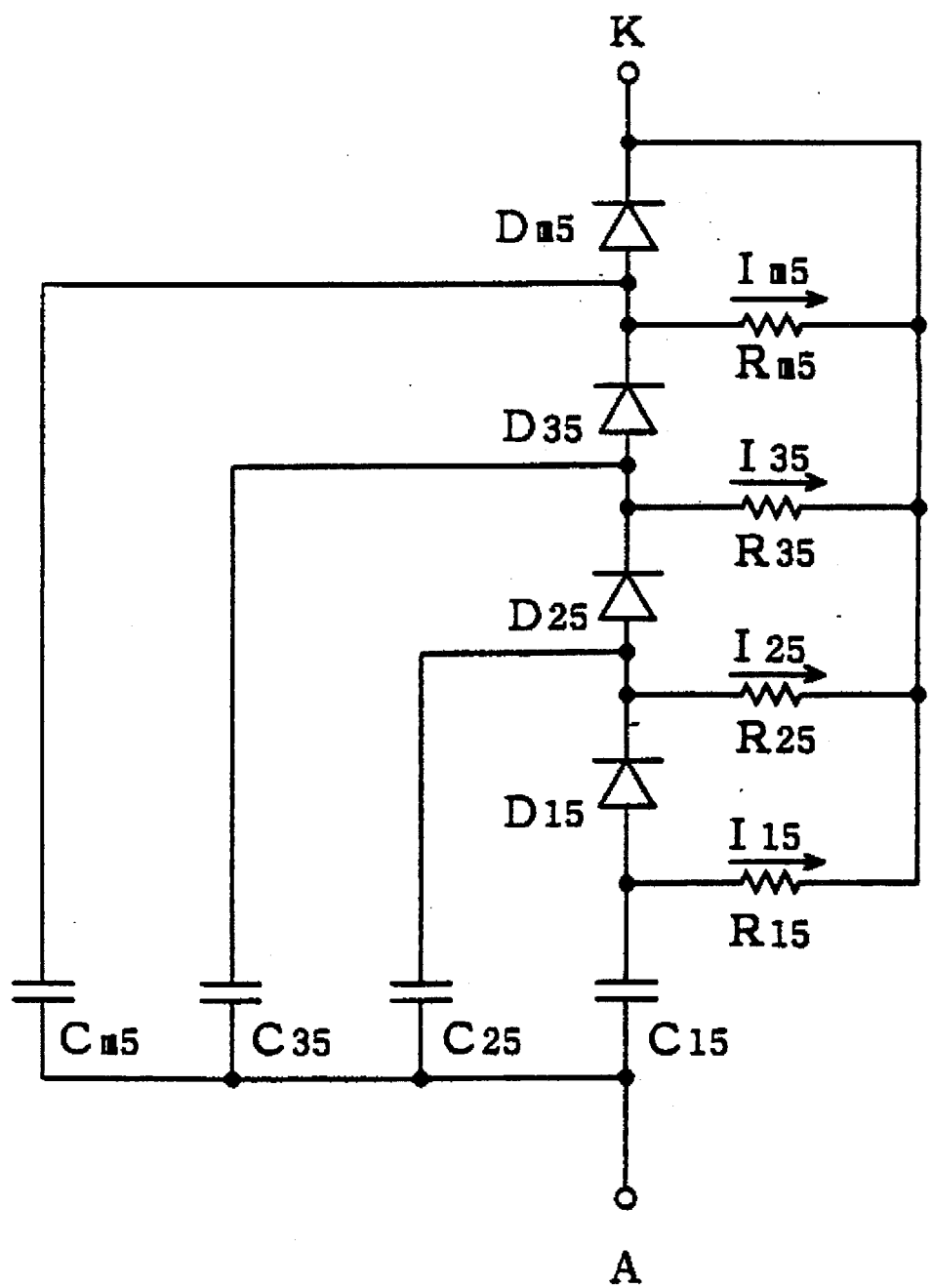
FIG. 26 is an equivalent circuit diagram of the optical thyristor according to the fifth embodiment of the present invention.

FIG. 26 is an equivalent circuit diagram of the thyristor which is related to behavior of the displacement currents $I_{15}$ to $I_{35}$ and $I_{m5}$. Diodes $D_{15}$ to $D_{35}$ equivalently express the junctions between the auxiliary emitter layers 505a to 505c of the auxiliary thyristors $ST_1$ to $ST_3$ and the P base layer 502, while a diode $D_{m5}$ expresses the junction between the main emitter layer 501 of the main thyristor MT and the P base layer 502. The resistances $R_{15}$ to $R_{35}$ and $R_{m5}$, which are along the paths of the displacement currents $I_{15}$ to $I_{35}$ and $I_{m5}$ respectively as hereinabove described, mainly correspond to transverse resistances of the portions of the P base layer 502 located immediately under the auxiliary emitter layers 505a to 505c and the main emitter layer 501 respectively. Single ends of the resistances $R_{15}$ to $R_{35}$ and $R_{m5}$ are short-circuited with the cathode electrode 508 (K) respectively.

A voltage corresponding to the product of the displacement current $I_{15}$ and the resistance $R_{15}$ is applied to an anode of the diode $D_{15}$. However, this voltage is not applied as such across the anode and a cathode of the diode $D_{15}$, i.e., the junction between the auxiliary emitter layer 505a and the P base layer 502, as a forward bias voltage. Since a voltage corresponding to the product of the displacement current $I_{25}$ and the resistance $R_{25}$ is applied to the cathode of the diode $D_{15}$, a forward bias voltage corresponding to the difference $(I_{15} \times R_{15} - I_{25} \times R_{25})$ between the two voltages is applied across the anode and the cathode of the diode $D_{15}$. Namely, the forward bias voltage for the auxiliary thyristor $ST_1$ which is originally brought by the displacement current $I_{15}$ is attenuated by the next stage displacement current $I_{25}$. Thus, the auxiliary thyristor $ST_1$ is suppressed from abnormal ignition caused by the displacement current $I_{12}$.

Similarly, a forward bias voltage corresponding to the voltage difference $(I_{25} \times R_{25} - I_{35} \times R_{35})$ brought by the two displacement currents $I_{25}$ and $I_{35}$ is applied across an anode and a cathode of the diode $D_{25}$. Namely, a forward bias voltage for each auxiliary thyristor $ST_2$ which is originally brought by each displacement current $I_{25}$ is attenuated by the next stage displacement current $I_{35}$. Thus, each auxiliary thyristor $ST_2$ is suppressed from abnormal ignition caused by the displacement current $I_{25}$.

Further, a forward bias voltage corresponding to the voltage difference $(I_{35} \times R_{35} - I_{m5} \times R_{m5})$ brought by the two displacement currents $I_{35}$ and $I_{m5}$ is applied across an anode and a cathode of the diode $D_{35}$. Namely, a forward bias voltage for each auxiliary thyristor $ST_3$ which is originally brought by each displacement current $I_{35}$ is attenuated by the next stage displacement current $I_{m5}$. Thus, each auxiliary thyristor $ST_3$ is suppressed from abnormal ignition caused by the displacement current $I_{35}$.

Thus, all auxiliary thyristors $ST_1$ to $ST_3$ are suppressed from abnormal ignition in this thyristor. Consequently, the overall thyristor is improved in dv/dt resistance.

It is also possible to cancel forward bias voltages which are applied to the junctions of the auxiliary thyristors $ST_1$ to $ST_3$ respectively by adjusting the resistances $R_{15}$ to $R_{35}$ and $R_{m5}$ or the aforementioned transverse resistances forming principal parts thereof.

The parameters deciding the photosensitivity are the value of the photoelectric current and the resistance $R_{15}$ (in other words, the transverse resistance of the portion of the P base layer 502 mainly located immediately under the auxiliary emitter layer 505a), while those deciding the dv/dt resistance are the displacement currents $I_{25}$, $I_{35}$ and $I_{m5}$ and the resistances $R_{25}$, $R_{35}$ and $R_{m5}$ (in other words, the respective transverse resistances of the portions of the P base layer 502 mainly located immediately under the auxiliary emitter layers 505b and 505c and the main emitter layer 501 and the resistances of the short-circuiting portions 516) of the paths thereof. Therefore, it is possible to decide the photosensitivity and the dv/dt resistance independently of each other by adjusting the values of these resistances, thereby improving the dv/dt resistance without reducing the photosensitivity.

In this thyristor, further, the displacement currents $I_{15}$ to $I_{35}$ which are generated in the auxiliary thyristors $ST_1$ to $ST_3$ will not flow into the short- circuiting portions 516 for short-circuiting the cathode electrode 508 and the P base layer 502, whereby the areas of the short-circuiting portions 516 can be reduced. The main thyristor MT can be easily turned on due to such area reduction of the short-circuiting portions 516, whereby a conduction area in the main thyristor MT is quickly increased in the turn-on time. Consequently, di/dt resistance is improved and the turn-on time is reduced. Further, the area of the cathode electrode 508 can be increased due to the area reduction of the short-circuiting portions 516, whereby it is possible to reduce an ON-state voltage and to improve surge current resistance.

Further, the thyristor according to this embodiment is so structured that the two second-stage thyristors $ST_2$ are turned on by the initial stage auxiliary thyristor $ST_1$ and the three third-stage auxiliary thyristors $ST_3$ are turned on by each auxiliary thyristor $ST_2$. Therefore, the turn-on currents are effectively amplified through the stages. Further, the turn-on currents for the final stage auxiliary thyristors $ST_3$ are supplied to the plurality of gate electrodes 511 which are sprinkled in the main emitter layer 501 as trigger currents for the main thyristor MT. Thus, the main thyristor MT is simultaneously ignited as a whole, whereby the conduction area of the main thyristor MT in the turn-on time is quickly increased. This also contributes to improvement of the di/dt resistance.

<Sixth Embodiment>

Figure 27:
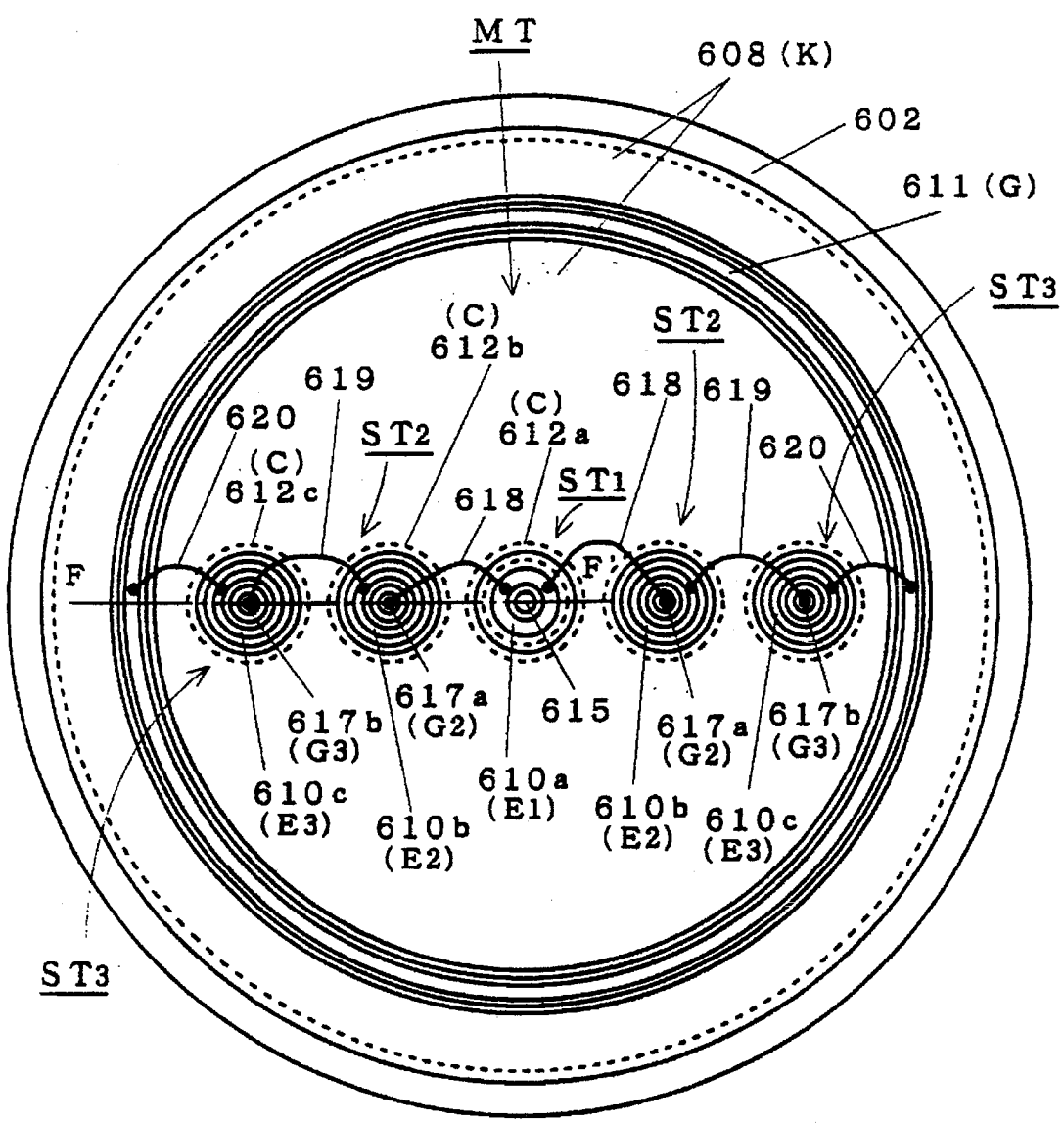
FIG. 27 is a plan view showing an optical thyristor according to a sixth embodiment of the present invention.
Figure 28:
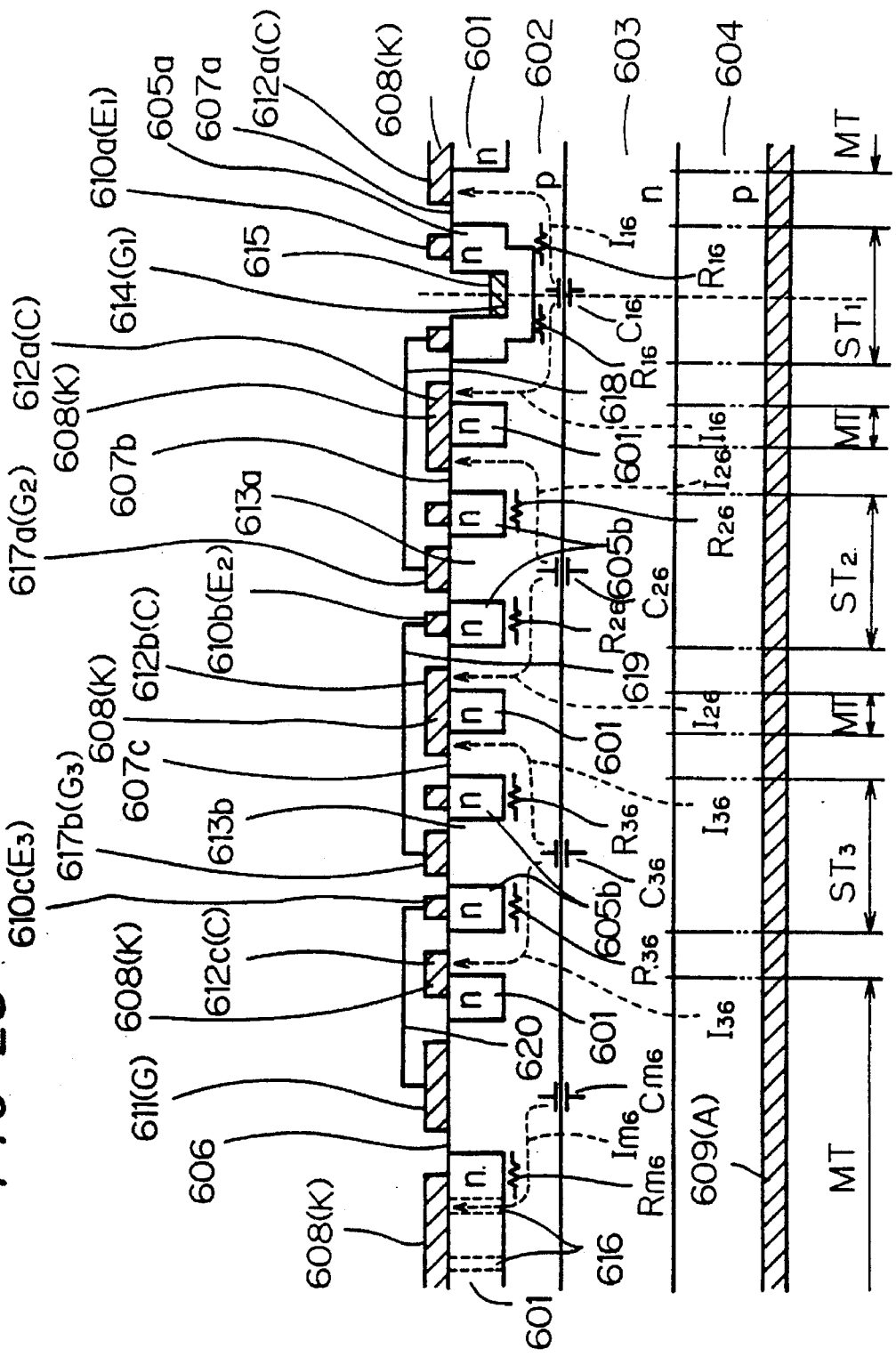
FIG. 28 is a sectional view showing the optical thyristor according to the sixth embodiment of the present invention taken along the line F–F' in FIG. 27.
Figure 29:
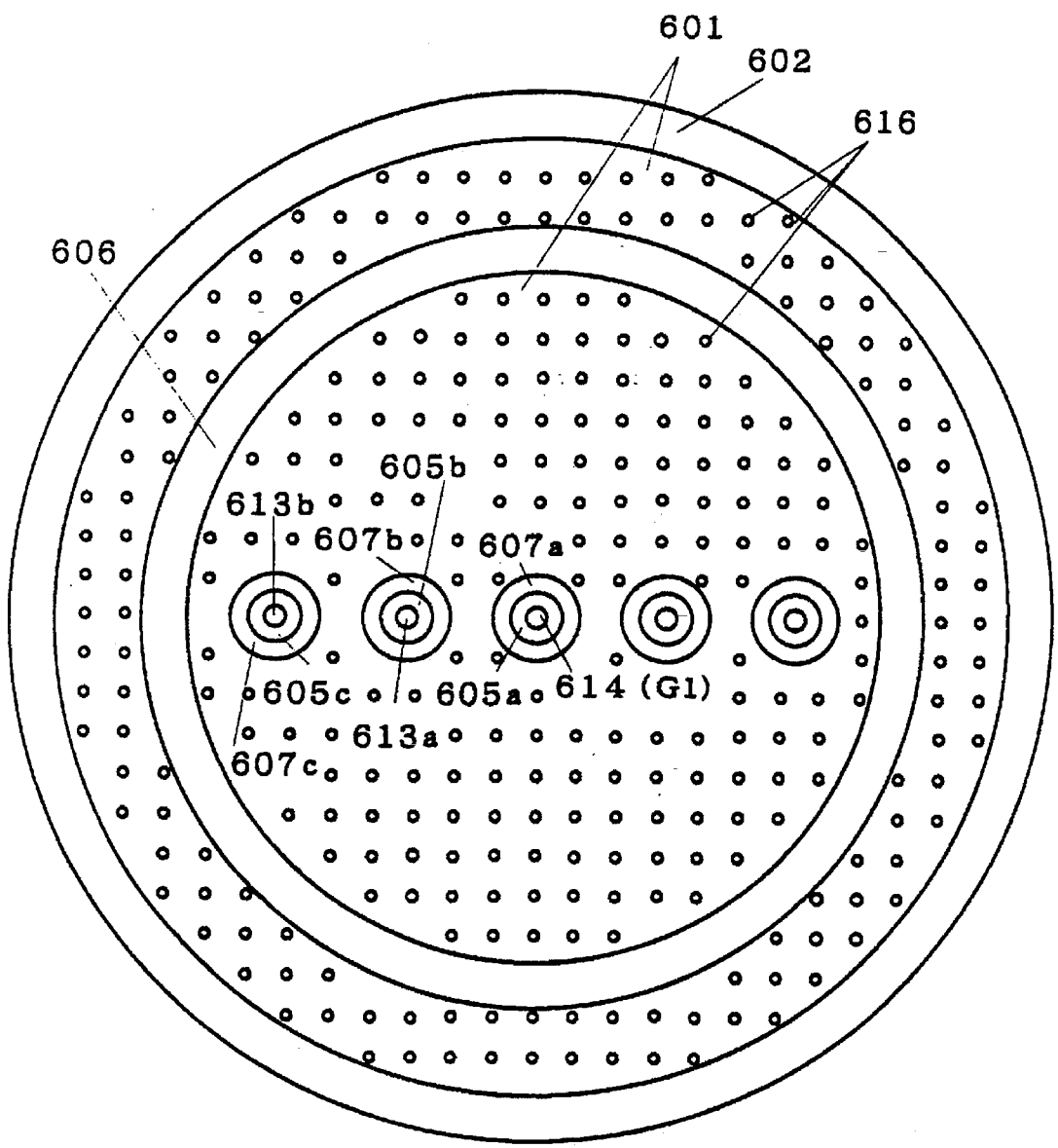
FIG. 29 is a plan view showing the optical thyristor according to the sixth embodiment of the present invention taken in a state before formation of electrodes.

A sixth embodiment of the present invention is now described. FIGS. 27 to 29, illustrating the structure of an optical thyristor according to this embodiment, are a plan view, a sectional view taken along the line F-F' in FIG. 27, and a plan view showing the thyristor with omission of electrodes respectively.

In this optical thyristor, an N-type main emitter layer 601, a P-type P base layer 602, an N-type N base layer 603 and a P-type P emitter layer 604 are stackedly formed on a substantially discoidal semiconductor substrate of silicon having a pair of major surfaces, thereby forming a main thyristor MT. A circular N-type auxiliary emitter layer 605a is positioned substantially at the center of the semiconductor substrate, and forms an initial stage auxiliary thyristor $ST_1$ with the P base layer 602, the N base layer 603 and the P emitter layer 604. Annular N-type auxiliary emitter layers 605b and portions 613a of the P base layer 602 which are enclosed with the same form second stage auxiliary thyristors $ST_2$ with the N base layer 603 and the P emitter layer 604. Further, annular N-type auxiliary emitter layers 605c and portions 613b of the P base layer 602 which are enclosed with the same form third stage auxiliary thyristors $ST_3$ with the N base layer 603 and the P emitter layer 604. Namely, this thyristor has a four-stage structure provided with three stage auxiliary thyristors $ST_1$ to $ST_3$ and the main thyristor MT, similarly to the fifth embodiment.

The auxiliary emitter layer 605a of the initial stage auxiliary thyristor $ST_1$ is provided on its center with a photoreceiving portion 614. The photoreceiving portion 614 is coated with an antireflection film 615, whose thickness is optimized similarly to that in the first embodiment.

The auxiliary thyristor $ST_1$ is provided on a central portion, the auxiliary thyristors $ST_2$ are provided on two portions around the same while the auxiliary thyristors $ST_3$ are provided on two portions around the same, so that these auxiliary thyristors $ST_1$ to $ST_3$ are enclosed with the main emitter layer 601 of the main thyristor MT independently of each other. A portion of the P base layer 602 dividing the main emitter layer 601 into inner and outer regions and being exposed on the upper major surface of the semiconductor substrate is annularly formed as a first region 606. The auxiliary emitter layers $ST_1$ to $ST_3$ are arranged in the inner region.

Further, portions of the P base layer 602 enclosing the auxiliary emitter layers 605a, 605b and 605c, which are enclosed with the main emitter layer 601 and annularly exposed on the upper major surface of the semiconductor substrate, are formed as second regions 607a, 607b and 607c. The first and second regions 606, 607a, 607b and 607c are separated from each other by the main emitter layer 601.

A cathode electrode 608 is formed on the upper major surface of the main emitter layer 601, to be electrically in contact with the main emitter layer 601. The main emitter layer 601 is provided therein with a plurality of short-circuiting portions 616 in the form of holes vertically passing through the same, so that the cathode electrode 608 is short-circuited with the P base layer 602 through the short-circuiting portions 616. Portions of the cathode electrode 608 which are in contact with the short-circuiting portions 616 serve as compensation electrodes.

An anode electrode 609 is formed on the lower major surface of the P emitter layer 604, to be electrically in contact with the P emitter layer 604. Annular auxiliary emitter electrodes 610a, 610b and 610c are formed on the auxiliary emitter layers 605a, 605b and 605c respectively, to be electrically in contact with the auxiliary emitter layers 605a, 605b and 605c respectively. An annular gate electrode 611 of the main thyristor MT is formed on the first region 606, to be electrically in contact with the first region 606. Compensation electrodes 612a, 612b and 612c which are annularly formed on the second regions 607a, 607b and 607c respectively are electrically in contact with the second regions 607a, 607b and 607c respectively, and integrally formed with the cathode electrode 608.

Auxiliary gate electrodes 617a and 617b of the auxiliary thyristors $ST_2$ and $ST_3$ are formed on the portions 613a and 613b of the P base layer 602 which are exposed on the major surfaces enclosed with the auxiliary emitter layers 605b and 605c respectively. The auxiliary emitter electrode 610a of the auxiliary thyristor $ST_1$ and the auxiliary gate electrodes 617a of the auxiliary thyristors $ST_2$ are electrically connected with each other through wires 618 such as aluminum wires. Similarly, the auxiliary emitter electrodes 610b of the auxiliary thyristors $ST_2$ and the auxiliary gate electrodes 617b of the auxiliary thyristors $ST_3$ are electrically connected with each other by wires 619 such as aluminum wires. Further, the auxiliary emitter electrodes 610c of the auxiliary thyristors $ST_3$ and the gate electrode 611 of the main thyristor MT are electrically connected with each other by wires 620 such as aluminum wires.

The annular first region 606 is formed to have an inner diameter which is about ⅓ to ⅔ of the maximum outer diameter of the main emitter layer 601 having a substantially circular outer periphery. When the ratio of the two diameters is in this range, it is possible to obtain preferable characteristics such that the overall main thyristor MT is quickly ignited, as described later.

This thyristor can be fabricated by steps which are similar to those of the method of fabricating the thyristor according to the fifth embodiment except that the auxiliary emitter layers 605a to 605c and the main emitter layer 601 are different in shape from those of the fifth embodiment, and hence redundant description as to the fabrication method is omitted.

The ordinary operation of this thyristor is now described. Description is omitted as to operating parts which are in common with those of the fifth embodiment. In this thyristor, turn-on currents for the final stage two (plural) auxiliary thyristors $ST_3$ are supplied to the annularly formed serial gate electrode 611 as gate currents. Even if the final stage plural auxiliary thyristors $ST_3$ are dispersed in turn-on characteristics, therefore, the gate currents for the main thyristor MT are uniformly supplied along the overall periphery of the annular gate electrode 611 with no influence by such dispersion. Consequently, the main thyristor MT is stabilized in turn-on characteristics.

In this thyristor, further, the first region 606 is formed to have an inner diameter which is ⅓ to ⅔ of the maximum outer diameter of the main emitter layer 601 having a substantially circular outer periphery as hereinabove described, whereby the distances between the gate electrode 611 to the outer periphery of the main thyristor MT and between the gate electrode 611 and the central portion of the main thyristor MT are substantially equal to each other. Therefore, the overall area of the main thyristor MT advantageously enters a conducting state in a short time. Thus, the conduction area of the main thyristor MT is quickly increased in the turn-on time, whereby the thyristor is advantageously improved in di/dt resistance and reduced in turn-on time.

Description is now made on a characteristic operation of the optical thyristor to which a voltage noise having a large dv/dt value is applied. Upon application of such a voltage noise, displacement currents $I_{16}$, $I_{26}$, $I_{36}$ and $I_{m6}$ are generated by capacitances $C_{16}$, $C_{26}$, $C_{36}$ and $C_{m6}$ of the junctions between the auxiliary emitter layer 605a of the auxiliary thyristor $ST_1$ and the P base layer 602, between the auxiliary emitter layers 605b of the auxiliary thyristors $ST_2$ and the P base layer 602, between the auxiliary emitter layers 605c of the auxiliary thyristors $ST_3$ and the P base layer 602 and between the main emitter layer 601 of the main thyristor MT and the P base layer 602 respectively.

The displacement current $I_{16}$ flows through the same path as the photoelectric current in the P base layer 602, while the displacement currents $I_{26}$, $I_{36}$ and $I_{m6}$ flow through the same paths as the gate currents for the auxiliary thyristors $ST_2$ and $ST_3$ and the main thyristor MT respectively. Thus, the paths of the four displacement currents $I_{16}$ to $I_{36}$ and $I_{m6}$ are separated from each other similarly to the paths of the photoelectric current and the respective gate currents. Further, the displacement currents $I_{16}$ to $I_{36}$ and $I_{m6}$ bring potential differences based on resistances $R_{16}$ to $R_{36}$ and $R_{m6}$ which are specific to the respective paths, along these paths.

Figure 30:
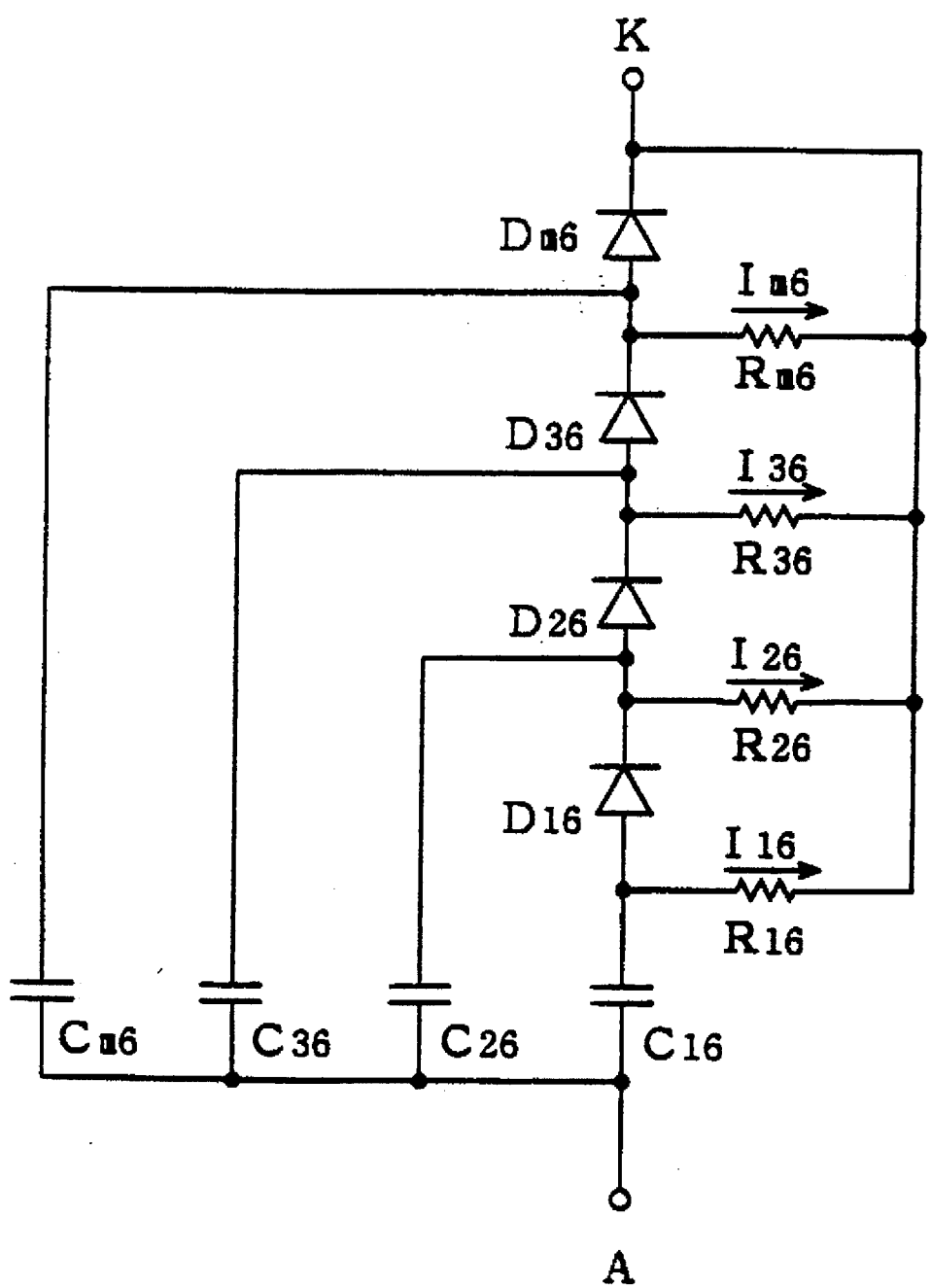
FIG. 30 is an equivalent circuit diagram of the optical thyristor according to the sixth embodiment of the present invention.

FIG. 30 is an equivalent circuit diagram which is related to behavior of the displacement currents $I_{16}$ to $I_{36}$ and $I_{m6}$. Diodes $D_{16}$ to $D_{36}$ equivalently express junctions between the auxiliary emitter layers 605a to 605c of the auxiliary thyristors $ST_1$ to $ST_3$ and the P base layer 602, while a diode $D_{m6}$ expresses the junction between the main emitter layer 601 of the main thyristor MT and the P base layer 602. The resistances $R_{16}$ to $R_{36}$ and $R_{m6}$, which are along the paths of the displacement currents $I_{16}$ to $I_{36}$ and $I_{m6}$ respectively as hereinabove described, mainly correspond to transverse resistances of the portions of the P base layer 602 which are located immediately under the auxiliary emitter layers 605a to 605c and the main emitter layer 601 respectively. Single ends of the resistances $R_{16}$ to $R_{36}$ and $R_{m6}$ are short-circuited with the cathode electrode 608 (K) respectively.

In the circuit of this thyristor which is equivalently expressed by the circuit diagram shown in FIG. 30, forward bias voltages for the auxiliary thyristors $ST_1$ to $ST_3$ which are originally brought by the displacement currents $I_{16}$ to $I_{36}$ generated in the auxiliary thyristors $ST_1$ to $ST_3$ are attenuated by the displacement currents which are generated in the next stages respectively, similarly to the thyristor according to the fifth embodiment. Therefore, all auxiliary thyristors $ST_1$ to $ST_3$ are suppressed from abnormal ignition, whereby the thyristor is improved in dv/dt resistance. Further, it is also possible to cancel forward bias voltages which are applied to the junctions of the auxiliary thyristors $ST_1$ to $ST_3$ respectively by adjusting the resistances $R_{16}$ to $R_{36}$ and $R_{m6}$ or the aforementioned transverse resistances forming principal parts thereof.

Similarly to the thyristor according to the fifth embodiment, further, it is possible to decide photosensitivity and dv/dt resistance independently of each other by adjusting the resistances $R_{16}$ to $R_{36}$ and $R_{m6}$, thereby improving the dv/dt resistance without reducing the photosensitivity. In addition, the displacement currents $I_{16}$ to $I_{36}$ which are generated in the auxiliary thyristors $ST_1$ to $ST_3$ will not flow into the short-circuiting portions 616 in this thyristor, whereby it is possible to improve di/dt resistance, the turn-on time, the ON-state voltage, and surge current resistance.

<Seventh Embodiment>

Figure 31:
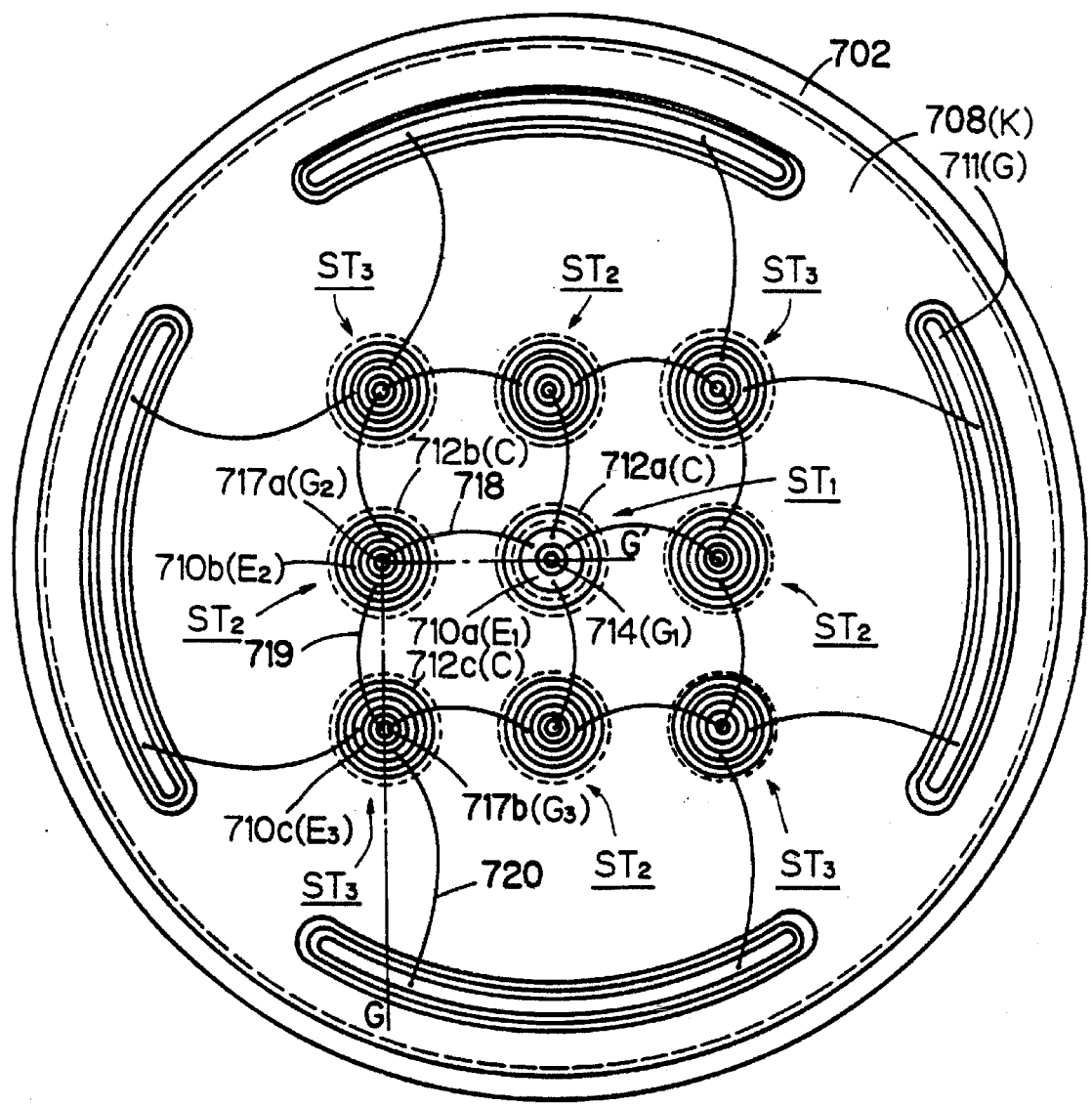
FIG. 31 is a plan view showing an optical thyristor according to a seventh embodiment of the present invention.
Figure 32:
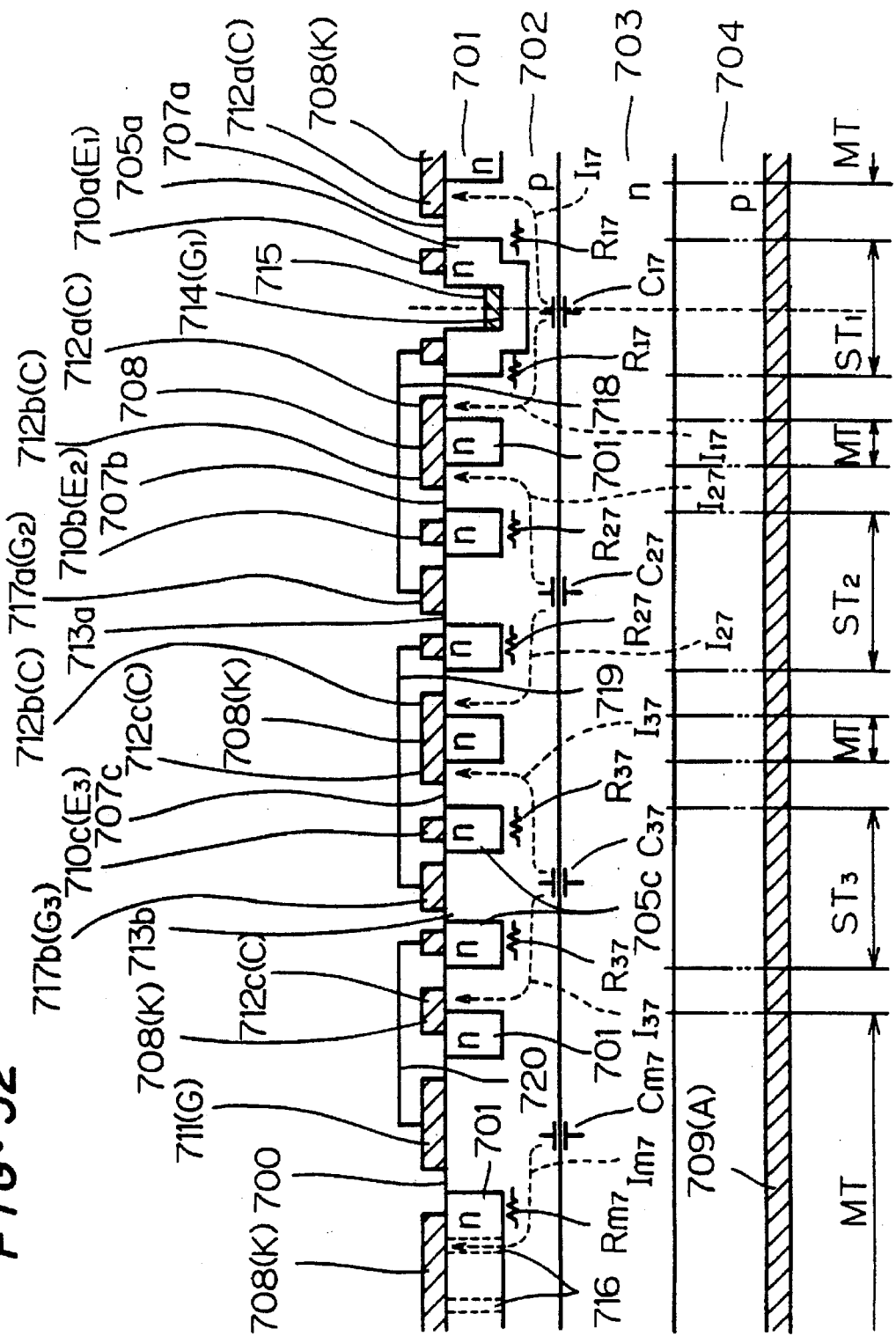
FIG. 32 is a sectional view showing the optical thyristor according to the seventh embodiment of the present invention taken along the line G–G' in FIG. 31.
Figure 33:
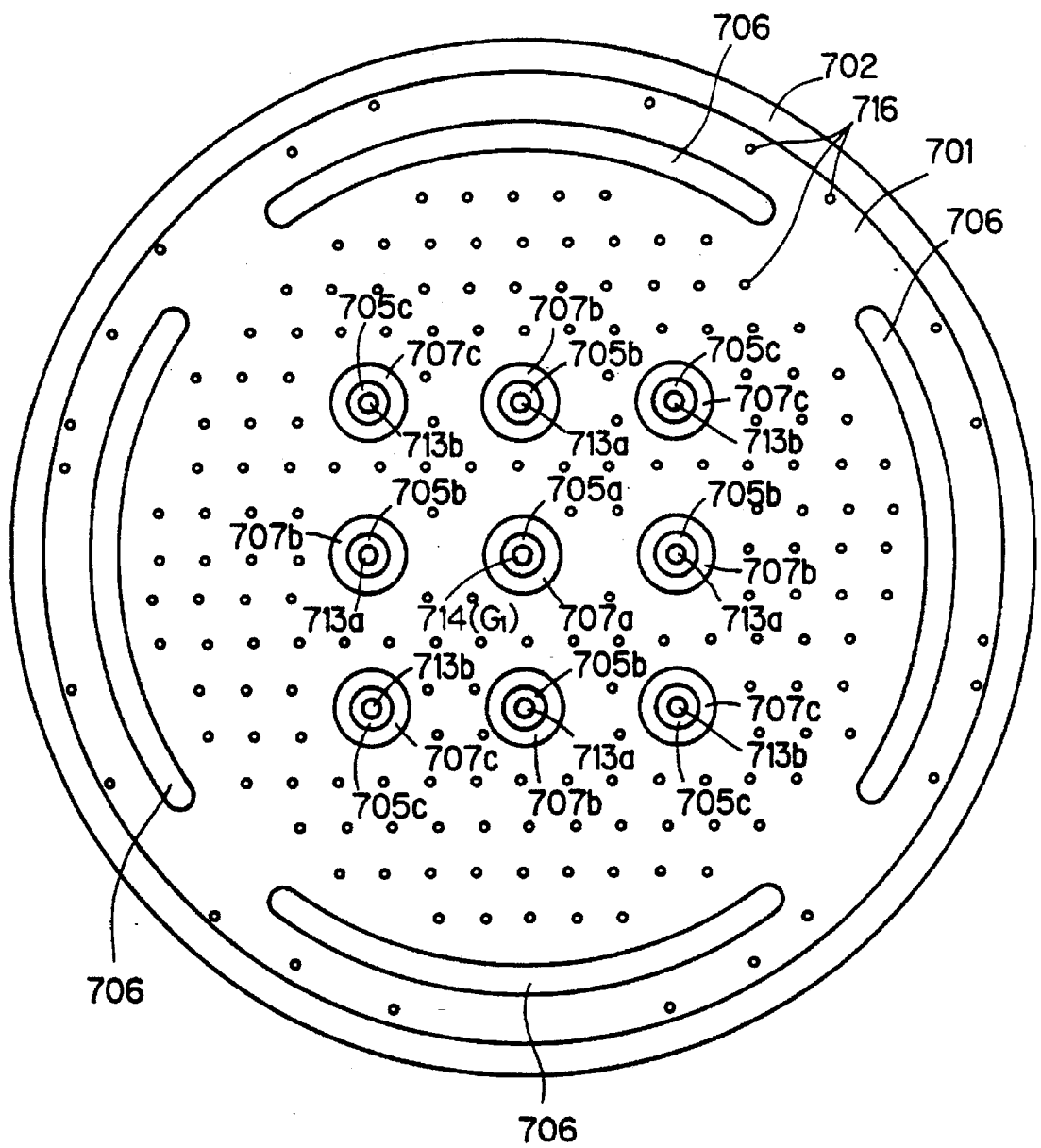
FIG. 33 is a plan view showing the optical thyristor according to the seventh embodiment of the present invention in a state before formation of electrodes.

A seventh embodiment of the present invention is now described. FIGS. 31 to 33, illustrating the structure of an optical thyristor according to this embodiment, are a plan view, a sectional view taken along the line G-G' in FIG. 31, and a plan view showing the thyristor with omission of electrodes respectively.

In this optical thyristor, an N-type main emitter layer 701, a P-type P base layer 702, an N-type N base layer 703 and a P-type P emitter layer 704 are stackedly formed on a substantially discoidal semiconductor substrate of silicon having a pair of major surfaces, thereby forming a main thyristor MT. A circular N-type auxiliary emitter layer 705a is positioned substantially at the center of the semiconductor substrate, and forms an initial stage auxiliary thyristor $ST_1$ with the P base layer 702, the N base layer 703 and the P emitter layer 704. Annular N-type auxiliary emitter layers 705b and portions 713a of the P base layer 702 which are enclosed with the same form second stage auxiliary thyristors $ST_2$ with the P base layer 702, the N base layer 703 and the P emitter layer 704. Further, annular N-type auxiliary emitter layers 705c and portions 713b of the P base layer 702 which are enclosed with the same form third stage auxiliary thyristors $ST_3$ with the P base layer 702, the N base layer 703 and the P emitter layer 704. Namely, this thyristor has a four-stage structure provided with three stage auxiliary thyristors $ST_1$ to $ST_3$ and the main thyristor MT, similarly to the fifth embodiment.

The auxiliary emitter layer 705a of the initial stage auxiliary thyristor $ST_1$ is provided on its center with a photoreceiving portion 714. The photoreceiving portion 714 is coated with an antireflection film 715, whose thickness is optimized similarly to that in the first embodiment.

The auxiliary thyristor $ST_1$ is provided on a central portion, the auxiliary thyristors $ST_2$ are provided on four portions around the same while the auxiliary thyristors $ST_3$ are provided on four portions around the same, so that these auxiliary thyristors $ST_1$ to $ST_3$ are enclosed with the main emitter layer 701 of the main thyristor MT independently of each other. Portions of the P base layer 702 which are adjacent to the main emitter layer 701, enclosed and exposed on the upper major surface of the semiconductor substrate are formed on four portions around the auxiliary thyristors $ST_1$ to $ST_3$ as first regions 706.

Further, portions enclosing the auxiliary emitter layers 705a, 705b and 705c, which are enclosed with the main emitter layer 701 and annularly exposed on the upper major surface of the semiconductor substrate, are formed as second regions 707a, 707b and 707c. The first and second regions 706, 707a, 707b and 707c are separated from each other by the main emitter layer 701.

A cathode electrode 708 is formed on the upper major surface of the main emitter layer 701, to be electrically in contact with the main emitter layer 701. The main emitter layer 701 is provided therein with a plurality of short-circuiting portions 716 in the form of holes vertically passing through the same, so that the cathode electrode 708 is short-circuited with the P base layer 702 through the short-circuiting portions 716. Portions of the cathode electrode 708 which are in contact with the short-circuiting portions 716 serve as compensation electrodes.

An anode electrode 709 is formed on the lower major surface of the P emitter layer 704, to be electrically in contact with the P emitter layer 704. Annular auxiliary emitter electrodes 710a, 710b and 710c are formed on the auxiliary emitter layers 705a, 705b and 705c respectively, to be electrically in contact with the auxiliary emitter layers 705a, 705b and 705c respectively. Annular gate electrodes 711 of the main thyristor MT are formed on the first region 706, to be electrically in contact with the first region 706. Compensation electrodes 712a, 712b and 712c which are annularly formed on the second regions 707a, 707b and 707c respectively are electrically in contact with the second regions 707a, 707b and 707c respectively, and integrally formed with the cathode electrode 708.

Auxiliary gate electrodes 717a and 717b of the auxiliary thyristors $ST_2$ and $ST_3$ are formed on the portions 713a and 713b of the P base layer 702 which are exposed on the major surfaces enclosed with the auxiliary emitter layers 705b and 705c respectively. The auxiliary emitter electrode 710a of the auxiliary thyristor $ST_1$ and the auxiliary gate electrodes 717a of the auxiliary thyristors $ST_2$ are electrically connected with each other through wires 718 such as aluminum wires. Similarly, the auxiliary emitter electrodes 710b of the auxiliary thyristors $ST_2$ and the auxiliary gate electrodes 717b of the auxiliary thyristors $ST_3$ are electrically connected with each other by wires 719 such as aluminum wires. Further, the auxiliary emitter electrodes 710c of the auxiliary thyristors $ST_3$ and the gate electrodes 711 of the main thyristor MT are electrically connected with each other by wires 720 such as aluminum wires.

This thyristor can be fabricated by steps which are similar to those of the method of fabricating the thyristor according to the fifth embodiment except that the auxiliary emitter layers 705a to 705c and the main emitter layer 701 are different in shape from those of the fifth embodiment, and hence redundant description as to the fabrication method is omitted.

The ordinary operation of this thyristor is now described. Description is omitted as to operating parts which are in common with those of the fifth embodiment. In this thyristor, the auxiliary gate electrodes 717a of the four second stage auxiliary thyristors $ST_2$ are connected to the auxiliary emitter electrode 710a of the single initial stage auxiliary thyristor $ST_1$, and each of the auxiliary gate electrodes 717b of the third stage auxiliary thyristors $ST_3$ is connected to the auxiliary gate electrodes 717a of two (plural) second stage auxiliary thyristors $ST_2$, as shown in FIG. 31. Further, the auxiliary emitter electrodes 710c of two (plural) third stage (final stage) auxiliary thyristors $ST_3$ are connected to each gate electrode 711 of the main thyristor MT.

Due to this structure, it is possible to integrate a plurality of amplification paths employing the respective auxiliary thyristors having different turn-on characteristics by the final stage auxiliary thyristors $ST_3$ in the amplification paths as well as by the gate electrodes 711. Thus, it is possible to reduce or eliminate inequality of the turn-on characteristics between the respective amplification paths. Thus, the turn-on characteristics of the main thyristor MT are further stabilized, while it is possible to implement improvement in di/dt resistance and reduction of the turn-on time.

Description is now made on a characteristic operation of the optical thyristor to which a voltage noise having a large dv/dt value is applied. Upon application of such a voltage noise, displacement currents $I_{17}$, $I_{27}$, $I_{37}$ and $I_{m7}$ are generated by capacitances $C_{17}$, $C_{27}$, $C_{37}$ and $C_{m7}$ of the junctions between the auxiliary emitter layer 705a of the auxiliary thyristor $ST_1$ and the P base layer 702, between the auxiliary emitter layers 705b of the auxiliary thyristors $ST_2$ and the P base layer 702, between the auxiliary emitter layers 705c of the auxiliary thyristors $ST_3$ and the P base layer 702 and between the main emitter layer 701 of the main thyristor MT and the P base layer 702 respectively.

The displacement current $I_{17}$ flows through the same path as the photoelectric current in the P base layer 702, while the displacement currents $I_{27}$, $I_{37}$ and $I_{m7}$ flow through the same paths as the gate currents for the auxiliary thyristors $ST_2$ and $ST_3$ and the main thyristor MT respectively. Thus, the paths of the four displacement currents $I_{17}$ to $I_{37}$ and $I_{m7}$ are separated from each other similarly to the paths of the photoelectric current and the respective gate currents. Further, the displacement currents $I_{17}$ to $I_{37}$ and $I_{m7}$ bring potential differences based on resistances $R_{17}$ to $R_{37}$ and $R_{m7}$ which are specific to the respective paths, along these paths.

Figure 34:
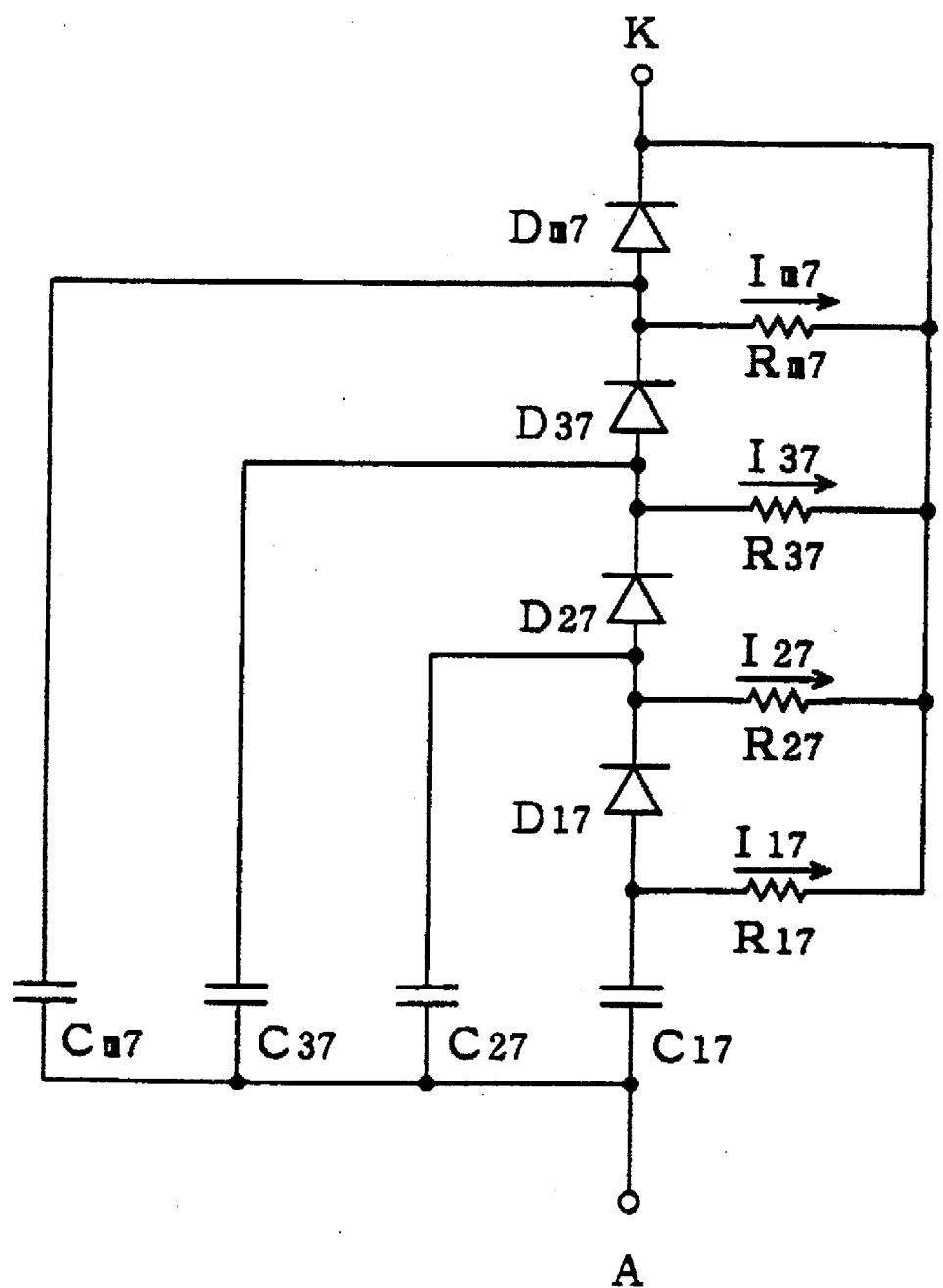
FIG. 34 is an equivalent circuit diagram of the optical thyristor according to the seventh embodiment of the present invention.

FIG. 34 is an equivalent circuit diagram which is related to behavior of the displacement currents $I_{17}$ to $I_{37}$ and $I_{m7}$. Diodes $D_{17}$ to $D_{37}$ equivalently express the junctions between the auxiliary emitter layers 705a to 705c of the auxiliary thyristors $ST_1$ to $ST_3$ and the P base layer 702, while a diode $D_{m7}$ expresses the junction between the main emitter layer 701 of the main thyristor MT and the P base layer 702. The resistances $R_{17}$ to $R_{37}$ and $R_{m7}$, which are along the paths of the displacement currents $I_{17}$ to $I_{37}$ and $I_{m7}$ respectively as hereinabove described, mainly correspond to transverse resistances of the portions of the P base layer 702 located immediately under the auxiliary emitter layers 705a to 705c and the main emitter layer 701 respectively. Single ends of the resistances $R_{17}$ to $R_{37}$ and $R_{m7}$ are short-circuited with the cathode electrode 708 (K) respectively.

In the circuit of this thyristor which is equivalently expressed by the circuit diagram shown in FIG. 34, forward bias voltages for the auxiliary thyristors $ST_1$ to $ST_3$ which are originally brought by the displacement currents $I_{17}$ to $I_{37}$ generated in the auxiliary thyristors $ST_1$ to $ST_3$ are attenuated by the displacement currents which are generated in the next stages respectively, similarly to the thyristor according to the fifth embodiment. Therefore, all auxiliary thyristors $ST_1$ to $ST_3$ are suppressed from abnormal ignition, whereby the thyristor is improved in dv/dt resistance. Further, it is also possible to cancel forward bias voltages which are applied to the junctions of the auxiliary thyristors $ST_1$ to $ST_3$ respectively by adjusting the resistances $R_{17}$ to $R_{37}$ and $R_{m7}$ or the aforementioned transverse resistances forming principal parts thereof.

Similarly to the thyristor according to the fifth embodiment, further, it is possible to decide photosensitivity and dr/dr resistance independently of each other by adjusting the resistances $R_{17}$ to $R_{37}$ and $R_{m7}$, thereby improving the dv/dt resistance without reducing the photosensitivity. In addition, the displacement currents $I_{17}$ to $I_{37}$ which are generated in the auxiliary thyristors $ST_1$ to $ST_3$ will not flow into the short-circuiting portions 716 similarly to the thyristor according to the fifth embodiment, whereby it is possible to improve di/dt resistance, the turn-on time, the ON-state voltage, and surge current resistance.

<Eighth Embodiment>

Figure 35:
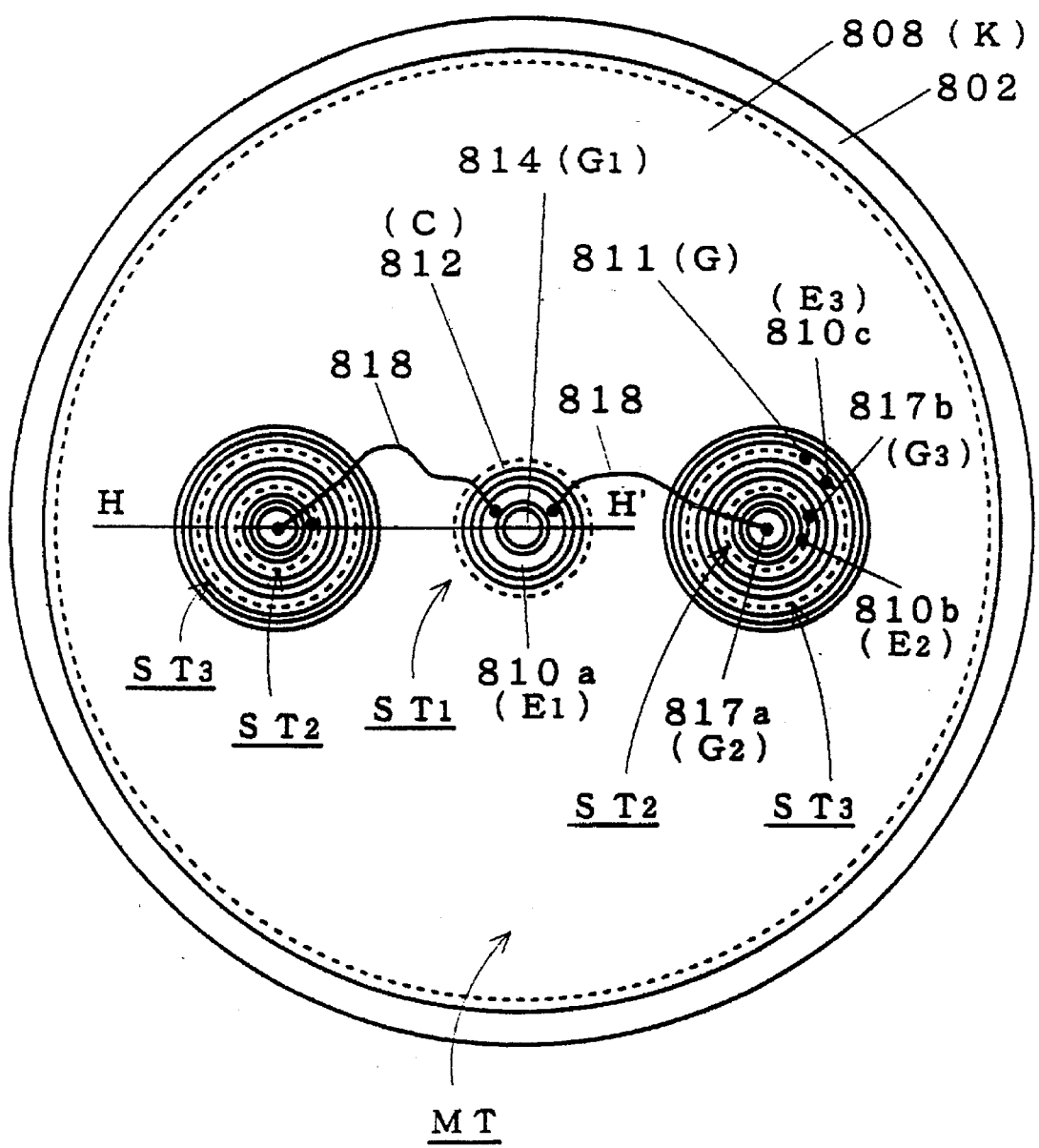
FIG. 35 is a plan view showing an optical thyristor according to an eighth embodiment of the present invention.
Figure 36:
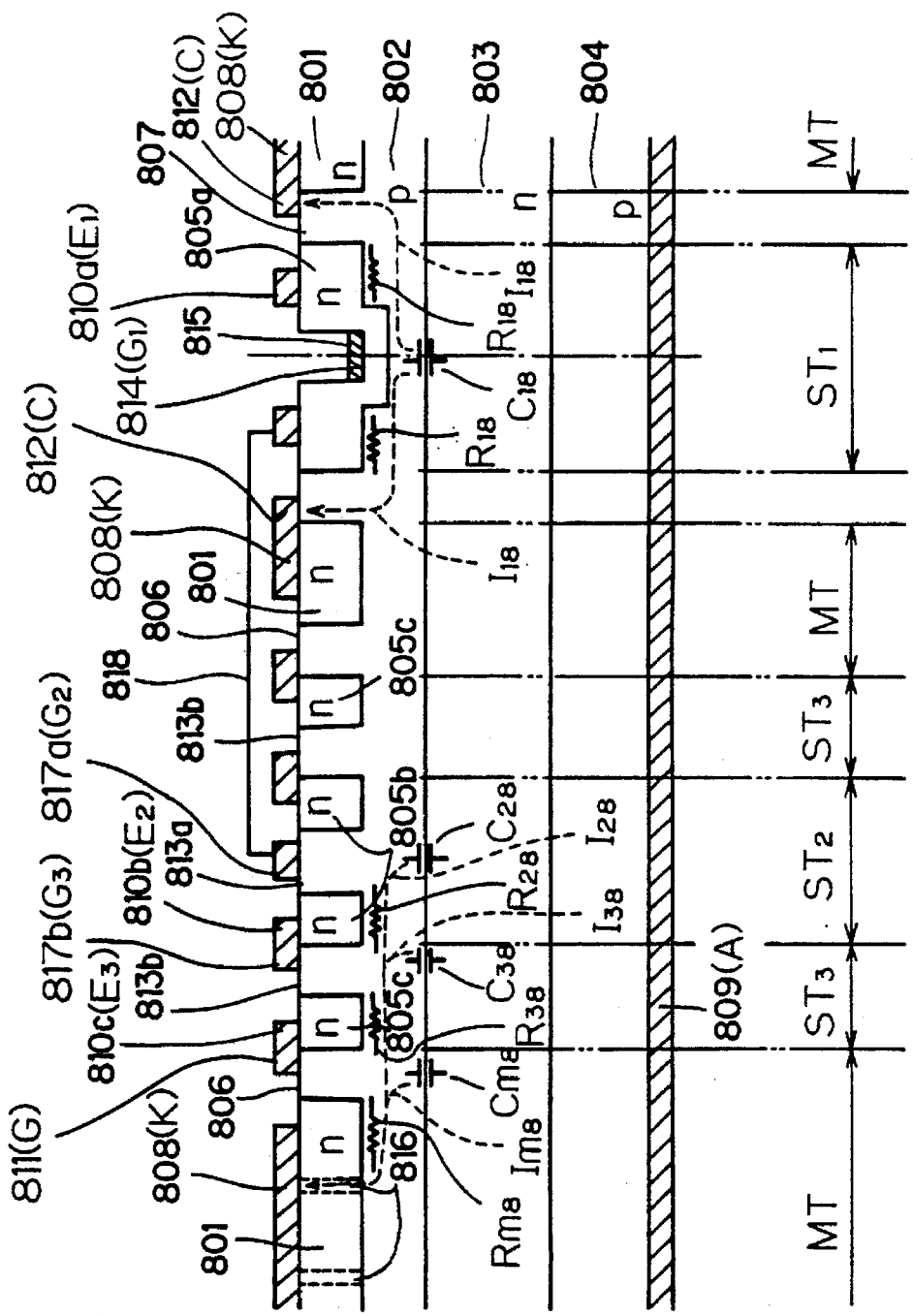
FIG. 36 is a sectional view showing the optical thyristor according to the eighth embodiment of the present invention taken along the line H–H' in FIG. 35.
Figure 37:
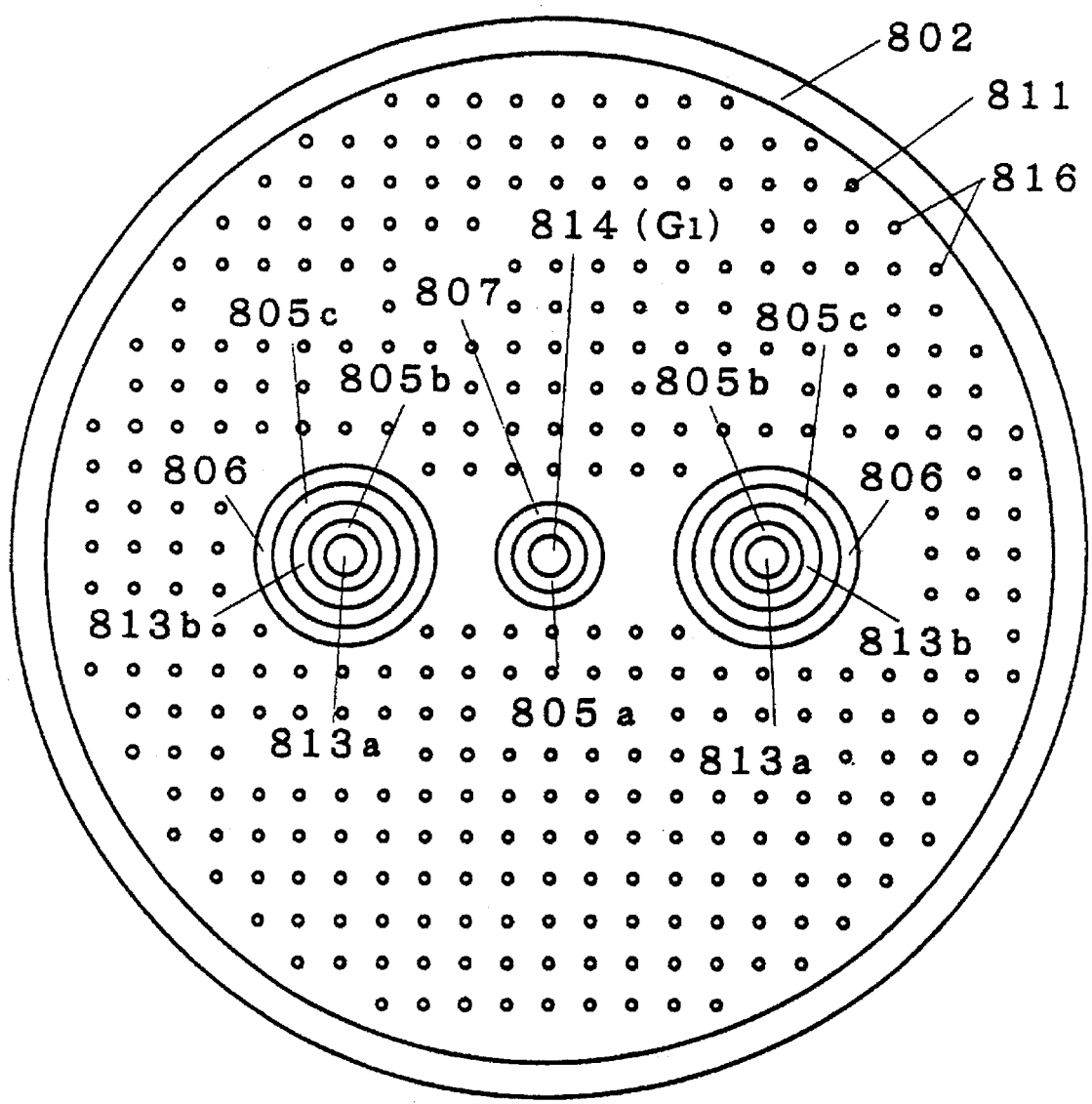
FIG. 37 is a plan view showing the optical thyristor according to the eighth embodiment of the present invention in a state before formation of electrodes.

An eighth embodiment of the present invention is now described. FIGS. 35 to 37, illustrating the structure of an optical thyristor according to this embodiment, are a plan view, a sectional view taken along the line H-H' in FIG. 35, and a plan view showing the thyristor with omission of electrodes respectively.

In this optical thyristor, an N-type main emitter layer 801, a P-type P base layer 802, an N-type N base layer 803 and a P-type P emitter layer 804 are stackedly formed on a substantially discoidal semiconductor substrate of silicon having a pair of major surfaces, thereby forming a main thyristor MT. A circular N-type auxiliary emitter layer 805a is positioned substantially at the center of the semiconductor substrate, and forms an initial stage auxiliary thyristor $ST_1$ with the P base layer 802, the N base layer 803 and the P emitter layer 804. Annular N-type auxiliary emitter layers 805b and portions 813a of the P base layer 802 which are enclosed with the same form second stage auxiliary thyristors $ST_2$ with the P base layer 802, the N base layer 803 and the P emitter layer 804. Further, annular N-type auxiliary emitter layers 805c and portions 813b of the P base layer 802 which are enclosed with the same form third stage auxiliary thyristors $ST_3$ with the P base layer 803, the N base layer 803 and the P emitter layer 804. Namely, this thyristor has a four-stage structure provided with three stage auxiliary thyristors $ST_1$ to $ST_3$ and the main thyristor MT, similarly to the fifth embodiment.

The auxiliary emitter layer 805a of the initial stage auxiliary thyristor $ST_1$ is provided on its center with a photoreceiving portion 814. The photoreceiving portion 814 is coated with an antireflection film 815, whose thickness is optimized similarly to that in the first embodiment.

The portions 813b of the P base layer 802 of the auxiliary thyristors $ST_3$ are annular and enclose the auxiliary emitter layers 805b of the auxiliary thyristors $ST_2$. Namely, the two auxiliary thyristors $ST_2$ and $ST_3$ are in such double structures that the latter enclose the former. The auxiliary thyristor $ST_1$ is provided on a central portion, while the auxiliary thyristors $ST_2$ and the auxiliary thyristors $ST_3$ enclosing the same are provided on two portions around the auxiliary thyristor $ST_1$. Further, the auxiliary thyristors $ST_1$ and $ST_3$ are so provided that the same are enclosed with the main emitter layer 801 of the main thyristor MT independently of each other. Annular portions of the P base layer 802 are formed between the main emitter layer 801 and the auxiliary emitter layers 805c as first regions 806, to be annularly exposed on the upper major surface of the semiconductor substrate.

Further, annular portions of the P base layer 802 are formed between the auxiliary emitter layers 805a and the main emitter layer 801 as second regions 807, and annularly exposed on the upper major surface of the semiconductor substrate. The first and second regions 806 and 807 are separated from each other by the main emitter layer 801.

A cathode electrode 808 is formed on the upper major surface of the main emitter layer 801, to be electrically in contact with the main emitter layer 801. The main emitter layer 801 is provided therein with a plurality of short-circuiting portions 816 in the form of holes vertically passing through the same, so that the cathode electrode 808 is short-circuited with the P base layer 802 through the short-circuiting portions 816. Portions of the cathode electrode 808 which are in contact with the short-circuiting portions 816 serve as compensation electrodes.

An anode electrode 809 is formed on the lower major surface of the P emitter layer 804, to be electrically in contact with the P emitter layer 804. Annular auxiliary emitter electrodes 810a, 810b and 810c are formed on the auxiliary emitter layers 805a, 805b and 805c respectively, to be electrically in contact with the auxiliary emitter layers 805a, 805b and 805c respectively. Annular gate electrodes 811 of the main thyristor MT are formed on the first regions 806, to be electrically in contact with the first regions 806. The gate electrodes 811 are integrally formed with the auxiliary emitter electrodes 810c. Compensation electrodes 812 which are annularly formed on the second regions 807 are electrically in contact with the second regions 807, and integrally formed with the cathode electrode 808.

Auxiliary gate electrodes 817a of the auxiliary thyristors $ST_3$ and annular auxiliary gate electrodes 817b of the auxiliary thyristors $ST_3$ are formed on portions 813a and 813b of the P base layer 802 which are adjacent to the inner sides of the auxiliary emitter layers 805b and 805c respectively. The auxiliary emitter electrode 801a and the auxiliary gate electrodes 817a of the auxiliary thyristors $ST_1$ and $ST_2$ are electrically connected with each other by wires 818 such as aluminum wires. On the other hand, the auxiliary emitter electrodes 810b and the auxiliary gate electrodes 817b of the auxiliary thyristors $ST_2$ and $ST_3$ are integrally formed with each other. Similarly, the auxiliary emitter electrodes 810c of the auxiliary thyristors $ST_3$ and the gate electrodes 811 of the main thyristor MT are integrally formed with each other. In this thyristor, as hereinabove described, the auxiliary emitter electrodes 810b and the auxiliary gate electrodes 817b, the auxiliary emitter electrodes 810c and the gate electrodes 811, as well as the compensation electrodes 812 and the cathode electrode 808 are not connected with each other by wiring materials but integrally formed with each other, whereby neither disconnection nor short-circuiting is caused and reliability is improved.

<8-2. Steps of Fabricating the Device>

A method of fabricating this optical thyristor is now described. A step of preparing a silicon semiconductor substrate 150 to that of forming metal films 151 and 109 on both major surfaces of the semiconductor substrate (FIG. 8B) can be carried out similarly to those for forming the thyristor according to the first embodiment except the numbers, shapes and arrangement of the selectively formed auxiliary emitter layers 805a to 805c and the main emitter layer 801, and hence redundant description is omitted. The metal film 109 provided on the lower major surface functions as the anode electrode 809 as such.

In the following step, the metal film 151 (FIG. 8B) provided on the upper major surface is selectively etched thereby simultaneously forming the cathode electrode 808, the auxiliary emitter electrodes 810a to 810c, the auxiliary gate electrodes 817a and 817b, the gate electrodes 811 and the compensation electrodes 812, as shown in FIGS. 35 and 36. At this time, the auxiliary emitter electrodes 810b and the auxiliary gate electrodes 817b, the auxiliary emitter electrodes 810c and the gate electrodes 811, as well as the compensation electrodes 812 and the cathode electrode 808 are formed integrally with each other.

Thereafter wiring materials such as aluminum wires are employed to electrically connect the auxiliary emitter electrodes 810a and the auxiliary gate electrodes 817a with each other, as shown in FIG. 35.

According to this fabrication method, the auxiliary emitter electrodes 810b and the auxiliary gate electrodes 817b, the auxiliary emitter electrodes 810c and the gate electrodes 811, as well as the compensation electrodes 812 and the cathode electrode 808 are not electrically connected with each other by wiring materials but formed integrally with each other, whereby the fabrication steps are advantageously simplified.

<8-3. Ordinary Operation of the Device>

The ordinary operation of this device is now described with reference to FIG. 36. In order to use this device, an external power source is connected to the anode electrode 809 and the cathode electrode 808 of this device, thereby applying a positive voltage across these electrodes. When the photoreceiving portion 814 is irradiated with an optical trigger signal under such application of the positive voltage, a photoelectric current is generated in depletion layer regions provided on both sides of a P-N junction formed between the N base layer 803 and the P base layer 802 of the initial stage auxiliary thyristor $ST_1$, to flow into the P base layer 802. This photoelectric current transversely flows through the P base layer 802, and thereafter flows into the electrodes 812 which are provided on the second regions 807. The path of the photoelectric current is identical to that (shown in FIG. 36) of a displacement current $I_{l8}$ described later. The photoelectric current flowing into the compensation electrode 812 further flows to the external power source from the cathode electrode 808.

Consequently, the photoelectric current develops a transverse potential difference in the portion of the P base layer 802 located immediately under the auxiliary emitter layer 805a of the auxiliary thyristor $ST_1$, thereby forward-biasing a P-N junction which is formed between the auxiliary emitter layer 805a of the auxiliary thyristor $ST_1$ and the P base layer 802. When the optical signal is so strong that the forward bias voltage approaches the value of a diffusion potential which is specific to the P-N junction, electron injection from the auxiliary emitter layer 805a into the P base layer 802 is abruptly increased to turn on the auxiliary thyristor $ST_1$. The turn-on current for the auxiliary thyristor $ST_1$ flows from the auxiliary emitter electrode 810a to the wires 818 and the auxiliary gate electrodes 817b, thereby being supplied to the portions 813a of the P base layer 802. The turn-on currents supplied to the portions 813a of the P base layer 802 function as gate currents for the auxiliary thyristors $ST_2$.

The gate currents transversely pass through the portions of the P base layer 802 located immediately under the annular auxiliary emitter layers 805b (along the same paths as displacement currents $I_{28}$ described later), further transversely pass through the portions of the P base layer 802 located immediately under the annular auxiliary emitter layers 805c arranged outside the same (along the same paths as the displacement currents $I_{28}$ described later), further transversely flows through portions of the P base layer 802 located immediately under the main emitter layer 801 arranged outside the same, and thereafter pass through the short-circuiting portions 816 (through the same path as a displacement current $I_{m8}$ described later), to flow into the cathode electrode 808. Since the gate currents are by far larger than the photoelectric current which is generated in the auxiliary thyristor $ST_1$, high voltages are generated along the paths of the gate currents. Consequently, forward bias voltages of sufficient values are applied to P-N junctions between the auxiliary emitter layers 805b and the P base layer 802, whereby the auxiliary thyristors $ST_2$ are turned on. The turn-on currents for the auxiliary thyristors $ST_2$ flow from the auxiliary emitter electrodes 810b to the auxiliary gate electrodes 817b, thereby being supplied to the portions 813b of the P base layer 802. The turn-on currents supplied to the portions 813b of the P base layer 802 function as gate currents for the auxiliary thyristors $ST_3$.

The gate currents reach the cathode electrode 808 from the paths of the displacement currents $I_{2g}$ described below through that of the displacement current $I_{mg}$ described later. At this time, the auxiliary thyristors $ST_3$ are turned on by a mechanism which is similar to that for turning on the auxiliary thyristors $ST_2$. The turn-on currents for the auxiliary thyristors $ST_3$ flow from the auxiliary emitter electrodes 810c to the gate electrodes 811, thereby being supplied to the first regions 806. The turn-on currents supplied to the first regions 806 function as gate currents for the main thyristor MT.

The gate currents which are supplied to the first regions 806 transversely flow through the P base layer 802 and thereafter pass through the short-circuiting portions 816, thereby flowing into the cathode electrode 808. These gate currents are those obtained by successively amplifying the photoelectric current which is generated in the auxiliary thyristor $ST_1$ over three stages, whereby large voltages are generated along the paths of the gate currents. Consequently, a forward bias voltage of a sufficient value is applied to the P-N junction between the main emitter layer 801 and the P base layer 802, whereby the main thyristor MT is turned on. Thus, a main current flows from the anode electrode 809 to the cathode electrode 808. Namely, the thyristor conducts.

In this thyristor, the paths of the photoelectric current and the remaining gate currents are separated from each other, as hereinabove described. However, the paths of the gate currents for the auxiliary thyristors $ST_2$ and $ST_3$ and the main thyristor MT are not separated from each other.

Also in this thyristor, the transverse resistance of the portion of the P base layer 802 located immediately under the auxiliary emitter layer 805 of the auxiliary thyristor $ST_1$ which is turned on at first may be increased, in order to improve photosensitivity. Thus, the voltage which is generated along the path of the photoelectric current is increased, whereby the auxiliary thyristor $ST_1$ is easily turned on. Namely, the thyristor is improved in photosensitivity.

<8-4. Characteristic Operation of the Device>

Description is now made on an operation of this optical thyristor to which a voltage noise having a large dv/dt value is applied. At this time, the displacement currents $I_{1g}, I_{2g}, I_{3g}$ and $I_{mg}$ are generated by capacitances $C_{1g}, C_{2g}, C_{3g}$ and $C_{mg}$ of the junctions between the auxiliary emitter layer 805a of the auxiliary thyristor $ST_1$ and the P base layer 802, between the auxiliary emitter layers 805b of the auxiliary thyristors $ST_2$ and the P base layer 802, between the auxiliary emitter layers 805c of the auxiliary thyristors $ST_3$ and the P base layer 802 and between the main emitter layer 801 of the main thyristor MT and the P base layer 802 respectively.

The displacement current $I_{1g}$ which is generated in the auxiliary thyristor $ST_1$ flows into the compensation electrodes 812 through the same path as the photoelectric current in the P base layer 802, and thereafter flows to the cathode electrode 808. Due to a resistance $R_{1g}$ provided in the path, the displacement current $I_{1g}$ generates a transverse potential difference mainly in the portion of the P base layer 802 which is located immediately under the auxiliary emitter layer 805a. Similarly, the displacement currents $I_{2g}$ which are generated in the auxiliary thyristors $ST_2$ flow to the cathode electrode 808 in the P base layer 802 through the same paths as the gate currents for the auxiliary thyristors $ST_2$. Due to resistances $R_{2g}$ of the auxiliary thyristors $ST_2$ in the P base layer 802, the displacement currents $I_{2g}$ develop transverse potential differences in the portions of the P base layer 802 located immediately under the auxiliary emitter layers 805b. Further, the displacement currents $I_{3g}$ which are generated in the auxiliary thyristors $ST_3$ flow to the cathode electrode 808 in the P base layer 802 through the same paths as the gate currents for the auxiliary thyristors $ST_3$. Due to resistances $R_{3g}$ of the auxiliary thyristors $ST_3$ in the P base layer 802, the displacement currents $I_{3g}$ develop transverse potential differences in the portions of the P base layer 802 located immediately under the auxiliary emitter layers 805c, with the displacement currents $I_{2g}$.

Further, the displacement current $I_{mg}$ generated in the main thyristor MT flows into the cathode electrode 808 through the same path as the gate current for the main thyristor MT. Due to a resistance $R_{mg}$ provided in the path, the displacement current $I_{mg}$ develops a transverse potential difference mainly in the portion of the P base layer 802 located immediately under the main emitter layer 805 of the main thyristor MT. As hereinabove described, the path of the displacement current $I_{1g}$ is separated from those of the other displacement currents $I_{2g}, I_{3g}$ and $I_{mg}$. However, the paths of the three displacement currents $I_{2g}, I_{3g}$ and $I_{mg}$, each partially forming the remaining paths, are not separated from each other.

Figure 38:
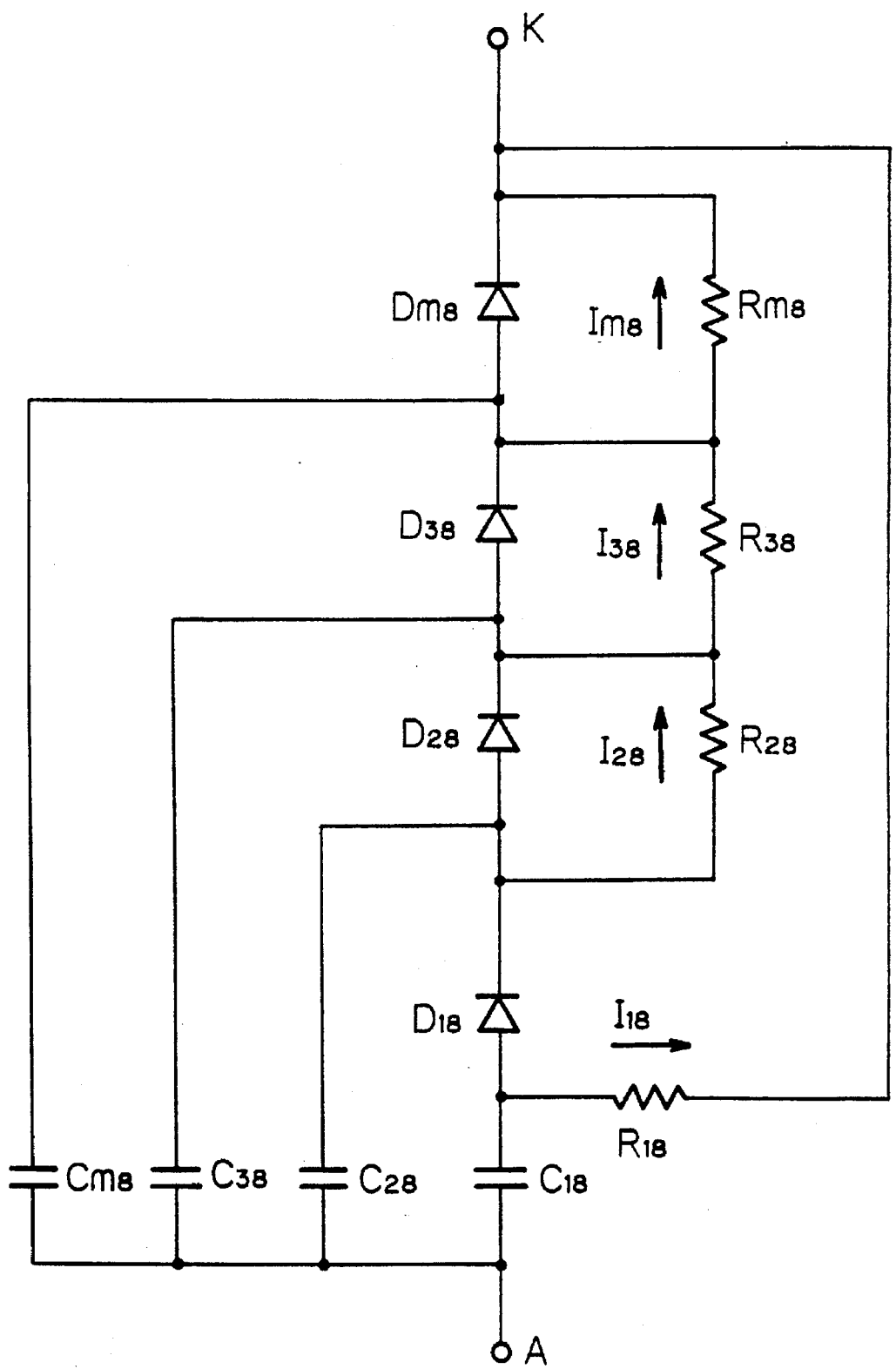
FIG. 38 is an equivalent circuit diagram of the optical thyristor according to the eighth embodiment of the present invention.

FIG. 38 is an equivalent circuit diagram which is related to behavior of the displacement currents $I_{1g}$ to $I_{3g}$ and $I_{mg}$. Diodes $D_{1g}$ to $D_{3g}$ equivalently express the junctions between the auxiliary emitter layers 805a to 805c of the auxiliary thyristors $ST_1$ to $ST_3$ and the P base layer 802, while a diode $D_{mg}$ expresses the junction between the main emitter layer 801 of the main thyristor MT and the P base layer 802. Ends of only two resistances $R_{1g}$ and $R_{mg}$ are short-circuited with the cathode electrode 808 (K).

A voltage corresponding to the product of the displacement current $I_{1g}$ and the resistance $R_{1g}$ is applied to an anode of the diode $D_{1g}$. However, this voltage is not applied as such across the anode and a cathode of the diode $D_{1g}$, i.e., the junction between the auxiliary emitter layer 805a and the P base layer 802, as a forward bias voltage. Since a voltage developed by the displacement currents $I_{2g}, I_{3g}$ and $I_{mg}$ is applied to the cathode of the diode $D_{1g}$, a forward bias voltage which is provided by $I_{1g} \times R_{1g} - I_{2g} \times R_{2g} - (I_{2g}+I_{3g}) \times R_{3g} - (I_{2g}+I_{3g}+I_{mg}) \times R_{mg}$. Namely, the forward bias voltage for the auxiliary thyristor $ST_1$ which is originally brought by the displacement current $I_{1g}$ is attenuated by the following displacement currents $I_{2g}, I_{3g}$ and $I_{mg}$. Thus, the auxiliary thyristor $ST_1$ is suppressed from abnormal ignition caused by the displacement current $I_{1g}$.

On the other hand, a forward bias voltage corresponding to a voltage ($I_{2g} \times R_{2g}$) brought by the displacement current $I_{2g}$ is applied across an anode and a cathode of the diode $D_{2g}$. Further, a voltage brought by the displacement currents $I_{2g}$ and $I_{3g}$, i.e., a forward bias voltage which is provided by $(I_{2g}+I_{3g}) \times R_{3g}$ is applied across the anode and the cathode of the diode $D_{3g}$. In addition, a voltage brought by the displacement currents $I_{2g}, I_{3g}$ and $I_{mg}$, i.e., a forward bias voltage which is provided by $(I_{2g}+I_{3g}+I_{mg}) \times R_{mg}$ is applied across the anode and the cathode of the diode $D_{mg}$. As hereinabove described, no effects of suppressing abnormal ignition of the second and third stage auxiliary thyristors $ST_2$ and $ST_3$ appear in this thyristor. This results from the fact that the paths of the displacement currents $I_{2s}$, $I_{3s}$ and $I_{ms}$ generated in the second and third auxiliary thyristors $ST_2$ and $ST_3$ and the main thyristor MT are not separated from each other.

In general, however, the initial stage auxiliary thyristor $ST_1$ is set at an extremely high sensitivity level so that it is possible to turn on the optical thyristor by a feeble optical signal, and hence dv/dt resistance of the initial stage auxiliary thyristor $ST_1$ decides the dv/dt resistance of the overall thyristor. In this thyristor, it is possible to suppress the initial stage auxiliary thyristor $ST_1$ from abnormal ignition which is most easily caused by the displacement current, whereby a sufficient effect can be attained for improving the dv/dt resistance of the overall thyristor. Further, it is also possible to cancel the forward bias voltage which is applied to the junction of the auxiliary thyristor $ST_1$ by adjusting the resistances $R_{1s}$ to $R_{3s}$ and $R_{ms}$ or the aforementioned transverse resistances forming principal parts thereof.

In this thyristor, further, the portions 813b of the P base layer 802 and the first regions 806 enclosing the second stage and final stage auxiliary thyristors $ST_2$ and $ST_3$ are not provided with compensation electrodes and the auxiliary emitter electrodes 810b and 810c are integrally formed with the auxiliary gate electrodes 817b and the gate electrodes 811 respectively, whereby it is possible to set the main emitter layer 801 in a large area. Thus, it is possible to reduce the ON-state voltage and improve surge resistance.

<Ninth Embodiment>

<9-1. Structure of the Device>

Figure 39:
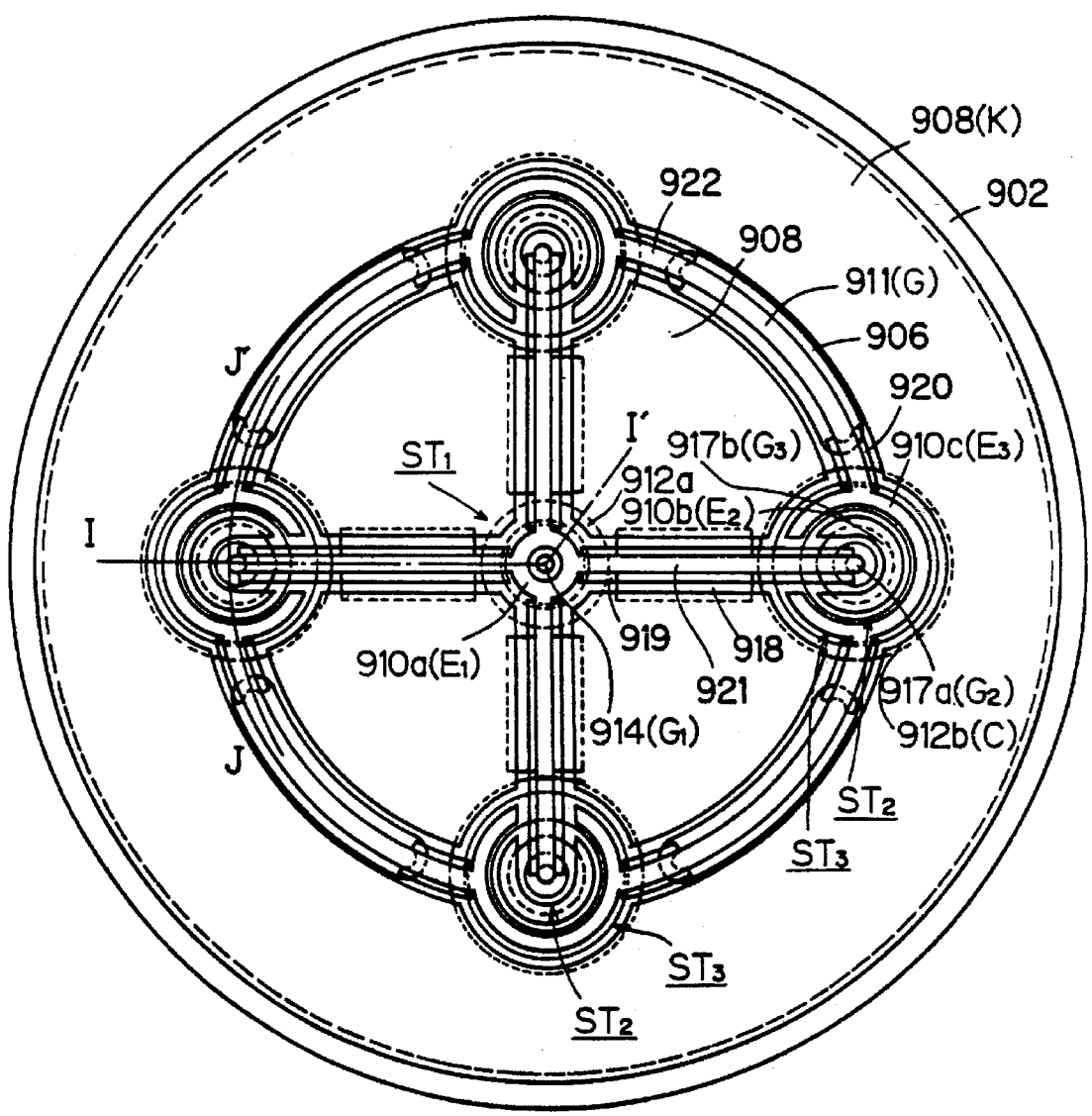
FIG. 39 is a plan view showing an optical thyristor according to a ninth embodiment of the present invention.
Figure 40:
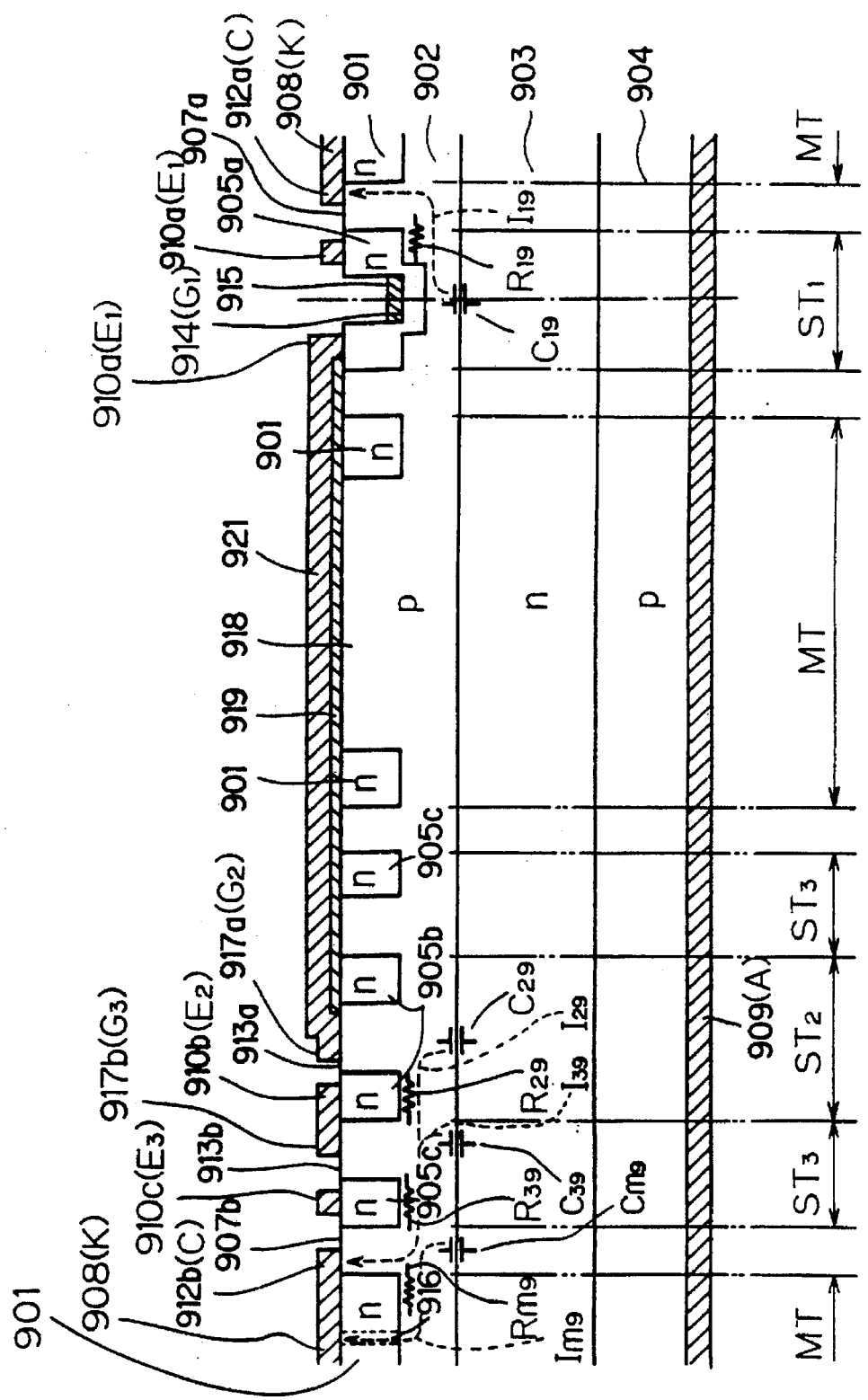
FIG. 40 is a sectional view showing the optical thyristor according to the ninth embodiment of the present invention taken along the line I–I' in FIG. 39.
Figure 41:
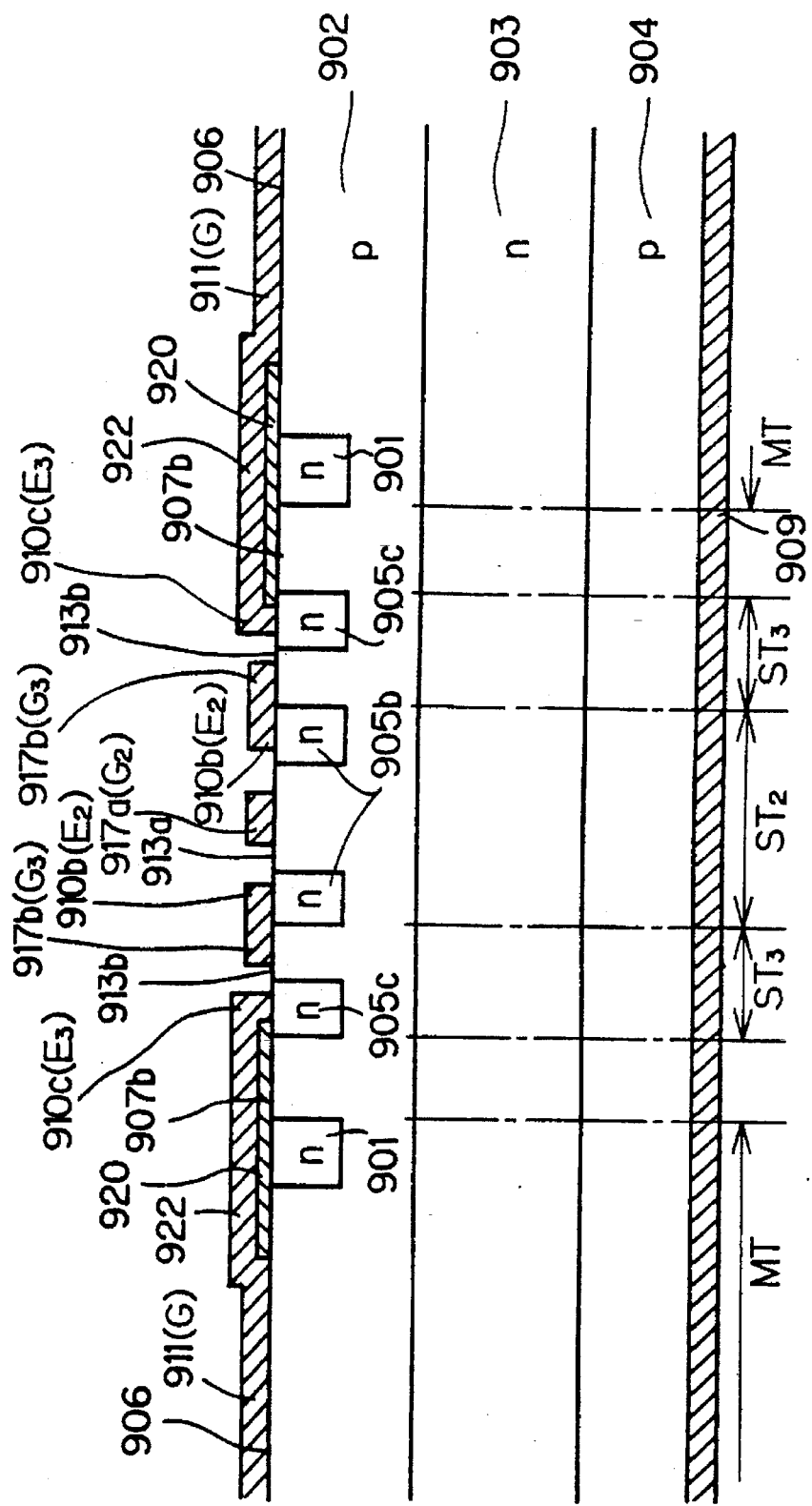
FIG. 41 is a sectional view showing the optical thyristor according to the ninth embodiment of the present invention taken along the line J–J' in FIG. 40.
Figure 42:
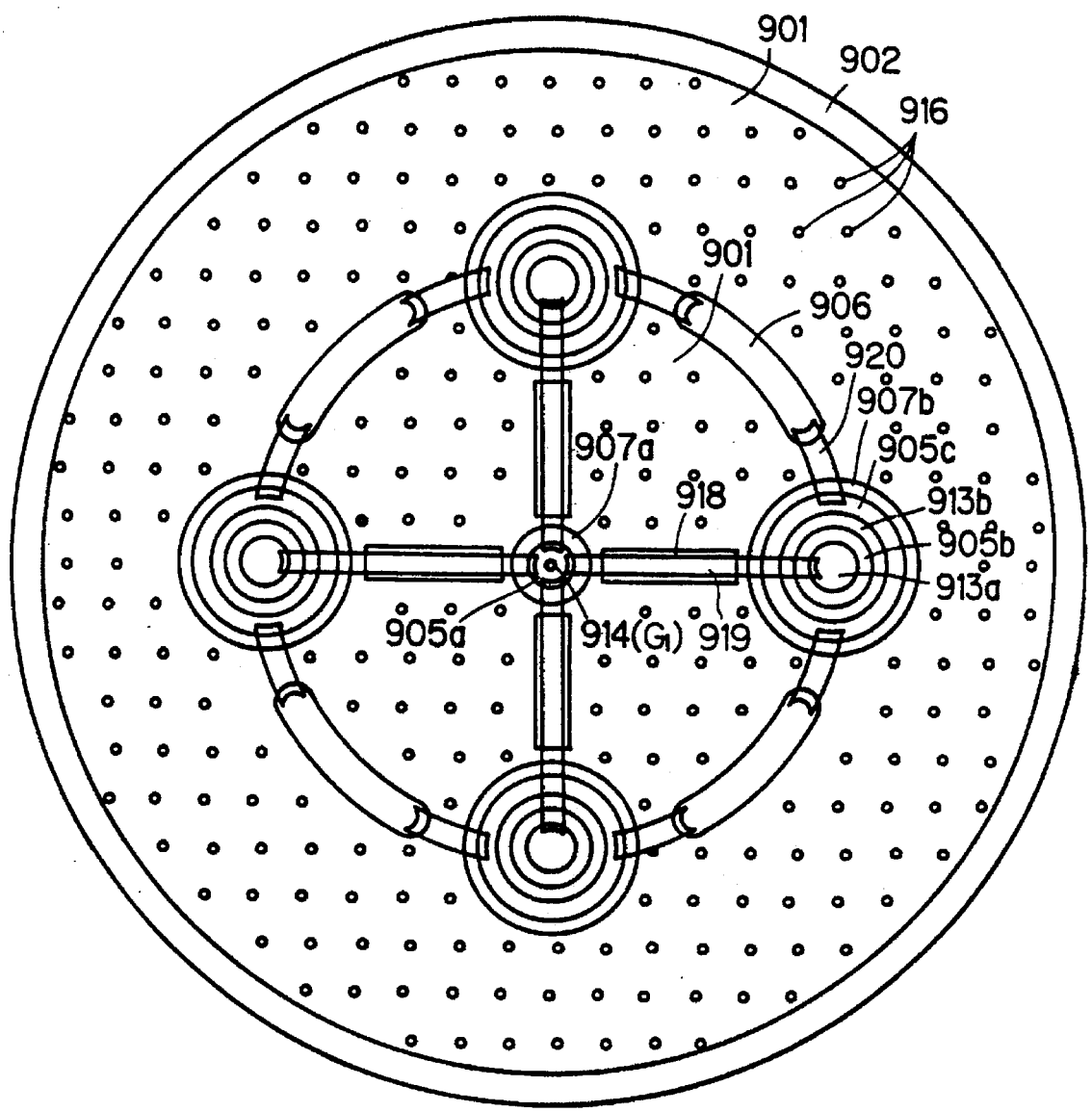
FIG. 42 is a plan view showing the optical thyristor according to the ninth embodiment of the present invention in a state before formation of electrodes.

A ninth embodiment of the present invention is now described. FIGS. 39 to 41, illustrating the structure of an optical thyristor according to this embodiment, are a plan view, a sectional view taken along the line J-J' in FIG. 39, and a plan view showing the thyristor with omission of electrodes respectively.

In this optical thyristor, an N-type main emitter layer 901, a P-type P base layer 902, an N-type N base layer 903 and a P-type P emitter layer 904 are stackedly formed on a substantially discoidal semiconductor substrate of silicon having a pair of major surfaces, thereby forming a main thyristor MT. A circular N-type auxiliary emitter layer 905a is positioned substantially at the center of the semiconductor substrate, and forms an initial stage auxiliary thyristor $ST_1$ with the P base layer 902, the N base layer 903 and the P emitter layer 904. Annular N-type auxiliary emitter layers 905b and portions 913a of the P base layer 902 which are enclosed with the same form second stage auxiliary thyristors $ST_2$ with the P base layer 902, the N base layer 903 and the P emitter layer 904. Further, annular N-type auxiliary emitter layers 905c and portions 913b of the P base layer 902 which are enclosed with the same form third stage auxiliary thyristors $ST_3$ with the P base layer 902, the N base layer 903 and the P emitter layer 904. Namely, this thyristor has a four-stage structure provided with three stage auxiliary thyristors $ST_1$ to $ST_3$ and the main thyristor MT, similarly to the fifth embodiment.

The auxiliary emitter layer 905a of the initial stage auxiliary thyristor $ST_1$ is provided on its center with a photoreceiving portion 914. The photoreceiving portion 914 is coated with an antireflection film 915, whose thickness is optimized similarly to that in the first embodiment.

The portions 913b of the P base layer 902 of the auxiliary thyristors $ST_3$ are annular and enclose the auxiliary emitter layers 905b of the auxiliary thyristors $ST_2$. Namely, the two auxiliary thyristors $ST_2$ and $ST_3$ are in such double structures that the latter enclose the former. The auxiliary thyristor $ST_1$ is provided on a central portion, and each of the auxiliary thyristors $ST_2$ and the auxiliary thyristors $ST_3$ enclosing the same are provided on four positions to be arranged on a virtual circumference about the auxiliary thyristor $ST_1$ at equal intervals. The auxiliary thyristors $ST_1$ and $ST_3$ are provided to be enclosed with the main emitter layer 901 of the main thyristor MT independently of each other.

Further, portions of the P base layer 902 which are adjacent to the main emitter layer 901, enclosed with this emitter layer 901 and exposed on the upper major surface of the semiconductor substrate are formed in four portions as first regions 906. These first regions 906 are formed in the form of strips in regions at equal intervals from adjacent pairs of the auxiliary thyristors $ST_3$ along the aforementioned virtual circumference. Further, annular portions of the P base layer 902 are formed between the auxiliary emitter layers 905a and the main emitter layer 901 as second regions 907a, to be annularly exposed on the upper major surface of the semiconductor substrate. In addition, annular portions of the P base layer 902 are formed between the main emitter layer 901 and the auxiliary emitter layers 905c as second regions 907b, to be annularly exposed on the upper major surface of the semiconductor substrate. On the other hand, portions of the P base layer 902 which are adjacent to the main emitter layer 901, enclosed with this main emitter layer 901 and exposed on the upper major surface of the semiconductor substrate are formed as third regions 918 in the form of strips on lines connecting the second regions 907a and 907b with each other.

The first regions 906, the second regions 907a and 907b, and the third regions 918 are separated from each other by the main emitter layer 901.

A cathode electrode 908 is formed on the upper major surface of the main emitter layer 901, to be electrically connected with the main emitter layer 901. The main emitter layer 901 is provided therein with a plurality of short-circuiting portions 916 in the form of holes vertically passing through the same, so that the cathode electrode 908 is short-circuited with the P base layer 902 through the short-circuiting portions 916. Portions of the cathode electrode 908 which are in contact with the short-circuiting portions 916 function as compensation electrodes.

An anode electrode 909 is formed on the lower major surface of the P emitter layer 904, to be electrically in contact with the P emitter layer 904. An annular auxiliary emitter electrode 910a and annular emitter electrodes 910b and 910c having single parted portions are formed on the auxiliary emitter layers 905a, 905b and 905c respectively, to be electrically in contact with the auxiliary emitter layers 905a, 905b and 905c respectively. Gate electrodes 911 of the main thyristor MT are formed on the first regions 906, to be electrically in contact with the first regions 906. Compensation electrodes 912a are formed on the second regions 907a, to be electrically in contact with the second regions 907a. The compensation electrodes 912a are integrally formed with the cathode electrode 908. Further, compensation electrodes 912b are formed on the second regions 907b, to be electrically in contact with the second regions 907b. The compensation electrodes 912b are also integrally formed with the cathode electrode 908.

Auxiliary gate electrodes 917a and 917b of the auxiliary thyristors $ST_2$ and $ST_3$ are formed on portions 913a and 913b of the P base layer 902 which are adjacent to the inner sides of the auxiliary emitter layers 905b and 905c respectively. The auxiliary emitter electrode 901a and the auxiliary gate electrodes 917a of the auxiliary thyristors $ST_1$ and $ST_2$ are electrically connected with each other by conductor bridging portions 921 which are integrally formed with the same. On the other hand, the auxiliary gate electrodes 917b of the auxiliary thyristors ST2, which are annular electrodes each having one parted portion similarly to the auxiliary emitter electrodes 910b, are integrally formed with the auxiliary emitter electrodes 910b. The four auxiliary emitter electrodes 910c of the auxiliary thyristors $ST_3$ and the four gate electrodes 911 of the main thyristor MT are electrically connected with each other by four conductor bridging portions 922 which are integrally formed with the same. The bridging portions 921 and 922 are arranged on insulating layers 919 and 920 which are formed on the upper major surface of the semiconductor substrate respectively. Thus, the bridging portions 921 and 922 are prevented from being short-circuited with the semiconductor substrate. The insulating layer 919 is formed along the strip-shaped third regions 918.

As hereinabove described, the auxiliary emitter electrodes 910b and the auxiliary gate electrodes 917b as well as the compensation electrodes 912a and 912b and the cathode electrode 908 are not connected with each other by wiring materials but integrally formed with each other, while the auxiliary emitter electrodes 910a and the auxiliary gate electrodes 917a as well as the auxiliary emitter electrodes 910c and the gate electrodes 911 are electrically connected with each other by the conductor bridging portions 921 and 922 which are integrally formed with each other, whereby reliability is improved with no possibility for disconnection, short-circuiting and the like.

The third regions 918 are so provided that the minimum width of the main emitter layer 901 separating the second regions 907a and 907b from each other is not in excess of 2 mm in such a device that the interval between the second regions 907a and 907b is set to be larger than 4 mm. If the minimum width exceeds 2 mm, transverse resistances of the P base layer 902 corresponding to portions which are located immediately under those of the main emitter layer 901 are excessively increased and hence abnormal ignition is caused by the displacement currents from these portions of the main emitter layer 901, to reduce dv/dt resistance of the overall thyristor. This is because the insulating layer 919 is formed on upper major surfaces of the portions of the main emitter layer 901 separating the second regions 907a and 907b and neither the cathode electrode 908 nor the short-circuiting portions 916 can be formed on these portions. <9-2. Steps of Fabricating the Device>

A method of fabricating the optical thyristor is now described. A step of preparing a silicon semiconductor substrate 150 to that of forming the photoreceiving portion 914 (FIG. 7B) can be carried out similarly to those for fabricating the thyristor according to the first embodiment except the numbers, shapes and arrangement of the auxiliary emitter layers 905a to 905c and the main emitter layer 901, and hence redundant description is omitted as to these steps.

In the following step, the insulating films 919 and 920 and the antireflection film 915 are formed respectively in a similar manner to that shown in FIG. 17A. Thereafter metal films are formed to entirely cover both major surfaces, the insulating films 919 and 920 and the antireflection film 915, in a similar manner to that shown in FIG. 17B. The metal film (corresponding to the metal film 309 in FIG. 17B) functions as the anode electrode 909 as such.

Then, the metal film (corresponding to the metal film 351 in FIG. 17B) provided on the upper major surface is selectively etched to simultaneously form the cathode electrode 908, the auxiliary emitter electrodes 910a to 910c, the auxiliary gate electrodes 917a and 917b, the gate electrodes 911, the compensation electrodes 912a and 912b and the bridging portions 921 and 922, as shown in FIGS. 39 to 41. At this time, the auxiliary emitter electrodes 910b and the auxiliary gate electrodes 917b are integrally formed with each other. Further, the compensation electrodes 912a and 912b and the cathode electrode 908 are also integrally formed with each other. In addition, the auxiliary emitter electrode 910a, the bridging portions 921 and the auxiliary gate electrodes 917a are also integrally formed with each other. Further, the auxiliary emitter electrodes 910c, the bridging portions 922 and the gate electrodes 911 are integrally formed with each other.

According to this fabrication method, the electrodes are integrally formed with each other to be electrically connected with each other with no employment of wiring materials, whereby the fabrication steps are advantageously simplified.

<9-3. Ordinary Operation of the Device>

The ordinary operation of this optical thyristor is now described with reference to FIGS. 40 and 41. In order to use this optical thyristor, an external power source is connected to the anode electrode 909 and the cathode electrode 908 of this device, thereby applying a positive voltage across these electrodes. When the photoreceiving portion 914 is irradiated with an optical trigger signal under such application of the positive voltage, a photoelectric current is generated in depletion layer regions provided on both sides of a P-N junction formed between the N base layer 903 and the P base layer 902 of the initial stage auxiliary thyristor $ST_1$, to flow into the P base layer 902. This photoelectric current transversely flows through the P base layer 902, and thereafter flows into the electrodes 912a which are provided on the second regions 907a. The path of the photoelectric current is identical to that (shown in FIG. 40) of a displacement current $I_{19}$ described later. The photoelectric current flowing into the compensation electrodes 912a further flows to the external power source from the cathode electrode 908.

Consequently, the photoelectric current develops a transverse potential difference in the portion of the P base layer 902 located immediately under the auxiliary emitter layer 905a of the auxiliary thyristor $ST_1$, thereby forward-biasing a P-N junction which is formed between the auxiliary emitter layer 905a of the auxiliary thyristor $ST_1$ and the P base layer 902. When the optical signal is so strong that the forward bias voltage approaches the value of a diffusion potential which is specific to the P-N junction, electron injection from the auxiliary emitter layer 905a into the P base layer 902 is abruptly increased to turn on the auxiliary thyristor $ST_1$. The turn-on current for the auxiliary thyristor $ST_1$ flows from the auxiliary emitter electrode 910a to the bridging portions 921 and the auxiliary gate electrodes 917a, thereby being supplied to the portions 913a of the P base layer 902. The turn-on currents supplied to the portions 913a of the P base layer 902 function as gate currents for the auxiliary thyristors $ST_2$.

The gate currents transversely pass through the portions of the P base layer 902 located immediately under the annular auxiliary emitter layers 905b (along the same paths as displacement currents $I_{29}$ described later), further transversely pass through the portions of the P base layer 902 located immediately under the annular auxiliary emitter layers 905c arranged outside the same (along the same paths as the displacement currents $I_{39}$ described later), and thereafter flow into the compensation electrodes 912b which are formed on the second regions 907b. Since the gate currents are by far larger than the photoelectric current which is generated in the auxiliary thyristor $ST_1$, high voltages are generated along the paths of the gate currents. Consequently, forward bias voltages of sufficient values are applied to P-N junctions between the auxiliary emitter layers 905b and the P base layer 902, whereby the auxiliary thyristors $ST_2$ are turned on. The turn-on currents for the auxiliary thyristors $ST_2$ flow from the auxiliary emitter electrodes 910b to the auxiliary gate electrodes 917b, thereby being supplied to the portions 913b of the P base layer 902. The turn-on currents supplied to the portions 913b of the P base layer 902 function as gate currents for the auxiliary thyristors $ST_3$.

The gate currents flow into the compensation electrodes 912b through the paths of the displacement currents $I_{29}$. At this time, the auxiliary thyristors $ST_3$ are turned on by a mechanism which is similar to that for turning on the auxiliary thyristors $ST_2$. The turn-on currents for the auxiliary thyristors $ST_3$ flow from the auxiliary emitter electrodes 910c to the gate electrodes 911 through the bridging portions 922, thereby being supplied to the first regions 906. The turn-on currents supplied to the first regions 906 function as gate currents for the main thyristor MT.

The gate currents which are supplied to the first regions 906 transversely flow through the P base layer 902 and thereafter pass through the short-circuiting portions 916, thereby flowing into the cathode electrode 908. These gate currents are those obtained by successively amplifying the photoelectric current which is generated in the auxiliary thyristor $ST_1$ over three stages, whereby large voltages are generated along the paths of the gate currents. Consequently, a forward bias voltage of a sufficient value is applied to the P-N junction between the main emitter layer 901 and the P base layer 902, whereby the main thyristor MT is turned on. Thus, a main current flows from the anode electrode 909 to the cathode electrode 908. Namely, the thyristor conducts.

In this thyristor, the paths of the photoelectric current and the remaining gate currents are separated from each other, as hereinabove described. Further, the paths of the gate currents for the auxiliary thyristors $ST_3$ and the main thyristor MT are also separated from each other. However, the paths of the gate currents for the auxiliary thyristors $ST_2$ and $ST_3$ are not separated from each other.

Also in this thyristor, the transverse resistance of the portion of the P base layer 902 located immediately under the auxiliary emitter layer 905 of the auxiliary thyristor $ST_1$ which is turned on at first may be increased, in order to improve photosensitivity. Thus, the voltage generated along the path of the photoelectric current is increased, whereby the auxiliary thyristor $ST_1$ is easily turned on. Namely, the thyristor is improved in photosensitivity.

In this thyristor, the auxiliary emitter electrodes 910c of the four (plural) third stage (final stage) auxiliary thyristors $ST_3$ are connected to the four gate electrodes 911 of the main thyristor MT, as shown in FIG. 39. Further, all of these electrodes are connected with each other. Thus, it is possible to integrate a plurality of different amplification paths employing the respective auxiliary thyristors having different turn-on characteristics in the gate electrodes 911. Consequently, it is possible to advantageously reduce or eliminate inequality in turn-on characteristics between the amplification paths. Thus, the turn-on characteristics of the main thyristor MT are further stabilized, while it is possible to implement improvement of di/dt resistance and reduction of the turn-on time.

<9-4. Characteristic Operation of the Device>

Description is now made on an operation of the optical thyristor to which a voltage noise having a large dv/dt value is applied. At this time, the displacement currents $I_{19}$, $I_{29}$, $I_{39}$ and $I_{m9}$ are generated by capacitances $C_{19}$, $C_{29}$, $C_{39}$ and $C_{m9}$ of the junctions between the auxiliary emitter layer 905a of the auxiliary thyristor $ST_1$ and the P base layer 902, between the auxiliary emitter layers 905b of the auxiliary thyristors $ST_2$ and the P base layer 902, between the auxiliary emitter layers 905c of the auxiliary thyristors $ST_3$ and the P base layer 902 and between the main emitter layer 901 of the main thyristor MT and the P base layer 902 respectively.

The displacement current $I_{19}$ which is generated in the auxiliary thyristor $ST_1$ flows into the compensation electrodes 912a through the same path as the photoelectric current in the P base layer 902, and thereafter flows to the cathode electrode 908. Due to a resistance $R_{19}$ provided in the path, the displacement current $I_{19}$ develops a transverse potential difference mainly in the portion of the P base layer 902 located immediately under the auxiliary emitter layer 905a. Similarly, the displacement currents $I_{29}$ which are generated in the auxiliary thyristors $ST_2$ flow to the compensation electrodes 912b in the P base layer 902 through the same paths as the gate currents for the auxiliary thyristors $ST_2$. Due to resistances $R_{29}$ of the auxiliary thyristors $ST_2$ in the P base layer 902, the displacement currents $I_{29}$ develop transverse potential differences in the portions of the P base layer 902 located immediately under the auxiliary emitter layers 905b. Further, the displacement currents $I_{39}$ which are generated in the auxiliary thyristors $ST_3$ flow to the compensation electrodes 912b in the P base layer 902 through the same paths as the gate currents for the auxiliary thyristors $ST_3$. Due to resistances $R_{39}$ of the auxiliary thyristors $ST_3$ in the P base layer 902, the displacement currents $I_{39}$ develop transverse potential differences in the portions of the P base layer 902 located immediately under the auxiliary emitter layers 905c with the displacement currents $I_{29}$.

Further, the displacement current $I_{m9}$ which is generated in the main thyristor MT flows into the cathode electrode 908 through the same path as the gate current for the main thyristor MT. Due to a resistance $R_{m9}$ provided in the path, the displacement current $I_{m9}$ develops a transverse potential difference mainly in the portion of the P base layer 902 located immediately under the main emitter layer 901 of the main thyristor MT. As hereinabove described, the path of the displacement current $I_{19}$ is separated from those of the other displacement currents $I_{29}$, $I_{39}$ and $I_{m9}$. Further, the paths of the two displacement currents $I_{39}$ and $I_{m9}$ are also separated from each other. However, the paths of the displacement currents $I_{39}$ form parts of those of the displacement currents $I_{29}$, and these paths are not separated from each other.

Figure 43:
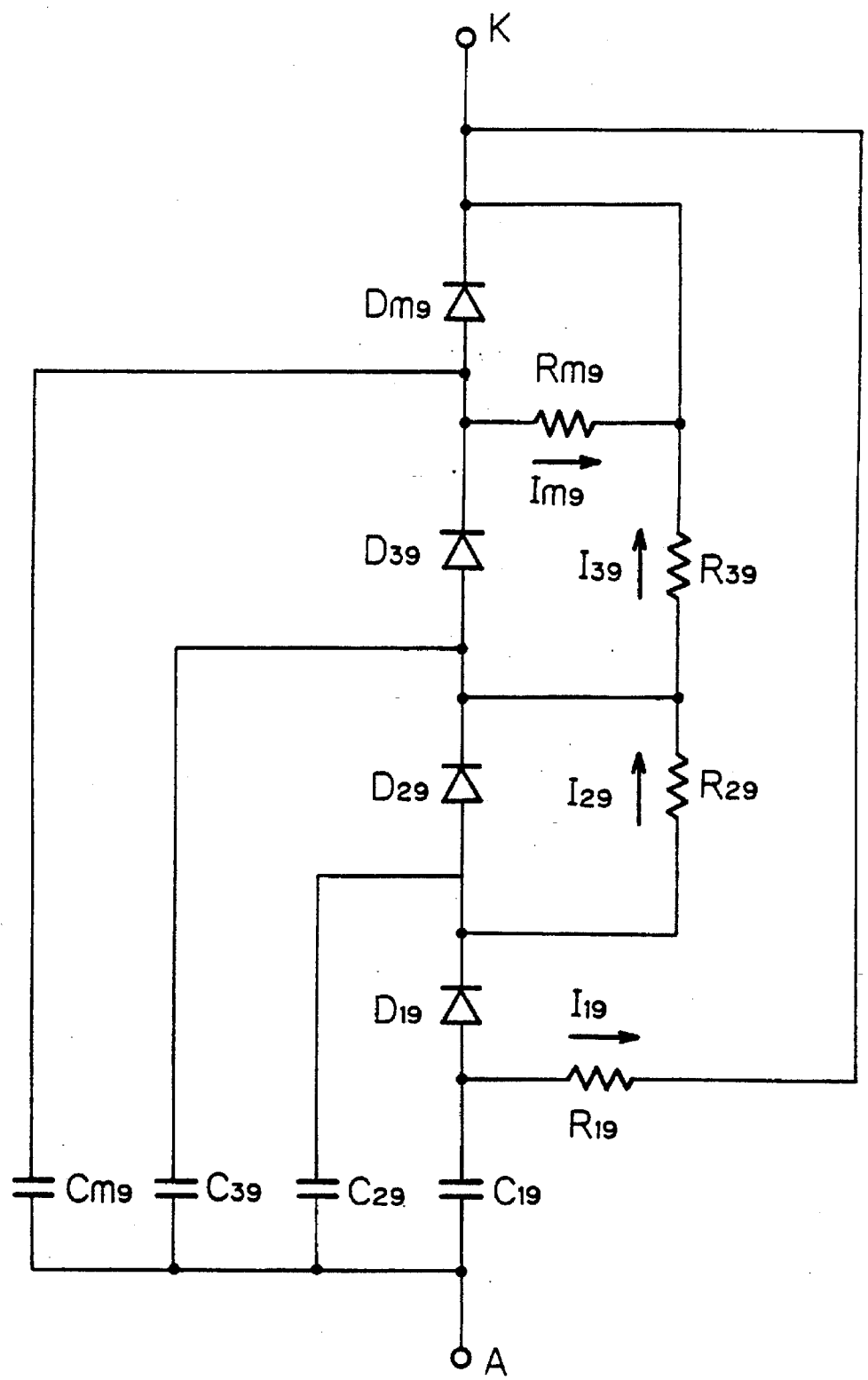
FIG. 43 is an equivalent circuit diagram of the optical thyristor according to the ninth embodiment of the present invention.
Figure 44:
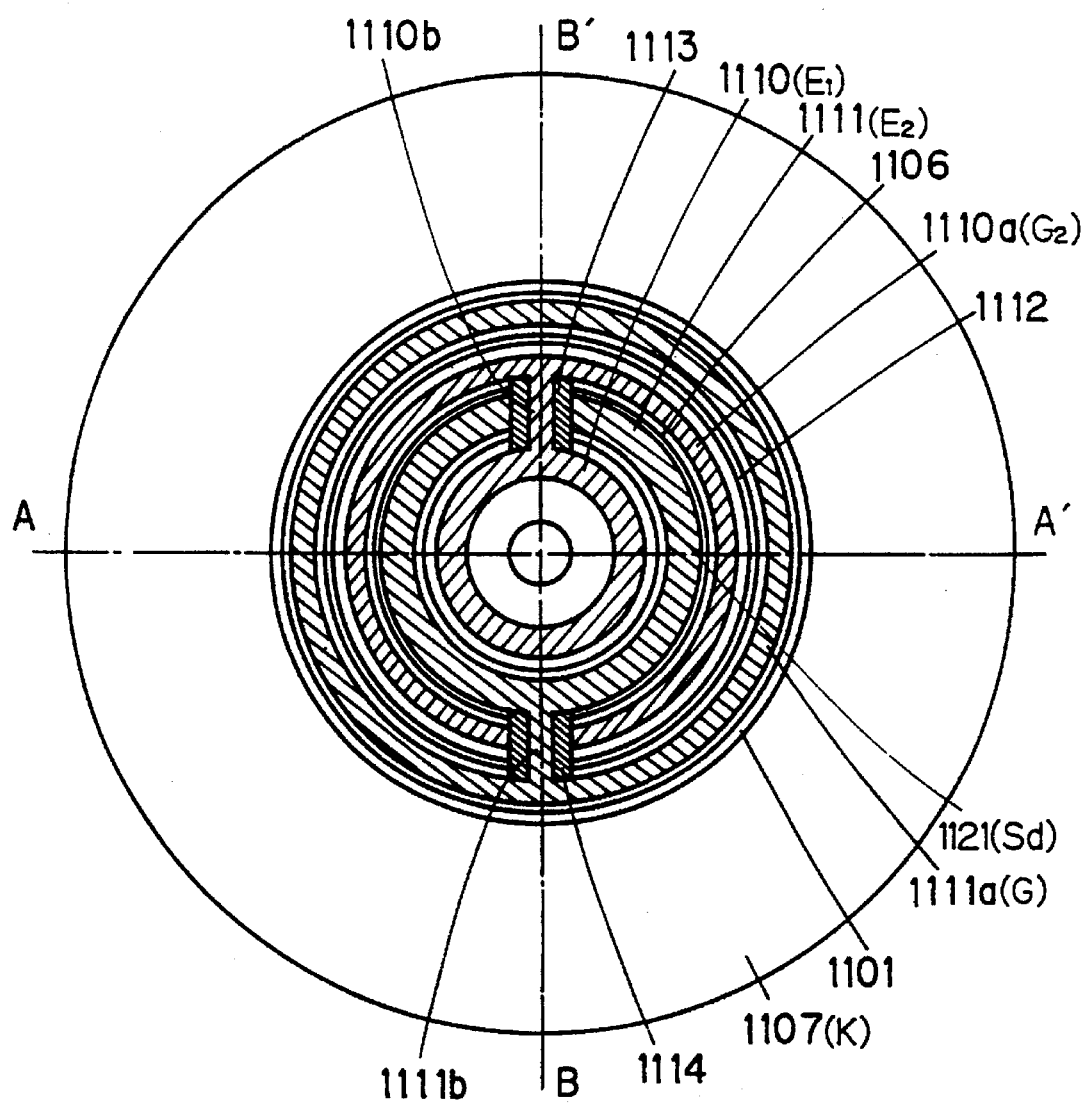
FIG. 44 is a plan view showing an optical thyristor according to an eleventh embodiment of the present invention.

FIG. 43 is an equivalent circuit diagram which is related to behavior of the displacement currents $I_{19}$ to $I_{39}$ and $I_{m9}$. Diodes $D_{19}$ to $D_{39}$ equivalently express the junctions between the auxiliary emitter layers 905a to 905c of the auxiliary thyristors $ST_1$ to $ST_3$ and the P base layer 902, while a diode $D_{m9}$ expresses the junction between the main emitter layer 901 of the main thyristor MT and the P base layer 902. Ends of only two resistances $R_{19}$ and $R_{m9}$ are short-circuited with the cathode electrode 908 (K).

A voltage corresponding to the product of the displacement current $I_{19}$ and the resistance $R_{19}$ is applied to an anode of the diode $D_{19}$. Since a voltage caused by the displacement currents $I_{29}$ and $I_{39}$ is applied to the cathode of the diode $D_{19}$, a forward bias voltage provided by $I_{19} \times R_{19} - I_{29} \times R_{29} -$ $(I_{29}+I_{39}) \times R_{39}$ is applied across the anode and the cathode of the diode $D_{19}$. Namely, the forward bias voltage for the auxiliary thyristor $ST_1$ which is originally brought by the displacement current $I_{19}$ is attenuated by the following displacement currents $I_{29}$ and $I_{39}$. Thus, the auxiliary thyristor $ST_1$ is suppressed from abnormal ignition caused by the displacement current $I_{19}$.

Further, a voltage corresponding to the product of the displacement current $I_{39}$ and the resistance $R_{39}$ is applied to the anode of the diode $D_{39}$. On the other hand, a voltage caused by the displacement current $I_{m9}$ is applied to the cathode of the diode $D_{39}$, whereby a forward bias voltage which is provided by $I_{39} \times R_{39} - I_{m9} \times R_{m9}$ is applied across the anode and the cathode of the diode $D_{39}$. Namely, the forward bias voltage for the auxiliary thyristor $ST_3$ which is originally brought by the displacement current $I_{39}$ is attenuated by the next stage displacement current $I_{m9}$. Thus, the auxiliary thyristor $ST_3$ is suppressed from abnormal ignition caused by the displacement current $I_{39}$. On the other hand, a forward bias voltage corresponding to a voltage $(I_{29} \times R_{29})$ which is brought by the displacement current $I_{29}$ is applied across the anode and the cathode of the diode $D_{29}$.

As hereinabove described, effects of suppressing the first and third stage auxiliary thyristors $ST_1$ and $ST_3$ from abnormal ignition appear while no effects of suppressing abnormal ignition of the second stage auxiliary thyristors $ST_2$ appear in this thyristor. This results from the fact that the path of the displacement current $I_{19}$ is separated from the paths of the displacement currents $I_{29}$, $I_{39}$ and $I_{m9}$ and the paths of the two displacement currents $I_{39}$ and $I_{m9}$ are also separated from each other while the paths of the two displacement currents $I_{39}$ and $I_{29}$ are not separated from each other.

However, the initial stage auxiliary thyristor $ST_1$ is suppressed from abnormal ignition similarly to the device according to the eighth embodiment while the final stage auxiliary thyristors $ST_3$ are also suppressed from abnormal ignition, whereby a sufficient effect is attained for improving the dv/dt resistance of the overall thyristor. Further, it is also possible to cancel the forward bias voltages which are applied to the junctions of the auxiliary thyristors $ST_1$ and $ST_3$, by adjusting the resistances $R_{19}$ to $R_{39}$ and $R_{m9}$ or the aforementioned transverse resistances forming principal parts thereof.

In this thyristor, further, the portions 913b of the P base layer 902 enclosing the second stage auxiliary thyristors $ST_2$ are not provided with compensation electrodes while the auxiliary emitter electrodes 910b are integrally formed with the auxiliary gate electrodes 917b, whereby it is possible to set the main emitter layer 901 in a large area. Thus, it is possible to reduce the ON-state voltage and improve surge resistance.

<Tenth Embodiment>

In the device according to the sixth embodiment, for example, the annular gate electrodes 611 of the main thyristor MT may have inwardly or outwardly directed branches (not shown). Due to this structure, it is possible to further quicken ignition along the overall area of the main thyristor, whereby further improvement of the di/dt resistance is implemented.

<Eleventh Embodiment>

<11-1. Structure of the Device>

An eleventh embodiment of the present invention is now described. FIGS. 44 to 47, illustrating the structure of an optical thyristor according to this embodiment, are a plan view, sectional views taken along the lines A-A' and B-B' in FIG. 44 respectively, and a plan view with omission of electrodes.

In this thyristor, three stage unit thyristors including an initial stage auxiliary thyristor $ST_1$, a second stage auxiliary thyristor $ST_2$ and a main thyristor MT are concentrically or concentric-annularly arranged along a major surface of a substantially discoidal semiconductor substrate of silicon in this order from its center. A P base layer 1102, an N base layer 1103 and a P emitter layer 1104 are stackedly formed on the semiconductor substrate successively from its upper major surface toward its lower major surface. Further, N-type auxiliary emitter layers 1105 and 1106 and an N-type main emitter layer 1101 are selectively concentrically or concentric-annularly formed in this order from the center of the upper major surface of the P base layer 1102 to be separated from each other.

The auxiliary emitter layer 1105 which is positioned at the center of the upper major surface of the semiconductor substrate and circularly exposed on this upper major surface forms the auxiliary thyristor $ST_1$ with the P base layer 1102, the N base layer 1103 and the P emitter layer 1104. Further, the auxiliary emitter layer 1106 forms the auxiliary thyristor $ST_2$ with the P base layer 1102, the N base layer 1103 and the P emitter layer 1104. In addition, the main emitter layer 1101 forms the main emitter layer MT with the P base layer 1102, the N base layer 1103 and the P emitter layer 1104.

A portion of the P base layer 1102 which is held between the auxiliary emitter layer 1106 and the main emitter layer 1101 and annularly exposed on the upper major surface is divided into inner and outer regions by an annular portion of the N base layer 1103. This annular portion of the N base layer 1103, i.e., a separating poriton 1112, functions as a barrier for suppressing or inhibiting carrier movement between the inner and outer regions.

A photoreceiving portion 1109 is provided at the center of the auxiliary emitter layer 1105 of the initial stage auxiliary thyristor $ST_1$. A cathode electrode 1107 is formed on an upper major surface of the main emitter layer 1101. A plurality of short-circuiting portions (shown by dotted lines in FIGS. 45 and 46) are formed in the main emitter layer 1101 in the form of small holes vertically passing through the same, so that the cathode electrode 1107 is short-circuited with the P base layer 1102 through these short-circuiting portions. An anode electrode 1108 is formed on a lower major surface of the P emitter layer 1104.

An annular auxiliary emitter layer 1110 is formed on the auxiliary emitter layer 1105. Further, an annular collector electrode 1121 having one parted portion is formed on a portion of the P base layer 1102 which is held between the auxiliary emitter layers 1105 and 1106. In addition, an annular emitter electrode 1111 having one parted portion is formed on the auxiliary emitter layer 1106 integrally with the collector electrode 1121. Further, an annular auxiliary gate electrode 1110a having one parted portion is formed on the aforementioned inner region which is adjacent to the outer side of the auxiliary emitter layer 1106. Further, an annular gate electrode (collector electrode) 111a is formed on the aforementioned outer region which is adjacent to the inner side of the main emitter layer 1101.

An insulating film 1113 of an oxide, for example, is selectively formed on the semiconductor substrate between the auxiliary emitter electrode 1110 and the auxiliary gate electrode 1110a across the parted portions of the collector electrode 1121 and the auxiliary emitter electrode 1111. A conductor bridging portion 1110b is formed on the insulating film 1113 integrally with the auxiliary emitter electrode 1110 and the auxiliary gate electrode 1110a for electrically connecting these electrodes with each other. Further, an insulating film 1114 of an oxide, for example, is selectively formed on the semiconductor substrate between the auxiliary emitter electrode 1111 and the gate electrode 1111a across the parted portion of the auxiliary gate electrode 1110a. A conductor bridging portion 1111b is formed on this insulating film 1114 integrally with the auxiliary emitter electrode 1111 and the gate electrode 1111a for electrically connecting these electrodes with each other. The insulating films 1113 and 1114 guarantee electrical insulation between the bridging portions 1110b and 1111b formed thereon and the semiconductor substrate.

In this optical thyristor, as hereinabove described, the electrodes are connected with each other not by wiring materials but by the bridging portions which are integrally formed with those to be connected with each other, whereby the thyristor is excellent in reliability with no possibility for disconnection and short-circuiting.

The width of the isolation region 1112 is preferably not more than 60 μm, and set at 30 μm, for example. If this width exceeds 60 μm, a P-N junction which is formed between the P base layer 1102 and the N base region 1103 may cause withstand voltage deterioration since this P-N junction is a voltage inhibiting junction.

The auxiliary emitter electrode 1110 and the auxiliary gate electrode 1110a extend over the oxide film 1113 while the auxiliary emitter electrode 1111 and the gate electrode 1111a extend over the oxide film 1114, and hence these electrodes may be partially broken by corner portions of the oxide films 1113 and 1114 if these electrodes are insufficient in thickness with respect to the oxide films. Therefore, these electrodes are preferably about or at least five times the oxide films 1113 and 1114 in thickness. Since the oxide films 1113 and 1114 are about 1 μm in thickness at the most, the electrodes are preferably at least 5 μm in thickness.

<11-2. Steps of Fabricating the Device>

A method of fabricating this optical thyristor is now described. FIGS. 48A to 53 illustrate exemplary steps of this fabrication method. In order to fabricate this optical thyristor, an N-type silicon semiconductor substrate 1150 having a substantially discoidal shape and containing an N-type impurity in relatively low concentration is first prepared as shown in FIG. 48A. Then, a P-type impurity such as boron is introduced into the overall semiconductor substrate 1150 from its lower major surface, as shown in FIG. 48B. Thus, the semiconductor substrate 1150 has such a structure that the N-type N base layer 1103 is stacked on the P-type P emitter layer 1104.

Then, an upper major surface of the N base layer 1103 (upper major surface of the semiconductor substrate 1150) is ideologically divided into five regions including a circular region $U_1$ which is positioned at the center and concentric-annular regions $U_2$ to $U_5$ in this order from the center to the periphery, as shown in FIG. 49. Further, the region $U_4$ is ideologically divided into concentric-annular three regions $U_{41}$, $U_{42}$ and $U_{43}$ in this order from the inner side to the outer side.

Figure 50A:
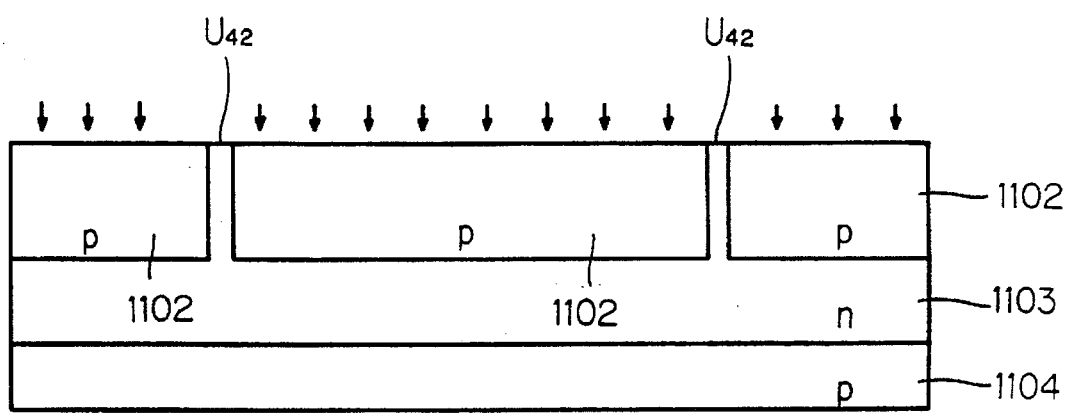
FIGS. 50A and 50B illustrate steps of fabricating the optical thyristor according to the eleventh embodiment of the present invention.

Then, a P-type impurity such as boron is selectively introduced into the upper major surface of the semiconductor substrate excluding the region $U_{42}$, to selectively form the P-type P base layer 1102 on the upper major surface portion of the N base layer 1103, as shown in FIG. 50A. At this time, the aforementioned isolation region 1121 is simultaneously formed.

Figure 50B:
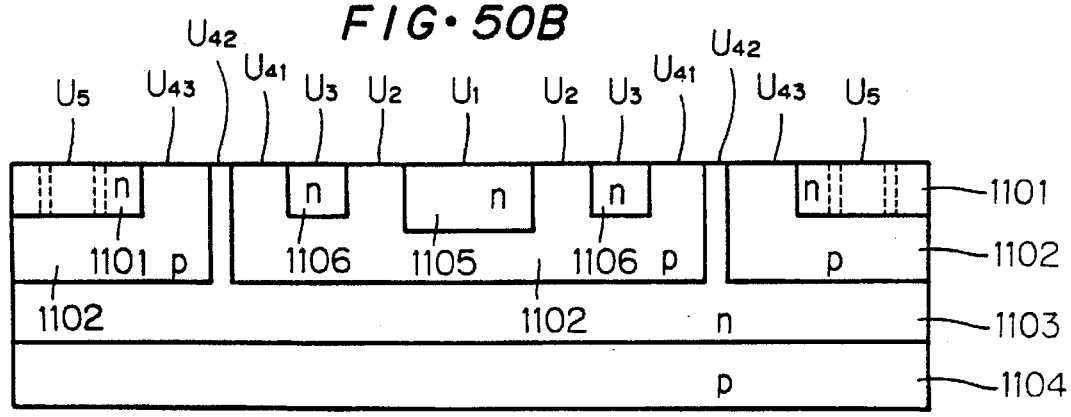

Then, an N-type impurity such as phosphorus is selectively introduced into the odd regions $U_1$, $U_3$ and $U_5$, thereby selectively forming the auxiliary emitter layers 1105 and 1106 and the main emitter layer 1101 on the upper major surface portion of the P base layer 1102, as shown in FIG. 50B. At this time, the impurity is selectively introduced into the region $U_5$ to exclude a plurality of sprinkled small regions. Thus, the aforementioned short-circuiting portions (shown by dotted lines in FIG. 50B) are formed in portions located immediately under the small regions.

Figure 51A:
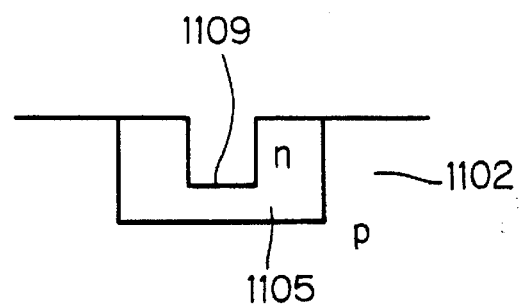
FIGS. 51A and 51B illustrate steps of fabricating the optical thyristor according to the eleventh embodiment of the present invention.

Then, the photoreceiving portion 1109 is formed on the center of the upper surface of the auxiliary emitter layer 1105, as shown in FIG. 51A.

Figure 51B:
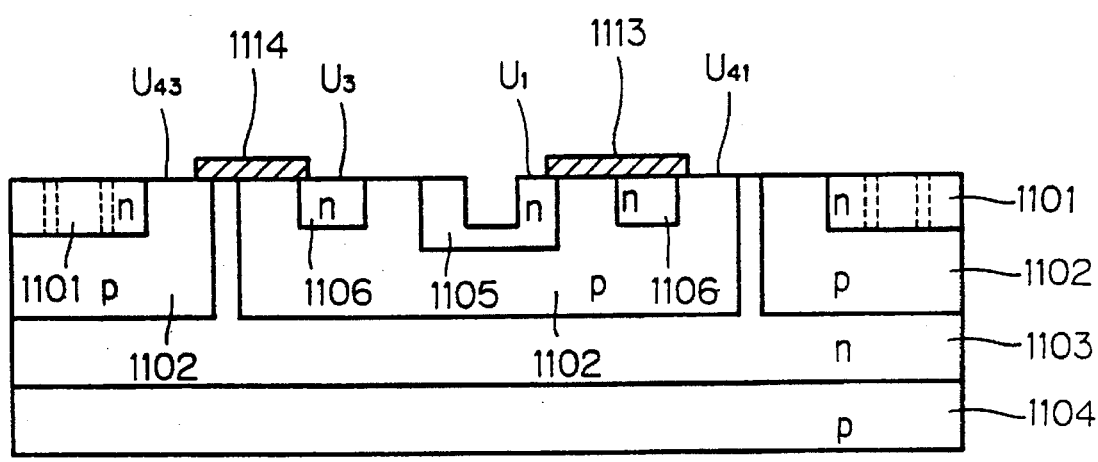

Then, the insulating film 1113 such as an oxide film, for example, is selectively formed on the upper major surface of the semiconductor substrate along a path connecting the regions $U_1$ and $U_{41}$ with each other, as shown in FIG. 51B. At the same time, the insulating film 1114 such as an oxide film, for example, is selectively formed on the upper major surface of the semiconductor substrate along a path connecting the regions $U_3$ and $U_{43}$ with each other.

Then, a metal film 1108 is formed on the overall major surface of the P emitter layer 1104, as shown in FIG. 52. Simultaneously with or around this, a metal film 1151 is formed to cover the upper major surface of the semiconductor substrate and the overall insulating films 1113 and 1114. The metal film 1108 functions as the anode electrode 1108 as such.

Referring again to FIGS. 44 to 46, the metal film 1151 is selectively removed through etching, for example, to form the annular auxiliary emitter electrode 1110, the annular collector electrode 1121 which is parted in one portion by the insulating film 1113, the annular auxiliary emitter electrode 1111 which is parted in one portion by the insulating film 1113, the annular auxiliary gate electrode 1110a which is parted in one portion by the insulating film 1114, and the annular gate electrode 1111a on the semiconductor substrate. At the same time, the bridging portions 1110b and 1111b are formed on the insulating films 1113 and 1114 respectively. At this time, the collector electrode 1121 and the auxiliary emitter electrode 1111, the bridging portion 1110b, the auxiliary emitter electrode 1110 and the auxiliary gate electrode 1110a, as well as the bridging portion 1111b, the auxiliary emitter electrode 1111 and the gate electrode 1111a are integrally formed with each other.

According to this fabrication method, as hereinabove described, the electrodes to be connected with each other are integrally formed with each other with no employment of wiring materials, whereby the fabrication steps are advantageously simplified.

<11-3. Ordinary Operation of the Device>

Figure 45:
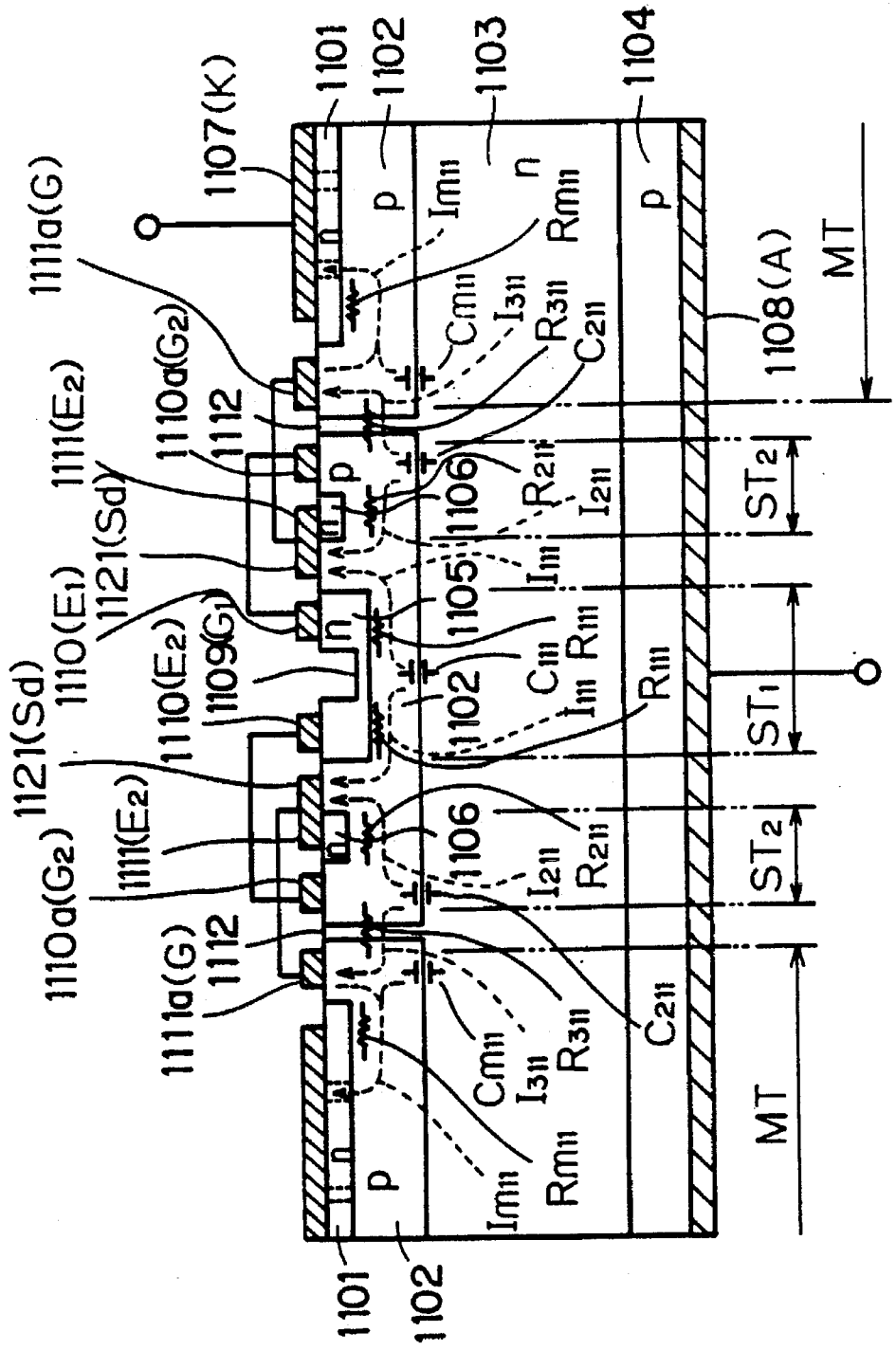
FIG. 45 is a sectional view showing the optical thyristor according to the eleventh embodiment of the present invention taken along the line A–A' in FIG. 44.
Figure 46:
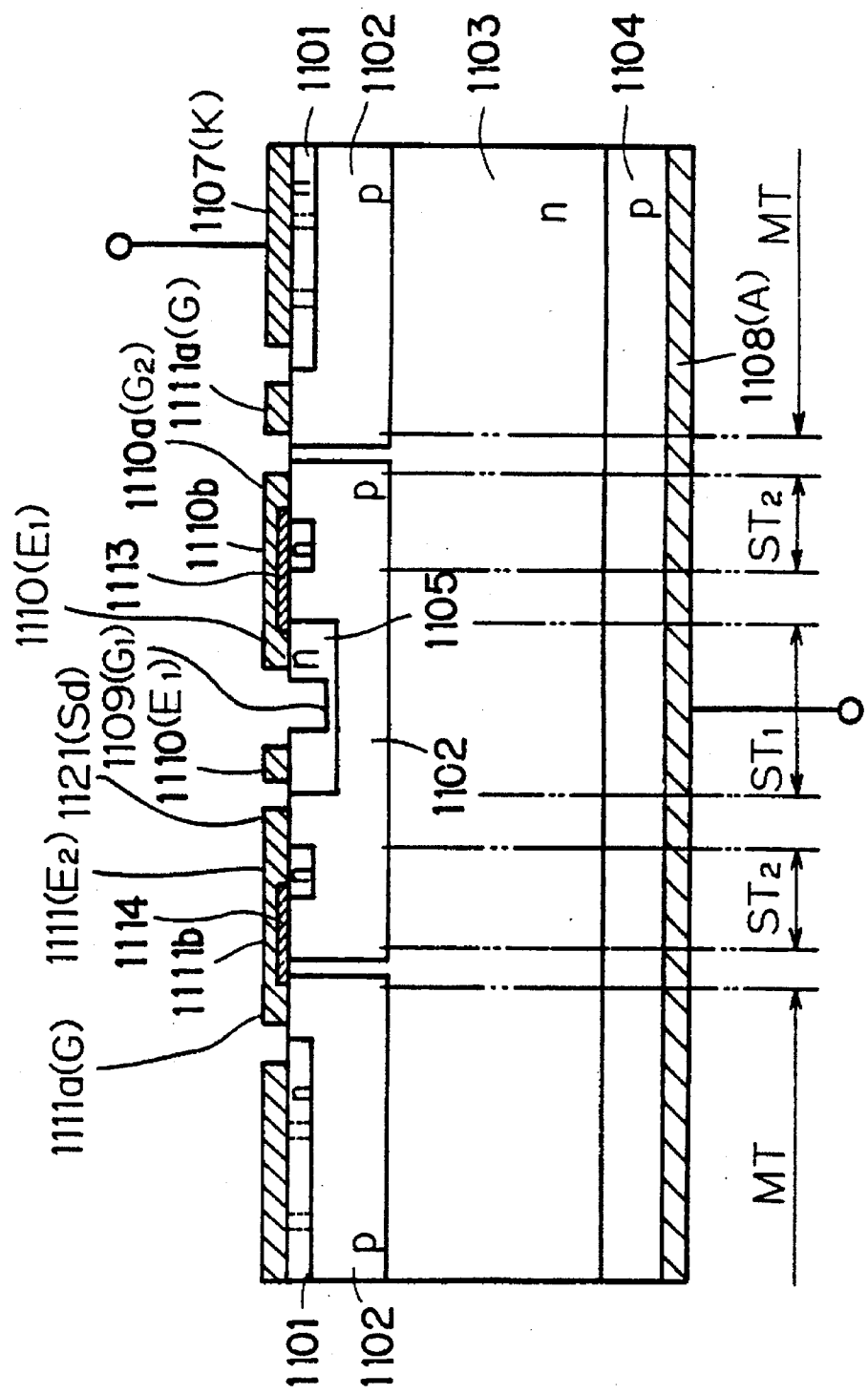
FIG. 46 is a sectional view showing the optical thyristor according to the eleventh embodiment of the present invention taken along the line B–B' in FIG. 44.
Figure 47:
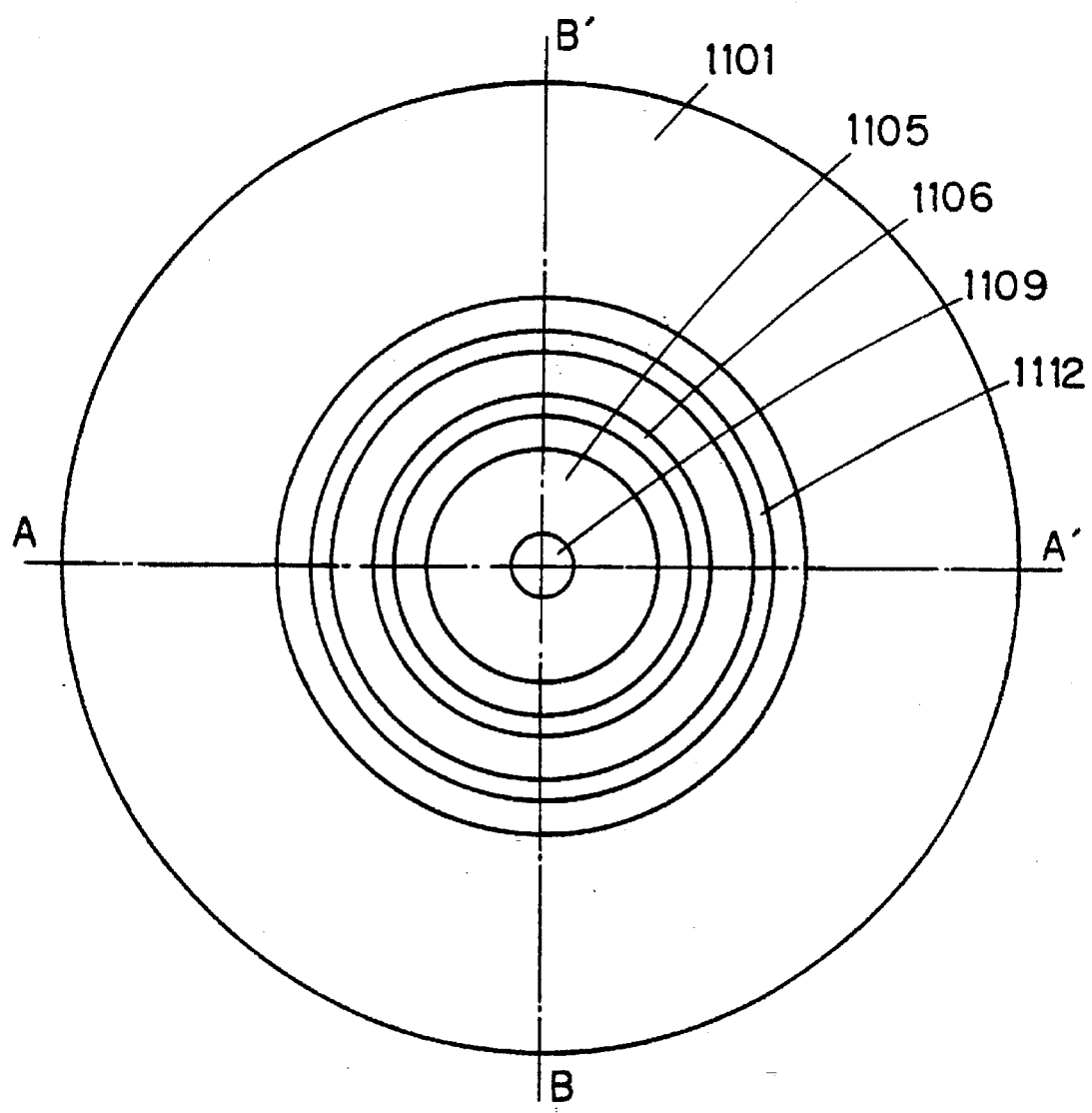
FIG. 47 is a plan view showing the optical thyristor according to the eleventh embodiment of the present invention in a state before formation of electrodes.

The ordinary operation of this optical thyristor is now described with reference to FIG. 45. In order to use this optical thyristor, an external power source is connected to the anode electrode 1108 and the cathode electrode 1107 of this device, thereby applying a positive voltage across these electrodes. When the photoreceiving portion 1109 is irradiated with an optical trigger signal under such application of the positive voltage, a photoelectric current is generated in depletion layer regions provided on both sides of a P-N junction formed between the N base layer 1103 of the initial stage auxiliary thyristor $ST_1$ and the P base layer 1102, to flow into the P base layer 1102. This photoelectric current transversely flows through the P base layer 1102, and thereafter flows into the collector electrode 1121. The photoelectric current flows through the same path of a displacement current $I_{111}$ described later. The photoelectric current flowing into the collector electrode 1121 reaches to the gate electrode 1111a through the bridging portion 1111b. The photoelectric current further flows to the aforementioned outer region from the gate electrode 1111a, transversely flows through the P base layer 1102, and thereafter flows into the cathode electrode 1107 through the short-circuiting portions, along the path of a displacement current $I_{m11}$ described later.

Consequently, the photoelectric current develops a transverse potential difference in a portion of the P base layer 1102 located immediately under the auxiliary emitter layer 1105 of the auxiliary thyristor $ST_1$, thereby forward-biasing a P-N junction which is formed between the auxiliary emitter layer 1105 of the auxiliary thyristor $ST_1$ and the P base layer 1102. If the optical signal is so strong that the forward bias voltage approaches the value of a diffusion potential which is specific to the P-N junction, electron injection from the auxiliary emitter layer 1105 into the P base layer 1102 is abruptly increased, to turn on the auxiliary thyristor $ST_1$. This turn-on current for the auxiliary thyristor $ST_1$ flows to the auxiliary gate electrode 1110a from the auxiliary emitter electrode 1110 through the bridging portion 1110b, thereby being supplied to the aforementioned inner region. The turn-on current which is supplied to the inner region functions as a gate current for the auxiliary thyristor $ST_2$.

Due to the isolation region 1112, this gate current flows not into the gate electrode 1111a but into the collector electrode 1121 transversely through a portion of the P base layer 1102 located immediately under the annular auxiliary emitter layer 1106 along the same path as a displacement current $I_{211}$ described later. The gate current flowing into the collector electrode 1121 flows to the cathode electrode 1107 through a path similar to that of the photoelectric current. This gate current is by far larger than the photoelectric current which is generated in the auxiliary thyristor $ST_1$, whereby a large voltage is generated along the path of the gate current. Consequently, a sufficiently high forward bias voltage is applied to a P-N junction between the auxiliary emitter layer 1106 and the P base layer 1102, whereby the auxiliary thyristor $ST_2$ is turned on. This turn-on current for the auxiliary thyristor $ST_2$ flows from the auxiliary emitter electrode 1111 to the gate electrode 1111a through the bridging portion 1111b, thereby being supplied to the aforementioned outer region. The turn-on current which is supplied to the outer region functions as a gate current for the main thyristor MT.

Similarly to the photoelectric current, the gate current which is supplied to the outer region transversely flows through the P base layer 1102 and thereafter flows into the cathode electrode 1107 by passing through the short-circuiting portions. Since this gate current is obtained by successively amplifying the photoelectric current which is generated in the auxiliary thyristor $ST_1$ over two stages, a large voltage is generated along the path of the gate current. Consequently, a forward bias voltage of a sufficient value is applied to the P-N junction between the main emitter layer 1101 and the P base layer 1102, whereby the main thyristor MT is turned on. Thus, a main current flows from the anode electrode 1108 to the cathode electrode 1107. Namely, the thyristor conducts.

Also in this thyristor, the transverse resistance of the portion of the P base layer 1102 located immediately under the auxiliary emitter layer 1105 of the auxiliary thyristor $ST_1$ which is turned on at first may be increased, in order to improve photosensitivity. Thus, the voltage which is generated along the path of the photoelectric current is increased, whereby the auxiliary thyristor $ST_1$ is easily turned on. Namely, the thyristor is improved in photosensitivity. On the other hand, it is preferable to set the transverse resistance of the portion of the P base layer 1102 located immediately under the auxiliary emitter region 1106 of the second auxiliary thyristor $ST_2$ at a small value.

<11-4. Characteristic Operation of the Device>

Description is now made on an operation of this optical thyristor, to which a voltage noise having a large dv/dt value is applied. At this time, the displacement currents $I_{111}$, $I_{211}$ and $I_{m11}$ are generated by capacitances $C_{111}$, $C_{211}$ and $C_{m11}$ of junctions between the auxiliary emitter layer 1105 of the auxiliary thyristor $ST_1$, between the auxiliary emitter layer 1106 of the auxiliary thyristor $ST_2$ and the P base layer 1102, and between the main emitter layer 1101 of the main thyristor MT and the P base layer 1102 respectively.

The displacement current $I_{111}$ which is generated in the auxiliary thyristor $ST_1$ flows in the P base layer 1102 into the collector electrode 1121 through the same path as the photoelectric current, and thereafter flows to the gate electrode 1111a through the bridging portion 1111b. Due to a resistance $R_{111}$ provided in this path, the displacement current $I_{111}$ develops a transverse potential difference mainly in a portion of the P base layer 1102 located immediately under the auxiliary emitter layer 1105. Similarly, the displacement current $I_{211}$ which is generated in the auxiliary thyristor $ST_2$ flows in the P base layer 1102 into the collector electrode 1121 through the same path as the photoelectric current, and thereafter flows to the gate electrode 1111a through the bridging portion 1111b. Due to a resistance $R_{211}$ of the auxiliary thyristor $ST_2$ in the P base layer 1102, the displacement current $I_{211}$ develops a transverse potential difference in a portion of the P base layer 1102 located immediately under the auxiliary emitter layer 1106. As clearly understood from FIG. 45, the paths of the two displacement currents $I_{111}$ and $I_{211}$ are separated from each other.

Further, the displacement current $I_{m11}$ which is generated in the main thyristor MT is joined with the displacement currents $I_{111}$ and $I_{211}$ which are supplied from the gate electrode 1111a, and flows into the cathode electrode 1107 through the same path as the gate current for the main thyristor MT. Due to a resistance $R_{m11}$ provided in the path, the displacement currents $I_{111}$, $I_{211}$ and $I_{m11}$ develop a transverse potential difference mainly in a portion of the P base layer 1102 located immediately under the main emitter layer 1101 of the main thyristor MT.

Figure 53:
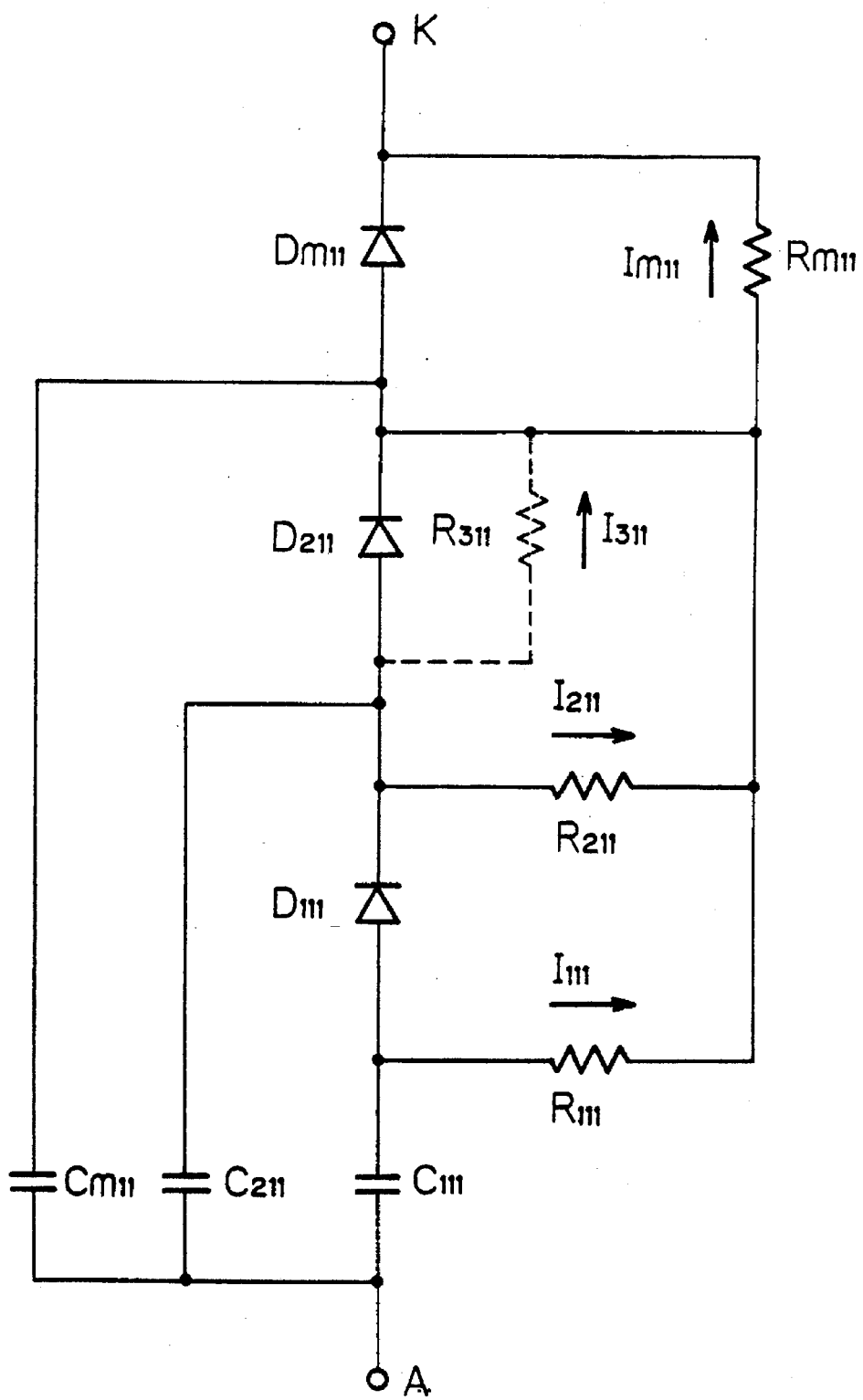
FIG. 53 is an equivalent circuit diagram of the optical thyristor according to the eleventh embodiment of the present invention.
Figure 54:
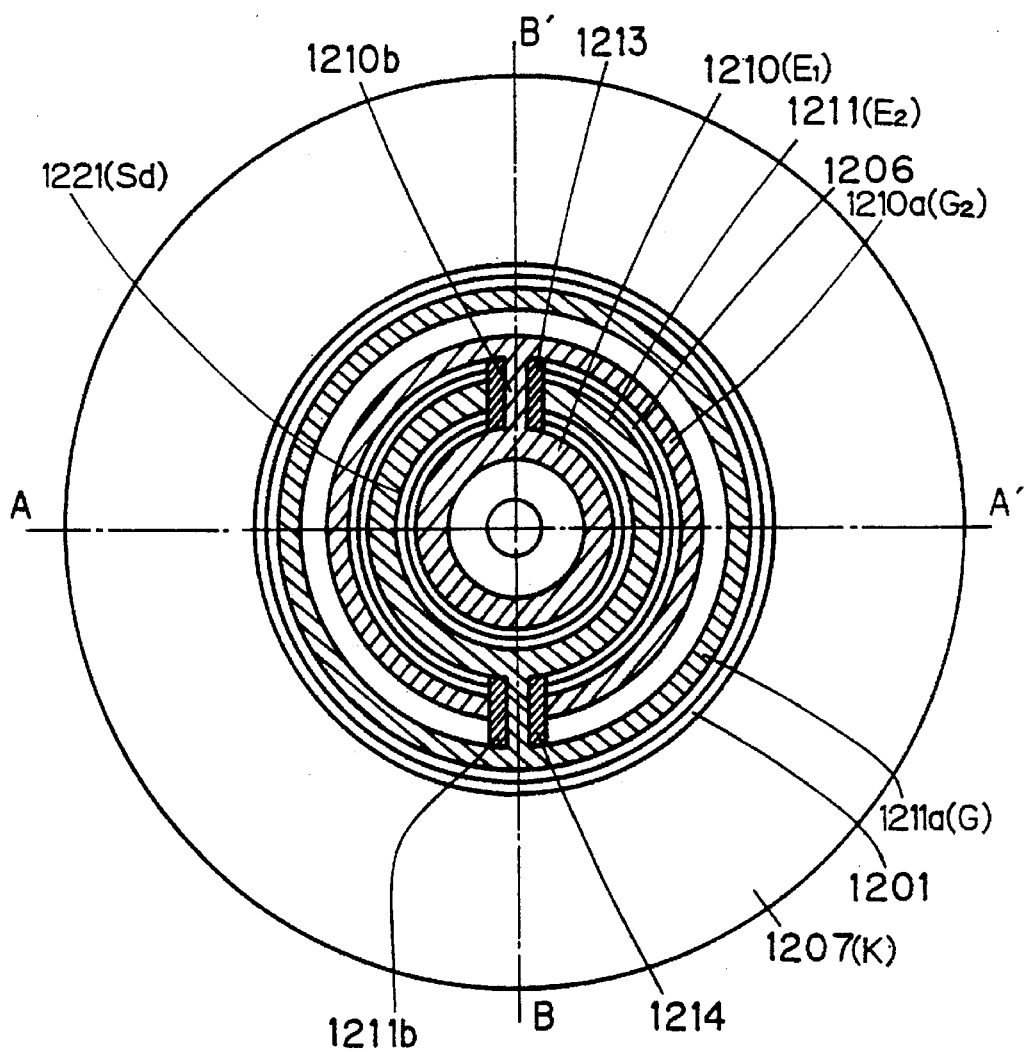
FIG. 54 is a plan view showing an optical thyristor according to a twelfth embodiment of the present invention.
Figure 55:
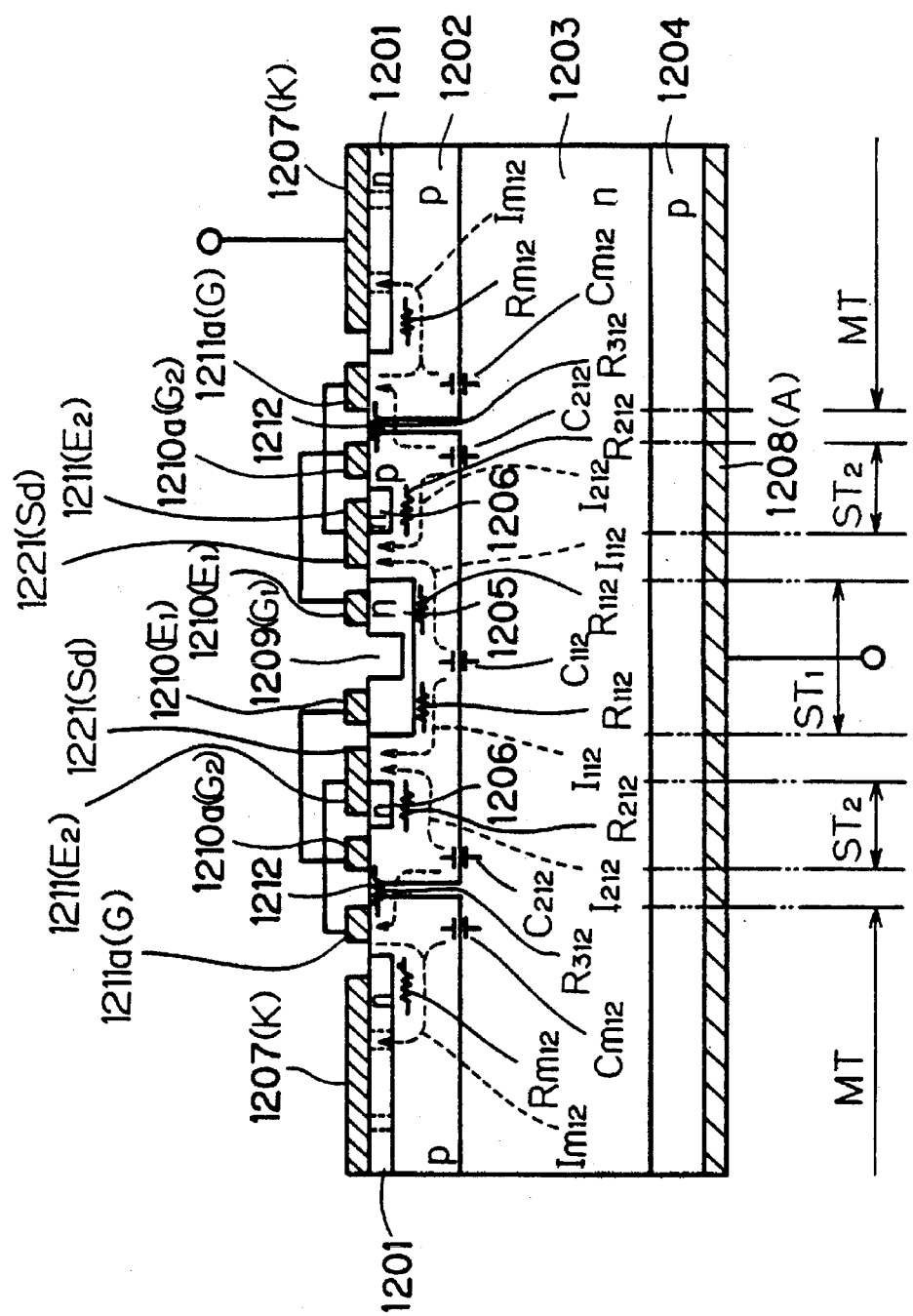
FIG. 55 is a sectional view showing the optical thyristor according to the twelfth embodiment of the present invention taken along the line A–A' in FIG. 54.
Figure 56:
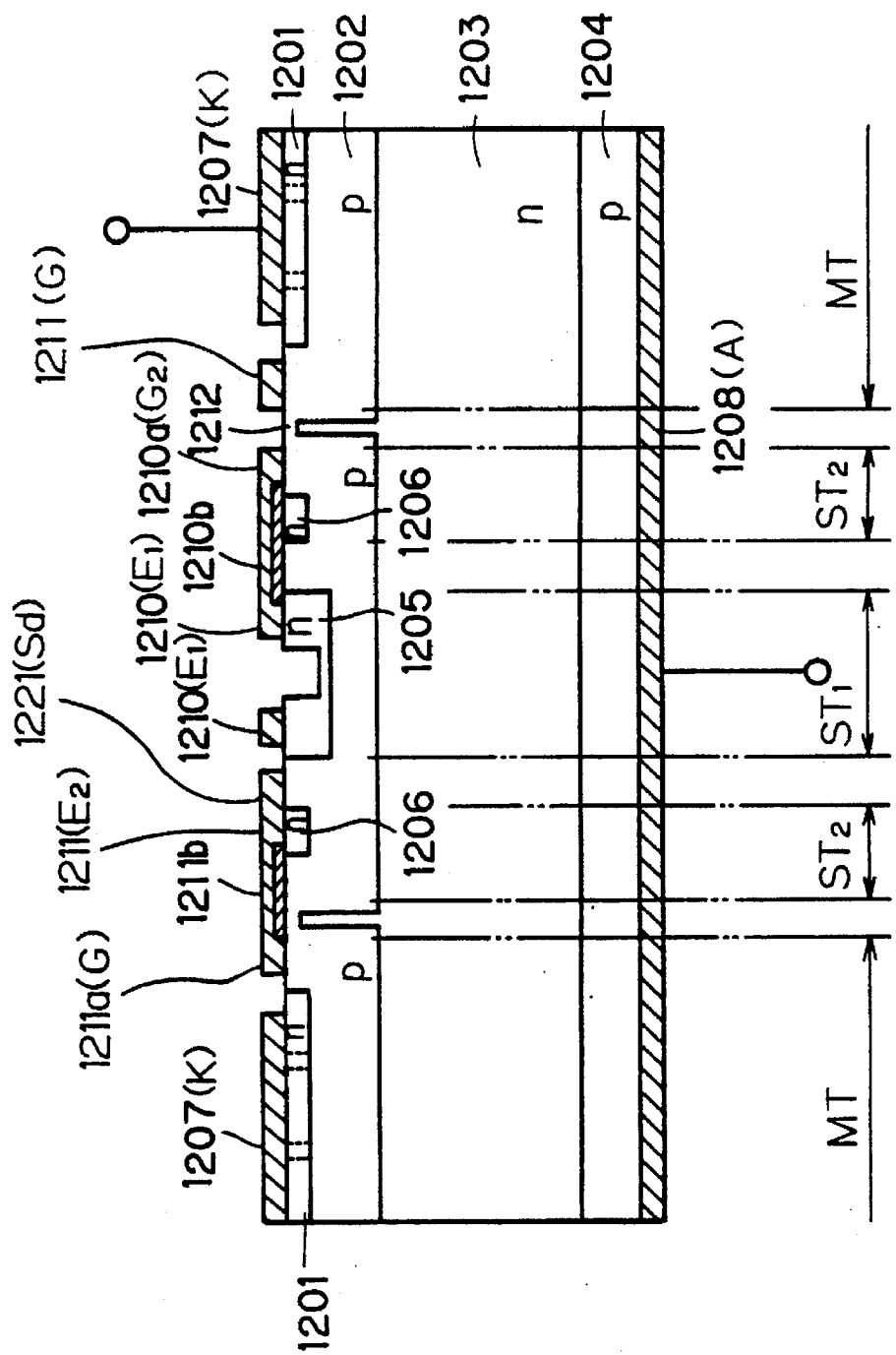
FIG. 56 is a sectional view showing the optical thyristor according to the twelfth embodiment of the present invention taken along the line B–B' in FIG. 54.

FIG. 53 is an equivalent circuit diagram which is related to behavior of the displacement currents $I_{111}$, $I_{211}$ and $I_{m11}$. Diodes $D_{111}$ and $D_{211}$ equivalently express the junctions between the auxiliary emitter layers 1105 and 1106 of the auxiliary thyristors $ST_1$ and $ST_2$ and the P base layer 1102 respectively, while a diode $D_{m11}$ expresses the junction between the main emitter layer 1101 of the main thyristor MT and the P base layer 1102. An end of only the resistance $R_{m11}$ is short-circuited with the cathode electrode 1107 (K). A resistance $R_{311}$ of the isolation region 1112 is set at a sufficiently high value as compared with the resistance $R_{211}$, and hence only a small amount of component of the displacement current $I_{211}$ is divided into the resistance $R_{311}$. Namely, the displacement current $I_{211}$ preferentially flows through the resistance $R_{211}$ as compared with the resistance $R_{311}$, due to the isolation region 1112.

As understood from FIG. 53, a forward bias voltage which is provided by $I_{111} \times R_{111} - I_{211} \times R_{211}$ is applied across an anode and a cathode of the diode $D_{111}$. Namely, a forward bias voltage for the auxiliary thyristor $ST_1$ which is originally brought by the displacement current $I_{111}$ is attenuated by the next stage displacement current $I_{211}$. Therefore, the auxiliary thyristor $ST_1$ is suppressed from abnormal ignition caused by the displacement current $I_{111}$. This results from the fact the paths of the two displacement currents $I_{111}$ and $I_{211}$ are separated from each other. On the other hand, a forward bias voltage corresponding to a voltage ($I_{211} \times R_{211}$) which is brought by the displacement current $I_{211}$ is applied across an anode and a cathode of the diode $D_{211}$. Thus, no effect of suppressing abnormal ignition appears with respect to the second stage (final stage) auxiliary thyristor $ST_2$ in this thyristor.

In this optical thyristor, however, it is possible to suppress abnormal ignition with respect to the initial stage auxiliary thyristor $ST_1$ whose abnormal ignition is most easily generated by the displacement current, whereby a sufficient effect is attained for improving dv/dt resistance of the overall thyristor. Further, it is also possible to cancel the forward bias voltage which is applied to the junction of the auxiliary thyristor $ST_1$ by adjusting the resistances $R_{111}$ and $R_{211}$ or the aforementioned transverse resistances forming principal parts thereof.

Further, it is possible to decide photosensitivity and dv/dt resistance independently of each other by adjusting the resistances $R_{111}$ and $R_{211}$, whereby the photosensitivity and the dv/dt resistance can be decided independently of each other. Thus, it is possible to compatibly improve the photosensitivity and the dv/dt resistance.

In the optical thyristor according to this embodiment, further, the auxiliary emitter layers 1105 and 1106 are concentrically or concentric-annularly formed, whereby the following three advantages are attained: First, it is possible to increase the emitter lengths in the order of the auxiliary emitter layer 1105, the auxiliary emitter layer 1106 and the main emitter layer 1101. Therefore, conduction areas are increased in order of the auxiliary emitter layer 1105, the auxiliary emitter layer 1106 and the main emitter layer 1101 when the auxiliary thyristor $ST_1$, the auxiliary thyristor $ST_2$ and the main emitter layer MT are turned on in this order, whereby the turn-on current which is increased with time is efficiently spread over the entire surface of the thyristor. Also when a turn-on current having large di/dt is applied, therefore, it is possible to prevent concentration of the current.

Second, it is possible to shorten the bridging portions 1110b and 1111b between the auxiliary emitter electrodes 1110 and 1111 and the gate electrodes 1110a and 1111a respectively. Thus, it is possible to prevent the bridging portions 1110b and 1111b from being burnt out by the turn-on current having large di/dt continuously flowing to the bridging portions 1110b and 1111b before the main thyristor MT is turned on. Further, area efficiency is improved since the bridging portions 1110b and 1111b can be shortened.

Third, the auxiliary thyristors $ST_1$ and $ST_2$ can be set in large areas, whereby it is possible to set the displacement currents $I_{111}$ and $I_{211}$ which are generated by dv/dt at large values while setting the transverse resistance of the portion of the P base layer 1104 located immediately under the auxiliary emitter region 1106 at a small value. This contributes to improvement of photosensitivity.

<Twelfth Embodiment>
<12-1. Structure of the Device>

A twelfth embodiment of the present invention is now described. FIGS. 54 to 57, illustrating the structure of an optical thyristor according to this embodiment, are a plan view, sectional views taken along the lines A-A' and B-B' in FIG. 54 respectively, and a plan view with omission of electrodes.

This optical thyristor is identical to that of the eleventh embodiment except that an isolation region 1212 is different in structure. Namely, three stage unit thyristors including an initial stage auxiliary thyristor $ST_1$, a second stage auxiliary thyristor $ST_2$ and a main thyristor MT are concentrically or concentric-annularly arranged in this order from the center of a major surface of a substantially discoidal silicon semiconductor substrate. A P base layer 1202, an N base layer 1203 and a P emitter layer 1204 are stackedly formed on the semiconductor substrate successively from its upper major surface toward its lower major surface. Further, N-type auxiliary emitter layers 1205 and 1206 and an N-type main emitter layer 1201 are selectively concentrically or concentric-annularly formed in this order from the center of the upper major surface of the P base layer 1202.

The annular isolation region 1212 dividing a portion of the P base layer 1202 which is held between the auxiliary emitter layer 1206 and the main emitter layer 1201 and annularly exposed on the upper major surface into inner and outer regions is defined by forming this region of the P base layer 1202 to be shallower than the remaining regions. Due to such a structure, the isolation region 1212 functions as a barrier for suppressing or inhibiting carrier movement between the inner and outer regions. The width of the isolation region 1212 is set at a degree which is sufficient for resistively separating the auxiliary emitter electrode 1210a and the gate electrode 1211a from each other. Since the isolation region 1212 is a P-type region which is integrated with the P base layer 1202, it is possible to ensure the withstand voltage more easily as compared with the thyristor according to the eleventh embodiment, while allowance for the withstand voltage is high. Impurity concentration in the isolation region 1212 is preferably set at a lower value than the remaining regions.

A photoreceiving portion 1209, a cathode electrode 1207, an anode electrode 1208, an auxiliary emitter electrode 1210, a collector electrode 1221, an auxiliary emitter electrode 1211, an auxiliary gate electrode 1210a, a gate electrode (collector electrode) 1211a, an insulating film 1213, a bridging portion 1210b, an insulating film 1214 and a bridging portion 1211b are identical in structure to the corresponding portions of the thyristor according to the eleventh embodiment, and hence redundant description is omitted. According to this embodiment, the electrodes are connected with each other not by wiring materials but by the bridging portions which are integrally formed with the electrodes to be connected with each other similarly to the thyristor according to the eleventh embodiment, whereby the thyristor is excellent in reliability with no possibility of disconnection and short-circuiting.

<12-2. Steps of Fabricating the Device>

Figure 58A:
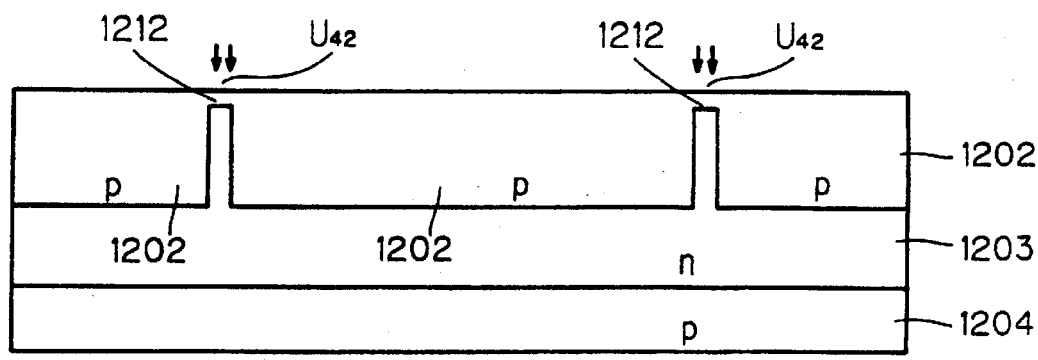
FIGS. 58A and 58B illustrate steps of fabricating the optical thyristor according to the twelfth embodiment of the present invention.
Figure 58B:
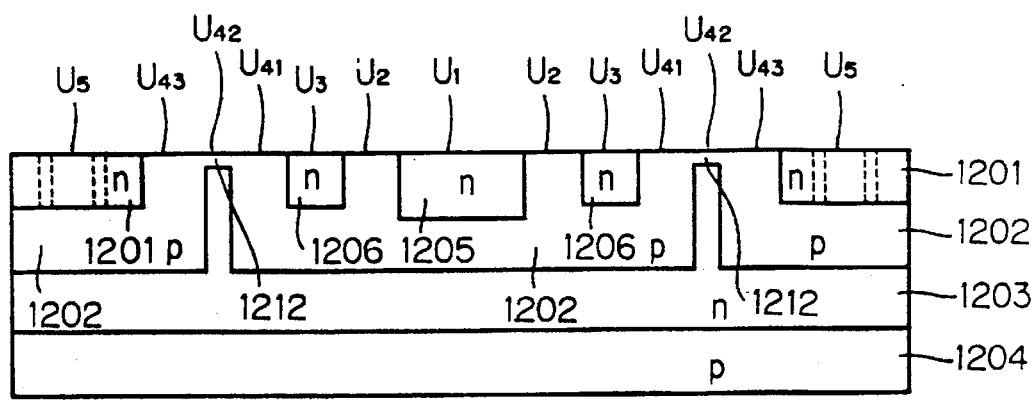

A method of fabricating this optical thyristor is now described. FIGS. 58A and 58B show steps of this fabrication method. In order to fabricate this optical thyristor, the steps shown in FIGS. 48A to 50A in the eleventh embodiment are first executed.

Then, as shown in FIG. 58A, P-type impurity such as boron is shallowly introduced into the overall upper major surface of the semiconductor substrate, or selectively into a region $U_{42}$, to convert a portion in proximity to an upper major surface of the isolation region 1212 to a P-type semiconductor layer. This P-type semiconductor layer is formed to be shallower than the P base layer 1102. Further, impurity concentration in the P-type semiconductor layer is adjusted to be lower than that in the P base layer 1102. Also when the P-type impurity is introduced into the overall upper major surface, the main emitter layer 1201 and the auxiliary emitter layers 1205 and 1206 into which a high concentration impurity is introduced are hardly influenced, due to its low concentration.

Then, an N-type impurity such as phosphorus is selectively introduced into odd regions $U_1$, $U_3$ and $U_5$ as shown in FIG. 58B, thereby selectively forming the auxiliary emitter layers 1205 and 1206 and the main emitter layer 1201 on an upper major surface portion of the P base layer 1202. At this time, the impurity is selectively introduced into the region $U_5$ while excluding a plurality of sprinkled small regions. Thus, short-circuiting portions (shown by dotted lines in FIG. 58B) are formed immediately under the small regions. The following steps are similar to the steps following FIG. 51A in the eleventh embodiment, and hence redundant description is omitted.

Also in this fabrication method, as hereinabove described, the electrodes to be connected with each other are integrally formed with each other with no employment of wiring materials similarly to the method described with reference to the eleventh embodiment, whereby the fabrication steps are advantageously simplified.

<12-3. Operation of the Device>

The ordinary operation of the optical thyristor according to this embodiment is similar to that of the optical thyristor according to the eleventh embodiment, and hence redundant description is omitted. Description is now made on an operation of the optical thyristor to which a voltage noise having a large dv/dt value is applied. At this time, displacement currents $I_{112}$, $I_{212}$ and $I_{m12}$ are generated by capacitances $C_{111}$, $C_{212}$ and $C_{m12}$ of junctions between the auxiliary emitter layer 1205 of the auxiliary thyristor $ST_1$ and the P base layer 1202, between the auxiliary emitter layer 1206 of the auxiliary thyristor $ST_2$ and the P base layer 1202, and between the main emitter layer 1201 of the main thyristor MT and the P base layer 1202 respectively. These displacement currents $I_{112}$, $I_{212}$ and $I_{m12}$ flow along paths which are similar to those of the displacement currents $I_{111}$, $I_{211}$ and $I_{m11}$ generated in the optical thyristor according to the eleventh embodiment respectively.

Therefore, a circuit of this thyristor which is related to behavior of the displacement currents $I_{112}$, $I_{212}$ and $I_{m12}$ is equivalently expressed by a circuit diagram shown in FIG. 59. Circuit diodes $D_{112}$ and $D_{212}$ equivalently express the junctions between the auxiliary emitter layers 1205 and 1206 of the auxiliary thyristors $ST_1$ and $ST_2$ and the P base layer 1202 respectively, while a diode $D_{m12}$ expresses the junction between the main emitter layer 1202 of the main thyristor MT and the P base layer 1202. Resistances $R_{112}$, $R_{212}$ and $R_{m12}$ are along the paths of the displacement currents $I_{112}$, $I_{212}$ and $I_{m12}$ respectively. Since a resistance $R_{312}$ of the isolation region 1212 is set at a sufficiently high level as compared with the resistance $R_{212}$, only a small amount of component of the displacement current $I_{212}$ is divided into the resistance $R_{312}$. Namely, the displacement current $I_{212}$ preferentially flows in the resistance $R_{212}$ as compared with the resistance $R_{312}$, due to the isolation region 1212. Namely, the circuit of this thyristor has a structure which is similar to that of the circuit of the thyristor according to the eleventh embodiment.

Therefore, abnormal ignition of the auxiliary thyristor $ST_1$ caused by the displacement current $I_{112}$ is suppressed by the displacement current $I_{212}$. Abnormal ignition can be suppressed as to the initial auxiliary thyristor $ST_1$ whose abnormal ignition is most easily caused by the displacement current, whereby this thyristor can sufficiently attain improvement in dv/dt resistance of the overall thyristor, similarly to the thyristor according to the eleventh embodiment.

The resistance $R_{312}$ of the isolation region 1212 is somewhat high as compared with the optical thyristor according to the eleventh embodiment, and hence a part $I_{213}$ of the displacement current $I_{212}$ tends to flow to the gate electrode 1211a across the isolation region 1212. In response to the degree of division of the displacement current $I_{212}$ to the displacement current $I_{312}$, the degree of application to the auxiliary thyristor $ST_1$ for attenuating the forward bias voltage is also reduced. However, the resistance $R_{212}$ is still sufficiently lower than the resistance $R_{312}$, and hence the displacement current $I_{212}$ is divided into the displacement current $I_{312}$ at a sufficiently low degree. Thus, a sufficient effect is attained for improving dv/dt resistance.

<Thirteenth Embodiment>

<13-1. Structure of the Device>

Figure 60:
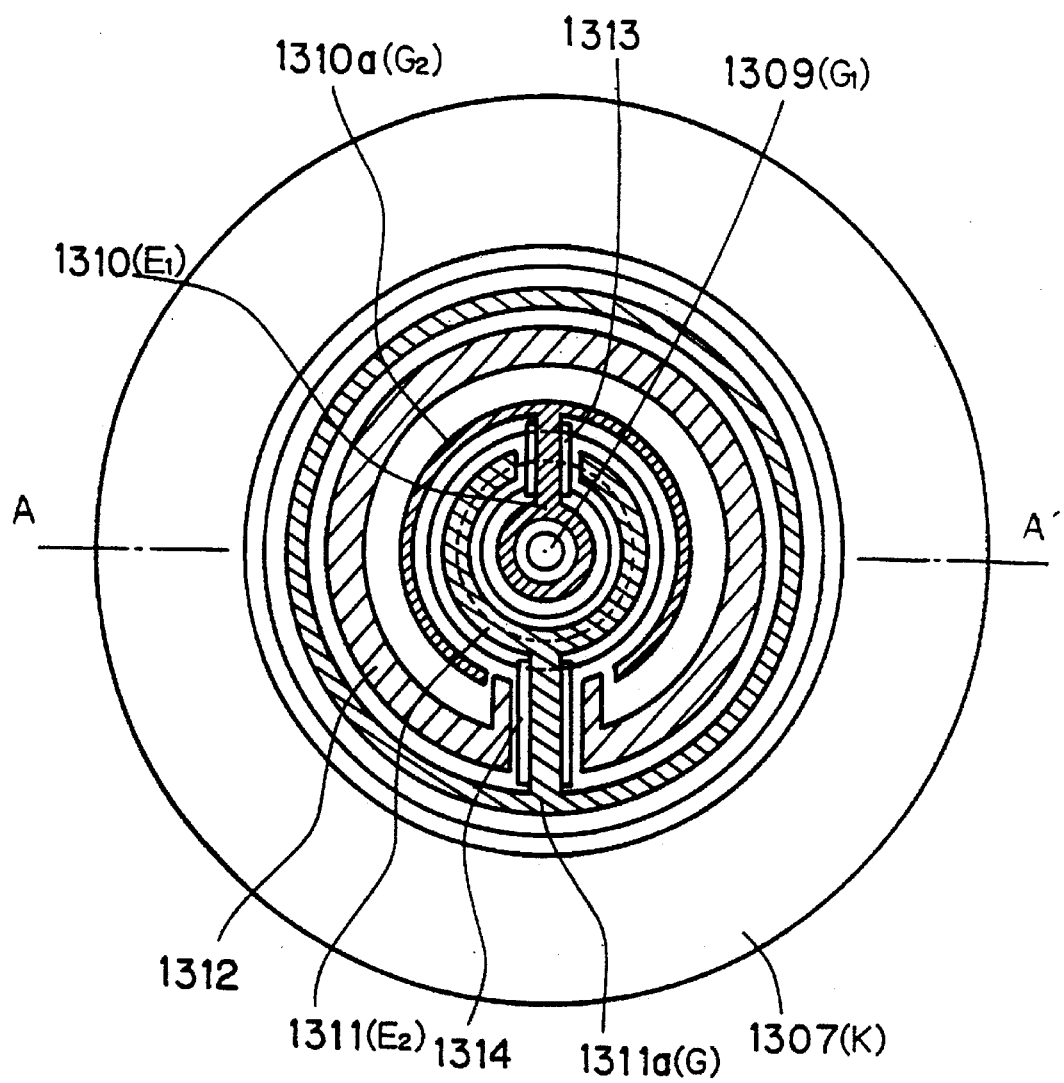
FIG. 60 is a plan view showing an optical thyristor according to a thirteenth embodiment of the present invention.

A thirteenth embodiment of the present invention is now described. FIGS. 60 to 62, illustrating the structure of an optical thyristor according to this embodiment, are a plan view, a sectional view taken along the line A-A' in FIG. 60, and a plan view with omission of electrodes respectively.

This optical thyristor is also identical to that of the eleventh embodiment except the structure of an isolation region 1312. Namely, three stage unit thyristors including an initial stage auxiliary thyristor $ST_1$, a second stage auxiliary thyristor $ST_2$ and a main thyristor MT are concentrically or concentric-annularly arranged in this order along a major surface of a substantially discoidal silicon semiconductor substrate from the center toward the periphery. A P base layer 1302, an N base layer 1303 and a P emitter layer 1304 are stackedly formed on the semiconductor substrate successively from its upper major surface toward its lower major surface. Further, N-type auxiliary emitter layers 1305 and 1306 and an N-type main emitter layer 1301 are selectively concentrically or concentric-annularly formed in this order from the center of the upper major surface of the P base layer 1202 to be separated from each other.

The annular isolation region 1312 dividing a portion of the P base layer 1302 which is held between the auxiliary emitter layer 1306 and the main emitter layer 1301 and annularly exposed on the upper major surface into inner and outer regions is worked into the form of a groove which is defined by removing an upper major surface portion of the P base layer 1202 having high impurity concentration and low resistance. Thus, the isolation region 1212 functions as a barrier for suppressing or inhibiting carrier movement between the inner and outer regions. Namely, a resistance $R_{313}$ between the auxiliary gate electrode 1310a and the gate electrode 1311a of the main thyristor MT is sufficiently high for resistively separating these electrodes from each other. Since the P base layer 1302 has a uniform diffusion depth in this optical thyristor, it is possible to ensure the withstand voltage more easily as compared with the optical thyristors according to the eleventh and twelfth embodiments.

A photoreceiving portion 1309, a cathode electrode 1307, an anode electrode 1308, an auxiliary emitter electrode 1310, a collector electrode 1321, an auxiliary emitter electrode 13 11, an auxiliary gate electrode 1310a, a gate electrode (collector electrode) 1311a, an insulating film 1313, a bridging portion 1310b, an insulating film 1314 and a bridging portion 1311b are identical in structure to the corresponding portions of the thyristor according to the eleventh embodiment, and hence redundant description is omitted. According to this embodiment, the electrodes are connected with each other not by wiring materials but by the bridging portions which are integrally formed with the electrodes to be connected with each other similarly to the thyristor according to the eleventh embodiment, whereby the thyristor is excellent in reliability with possibility for no disconnection and short-circuiting.

<13-2. Steps of Fabricating the Device>

Figure 63A:
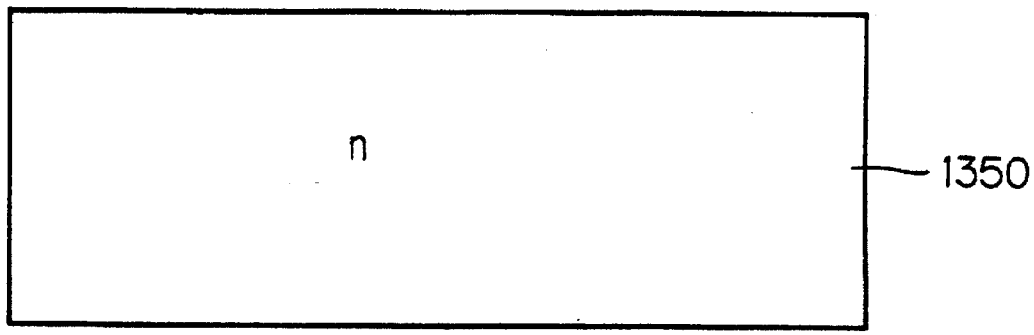
FIGS. 63A and 63B illustrate steps of fabricating the optical thyristor according to the thirteenth embodiment of the present invention.

A method of fabricating this optical thyristor is now described. FIGS. 63A, 63B, 64A and 64B illustrate steps of this fabrication method. In order to fabricate this optical thyristor, an N-type silicon semiconductor substrate 1350 having a substantially discoidal shape and containing an N-type impurity in relatively low concentration is prepared first, as shown in FIG. 63A.

Figure 63B:
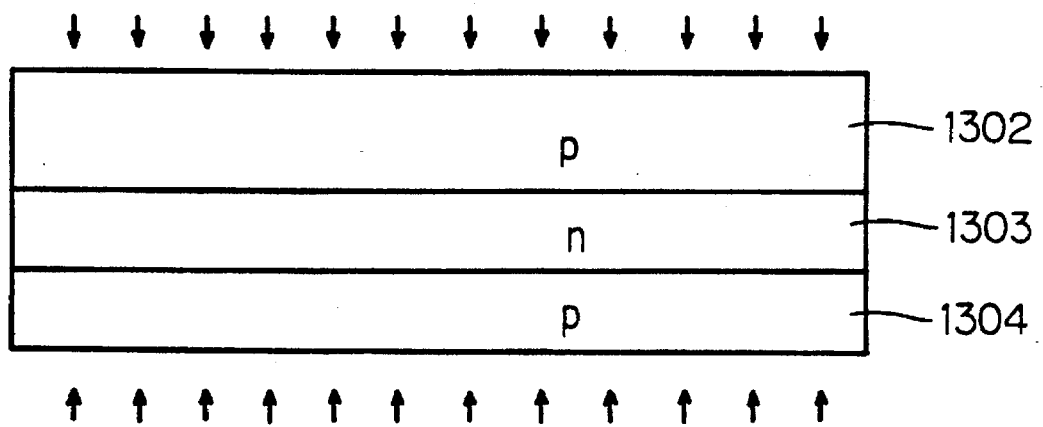

Then, a P-type impurity such as boron is introduced into the overall semiconductor substrate 1350 from upper and lower major surfaces thereof, as shown in FIG. 63B. Thus, the semiconductor substrate 1350 has such a structure that the P-type P base layer 1302, the N-type N base layer 1303 and the P-type P emitter layer 1304 are successively stacked on the P-type P emitter layer 1304 from the upper major surface toward the lower major surface.

Then, an upper major surface of the P base layer 1302 (upper major surface of the semiconductor substrate 1350) is ideologically divided into five regions $U_1$ to $U_5$, as shown in FIG. 49 in the eleventh embodiment, while the region $U_4$ is further ideologically divided into three regions $U_{41}$, $U_{42}$ and $U_{43}$.

Figure 64A:
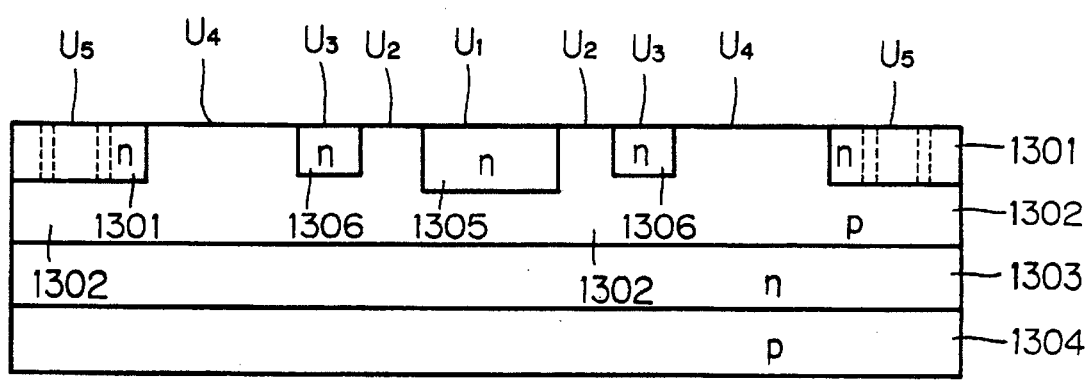
FIGS. 64A and 64B illustrate steps of fabricating the optical thyristor according to the thirteenth embodiment of the present invention.

Then, an N-type impurity such as phosphorus is selectively introduced into the odd regions $U_1$, $U_3$ and $U_5$ as shown in FIG. 64A, thereby selectively forming the auxiliary emitter layers 1305 and 1306 and the main emitter layer 1301 on an upper major surface portion of the P base layer 1302. At this time, the impurity is selectively introduced into the region $U_5$ while excluding a plurality of sprinkled small regions. Thus, short-circuiting portions (shown by dotted lines in FIG. 64A) are formed immediately under the small regions.

Figure 64B:
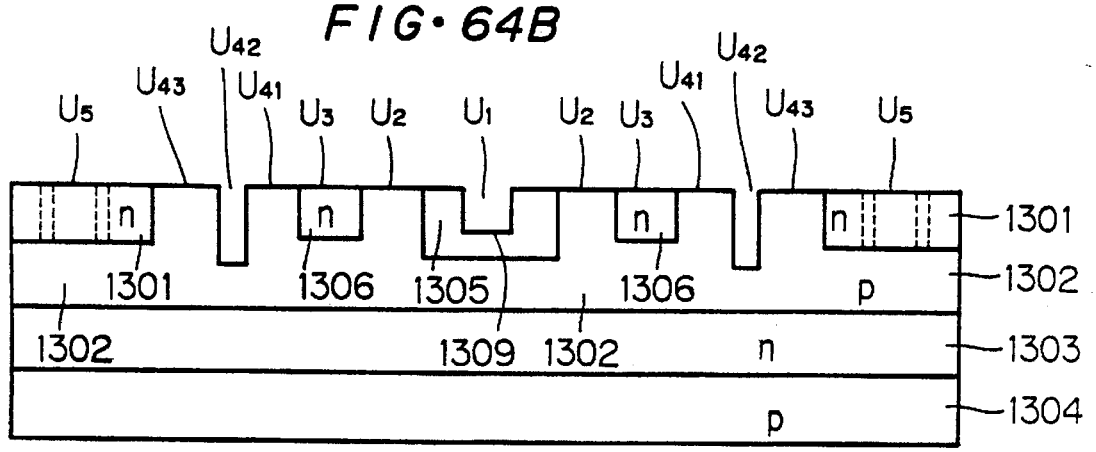

Then, the central portion of the upper surface of the auxiliary emitter layer 1305 and the region $U_{42}$ are simultaneously or independently removed by etching or the like for forming the photoreceiving portion 1309 and the groove-shaped isolation region 1312, as shown in FIG. 64B. The following steps are similar to the steps following FIG. 51B in the eleventh embodiment, and hence redundant description is omitted.

Also in this fabrication method, as hereinabove described, the electrodes to be connected with each other are integrally formed with each other with no employment of wiring materials similarly to the method described with reference to the eleventh embodiment, whereby the fabrication steps are advantageously simplified.

<13-3. Operation of the Device>

The ordinary operation of the optical thyristor according to this embodiment is similar to that of the optical thyristor according to the eleventh embodiment, and hence redundant description is omitted. Description is now made on an operation of the optical thyristor to which a voltage noise having a large dv/dt value is applied. At this time, displacement currents $I_{113}$, $I_{313}$ and $I_{m13}$ are generated by capacitances $C_{113}$, $C_{213}$ and $C_{m13}$ of junctions between the auxiliary emitter layer 1305 of the auxiliary thyristor $ST_1$ and the P base layer 1302, between the auxiliary emitter layer 1306 of the auxiliary thyristor $ST_2$ and the P base layer 1302, and between the main emitter layer 1301 of the main thyristor MT and the P base layer 1302 respectively. These displacement currents $I_{113}$, $I_{213}$ and $I_{m13}$ flow along paths which are similar to those of the displacement currents $I_{111}$, $I_{211}$ and $I_{m13}$ generated in the optical thyristor according to the eleventh embodiment respectively.

Therefore, the circuit of this thyristor which is related to behavior of the displacement currents $I_{113}$, $I_{213}$ and $I_{m13}$ is equivalently expressed by a circuit diagram shown in FIG. 65. Circuit diodes $D_{113}$ and $D_{213}$ equivalently express the junctions between the auxiliary emitter layers 1305 and 1306 of the auxiliary thyristors $ST_1$ and $ST_2$ and the P base layer 1302 respectively, while a diode $D_{m13}$ expresses the junction between the main emitter layer 1302 of the main thyristor MT and the P base layer 1302. Resistances $R_{113}$, $R_{213}$ and $R_{m13}$ are along the paths of the displacement currents $I_{113}$, $I_{213}$ and $I_{m13}$ respectively. Since a resistance $R_{313}$ of the isolation region 1312 is set at a sufficiently high level as compared with the resistance $R_{213}$, only a small amount of component of the displacement current $I_{213}$ is divided into the resistance $R_{313}$. Namely, the displacement current $I_{213}$ preferentially flows in the resistance $R_{213}$ as compared with the resistance $R_{313}$, due to the isolation region 1312. Namely, the circuit of this thyristor has a structure which is similar to that of the circuit of the thyristor according to the eleventh embodiment.

Therefore, abnormal ignition of the auxiliary thyristor $ST_1$ caused by the displacement current $I_{123}$ is suppressed by the displacement current $I_{213}$. Abnormal ignition can be suppressed as to the initial auxiliary thyristor $ST_1$ whose abnormal ignition is most easily caused by the displacement current, whereby this thyristor can sufficiently attain improvement in dv/dt resistance of the overall thyristor, similarly to the thyristor according to the eleventh embodiment.

The resistance $R_{313}$ of the isolation region 1312 is somewhat high as compared with the optical thyristor according to the eleventh embodiment, and hence a part $I_{313}$ of the displacement current $I_{213}$ tends to flow to the gate electrode 1311a across the isolation region 1312. In response to the degree of division of the displacement current $I_{213}$ to the displacement current $I_{313}$, the degree of application to the auxiliary thyristor $ST_1$ for attenuating the forward bias voltage is also reduced. However, the resistance $R_{213}$ is still sufficiently lower than the resistance $R_{313}$, and hence the displacement current $I_{213}$ is divided into the displacement current $I_{313}$ at a sufficiently low degree. Thus, a sufficient effect is attained for improving dv/dt resistance.

<Fourteenth Embodiment>

<14-1. Structure of the Device>

Figure 67:
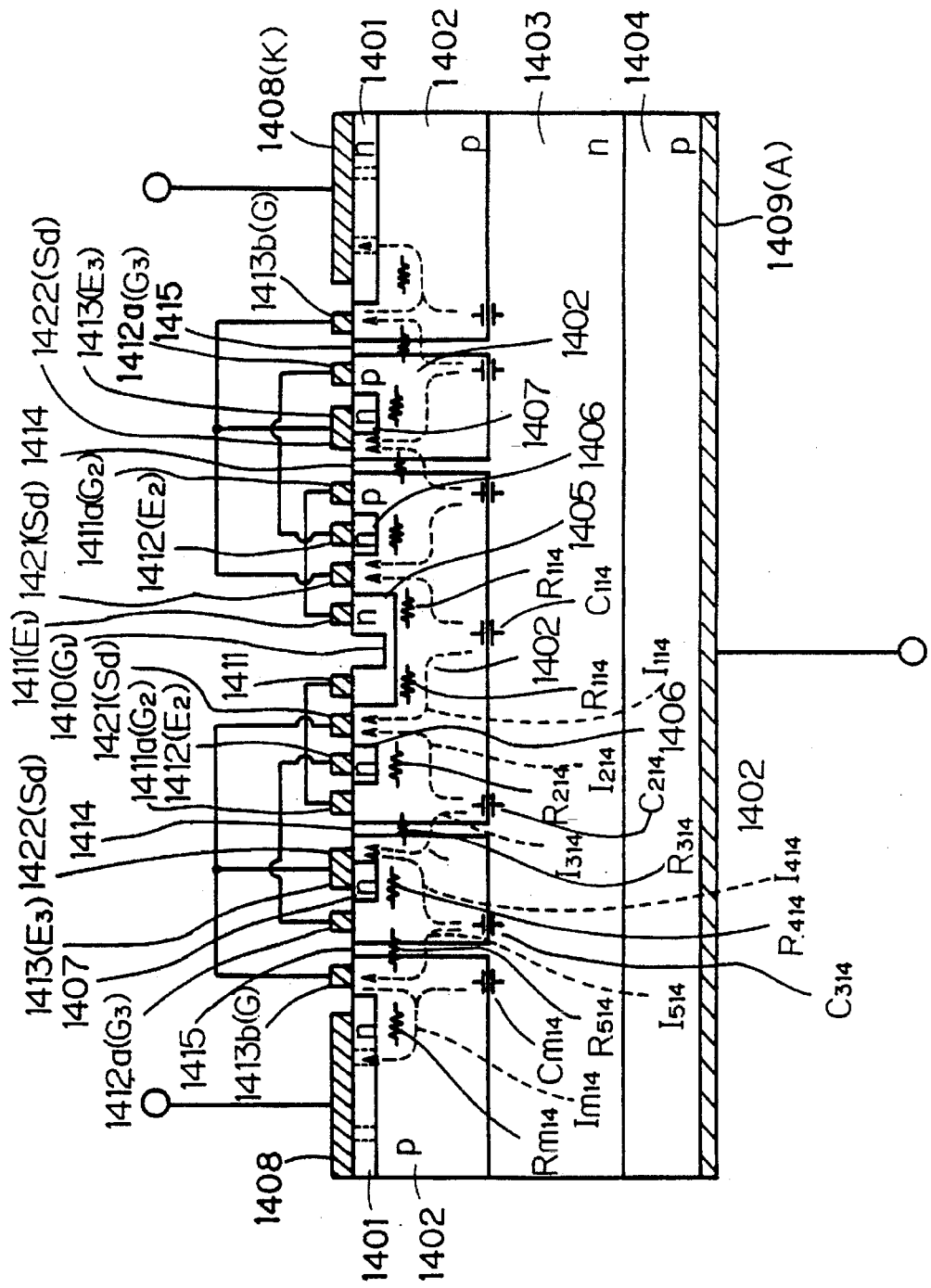
FIG. 67 is a sectional view showing the optical thyristor according to the fourteenth embodiment of the present invention.
Figure 68:
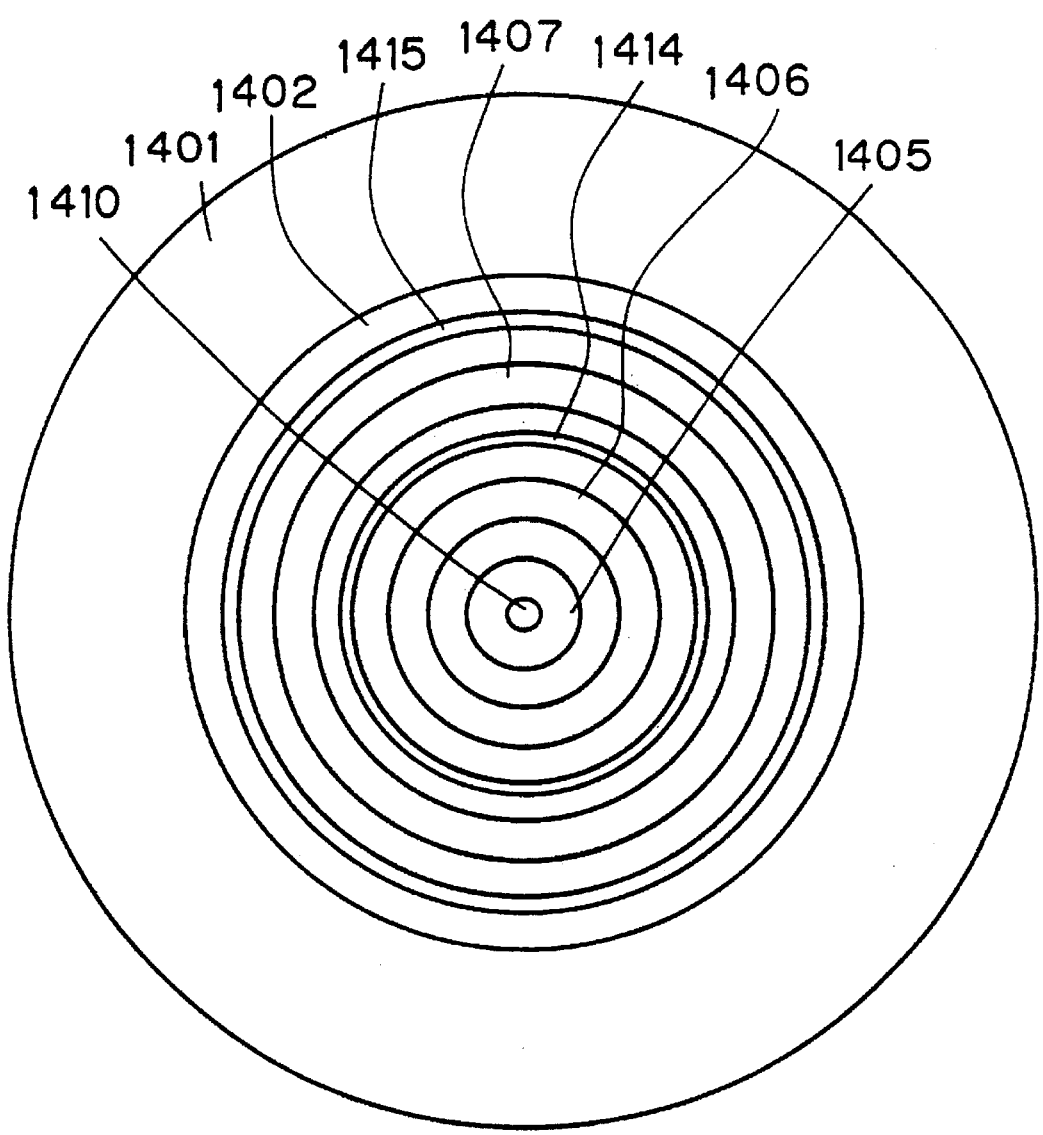
FIG. 68 is a plan view showing the optical thyristor according to the fourteenth embodiment of the present invention in a state before formation of electrodes.

A fourteenth embodiment of the present invention is now described. FIGS. 66 to 68, illustrating the structure of an optical thyristor according to this embodiment, are a plan view, a front sectional view and a plan view with omission of electrodes respectively.

In this thyristor, four stage unit thyristors including initial to third stage auxiliary thyristors $ST_1$ to $ST_3$ and a main thyristor MT are concentrically or concentric-annularly arranged in this order along a major surface of a substantially discoidal silicon semiconductor substrate from the center to the periphery. A P base layer 1402, an N base layer 1403 and a P emitter layer 1404 are stackedly formed on the semiconductor substrate in order from its upper major surface toward its lower major surface. Further, N-type auxiliary emitter layers 1405, 1406 and 1407 and an N-type main emitter layer 1401 are selectively formed in this order on an upper major surface of the P base layer 1402 concentrically or concentric-annularly from the center to the periphery to be separated from each other.

The auxiliary emitter layer 1405 which is positioned at the center of the upper major surface of the semiconductor substrate and circularly exposed on this upper major surface forms the auxiliary thyristor $ST_1$ with the P base layer 1402, the N base layer 1403 and the P emitter layer 1404. Further, the auxiliary emitter layer 1406 forms the auxiliary thyristor $ST_2$ with the P base layer 1402, the N base layer 1403 and the P emitter layer 1404. In addition, the auxiliary emitter layer 1407 forms the auxiliary thyristor $ST_3$ with the P base layer 1402, the N base layer 1403 and the P emitter layer 1404. Further, the main emitter layer 1401 forms the main thyristor MT with the P base layer 1402, the N base layer 1403 and the P emitter layer 1404.

A portion of the P base layer 1402 which is held between the auxiliary emitter layers 1406 and 1407 and annularly exposed on the upper major surface is divided into inner and outer regions by an annular portion of the N base layer 1403. This annular portion of the N base layer 1403, i.e., an isolation region 1414, functions as a barrier for suppressing or inhibiting carrier movement between the inner and outer regions.

Similarly, a portion of the P base layer 1402 which is held between the auxiliary emitter layer 1407 and the main emitter layer 1401 and annularly exposed on the upper major surface is divided into inner and outer regions by an annular portion of the N base layer 1403. This annular portion of the N base layer 1403, i.e., an isolation region 1415, functions as a barrier for suppressing or inhibiting carrier movement between the inner and outer regions.

A photoreceiving portion 1410 is provided at the center of the auxiliary emitter layer 1405 of the initial stage auxiliary thyristor $ST_1$. A cathode electrode 1408 is formed on an upper major surface of the main emitter layer 1401. A plurality of short-circuiting portions (shown by dotted lines in FIG. 67) are formed in the main emitter layer 1401 in the form of small holes vertically passing through the same, so that the cathode electrode 1408 is short-circuited with the P base layer 1402 through the short-circuiting portions. An anode electrode 1409 is formed on the lower major surface of the P emitter layer 1404.

An annular auxiliary emitter electrode 1411 is formed on the auxiliary emitter layer 1405. Further, an annular collector electrode 1421 having one parted portion is formed on a portion of the P base layer 1402 which is held between the auxiliary emitter layers 1405 and 1406. In addition, an annular auxiliary emitter electrode 1412 having one parted portion is formed on the auxiliary emitter layer 1406. Further, an annular auxiliary gate electrode 1411a having one parted portion is formed on the inner region which is adjacent to the outer side of the auxiliary emitter layer 1406. An annular collector electrode 1422 having one parted portion is formed on the outer region which is adjacent to the inner side of the auxiliary emitter layer 1407. Further, an annular auxiliary emitter electrode 1413 having one parted portion is formed on the auxiliary emitter layer 1407 integrally with the collector electrode 1422. In addition, an annular auxiliary gate electrode 1412a having one parted portion is formed on another inner region which is adjacent to the outer side of the auxiliary emitter layer 1407. Further, an annular gate electrode (collector electrode) 1413a is formed on another outer region which is adjacent to the inner side of the main emitter layer 1401.

Between the auxiliary emitter electrode 1411 and the auxiliary gate electrode 1411a, an insulating film 1416 of an oxide, for example, is selectively formed on the semiconductor substrate across the parted portions of the collector electrode 1421 and the auxiliary emitter electrode 1412. A conductor bridging portion 1411b is formed on the insulating film 1416 integrally with the auxiliary emitter electrode 1411 and the auxiliary gate electrode 1411a, for electrically connecting these electrodes with each other.

Between the collector electrodes 1421 and 1422, an insulating film 1419 of an oxide, for example, is selectively formed on the semiconductor substrate across the parted portions of the auxiliary emitter electrode 1412 and the auxiliary gate electrode 1411a. A conductor bridging portion 1413d is formed on the insulating film 1419 integrally with the collector electrodes 1421 and 1422, for electrically connecting these electrodes with each other.

Between the auxiliary emitter electrode 1412 and the auxiliary gate electrode 1412a, an insulating film 1417 of an oxide, for example, is selectively formed on the semiconductor substrate across the parted portions of the auxiliary gate electrode 1411a and the integrally formed collector electrode 1422 and auxiliary emitter electrode 1413. A conductor bridging portion 1412b is formed on the insulating film 1417 integrally with the auxiliary emitter electrode 1412 and the auxiliary gate electrode 1412a, for electrically connecting these electrodes with each other.

Between the auxiliary emitter electrode 1413 and the gate electrode 1413a, further, an insulating film 1418 of an oxide, for example, is selectively formed on the semiconductor substrate across the parted portion of the auxiliary gate electrode 1412a. A conductor bridging portion 1413c is formed on the insulating film 1418 integrally with the auxiliary emitter electrode 1413 and the gate electrode 1413a, for electrically connecting these electrodes with each other. The insulating films 1416, 1417, 1418 and 1419 guarantee electrical insulation between the bridging portions 1411b, 1412b, 1413c and 1413d which are formed thereon and the semiconductor substrate.

In this optical thyristor, as hereinabove described, the electrodes are connected with each other not by wiring materials but by the bridging portions which are integrally formed with the electrodes to be connected with each other, whereby the thyristor is excellent in reliability with no possibility for disconnection and short-circuiting.

<14-2. Steps of Fabricating the Device>

A method of fabricating this optical thyristor is now described. FIGS. 69 to 73 show exemplary steps of the fabrication method. In order to fabricate this optical thyristor, the steps shown in FIGS. 48A and 48B of the eleventh embodiment are first executed. Thus, the semiconductor substrate is obtained in such a structure that the N-type N base layer 1403 is stacked on the P-type P emitter layer 1404.

Figure 69:
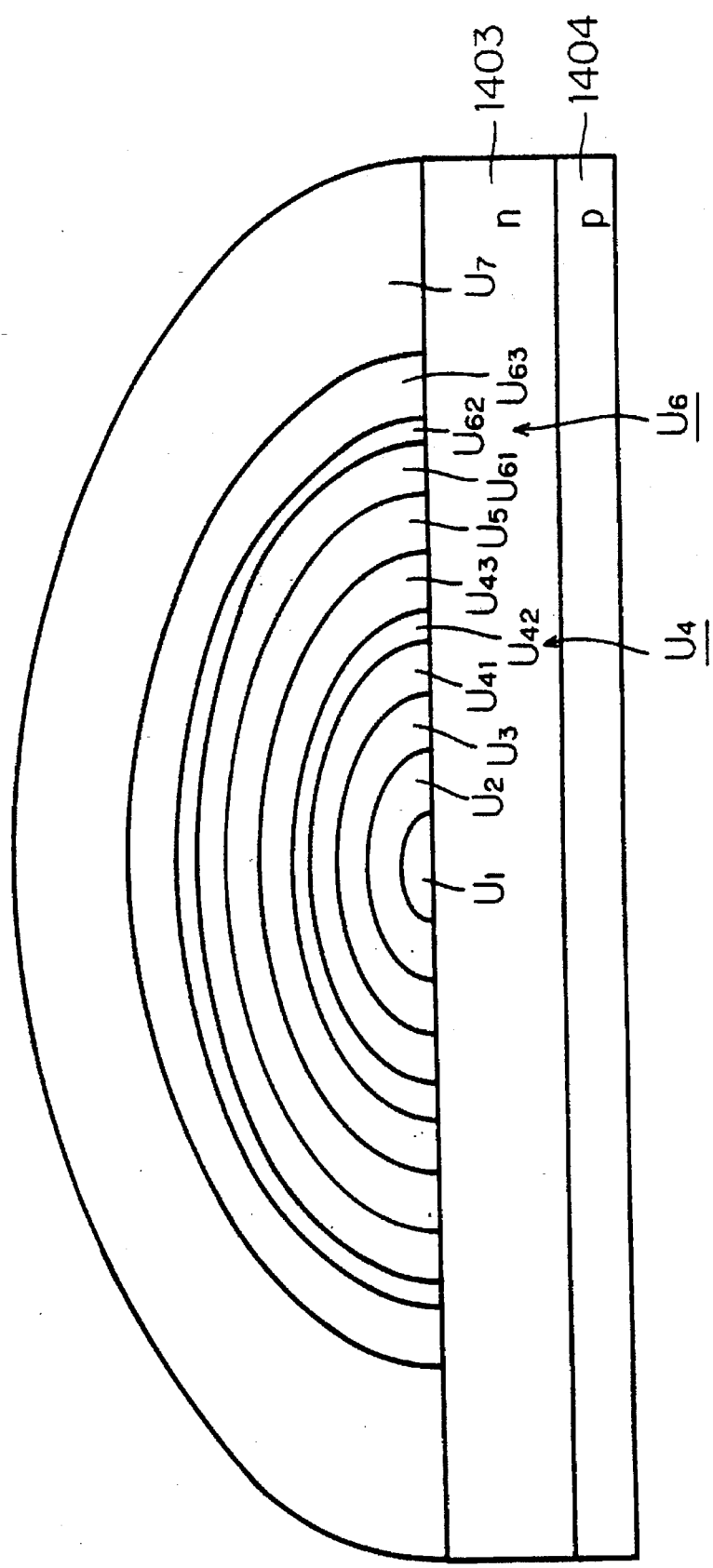
FIG. 69 illustrates a step of fabricating the optical thyristor according to the fourteenth embodiment of the present invention.

Then, the upper major surface of the N base layer 1403 is ideologically divided into seven regions including a circular region $U_1$ which is positioned at the center and concentric-annular regions $U_2$ to $U_7$ in this order from the center to the periphery, as shown in FIG. 69. Further, the region $U_4$ is ideologically divided into three concentric-annular regions $U_{41}$, $U_{42}$ and $U_{43}$ in this order from the inner side toward the outer side. Similarly, the region $U_6$ is ideologically divided into three concentric-annular regions $U_{61}$, $U_{62}$ and $U_{63}$ in this order from the inner side toward the outer side.

Figure 70:
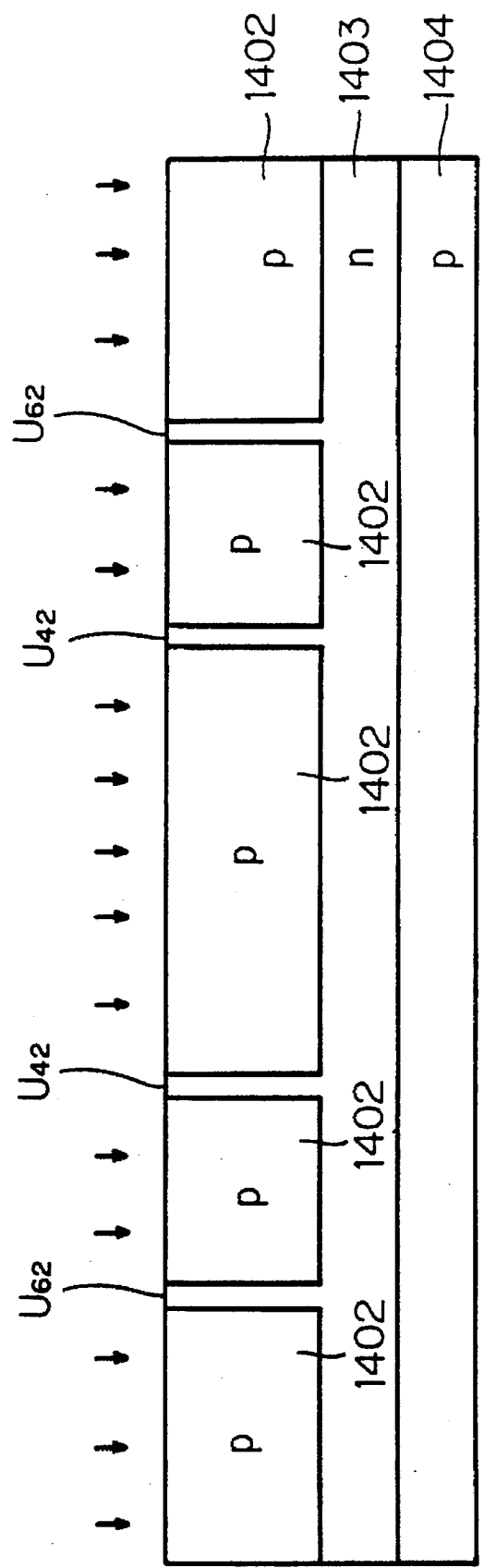
FIG. 70 illustrates a step of fabricating the optical thyristor according to the fourteenth embodiment of the present invention.
Figure 71:
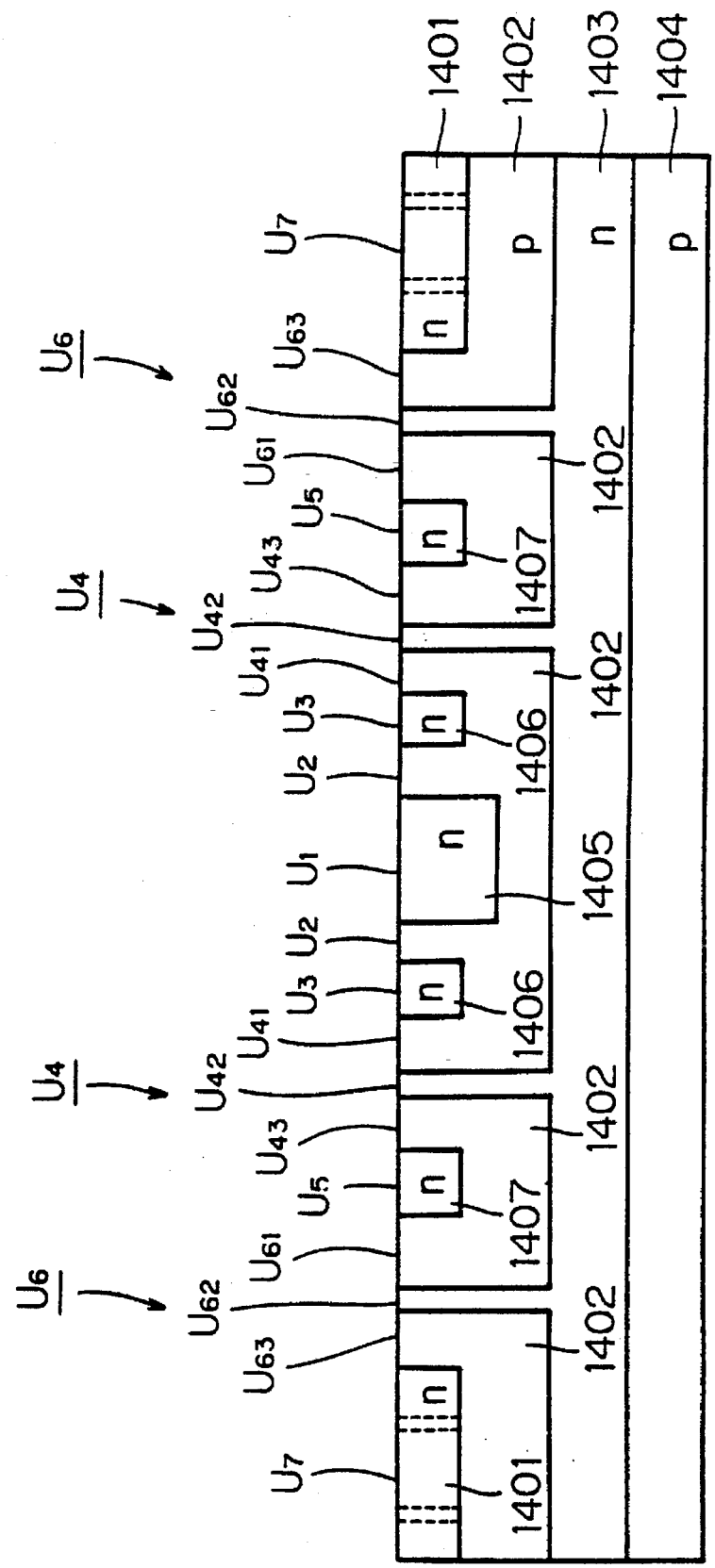
FIG. 71 illustrates a step of fabricating the optical thyristor according to the fourteenth embodiment of the present invention.

Then, a P-type impurity such as boron is selectively introduced into the upper major surface of the semiconductor substrate excluding the regions $U_{42}$ and $U_{62}$, thereby selectively forming the P-type P base layer 1402 on an upper major surface portion of the N base layer 1403, as shown in FIG. 70. At this time, the aforementioned isolation regions 1414 and 1415 are simultaneously formed.

Then, an N-type impurity such as phosphorus is selectively introduced into the odd regions $U_1$, $U_3$, $U_5$ and $U_7$, thereby selectively forming the auxiliary emitter layers 1405, 1406 and 1407 and the main emitter layer 1401 on the upper major surface portion of the P base layer 1402. At this time, the impurity is selectively introduced into the region $U_7$ to exclude a plurality of sprinkled small regions. Thus, the aforementioned short-circuiting portions (shown by dotted lines in FIG. 71) are formed immediately under the small regions.

Figure 72:
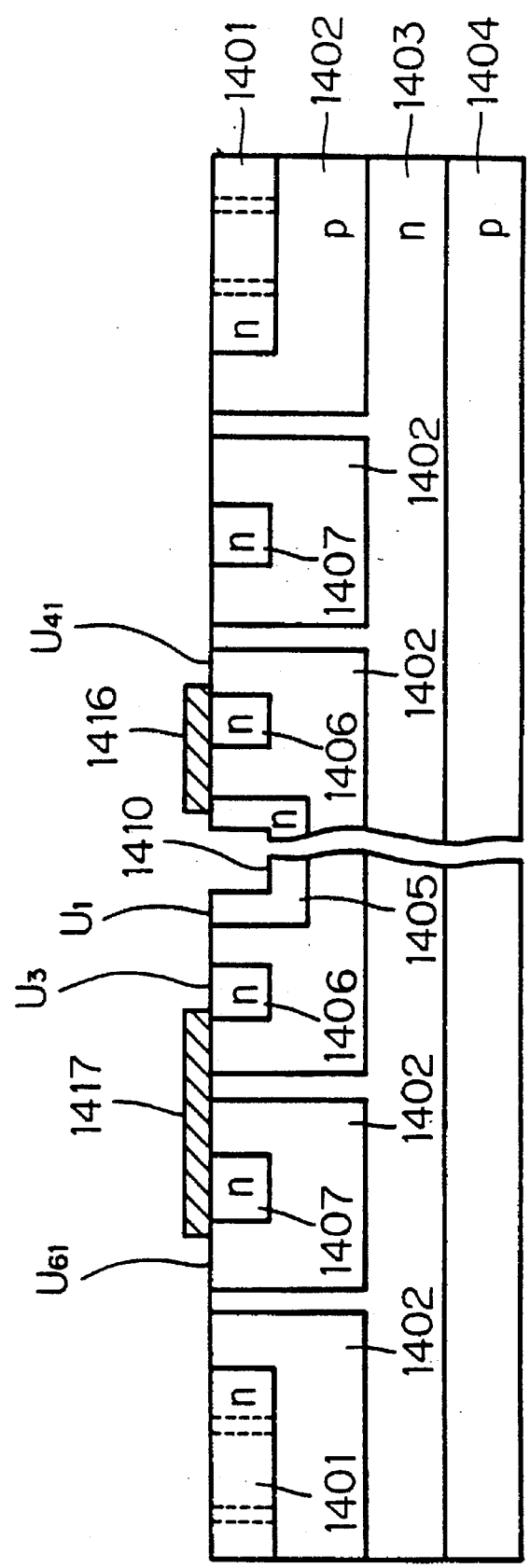
FIG. 72 illustrates a step of fabricating the optical thyristor according to the fourteenth embodiment of the present invention.
Figure 73:
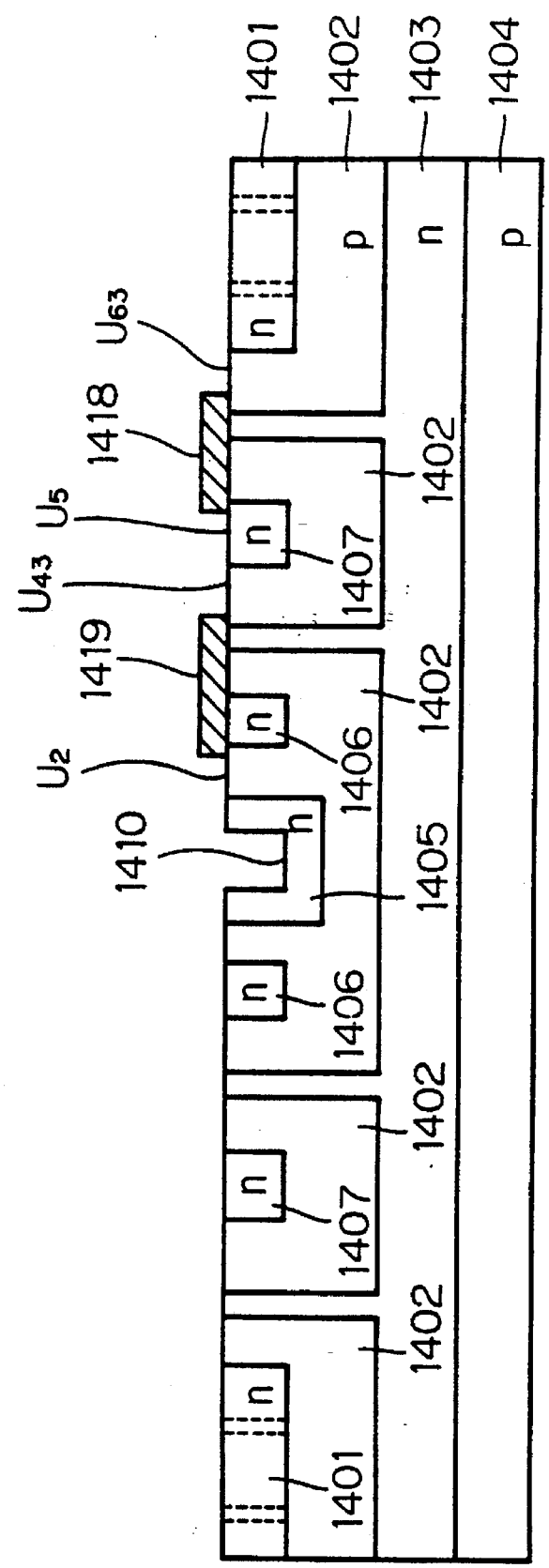
FIG. 73 illustrates a step of fabricating the optical thyristor according to the fourteenth embodiment of the present invention.

Then, the photoreceiving portion 1409 is formed on the center of the upper surface of the auxiliary emitter layer 1405, as shown in FIGS. 72 and 73. FIGS. 72 and 73 are sectional views showing different sections of the semiconductor substrate. Then, the insulating film 1416 such as an oxide film, for example, is selectively formed on the upper major surface of the semiconductor substrate along a path connecting the regions $U_1$ and $U_{41}$ with each other, as shown in FIG. 72. At the same time, the insulating film 1417 such as an oxide film, for example, is selectively formed on the upper major surface of the semiconductor substrate along a path connecting the regions $U_3$ and $U_{61}$ with each other.

At the same time, further, the insulating film 1419 such as an oxide film, for example, is selectively formed on the upper major surface of the semiconductor substrate along a path connecting the regions $U_2$ and $U_{43}$ with each other, as shown in FIG. 73. At the same time, in addition, the insulating film 1418 such as an oxide film, for example, is selectively formed on the upper major surface of the semiconductor substrate along a path connecting the regions $U_5$ and $U_{63}$ with each other.

Then, a step similar to that of the eleventh embodiment shown in FIG. 52 is executed. Namely, a metal film serving as the anode electrode 1409 as such is formed on the overall lower major surface of the P emitter layer 1404. Simultaneously with or around this, a metal film is formed to cover the upper major surface and the overall insulating films 1416 to 1419.

Referring again to FIGS. 66 and 67, the metal film covering the upper major surface of the semiconductor substrate is selectively removed through etching, for example, thereby forming the aforementioned respective electrodes and bridging portions. Shapes and arrangement of the electrodes and bridging portions have already been described and hence description thereof is omitted.

According to this fabrication method, as hereinabove described, the respective electrodes to be connected with each other are integrally formed with each other with no employment of wiring materials, whereby the fabrication steps are advantageously simplified.

<4-3. Ordinary Operation of the Device>

The ordinary operation of this optical thyristor is now described with reference to FIG. 67. In order to use this optical thyristor, an external power source is connected to the anode electrode 1409 and the cathode electrode 1408 of this device, thereby applying a positive voltage across these electrodes. When the photoreceiving portion 1410 is irradiated with an optical trigger signal under such application of the positive voltage, a photoelectric current is generated in depletion layer regions provided on both sides of a P-N junction which is formed between the N base layer 1403 of the initial stage auxiliary thyristor $ST_1$ and the P base layer 1402, to flow into the P base layer 1402. This photoelectric current transversely flows through the P base layer 1402, and thereafter flows into the collector electrode 1421. The photoelectric current flows through the same path as a displacement current $I_{l14}$ described later. The photoelectric current flowing into the collector electrode 1421 reaches the gate electrode 1413b through the bridging portions 1413d and 1413c. The photoelectric current further flows to the outer region which is adjacent to the outer side of the isolation region 1415 from the gate electrode 1413b, transversely flows through the P base layer 1402, and thereafter flows into the cathode electrode 1408 through the short-circuiting portions, along a path of a displacement current $I_{m14}$ described later.

Consequently, the photoelectric current develops a transverse potential difference in a portion of the P base layer 1402 located immediately under the auxiliary emitter layer 1405 of the auxiliary thyristor $ST_1$ thereby forward-biasing a P-N junction which is formed between the auxiliary emitter layer 1405 of the auxiliary thyristor $ST_1$ and the P base layer 1402. When the optical signal is so strong that the forward bias voltage approaches the value of a diffusion potential which is specific to the P-N junction, electron injection from the auxiliary emitter layer 1405 into the P base layer 1402 is abruptly increased, to turn on the auxiliary thyristor $ST_1$. This turn-on current for the auxiliary thyristor $ST_1$ flows to the auxiliary gate electrode 1411a from the auxiliary emitter electrode 1411 through the bridging portion 1411b, thereby being supplied to the inner region which is adjacent to the inner side of the isolation region 1414. The turn-on current which is supplied to the inner region functions as a gate current for the auxiliary thyristor $ST_2$.

Due to inhibition by the isolation region 1414, this gate current flows not to the collector electrode 1422 but into the collector electrode 1421 transversely through a portion of the P base layer 1402 located immediately under the annular auxiliary emitter layer 1406 along the same path as a displacement current $I_{214}$ described later. The gate current flowing into the collector electrode 1421 flows to the cathode electrode 1408 through a path which is similar to that of the photoelectric current. This gate current is by far larger than the photoelectric current which is generated in the auxiliary thyristor $ST_1$, whereby a large voltage is generated along the path of the gate current. Consequently, a sufficiently high forward bias voltage is applied to a P-N junction between the auxiliary emitter layer 1406 and the P base layer 1402, whereby the auxiliary thyristor $ST_2$ is turned on. This turn-on current for the auxiliary thyristor $ST_2$ flows from the auxiliary emitter electrode 1412 to the gate electrode 1412a through the bridging portion 1412b, thereby being supplied to the inner region which is adjacent to the inner side of the isolation region 1415. The turn-on current which is supplied to the inner region functions as a gate current for the auxiliary thyristor $ST_3$.

Due to inhibition by the isolation region 1415, this gate current flows not to the gate electrode 1413b but into the collector electrode 1422 transversely through a portion of the P base layer 1402 located immediately under the annular auxiliary emitter layer 1407 along the same path as a displacement current $I_{414}$ described later. The gate current flowing into the collector electrode 1422 flows to the cathode electrode 1408 through a path which is similar to that of the photoelectric current. This gate current is by far larger than the photoelectric current which is generated in the auxiliary thyristor $ST_2$, whereby a large voltage is generated along the path thereof. Consequently, a sufficiently high forward bias voltage is applied to a P-N junction between the auxiliary emitter layer 1407 and the P base layer 1402, whereby the auxiliary thyristor $ST_3$ is turned on. This turn-on current for the auxiliary thyristor $ST_3$ flows from the auxiliary emitter electrode 1413 to the gate electrode 1415b through the bridging portion 1413c, thereby being supplied to the outer region which is adjacent to the outer side of the isolation region 1415. The turn-on current which is supplied to the outer region functions as a gate current for the main thyristor MT.

Similarly to the photoelectric current, the gate current which is supplied to the outer region transversely flows through the P base layer 1402 and thereafter flows into the cathode electrode 1408 by passing through the short-circuiting portions. Since this gate current is obtained by successively amplifying the photoelectric current which is generated in the auxiliary thyristor $ST_1$ over three stages, a large voltage is generated along the path of the gate current. Consequently, a forward bias voltage of a sufficient value is applied to the P-N junction between the main emitter layer 1401 and the P base layer 1402, whereby the main thyristor MT is turned on. Thus, a main current flows from the anode electrode 1409 to the cathode electrode 1408. Namely, the thyristor conducts.

Also in this thyristor, the transverse resistance of the portion of the P base layer 1402 located immediately under the auxiliary emitter layer 1405 of the auxiliary thyristor $ST_1$ which is turned on at first may be increased in order to improve photosensitivity. Thus, the voltage which is generated along the path of the photoelectric current is increased, whereby the auxiliary thyristor $ST_1$ is easily turned on. Namely, the thyristor is improved in photosensitivity. On the other hand, it is preferable to set the transverse resistance of the portion of the P base layer 1402 located immediately under the auxiliary emitter region 1406 of the second auxiliary thyristor $ST_2$ at a small value. Further, it is preferable to set the transverse resistance of the portion of the P base layer 1402 located immediately under the auxiliary emitter region 1407 of the third auxiliary thyristor $ST_3$ at a smaller value.

<14-4. Characteristic Operation of the Device>

Description is now made on an operation of this optical thyristor, to which a voltage noise having a large dv/dt value is applied. At this time, the displacement currents $I_{114}$, $I_{214}$, $I_{314}$ and $I_{m14}$ are generated by capacitances $C_{114}$, $C_{214}$, $C_{314}$ and $C_{m14}$ of junctions between the auxiliary emitter layer 1405 of the auxiliary thyristor $ST_1$ and the P base layer 1402, between the auxiliary emitter layer 1406 of the auxiliary thyristor $ST_2$ and the P base layer 1402, between the auxiliary emitter layer 1407 of the auxiliary thyristor $ST_3$ and the P base layer 1402 and between the main emitter layer 1401 of the main thyristor MT and the P base layer 1402 respectively.

The displacement current $I_{114}$ which is generated in the auxiliary thyristor $ST_1$ flows in the P base layer 1402 into the collector electrode 1421 through the same path as the photoelectric current, and thereafter flows to the gate electrode 1413b through the bridging portions 1413d and 1413c. Due to a resistance $R_{114}$ provided in this path, the displacement current $I_{114}$ develops a transverse potential difference mainly in a portion of the P base layer 1402 located immediately under the auxiliary emitter layer 1405.

Similarly, the displacement current $I_{214}$ which is generated in the auxiliary thyristor $ST_2$ flows in the P base layer 1402 into the collector electrode 1421 through the same path as the photoelectric current, and thereafter flows to the gate electrode 1413b through the bridging portions 1413d and 1413c. Due to a resistance $R_{214}$ in the P base layer 1402 of the auxiliary thyristor $ST_2$, the displacement current $I_{214}$ develops a transverse potential difference in a portion of the P base layer 1402 located immediately under the auxiliary emitter layer 1406.

Similarly, the displacement current $I_{214}$ which is generated in the auxiliary thyristor $ST_3$ flows in the P base layer 1402 into the collector electrode 1422 through the same path as the gate current for the auxiliary thyristor $ST_3$, and thereafter flows to the gate electrode 1413b through the bridging portion 1413c. Due to a resistance $R_{314}$ in the P base layer 1402 of the auxiliary thyristor $ST_3$, the displacement current $I_{314}$ develops a transverse potential difference in a portion of the P base layer 1402 located immediately under the auxiliary emitter layer 1407.

Further, the displacement current $I_{m14}$ which is generated in the main thyristor MT is joined with the displacement currents $I_{114}$, $I_{214}$ and $I_{314}$ which are supplied from the gate electrode 1413b, and flows into the cathode electrode 1408 through the same path as the gate current for the main thyristor MT. Due to a resistance $R_{m14}$ provided in the path, the displacement currents $I_{114}$, $I_{214}$, $I_{314}$ and $I_{m14}$ develop a transverse potential difference mainly in a portion of the P base layer 1402 located immediately under the main emitter layer 1401 of the main thyristor MT. As understood from FIG. 67, the paths of the displacement currents $I_{114}$, $I_{214}$ and $I_{314}$ which are generated in the three auxiliary thyristors $ST_1$ to $ST_3$ are separated from each other.

Figure 74:
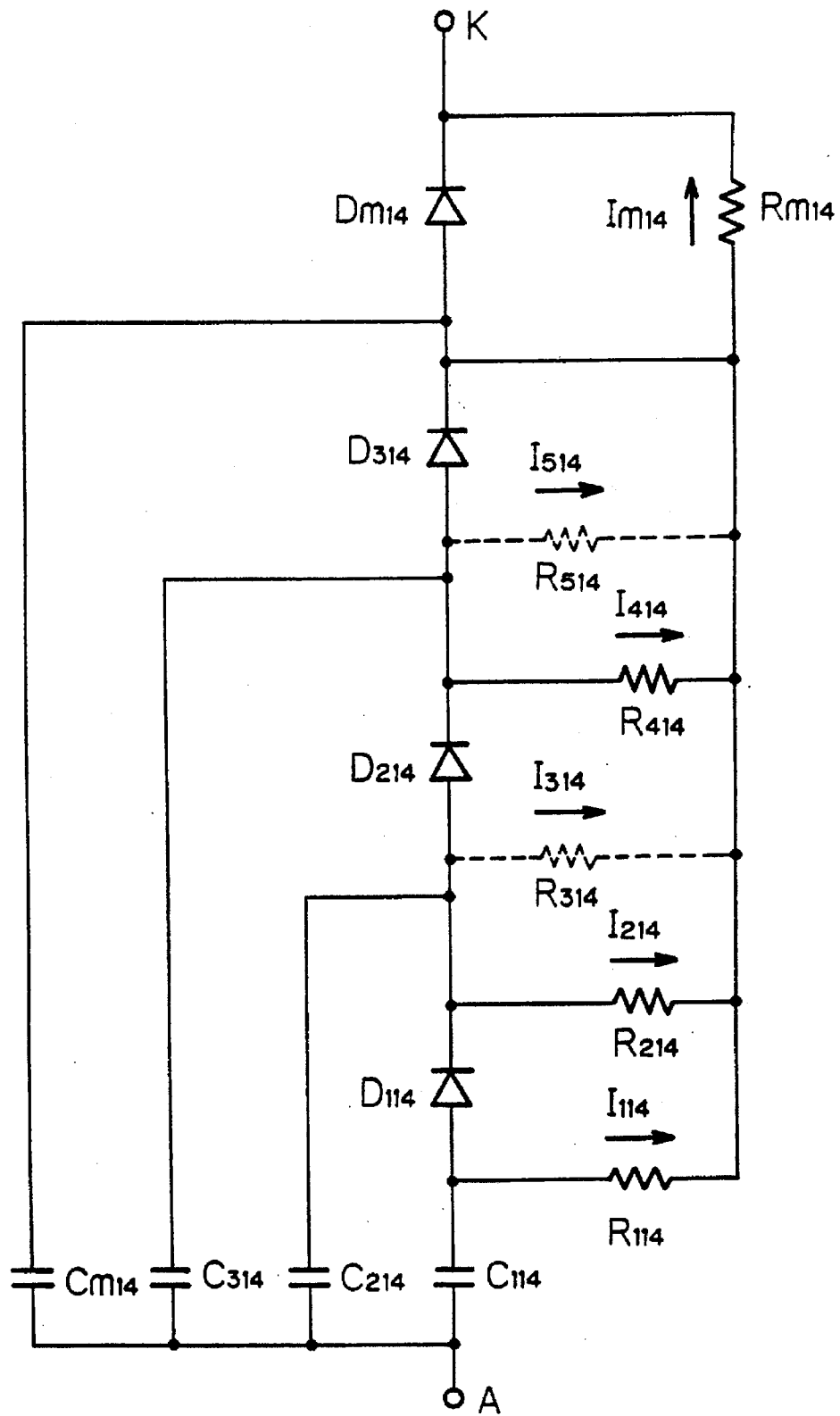
FIG. 74 is an equivalent circuit diagram of the optical thyristor according to the fourteenth embodiment of the present invention.
Figure 75:
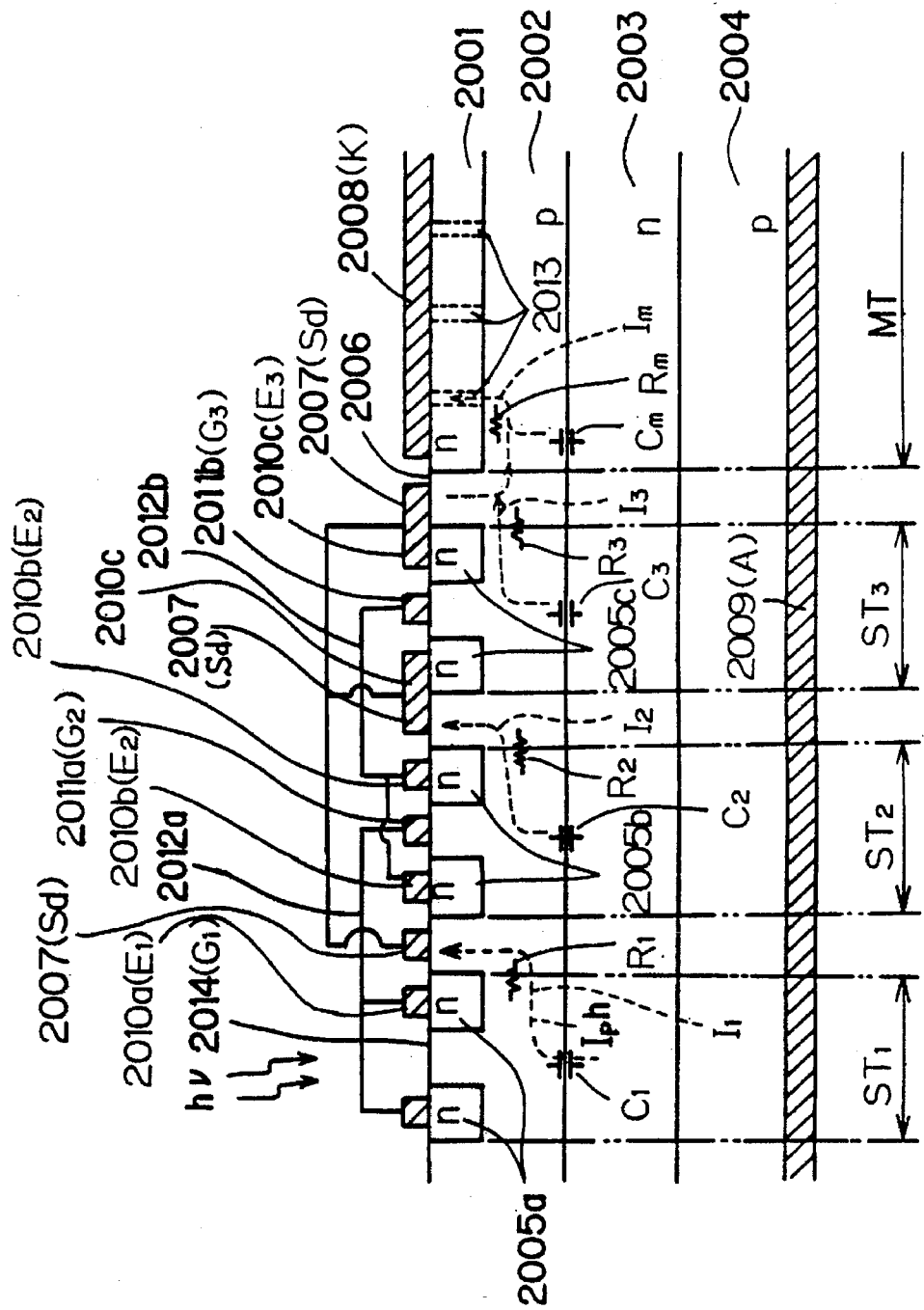
FIG. 75 is a sectional view showing an optical thyristor according to prior art.
Figure 76:
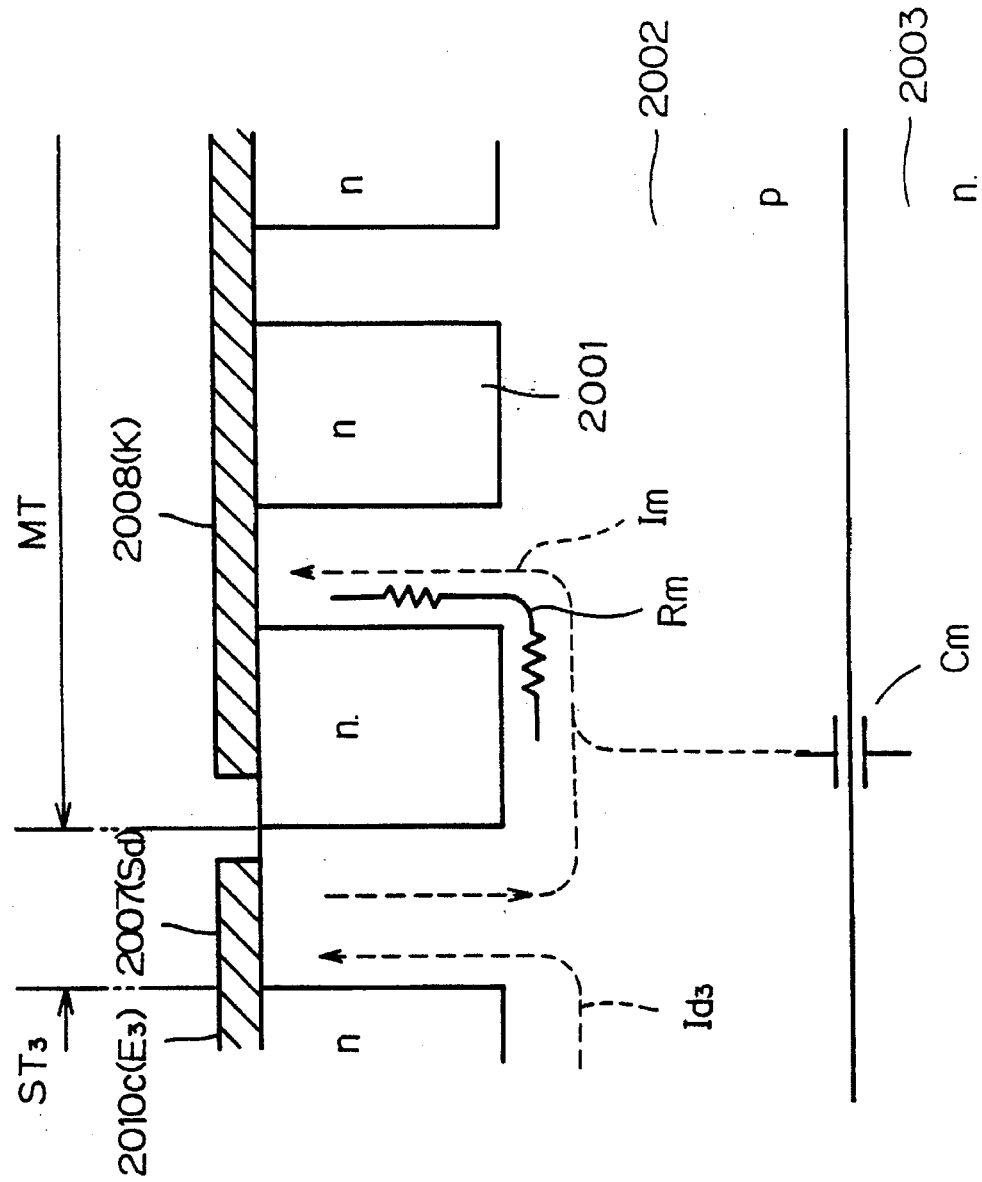
FIG. 76 is a partially enlarged view of the optical thyristor shown in FIG. 75.
Figure 77:
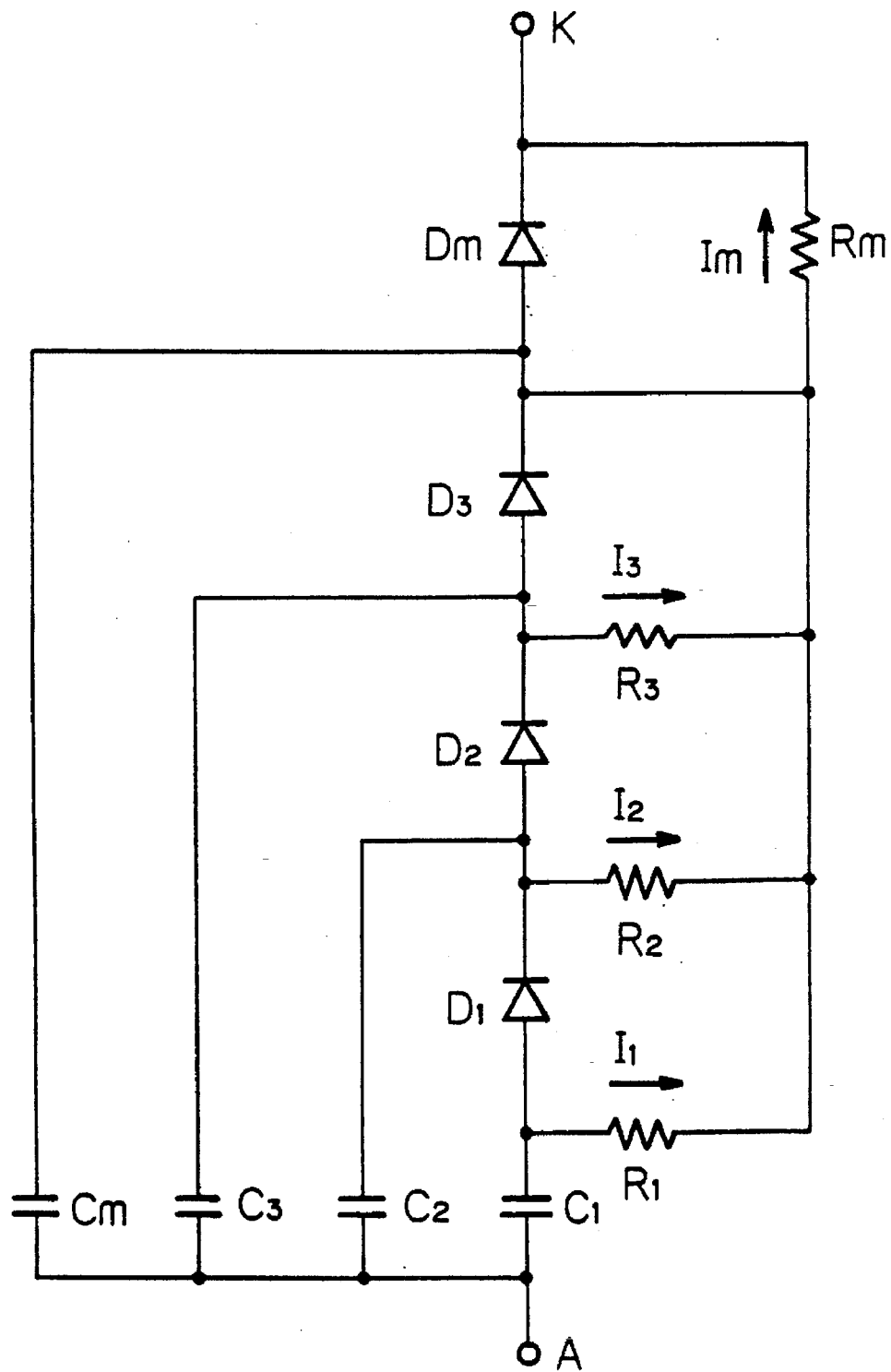
FIG. 77 is an equivalent circuit diagram of the optical thyristor according to the prior art.
Figure 78:
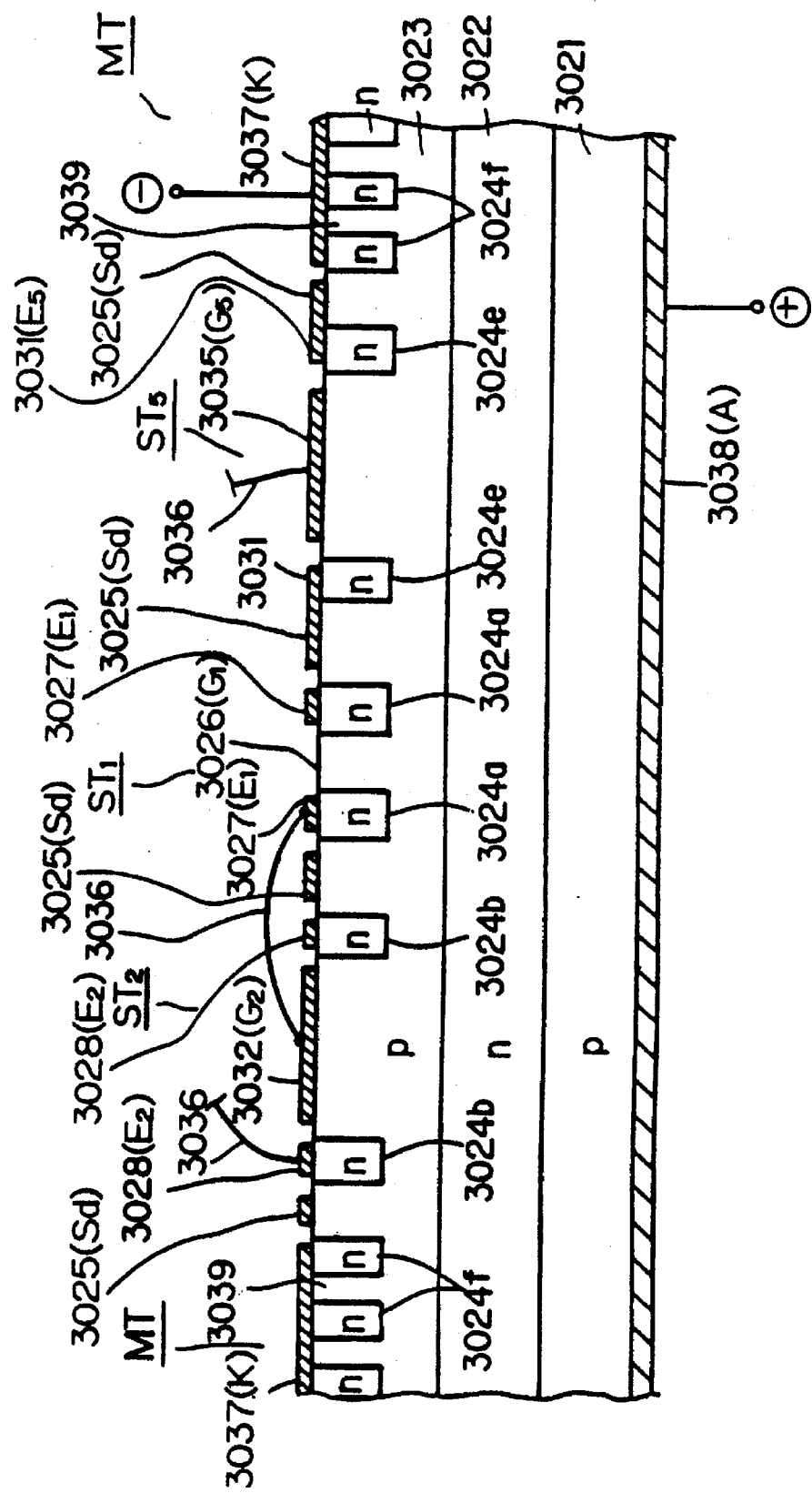
FIG. 78 is a sectional view showing the optical thyristor according to the prior art.
Figure 79:
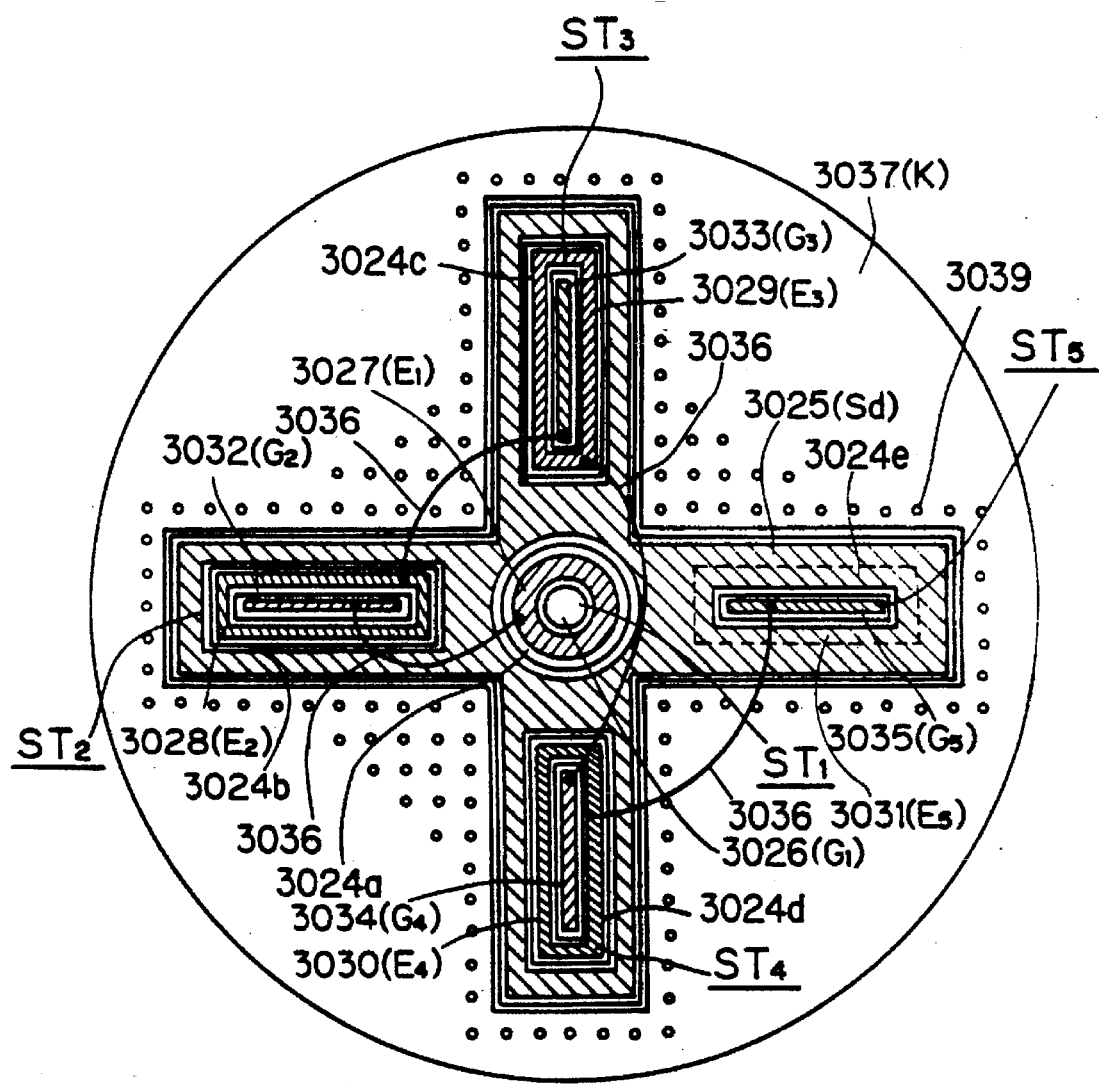
FIG. 79 is a plan view showing the optical thyristor according to the prior art.

FIG. 74 is an equivalent circuit diagram which is related to behavior of the displacement currents $I_{114}$, $I_{214}$, $I_{314}$ and $I_{m14}$. Diodes $D_{114}$, $D_{214}$ and $D_{314}$ equivalently express the junctions between the auxiliary emitter layers 1405, 1406 and 1407 of the auxiliary thyristors $ST_1$, $ST_2$ and $ST_3$ and the P base layer 1402 respectively, while a diode $D_{m14}$ expresses the junction between the main emitter layer 1401 of the main thyristor MT and the P base layer 1402. An end of only the resistance $R_{m14}$ is short-circuited with the cathode electrode 1407 (K).

A resistance $R_{314}$ of the isolation region 1414 is set at a sufficiently high value as compared with the resistance $R_{214}$, and hence only a small amount of component $I_{314}$ of the displacement current $I_{214}$ is divided into the resistance $R_{314}$. Namely, the displacement current $I_{214}$ preferentially flows through the resistance $R_{214}$ as compared with the resistance $R_{314}$, due to the isolation region 1414. Similarly, a resistance $R_{514}$ of the isolation region 1415 is set at a sufficiently high value as compared with the resistance $R_{414}$, and hence only a small amount of component $I_{514}$ of the displacement current $I_{514}$ is divided into the resistance $R_{514}$. Namely, the displacement current $I_{414}$ preferentially flows through the resistance $R_{414}$ as compared with the resistance $R_{514}$, due to the isolation region 1415.

As understood from FIG. 74, a forward bias voltage which is provided by $I_{114} \times R_{114} - I_{214} \times R_{214}$ is applied across an anode and a cathode of the diode $D_{114}$. Namely, a forward bias voltage for the auxiliary thyristor $ST_1$ which is originally brought by the displacement current $I_{114}$ is attenuated by the next stage displacement current $I_{214}$. Therefore, the auxiliary thyristor $ST_1$ is suppressed from abnormal ignition caused by the displacement current $I_{114}$. Further, a forward bias voltage which is provided by $I_{214} \times R_{214} - I_{414} \times R_{414}$ is applied across an anode and a cathode of the diode $D_{214}$. Namely, a forward bias voltage of the auxiliary thyristor $ST_2$ which is originally brought by the displacement current $I_{214}$ is attenuated by the next stage displacement current $I_{414}$. Therefore, the auxiliary thyristor $ST_2$ is suppressed from abnormal ignition caused by the displacement current $I_{214}$. This results from the fact the paths of the displacement currents $I_{114}$, $I_{214}$ and $I_{314}$ are separated from each other.

On the other hand, a forward bias voltage corresponding to a voltage ($I_{414} \times R_{414}$) which is brought by the displacement current $I_{414}$ is applied across an anode and a cathode of the diode $D_{314}$. Thus, no effect of suppressing abnormal ignition appears with respect to the third stage (final stage) auxiliary thyristor $ST_3$ in this thyristor.

In this optical thyristor, however, it is possible to suppress abnormal ignition with respect to the initial stage auxiliary thyristor $ST_1$ whose abnormal ignition is most easily caused by the displacement current, while abnormal ignition can be suppressed also as to the second stage auxiliary thyristor $ST_2$. Thus, dv/dt resistance of the overall thyristor can be advantageously improved in this optical thyristor. Further, it is also possible to cancel the forward bias voltages which are applied to the junctions of the auxiliary thyristors $ST_1$ and $ST_2$ by adjusting the resistances $R_{114}$, $R_{214}$ and $R_{414}$ or the aforementioned transverse resistances forming principal parts thereof.

Further, it is possible to decide photosensitivity and dv/dt resistance independently of each other by adjusting the resistances $R_{114}$, $R_{214}$ and $R_{414}$, whereby the photosensitivity and the dv/dt resistance can be decided independently of each other. Thus, it is possible to compatibly improve the photosensitivity and the dv/dt resistance.

In the optical thyristor according to this embodiment, further, the auxiliary emitter layers 1405 and 1406 are concentrically or concentric-annularly formed, whereby it is possible to prevent current concentration, to reduce the bridging portions 1411b, 1413d, 1413c and 1412b from being burnt out, and to improve photosensitivity, similarly to the optical thyristor according to the eleventh embodiment.

While both of the isolation regions 1414 and 1415 are identical in structure to the isolation region 1112 in the eleventh embodiment, the same may alternatively be identical in structure to the isolation region 1212 or 1312 according to the second or third embodiment. Further, one or a plurality of auxiliary thyristors may be added to a next stage of the third auxiliary thyristor $ST_3$. Also as to this case, it is possible to suppress abnormal ignition by displacement currents with respect to all auxiliary thyristors excluding the final stage one, whereby an effect of improving the dv/dt resistance of the overall thyristor can be attained.

<Fifteenth Embodiment>

While each of the above embodiments has been described with reference to an optical thyristor, the present invention is similarly applicable to an electric trigger thyristor, as a matter of course. When a P base region is exposed on an upper major surface to be enclosed with an N emitter region in an initial stage auxiliary thyristor and an initial stage gate electrode is connected to an upper surface of the P base region in the electric trigger thyristor, the initial auxiliary thyristor is efficiently turned on. However, an optical trigger signal which is currently available is feeble in energy as compared with an electric trigger signal, and hence the present invention attains a particularly large effect in an optical thyristor.

While the invention has been shown and described in detail, the foregoing description is in all aspects illustrative and not restrictive. It is therefore understood that numerous modifications and variations can be devised without departing from the scope of the invention.

What is claimed is:

1. A thyristor of a multistage structure comprising a plurality of stages of unit thyristors including a first stage thyristor being ignited by an externally inputted trigger signal and a final stage thyristor being fed with a main current, said unit thyristors being arranged in parallel with each other along a major surface of a semiconductor substrate, said thyristor being characterized in that:

each said unit thyristor comprises four semiconductor layers including a first emitter layer, a first base layer, a second base layer and a second emitter layer being successively stacked on said semiconductor substrate with conductivity types alternately differing from each other, said first emitter layers arc exposed on a lower major surface of said semiconductor substrate, said second base layers are exposed on an upper major surface of said semiconductor substrate, and said second emitter layers are selectively provided on upper major surface portions of said second base layers and exposed on said upper major surface, respective said layers excluding said second emitter layers are continuous to each other between respective said unit thyristors, said second emitter layers are separated from each other every said unit thyristor through said second base layers, a first main electrode is formed on lower major surfaces of said first emitter layers, a second main electrode is formed on an upper major surface of said second emitter layer of said final stage unit thyristor, gate electrodes are formed on upper major surfaces of said second base layers of at least second and larger stage said unit thyristors, emitter electrodes are formed on upper surfaces of said second emitter layers of said unit thyristors excluding said final stage one, said emitter electrodes of said unit thyristors excluding said final stage one electrically connected with said gate electrodes of next stage said unit thyristors, at least one compensation electrode in which trigger currents inputted in all said unit thyristors are accumulated, said at least one compensation electrode being electrically connected with said second main electrode is formed on said upper major surfaces of said second base layers, said compensation electrode being so formed that a path for feeding a principal part of a trigger current being inputted in one of said unit thyristors is separated from that for feeding a principal part of a trigger current being inputted in next one of said unit thyristors.

2. The thyristor in accordance with claim 1, wherein said major surface of said semiconductor substrate is substantially in the form of a circle, said unit thyristors being arranged to be rotation-symmetrical by at least twice about the center of said substantially circular major surface.

3. The thyristor in accordance with claim 1, wherein said compensation electrode is so arranged that said principal part of said trigger current being inputted in each said unit thyristor passes through said second base layer being located immediately under said second emitter layer of said unit thyristor.

4. The thyristor in accordance with claim 3, wherein the electric resistance value of a path of a displacement current flowing across a junction capacitance between said first and second base layers of each said unit thyristor and said second main electrode and said compensation electrode resulting from a voltage noise being applied to said thyristor is so optimized that a forward voltage being applied to a junction between said second base layer and said second emitter layer in said unit thyristor and a forward voltage being applied to a junction between said second base layer and said second emitter layer in next stage said unit thyristor for said unit thyristor substantially cancel with each other.

5. The thyristor in accordance with claim 3, wherein a portion receiving said trigger signal or a portion of said second base layer being provided with said gate electrode in at least one stage said unit thyristor is enclosed with said second emitter layer of said unit thyristor and separated from all said compensation electrode(s) through said second emitter layer.

6. The thyristor in accordance with claim 5, wherein said at least one stage is that excluding said final stage, said second emitter layer of said stage unit thyristor being arranged to be enclosed with said second emitter layer of said final stage unit thyristor through a first partial base layer partially forming said second base layer, said compensation electrode comprising a first partial compensation electrode being formed on an upper major surface of said first partial base layer and integrally formed with said second main electrode.

7. The thyristor in accordance with claim 6, wherein said first partial compensation electrode is so annularly formed as to enclose said second emitter layer being enclosed with said first partial base layer.

8. The thyristor in accordance with claim 5, wherein said at least one stage is that excluding said final stage, said second emitter layer of said stage unit thyristor being arranged to be enclosed with said second emitter layer of next stage said unit thyristor through a second partial base layer partially forming said second base layer, said gate electrode of said next stage unit thyristor is formed on an upper major surface of said second partial base layer, said compensation electrode comprises a second partial compensation electrode being formed on said upper major surface of said second partial base layer and electrically connected with said second main electrode, and a third partial compensation electrode being formed on an upper major surface of a portion of said second base layer being separated from said second partial base layer through said second emitter layer of said next stage unit thyristor and electrically connected with said second main electrode, and electric resistance across said next stage gate electrode and said second partial compensation electrode is set to be higher than that across said next stage gate electrode and said third partial compensation electrode.

9. The thyristor in accordance with claim 8, wherein said second partial base layer has an annular portion enclosing said second emitter layer of said at least one stage unit thyristor and a projecting portion elongatedly projecting from said annular portion to the periphery, said gate electrode of said next stage unit thyristor is formed on an upper major surface of a portion of said projecting portion being close to its forward end, and said second partial compensation electrode is formed on an upper major surface of said annular portion.

10. The thyristor in accordance with claim 8, wherein said second emitter layer of said at least one stage unit thyristor excluding said final stage one comprises a central portion enclosing a portion of said unit thyristor receiving said trigger signal or a portion of said second base layer being provided with said gate electrode, and an arm portion extending from said central portion, said second partial base layer encloses said arm portion in the form of a sheath, said second partial compensation electrode is formed to partially enclose said central portion, and said gate electrode of said next stage unit thyristor is formed on an upper major surface of a forward end portion of said arm portion.

11. The thyristor in accordance with claim 5, wherein said at least one stage is every one of said first to final stages, and a portion receiving said trigger signal or a portion of said second base layer provided with said gate electrode in each stage said unit thyristor is enclosed with said second emitter layer of said unit thyristor, said second emitter layer of each said unit thyristor excluding said final stage one is arranged to be enclosed with said second emitter layer of said final stage unit thyristor through a third partial base layer partially forming said second base layer, said compensation electrode comprises a fourth partial compensation electrode being formed on an upper major surface of said third partial base layer and integrally formed with said second main electrode, said second emitter layer of said final stage unit thyristor is provided with a through hole having an end opening on said upper major surface of said second emitter layer and another end opening on a lower surface of said second emitter layer, said through hole being filled up with a fourth partial base layer partially forming said second base layer, and said compensation electrode further comprises a fifth partial compensation electrode being formed on an upper major surface of said fourth partial base layer and integrally formed with said second main electrode.

12. The thyristor in accordance with claim 11, wherein said gate electrode of said final stage unit thyristor is so annularly formed as to divide said second emitter layer of said final stage unit thyristor into inner and outer sides, so that said unit thyristors excluding said final stage one are arranged inside said annular gate electrode.

13. The thyristor in accordance with claim 12, wherein said second emitter layer of said final stage unit thyristor has a circular outline, and said annular gate electrode is in the form of a circle being concentric with said circular outline of said second emitter electrode with a diameter being ⅓ to ½ the outer diameter of said circular second emitter layer.

14. The thyristor in accordance with claim 3, wherein said second emitter layer of said final stage unit thyristor is provided with a plurality of through holes having first ends opening on said upper major surface of said second emitter layer and second ends opening on a lower surface of said second emitter layer, said through holes being filled up with a fifth partial base layer partially forming said second base layer, and said compensation electrode further comprises a sixth partial compensation electrode being formed on an upper major surface of said second partial base layer and integrally formed with said second main electrode.

15. The thyristor in accordance with claim 3, wherein said compensation electrode is so arranged that paths for feeding principal parts of said trigger currents being inputted in respective said unit thyristors are separated from each other.

16. The thyristor in accordance with claim 15, wherein the electric resistance value of a path of a displacement current flowing across a junction capacitance between said first and second base layers of each said unit thyristor and said second main electrode and said compensation electrode resulting from a voltage noise being applied to said thyristor is so optimized that a forward voltage being applied to a junction between said second base layer and said second emitter layer in each said unit thyristor excluding said final stage one and a forward voltage being applied to a junction between said second base layer and said second emitter layer in next said unit thyristor for said unit thyristor substantially cancel with each other.

17. The thyristor in accordance with claim 3, wherein said emitter electrode of one stage said unit thyristor and said gate electrode of next stage said unit thyristor are connected with each other by a bridging portion of a conductor being provided on an insulating film being formed on said upper major surface of said semiconductor substrate integrally with said emitter and gate electrodes.

18. The thyristor in accordance with claim 17, wherein a portion of said second base layer being provided with said gate electrode of said next stage unit thyristor is enclosed with said second emitter layer of said next stage unit thyristor, and the width of a portion of said second emitter layer being located immediately under said insulating film is not more than 2 mm in the narrowest portion.

19. The thyristor in accordance with claim 3, wherein said gate electrode of said final stage unit thyristor comprises a plurality of gate electrodes.

20. The thyristor in accordance with claim 3, wherein said unit thyristors being precedent to one stage are arranged in plural so that said emitter electrodes of said plurality of precedent stage unit thyristors are electrically connected to said gate electrode of said one stage unit thyristor.

21. The thyristor in accordance with claim 3, wherein at least three stage said unit thyristors are so arranged that the numbers of said unit thyristors being arranged are successively increased from said first stage to said final stage.

22. The thyristor in accordance with claim 3, wherein at least three stage said unit thyristors are arranged, with presence of a combination of such a series of two stage said unit thyristors that the number of next stage said unit thyristors is larger than that of one stage said unit thyristor.

23. The thyristor in accordance with claim 3, wherein said trigger signal is an optical signal.

24. The thyristor in accordance with claim 23, wherein a photoreceiving portion receiving said optical signal is provided with an antireflection film, and the thickness of said antireflection film satisfies a relation of A−30 nm≦thickness of insulating film≦A+30 nm with respect to a value A being expressed as follows:

$$A=(2\times n-1)\times \lambda/(4\times N)$$

where n represents a natural number, λ represents a central wavelength of said optical signal, and N represents the refractive index of said insulating film.

25. A thyristor of a multistage structure comprising at least three stage unit thyristors including a first stage thyristor being ignited by an externally inputted trigger signal and a final stage thyristor being fed with a main current, said unit thyristors being arranged in parallel with each other along a major surface of a semiconductor substrate, said thyristor being characterized in that:

each said unit thyristor comprises four semiconductor layers including a first emitter layer, a first base layer, a second base layer and a second emitter layer being successively stacked on said semiconductor substrate with conductivity types alternately differing from each other, said first emitter layers are exposed on a lower major surface of said semiconductor substrate, said second base layers are exposed on an upper major surface of said semiconductor substrate, and said second emitter layers are selectively provided on upper major surface portions of said second base layers and exposed on said upper major surface, respective said layers excluding said second emitter layers are continuous to each other between respective said unit thyristors, said second emitter layers of said second and later stage unit thyristors are annularly formed to enclose said second emitter layers of precedent said unit thyristors through portions of said second base layers being annularly exposed on said upper major surface, an annular isolation region is provided for annularly dividing said portions of said second base layer, which are adjacent to the outer side of said annularly formed second emitter layer of each of said second and later stage unit thyristors, into inner and outer regions and suppressing or inhibiting carrier movement between said regions, an emitter electrode of said initial stage unit thyristor is annularly formed on an upper major surface of said second emitter layer of said unit thyristor to enclose an input portion for said trigger signal, an emitter electrode of each said stage unit thyristor excluding said initial and final stage ones is annularly formed along an annular upper major surface of said second emitter layer of said unit thyristor, a gate electrode of each said unit thyristor excluding said initial and final stage ones is annularly formed on an upper major surface of said inner region being adjacent to the outer side of said second emitter layer of said unit thyristor to enclose an upper major surface of said second emitter layer, a collector electrode of said second stage unit thyristor is annularly formed on an upper surface of said second base layer being adjacent to the inner side of said second emitter layer of said unit thyristor to enclose said second emitter layer of said initial stage unit thyristor, a collector electrode of each said unit thyristor excluding said initial and second stage ones is annularly formed on an upper major surface of said outer region being adjacent to the inner side of said second emitter layer of said unit thyristor to enclose said isolation region, each of said annular emitter electrode, said gate electrode and said collector electrode of each said unit thyristor excluding said initial and final stage ones has one parting portion, said emitter electrode of each said unit thyristor excluding said initial and final stage ones and said gate electrode of next stage said unit thyristor are connected with each other by a bridging portion of a conductor being formed on an insulating film being formed on said upper surface of said semiconductor substrate to cross said parting portions of other said electrodes being arranged between said electrodes, said bridging portion being integrally formed with said electrodes to be connected with each other, and said collector electrode of each said unit thyristor excluding said initial stage one and said emitter electrode of said unit thyristor being precedent to said final stage is connected with each other by a bridging portion of a conductor being formed on said insulating film being formed on said upper surface of said semiconductor substrate to cross said parting portions of other said electrodes being arranged between said electrodes, said bridging portion being integrally formed with said electrodes to be connected with each other.

26. The thyristor in accordance with claim 25, wherein said isolation region is defined by said first base layer being exposed on said upper major surface of said semiconductor substrate.

27. The thyristor in accordance with claim 26, wherein the thickness of said isolation region is not more than 60 μm.

28. The thyristor in accordance with claim 25, wherein said isolating region is defined by a region of said second base layer being thinner than other regions of second base layer.

29. The thyristor in accordance with claim 25, wherein said isolation region is defined by a groove being formed in said semiconductor substrate from said upper major surface toward a deep portion.

30. The thyristor in accordance with claim 25, wherein the thicknesses of said emitter electrodes, said gate electrodes and said collector electrodes being connected to said bridging portion are at least about five times that of said insulating film being located immediately under said bridging portion.

31. The thyristor in accordance with claim 25, wherein said final stage consists of at least four stages,
said emitter electrode of said unit thyristor preceding to said final stage thyristor and said collector electrode being integrally formed through no said bridging portion.

32. The thyristor in accordance with claim 25, wherein said trigger signal is an optical signal.

* * * * *